(12) United States Patent
Jiang et al.

(10) Patent No.: US 10,240,724 B2
(45) Date of Patent: Mar. 26, 2019

(54) LED FILAMENT

(71) Applicant: ZHEJIANG SUPER LIGHTING ELECTRIC APPLIANCE CO., LTD., Zhejiang (CN)

(72) Inventors: Tao Jiang, Zhejiang (CN); Li-Qin Li, Zhejiang (CN)

(73) Assignee: ZHEJIANG SUPER LIGHTING ELECTRIC APPLIANCE CO., LTD., Zhejiang (CN)

( * ) Notice: Subject to any disclaimer, the term of this patent is extended or adjusted under 35 U.S.C. 154(b) by 123 days.

(21) Appl. No.: 15/499,143

(22) Filed: Apr. 27, 2017

(65) Prior Publication Data

US 2017/0227169 A1   Aug. 10, 2017

Related U.S. Application Data

(63) Continuation-in-part of application No. 15/384,311, filed on Dec. 19, 2016, which is a (Continued)

(30) Foreign Application Priority Data

Aug. 17, 2015 (CN) .......................... 2015 1 0502630
Dec. 19, 2015 (CN) .......................... 2015 1 0966906

(Continued)

(51) Int. Cl.
*H01L 27/15* (2006.01)
*H01L 27/32* (2006.01)
(Continued)

(52) U.S. Cl.
CPC ............. *F21K 9/237* (2016.08); *F21K 9/232* (2016.08); *F21K 9/235* (2016.08); *F21V 3/02* (2013.01);
(Continued)

(58) Field of Classification Search
CPC .......... F21K 9/232; F21K 9/235; F21K 9/237; H01K 1/18; F21V 9/30; H01L 27/15; H01L 27/32
(Continued)

(56) References Cited

U.S. PATENT DOCUMENTS 3,959,684 A * 5/1976 Anderson ................. H01J 5/50
                                                    313/318.08
6,285,119 B1 * 9/2001 Sundhar .................. H01K 1/18
                                                    313/318.03
(Continued)

FOREIGN PATENT DOCUMENTS

CN    101834263    9/2010
CN    102364710    2/2012
(Continued)

*Primary Examiner* — Karabi Guharay
(74) *Attorney, Agent, or Firm* — Andrew M. Calderon; Roberts Mlotkowski Safran Cole & Calderon, P.C.

(57) ABSTRACT

An LED light bulb includes a bulb shell, a bulb base, a stem, conductive supports, an LED filament, and a supporting arm. The bulb base is connected to the bulb shell. The stem is connected to the bulb base. The conductive supports are connected to the stem. The LED filament includes a filament body and two conductive electrodes. The conductive electrodes are at two ends of the filament body and connected to the conductive supports. The filament body is around the stem. The supporting arm is connected to the stem and the filament body. In a height direction of the LED light bulb, H is a distance from a bottom to a top of the bulb shell. A first height difference is defined between the two conductive electrodes and is from 0 to 1/10H. The filament body is curved to form a highest point and a lowest point. A second height difference is defined between the highest point and the lowest point. The first height difference is less than the second height difference.

46 Claims, 114 Drawing Sheets

Related U.S. Application Data continuation-in-part of application No. 15/366,535, filed on Dec. 1, 2016, which is a continuation-in-part of application No. 15/237,983, filed on Aug. 16, 2016.

(30) Foreign Application Priority Data

| Date | | Application No. |
|---|---|---|
| Jan. 22, 2016 | (CN) | 2016 1 0041667 |
| Apr. 27, 2016 | (CN) | 2016 1 0272153 |
| Apr. 29, 2016 | (CN) | 2016 1 0281600 |
| Jun. 3, 2016 | (CN) | 2016 1 0394610 |
| Jul. 7, 2016 | (CN) | 2016 1 0544049 |
| Jul. 22, 2016 | (CN) | 2016 1 0586388 |
| Nov. 1, 2016 | (CN) | 2016 1 0936171 |
| Dec. 6, 2016 | (CN) | 2016 1 1108722 |
| Jan. 13, 2017 | (CN) | 2017 1 0024877 |
| Feb. 14, 2017 | (CN) | 2017 1 0079423 |
| Mar. 9, 2017 | (CN) | 2017 1 0138009 |
| Mar. 23, 2017 | (CN) | 2017 1 0180574 |
| Apr. 11, 2017 | (CN) | 2017 1 0234618 |

(51) Int. Cl.

| | |
|---|---|
| *F21K 9/237* | (2016.01) |
| *F21K 9/232* | (2016.01) |
| *F21V 3/02* | (2006.01) |
| *F21K 9/235* | (2016.01) |
| *F21V 29/70* | (2015.01) |
| *F21V 9/30* | (2018.01) |
| *F21Y 115/10* | (2016.01) |

(52) U.S. Cl.
CPC ............... *F21V 9/30* (2018.02); *F21V 29/70* (2015.01); *F21Y 2115/10* (2016.08)

(58) Field of Classification Search
USPC .................................. 313/318.01, 315, 271
See application file for complete search history.

(56) References Cited

U.S. PATENT DOCUMENTS

| | | | |
|---|---|---|---|
| 8,455,895 | B2 | 6/2013 | Chai et al. |
| 8,933,619 | B1 | 1/2015 | Ou |
| 9,016,900 | B2 | 4/2015 | Takeuchi et al. |
| 9,982,854 | B2 | 5/2018 | Ma et al. |
| 2004/0008525 | A1* | 1/2004 | Shibata ............ F21K 9/232 313/271 |
| 2013/0058080 | A1 | 3/2013 | Ge et al. |
| 2013/0235592 | A1 | 9/2013 | Takeuchi et al. |
| 2013/0293098 | A1 | 11/2013 | Li et al. |
| 2014/0268779 | A1 | 9/2014 | Sorensen et al. |
| 2014/0369036 | A1 | 12/2014 | Feng et al. |
| 2015/0069442 | A1 | 3/2015 | Liu et al. |
| 2015/0070871 | A1 | 3/2015 | Chen et al. |
| 2015/0255440 | A1 | 9/2015 | Hsieh |
| 2016/0223180 | A1 | 8/2016 | Jiang |
| 2016/0223182 | A1 | 8/2016 | Jiang |
| 2016/0363267 | A1 | 12/2016 | Jiang et al. |
| 2017/0012177 | A1 | 1/2017 | Trottier |
| 2017/0051878 | A1 | 2/2017 | Jiang et al. |
| 2017/0074462 | A1 | 3/2017 | Jiang et al. |
| 2017/0084809 | A1 | 3/2017 | Jiang et al. |
| 2017/0130906 | A1 | 5/2017 | Jiang et al. |

FOREIGN PATENT DOCUMENTS

| | | |
|---|---|---|
| CN | 202252991 | 5/2012 |
| CN | 202252991 U | 5/2012 |
| CN | 102751274 | 10/2012 |
| CN | 102751274 A | 10/2012 |
| CN | 103123949 | 5/2013 |
| CN | 103123949 A | 5/2013 |
| CN | 203367275 | 12/2013 |
| CN | 203367275 U | 12/2013 |
| CN | 103560128 | 2/2014 |
| CN | 103560128 A | 2/2014 |
| CN | 203628391 | 6/2014 |
| CN | 203628391 U | 6/2014 |
| CN | 103939758 | 7/2014 |
| CN | 103939758 A | 7/2014 |
| CN | 103956421 A | 7/2014 |
| CN | 103972364 | 8/2014 |
| CN | 103972364 A | 8/2014 |
| CN | 103994349 | 8/2014 |
| CN | 103994349 A | 8/2014 |
| CN | 104319345 | 1/2015 |
| CN | 104319345 A | 1/2015 |
| CN | 204083941 | 1/2015 |
| CN | 204083941 U | 1/2015 |
| CN | 104456165 | 3/2015 |
| CN | 104456165 A | 3/2015 |
| CN | 204289439 | 4/2015 |
| CN | 204289439 U | 4/2015 |
| CN | 104600174 | 5/2015 |
| CN | 104600174 A | 5/2015 |
| CN | 204387765 | 6/2015 |
| CN | 204387765 U | 6/2015 |
| CN | 204678100 | 9/2015 |
| CN | 105098032 A | 11/2015 |
| CN | 105140381 | 12/2015 |
| CN | 105140381 A | 12/2015 |
| CN | 105161608 | 12/2015 |
| CN | 105161608 A | 12/2015 |
| CN | 105371243 | 3/2016 |
| CN | 105371243 A | 3/2016 |
| CN | 105609621 | 5/2016 |
| CN | 105609621 A | 5/2016 |
| CN | 206973307 U | 2/2018 |
| CN | 207034659 U | 2/2018 |
| CN | 108039402 A | 5/2018 |
| CN | 105090782 B | 7/2018 |
| EP | 2567145 A1 | 3/2013 |
| EP | 2760057 | 7/2014 |
| EP | 2760057 A1 | 7/2014 |
| GB | 2547085 A | 8/2017 |
| JP | 3075689 | 2/2001 |
| JP | 3075689 U | 2/2001 |
| JP | 2013225587 A | 10/2013 |
| WO | 2011137662 | 11/2011 |
| WO | 2014167458 | 10/2014 |
| WO | 2014167458 A1 | 10/2014 |
| WO | 2017037010 | 3/2017 |
| WO | 2017037010 A1 | 3/2017 |

\* cited by examiner

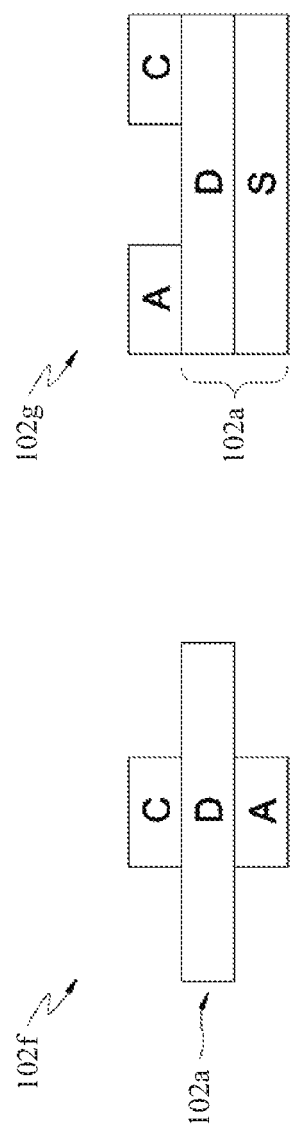

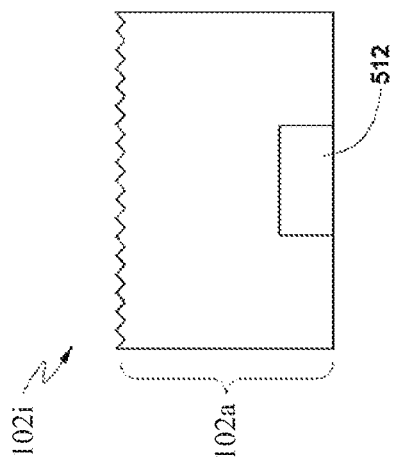
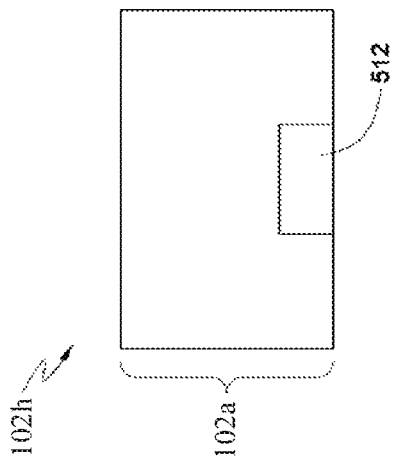

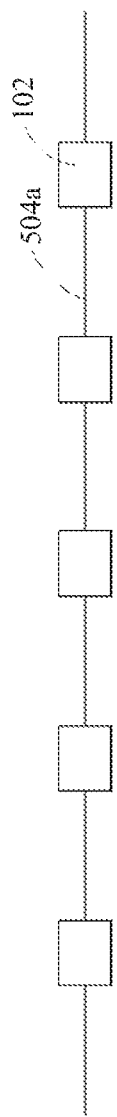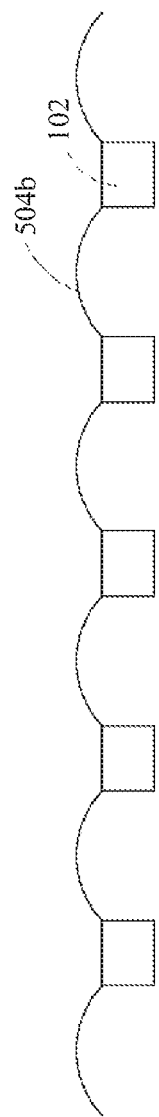

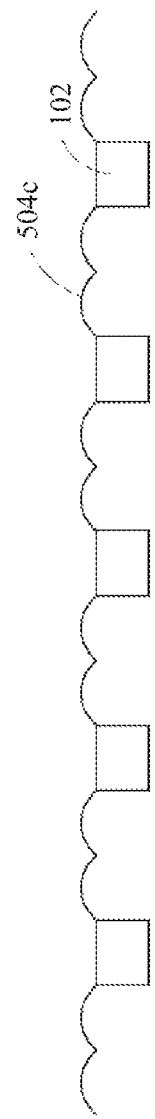
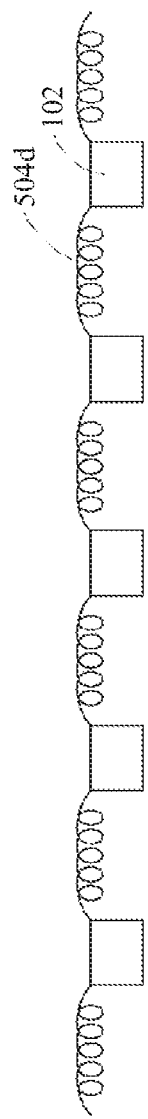

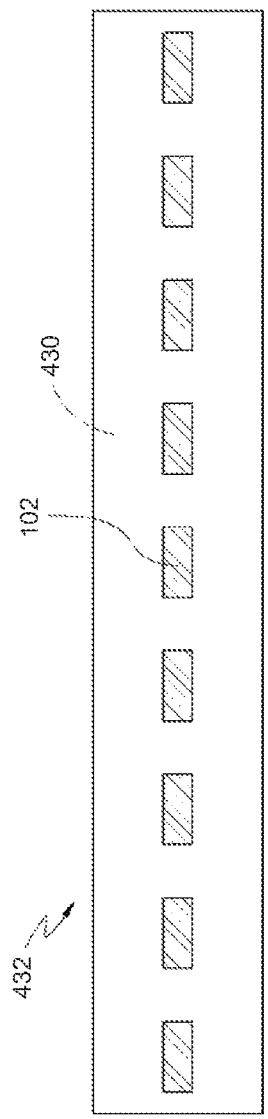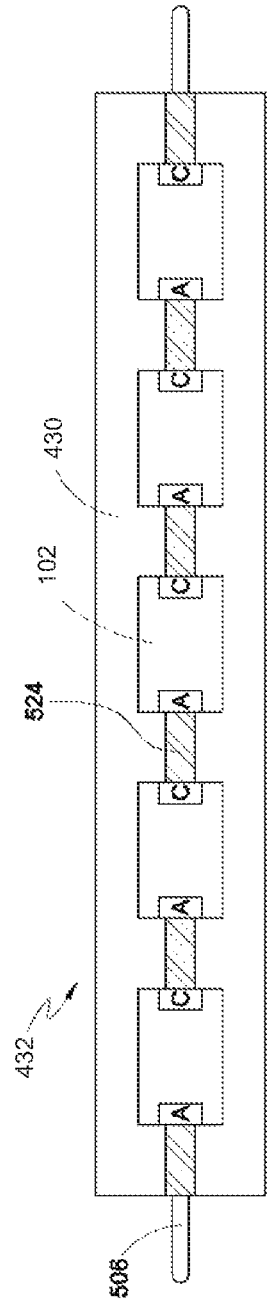

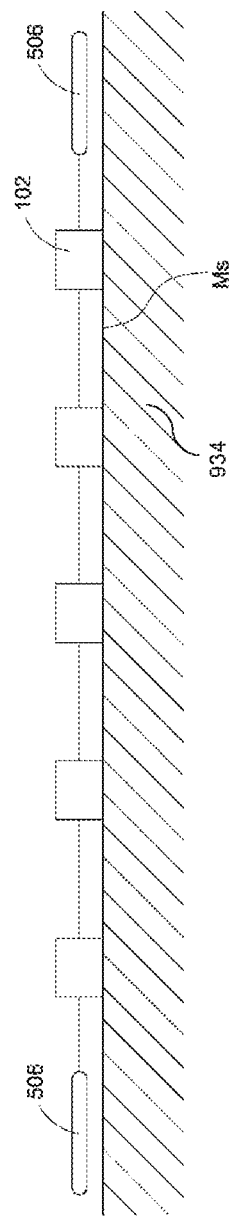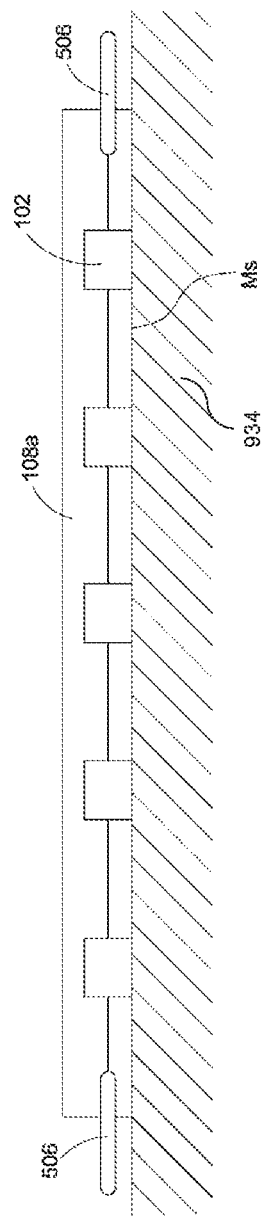

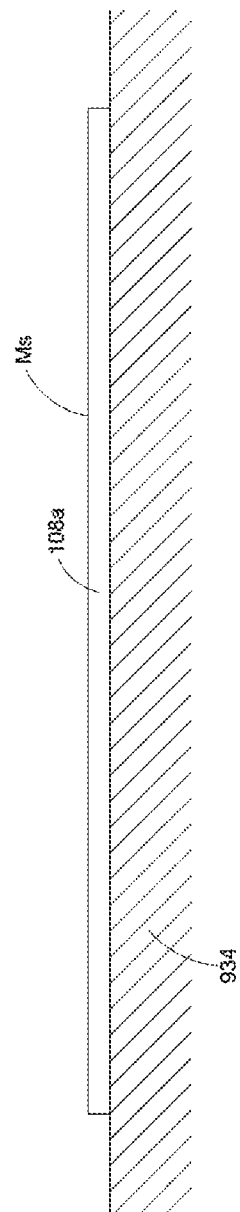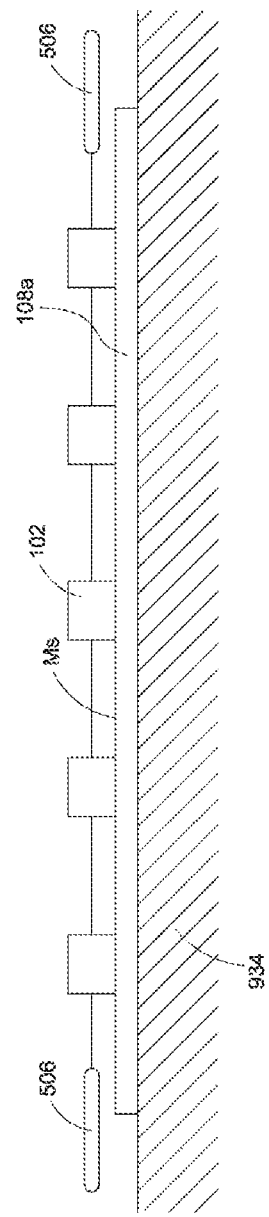

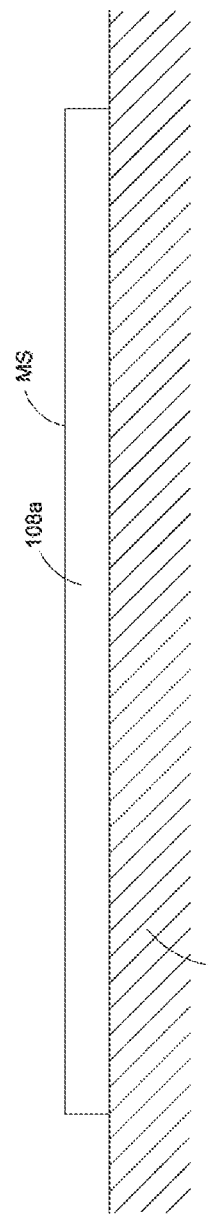
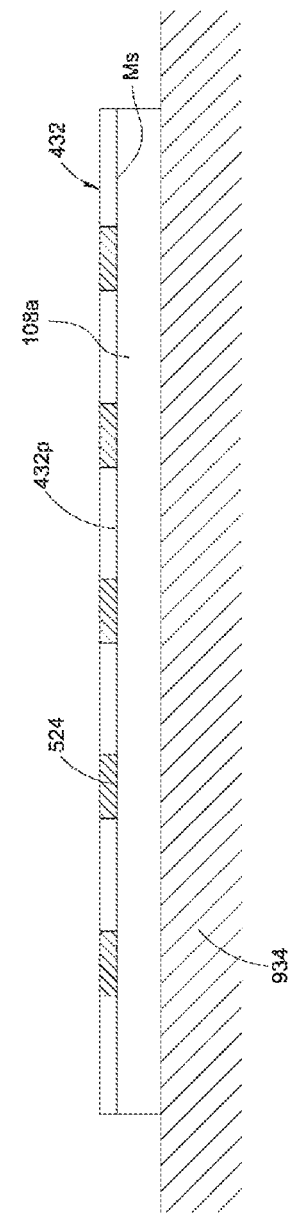
FIG. 12A
FIG. 12B

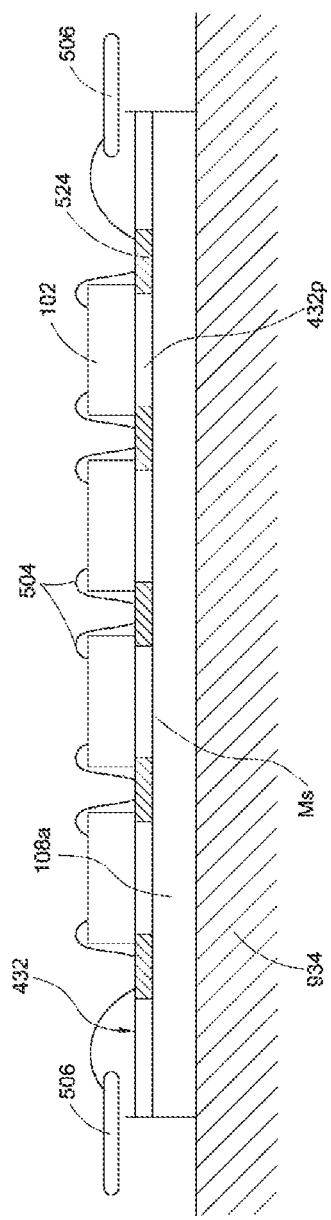

LED FILAMENT

RELATED APPLICATIONS

The present application claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016, CN201610936171.4 filed Nov. 1, 2016 and CN201611108722.4 filed Dec. 6, 2016, CN201610281600.9 filed Apr. 29, 2016, CN201710024877.8 filed Jan. 13, 2017, CN201710079423.0 filed Feb. 14, 2017, CN201710138009.2 filed Mar. 9, 2017, CN201710180574.5 filed Mar. 23, 2017, CN 201710234618.8 filed Apr. 11, 2017, each of which is incorporated herein by reference in its entirety.

The present application is a continuation-in-part application of U.S. Ser. No. 15/384,311 filed Dec. 19, 2016, which claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016, CN201610936171.4 filed Nov. 1, 2016 and CN201611108722.4 filed Dec. 6, 2016, which is a continuation-in-part application of U.S. Ser. No. 15/366,535 filed Dec. 1, 2016, which claims priority to CN201510502630.3 filed Aug. 17, 2015, CN201510966906.3 filed Dec. 19, 2015, CN201610041667.5 filed Jan. 22, 2016, CN201610281600.9 filed Apr. 29, 2016, CN201610272153.0 filed Apr. 27, 2016, CN201610394610.3 filed Jun. 3, 2016, CN201610586388.7 filed Jul. 22, 2016, CN201610544049.2 filed Jul. 7, 2016 and CN201610936171.4 filed Nov. 1, 2016, and which is a continuation-in-part application of U.S. Ser. No. 15/237,983 filed Aug. 16, 2016, which claims priority to CN201510502630.3 filed Aug. 17, 2015, CN201510966906.3 filed Dec. 19, 2015, CN201610041667.5 filed Jan. 22, 2016, CN201610272153.0 filed Apr. 27, 2016, CN201610281600.9 filed Apr. 29, 2016, CN201610394610.3 filed Jun. 3, 2016 and CN201610586388.7 filed Jul. 22, 2016, each of which is incorporated herein by reference in its entirety.

FIELD OF THE INVENTION

The present invention relates to LED luminaries. More particularly, this invention describes an LED filament for LED light bulbs.

BACKGROUND OF THE INVENTION

Incandescent light bulbs are a source of electric light that creates light by running electricity through a resistive filament, thereby heating the filament to a very high temperature, so that it glows and produces visible light. Incandescent bulbs are made in a wide range of sizes and voltages, from 1.5 volts to about 300 volts. The bulbs consist of a generally glass or plastic enclosure with a filament of tungsten wire inside the bulb through which an electrical current is passed. Incandescent lamps are designed as direct "plug-in" components that mate with a lampholder via a threaded Edison base connector (sometimes referred to as an "Edison base" in the context of an incandescent light bulb), a bayonet-type base connector (i.e., bayonet base in the case of an incandescent light bulb), or other standard base connector to receive standard electrical power (e.g., 120 volts A.C., 60 Hz in the United States, or 230V A.C., 50 Hz in Europe, or 12 or 24 or other D.C. voltage). The base provides electrical connections to the filament. Usually a stem or glass mount anchors to the base, allowing the electrical contacts to run through the envelope without gas or air leaks.

Incandescent light bulbs are widely used in household and commercial lighting, for portable lighting, such as table lamps, car headlamps, flashlights, and for decorative and advertising lighting. However, incandescent light bulbs are generally inefficient in terms of energy use and are subject to frequent replacement due to their limited lifetime (about 1,000 hours). Approximately 90% of the energy input is emitted as heat. These lamps are gradually being replaced by other, more efficient types of electric light such as fluorescent lamps, high-intensity discharge lamps, light emitting diodes (LEDs), etc. For the same energy input, these technologies give more visible light and generate much less heat. Particularly, LEDs consume a fraction of the energy used to illuminate incandescent bulbs and have a much longer lifetime (e.g. 50,000 to 75,000 hours). Furthermore, LED light sources are a very clean "green" light source and also provide good color reproduction.

LED light bulbs are far more efficient than traditional incandescent lamps, most notably because they use only a small fraction of the electricity of an incandescent. As traditional incandescent bulbs continue to be phased out, LED has become the mainstream light sources used on a variety of indoor and outdoor lighting fixtures. However, traditional LED light bulbs are not without its disadvantages, for example, the complicated designs which incorporate the heavy aluminum heat sinks and an electronic circuit for power conversion. Consequently, the cost is high and the shape is somewhat strange compared with the elegant incandescent bulbs people are accustomed to.

An LED filament bulb is a light bulb that uses LEDs as its filaments. Accordingly, it is desirable to provide a novel LED filament light bulb with improved performance and aesthetics that may be used as a better replacement for a typical incandescent light bulb than traditional LED light bulbs.

The LED has advantages of environmental protection, energy saving, high efficiency and long lifespan, and therefore it attracts widespread attention in recent years and gradually replaces traditional lighting lamps. However, due that the luminescence of the LED has directivity, current LED lamps is unable to provide with an illumination with a wide angle range like traditional lamps. Accordingly, how to design LED lamps with similar wide range of illumination to the traditional lamps challenges the industries.

Recently, an LED light bulb has been provided and gradually replaces the use of incandescent light bulbs. The kind of the LED light bulbs is provided with multiple LED filaments due to the limited illuminating angle of LED light sources. The LED filaments are aligned in a circle in the LED light bulb, and each of the LED filaments faces different angles for illumination, such that the illuminating angle of the LED light bulb could be increased in general. The manufacturing process of the LED filament includes: fixing multiple LED chips in series to a long, narrow glass substrate, enclosing the whole glass substrate by silicone gel mixed with phosphor powders, and processing electrical connection of the LED filament. When the LED filaments are welded to a stand in the LED light bulb, the LED filaments have to be welded one by one, which is numerous and complicated. Further, the LED filaments are welded in a spot welding manner, which requires high standard regarding property and size of materials, and has a risk of faulty welded joint. In appearance, the LED filaments are hard and straight and lack flexibility and variation. The conventional LED light bulb gives people nothing more than a visually stiff feeling and cannot provide an aesthetic appearance.

In addition, the color temperature of light generated by the LED filaments is usually too high such that the use of the LED filaments is only suitable for limited environments. In a comfort and relax occasion, using conventional tungsten filament bulbs with low color temperature of light for illumination is much better.

Further, the LED filaments generate a large amount of heat during operation. Heat may damage components in the LED light bulb such as LED chips and a driving circuit and lower the efficiency of the LED filaments.

OBJECTS AND SUMMARY OF THE INVENTION

It is an object of the present invention that light is emitted from one or more LED filaments uniformly and evenly in all directions, instead of beaming in a direction while leaving everywhere else dark the way that many traditional LED light bulbs do. Thus, the LED filament light bulb features a close resemblance with the traditional incandescent bulb. Desirably, the visually unpleasant aluminum die cast for heat dissipation in traditional LED light bulbs is no longer required in the LED filament light bulb. Thus, the LED filament light bulb is perfect for homes, hotels, restaurants, bars and places where classic style and appearance is critical. Desirably, all electronics of the LED filament light bulb is nestled inside the light bulb which is almost not visible. Desirably, light produced by the LED filament light bulb is similar to natural light. It does not have any infrared or ultraviolet radiation and it is uniform and soft on the eyes. After the regulations that banned the sale of the traditional light bulbs, many homeowners could not put in compact fluorescent bulbs or other bogus LED lights into most of these old fixtures and chandeliers. Desirably, the LED filament light bulb fits well into all the lighting fixtures that used the outdated incandescent light bulbs. Desirably, the LED filament light bulb makes it easy to reuse these old and attractive lighting fixtures. Desirably, the LED filament light bulb have remarkable energy efficiency. Desirably, the LED filament has a long service life. This extended lifespan is enhanced by a constant current source that ensures stability of parameters and prolongs the life of the light bulb. Hence, the cost of investing in these bulbs will provide cost savings for up to a few decades in some cases. Desirably, the LED filament light bulb can be placed in places where dimming of lights is necessary. The LED filament light bulb gives off a warm inviting golden soft glow when used in table lamps or as accent lights. The LED filament light bulb is perfect for creating a very pleasant atmosphere in sitting rooms or bedrooms.

Therefore, it is an object of the claimed invention to provide a significantly improved LED filament for using with an LED light bulb. In accordance with an embodiment with the present invention, the LED filament configured for emitting omnidirectional light, comprising: a linear array of LED chips operably interconnected to emit light upon energization; a conductive electrode; the linear array of LED chips is electrically connected with the conductive electrode; and a light conversion coating enclosing the linear array of the LED chip and the conductive electrode, wherein: the light conversion layer includes a top layer and a base layer conformally interconnected to form a unitary enclosure; the top layer is coated on a first side of the linear array of LED chips and the conductive electrode; and the base layer is coated on a second side of the linear array of LED chips and the conductive electrode.

It is an object of the claimed invention to provide an improved LED light bulb, which is easily manufactured, has a wide angle for illumination, and provides an aesthetic appearance.

In accordance with an embodiment with the present invention, the linear array of LED chips and the conductive electrode interpose the base layer and the top layer.

In accordance with an embodiment with the present invention, the base layer is harder than the top layer.

In accordance with an embodiment with the present invention, the top layer includes at least one of a phosphor glue layer and a phosphor film layer; optionally, the top layer further includes a transparent layer; the base layer includes at least one of a phosphor glue layer and a phosphor film layer; and optionally, the base layer further includes a transparent layer.

In accordance with an embodiment with the present invention, the LED filament in claim 4, wherein: surface roughness Rz of the phosphor film layer is from 1 nm to 200 μm and surface roughness Rz of the phosphor glue layer is from 1 μm to 2 mm.

In accordance with an embodiment with the present invention, the phosphor film layer is made from a first adhesive binder doped with phosphor particles; and the phosphor glue layer is made from a second adhesive binder doped with phosphor particles.

In accordance with an embodiment with the present invention, the first adhesive binder is further doped with inorganic oxide particles; and the second adhesive binder is further doped with inorganic oxide particles.

In accordance with an embodiment with the present invention, visible light transmittance of the transparent layer is greater than 40%; and the transparent layer is made from at least one of silica gel, silicone resin and polyimide.

In accordance with an embodiment with the present invention, the top layer includes a phosphor glue layer; the base layer includes a phosphor film layer; the linear array of LED chips interposes the top layer and the base layer; the phosphor glue layer is made from a first adhesive binder doped with a plurality of first phosphor particles and a plurality of first inorganic oxide particles; and the phosphor film layer is made from a second adhesive binder doped with a plurality of second phosphor particles and a plurality of second inorganic oxide particles.

In accordance with an embodiment with the present invention, the first adhesive binder is made from a different material from which the second adhesive binder is made.

In accordance with an embodiment with the present invention, base layer is harder than the top layer.

In accordance with an embodiment with the present invention, the second adhesive binder is harder than the first adhesive binder.

In accordance with an embodiment with the present invention, the second adhesive binder is partially made from polyimide; and the first adhesive binder is made from silicone resin.

In accordance with an embodiment with the present invention, the mass ratio of the polyimide in the second adhesive binder is equal to or less than 10%.

In accordance with an embodiment with the present invention, the second phosphor particle is dimensionally smaller than the first phosphor particle.

In accordance with an embodiment with the present invention, the second inorganic oxide particle is dimensionally smaller than the first inorganic oxide particle.

In accordance with an embodiment with the present invention, the inorganic oxide particle is from 100 to 600 nm.

In accordance with an embodiment with the present invention, the inorganic oxide particle is Al2O3.

In accordance with an embodiment with the present invention, Shore hardness of the phosphor glue layer is from D40 to D70; and Shore hardness of the phosphor film layer is from D20 to D70.

In accordance with an embodiment with the present invention, the index of refraction of the phosphor film layer is equal to or less than 1.4.

In accordance with an embodiment with the present invention, the light transmittance of the phosphor film layer is 40% to 95%.

In accordance with an embodiment with the present invention, the adhesive binder is made from polyimide; and the mass ratio of the polyimide in the light conversion coating is equal to or less than 10%.

In accordance with an embodiment with the present invention, the adhesive binder is made from polyimide; the mass ratio of the adhesive binder in the light conversion coating is from 5% to 40%; and the rotation viscosity of the polyimide is from 5 Pa·s to 20 Pa·s.

In accordance with an embodiment with the present invention, the top layer includes a phosphor glue layer; the base layer includes a phosphor film layer; the base layer interposes the first linear array of LED chips and the second linear array of LED chips; the first linear array of LED chips interposes the first top layer and the base layer; the second linear array of LED chips interposes the second top layer and the base layer; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, the first linear array of LED chips and the second linear array of LED chips are in electrical communication with a same set of electric electrodes.

In accordance with an embodiment with the present invention, the top layer includes a phosphor glue layer; the base layer includes a phosphor film layer and a transparent layer; the phosphor film layer is harder than the transparent layer; the phosphor film layer interposes the linear array of LED chips and the transparent layer; the linear array of LED chips interposes the top layer and the phosphor film layer; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, at least one of the top layer and the base layer comprise the transparent layer, wherein the transparent layer has a thickness as integral multiples of ±20 of ½ or ¼ wavelength of the light.

In accordance with an embodiment with the present invention, Shore hardness of the phosphor film layer is 40 plus; and Shore hardness of the transparent layer is from D20 to D40.

In accordance with an embodiment with the present invention, the phosphor film layer has a thickness different from the transparent layer.

In accordance with an embodiment with the present invention, the top layer includes a phosphor glue layer; the base layer includes alternating sections of first portions and second portions; the first portion has a different hardness from the second portion;

In accordance with an embodiment with the present invention, the linear array of LED chips interposes the top layer and the base layer; the phosphor glue layer is made from an adhesive binder doped with a plurality of first phosphor particles and a plurality of first inorganic oxide particles; the first portion is made from a first adhesive binder doped with a plurality of phosphor particles and a plurality of inorganic oxide particles; and the second portion is made from a second adhesive binder doped with a plurality of phosphor particles and a plurality of inorganic oxide particles.

In accordance with an embodiment with the present invention, the first adhesive binder is harder than the second adhesive binder.

In accordance with an embodiment with the present invention, the top layer includes a phosphor glue layer; the base layer includes a phosphor film layer; the linear array of LED chips is enclosed by the top layer; at least part of the linear array of LED chips is disposed on a plane where is different from the plane that the conductive electrode disposed on; the phosphor glue layer is made from an adhesive binder doped with a plurality of first phosphor particles and a plurality of first inorganic oxide particles; and the phosphor film layer is made from an adhesive binder doped with a plurality of phosphor particles and a plurality of inorganic oxide particles.

In accordance with an embodiment with the present invention, the top layer includes a phosphor glue layer and a transparent layer; the base layer includes a phosphor film layer and a transparent layer; the phosphor film layer is harder than the transparent layer; the phosphor film layer interposes the linear array of LED chips and the transparent layer; the linear array of LED chips interposes the phosphor glue layer and the phosphor film layer; the phosphor glue layer interposes the transparent layer and the linear array of LED chips; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, the top layer includes a phosphor glue layer; at least one between the top layer and the base layer extends into the other one; the base layer includes a phosphor film layer; the linear array of LED chips interposes the top layer and the base layer; the phosphor glue layer is made from an adhesive binder doped with a plurality of phosphor particles and a plurality of inorganic oxide particles; and the phosphor film layer is made from an adhesive binder doped with a plurality of phosphor particles and a plurality of inorganic oxide particles.

In accordance with an embodiment with the present invention, the mass ratio of the phosphors of the base layer is less than that of the phosphors of the top layer.

In accordance with an embodiment with the present invention, the mass ratio of the phosphors of the top layer is from 60% to 85%; and the mass ratio of the phosphors of the base layer is from 40% to 65%.

In accordance with an embodiment with the present invention, a linear array of LED chips operably interconnected to emit light upon energization; an insulation substrate;

a conductive electrode; a plurality of conductive wires and a plurality of conductive foils for electrically connecting the linear array of LED chips and the conductive electrode; and a light conversion coating covering the linear array of the LED chips and the conductive electrode, wherein: the conductive electrode is formed by two ends of a layer of the conductive foil; the linear array of LED chips and the conductive electrode are disposed in the insulation substrate; the conductive foil includes a plurality openings; the light conversion layer includes a top layer and a base layer conformally interconnected to form a unitary enclosure; the top layer is coated on a first side of the linear array of LED chips and the conductive electrode; and the base layer is coated on a second side of the linear array of LED chips and the conductive electrode.

In accordance with an embodiment with the present invention, the width of the opening is greater than the width of the LED chip configured to receive the LED chip.

In accordance with an embodiment with the present invention, the LED chip is a flip chip; the width of the opening, which is less than the width of the LED chip, is configured for the LED chip to mount around the opening; and the LED chip includes a soldering bump for electrically connecting the conductive foil and the LED chip.

In accordance with an embodiment with the present invention, the LED chip is a face-up chip; the LED chip includes a soldering bump and an extended bump; the soldering bump and the extended bump reach a same elevation; the LED chip is aligned in an upside-down position and electrically connected to the conductive foil via the soldering bump and the extended bump; and the soldering bump and the extended bump are respectively soldered on two sides of the conductive foil.

In accordance with an embodiment with the present invention, a first LED chip is configured to angle differently in relation to a second LED chip.

In accordance with an embodiment with the present invention, the light conversion coating further includes an auxiliary piece extending longitudinally in the LED filament for improving the toughness of the LED filament.

In accordance with an embodiment with the present invention, a linear array of LED chips operably interconnected to emit light upon energization; a conductive electrode; a plurality of conductive wires for electrically connecting the linear array of LED chips and the conductive electrode; and a light conversion coating enclosing the linear array of LED chips and the conductive electrode, wherein: the light conversion layer includes a first phosphor glue layer, a second phosphor glue layer and a transparent layer; the first phosphor glue layer includes a linear series of pairwise tangent globular structures; the LED chip is enclosed in a central portion of the first phosphor glue layer; the transparent layer forms an external layer of the LED filament; and the second phosphor glue layer fills the gap between the transparent layer and the first phosphor glue layer.

In accordance with an embodiment with the present invention, an LED light bulb comprises a bulb shell, a bulb base, a stem, at least two conductive supports, an LED filament, and at least one supporting arm. The bulb base is connected to the bulb shell. The stem comprises a stem bottom and a stem top opposite to each other. The stem bottom is connected to the bulb base. The two conductive supports are connected to the stem. The LED filament comprises a filament body and two conductive electrodes. The two conductive electrodes are at two opposite ends of the filament body and are respectively connected to the two conductive supports. The filament body is around the stem. An end of the supporting arm is connected to the stem and another end is connected to the filament body. In a height direction of the LED light bulb, H is a distance from a bottom of the bulb shell to a top of the bulb shell. A first height difference is defined between the two conductive electrodes and is from 0 to 1/10H. The filament body is curved and rises and falls to form a highest point and a lowest point. A second height difference is defined between the highest point and the lowest point. The first height difference is less than the second height difference, and the second height Difference is from 2/10H to 4/10H.

In another embodiment, when the LED light bulb is projected to a side projection plane parallel with a height direction of the LED light bulb, a filament side projection of the filament body on the side projection plane comprises a highest point and a lowest point. A height difference is defined between the highest point and the lowest point in the height direction. The height difference is from 1/8 to 3/8 of a height of the bulb shell. When the LED light bulb is projected to a horizontal projection plane perpendicular to the height direction of the LED light bulb, a filament horizontal projection of the filament body on the horizontal projection plane is of a quasi-circle or a quasi U shape, and a shortest distance between the two ends of the filament horizontal projection is from 0 cm to 3 cm. In the height direction of the LED light bulb, a height difference between the two conductive electrodes is from 0 mm to 5 mm In another embodiment, the filament body comprises at least one first curving segment and at least two second curving segments. The first curving segment is between the two second curving segments. The two conductive electrodes are respectively at an end of each of the two second curving segments away from the first curving segment. A height difference between the two conductive electrodes in a height direction of the LED light bulb is from 0 mm to 5 mm. The first curving segment curves towards a first direction. The second curving segment curves towards a second direction. The first curving segment and the two second curving segments form a wave shaped annular structure.

According to the embodiments of the instant disclosure, the LED light bulb includes many advantages. For example, the manufacturing of the product is simplified, the angle of emitting light is wide, the color temperature of light could be easily adjusted, the strength of the filament is better, and the whole of the product has a better aesthetic appearance.

Various other objects, advantages and features of the present invention will become readily apparent from the ensuing detailed description, and the novel features will be particularly pointed out in the appended claims.

BRIEF DESCRIPTION OF FIGURES

The following detailed descriptions, given by way of example, and not intended to limit the present invention solely thereto, will be best be understood in conjunction with the accompanying figures:

FIGS. 6A to 6H are schematic views of the LED device in accordance with an embodiment of the present invention;

FIGS. 7A to 7D are schematic views of the linear array of LED devices in accordance with an embodiment of the present invention;

FIGS. 9A and 9B are schematic views of the LED filament in accordance with an embodiment of the present invention;

FIGS. 10A to 10C are schematic views of the LED filament in accordance with an embodiment of the present invention;

FIGS. 11A to 11C are schematic views of the LED filament in accordance with an embodiment of the present invention;

FIGS. 12A to 12D are schematic views of the LED filament in accordance with an embodiment of the present invention;

FIG. 49I to FIG. 49K illustrate an LED filament with attaching strength being enhanced according to an embodiment, wherein FIG. 49I is a perspective view showing a base layer only, FIG. 49J is a perspective view showing a base layer and a top layer, and FIG. 49K is a cross-sectional view along a line E1-E2 in FIG. 49J, and wherein FIG. 49K is a cross-sectional view of a layer structure of an LED filament according to another embodiment;

DETAILED DESCRIPTION OF THE EMBODIMENTS

Figure 1:
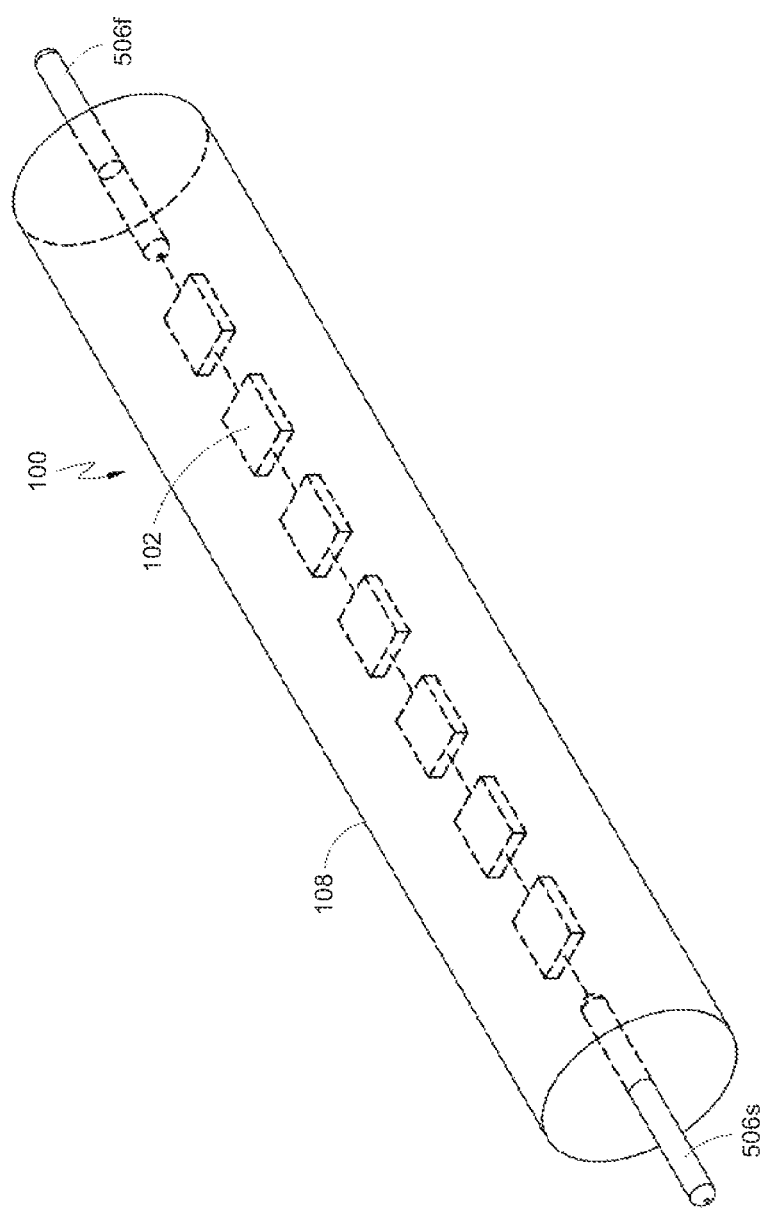
FIG. 1 is a see-through view of the LED filament in accordance with an embodiment of the present invention.

The invention will be described more fully hereinafter with reference to the accompanying drawings, in which example embodiments of the invention are shown. This invention may, however, be embodied in many different forms and should not be construed as limited to the example embodiments set forth herein. Rather, the disclosed embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element or layer is referred to as being "on," "connected to," "coupled to" or "responsive to" (and/or variants thereof) another element, it can be directly on or directly connected, coupled or responsive to the other element or intervening elements may be present. In contrast, when an element is referred to as being "directly on," "directly connected to," "directly coupled to" or "directly responsive to" (and/or variants thereof) another element, there are no intervening elements present. As used herein, the term "and/or" includes any and all combinations of one or more of the associated listed items and may be abbreviated as "/".

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for purposes of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

The present invention is described below with reference to block diagrams and/or flowchart illustrations of methods and/or apparatus (systems) according to embodiments of the invention. It is understood that a block of the block diagrams and/or flowchart illustrations, and combinations of blocks in the block diagrams and/or flowchart illustrations, can embody apparatus/systems (structure), means (function) and/or steps (methods) for implementing the functions/acts specified in the block diagrams and/or flowchart block or blocks. It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompasses both an orientation of above and below.

Example embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, may be expected. Thus, the disclosed example embodiments of the invention should not be construed as limited to the particular shapes of regions illustrated herein unless expressly so defined herein, but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention, unless expressly so defined herein.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

FIG. 1 is a see-through view of the LED filament 100 according to an embodiment of the invention. The LED filament 100 includes an enclosure 108, a linear array of LED devices (e.g. LED chips) 102 and an electrical connector 506. The linear array of LED devices 102 is disposed in the enclosure 108 to be operable to emit light when energized through the electrical connector 506. The enclosure is either straight or curvaceous. The enclosure has a cross section in any regular shapes (e.g. circle and polygon) or irregular shapes (e.g. petal and star). In FIG. 1, the enclosure 108 is a straight cylinder having a circular cross section. The enclosure 108 is made of any optically transmissive materials through which optical radiation from the LED device 102 can pass without being totally absorbed or reflected, e.g. glass, plastic, resin and silicone.

Figure 2:
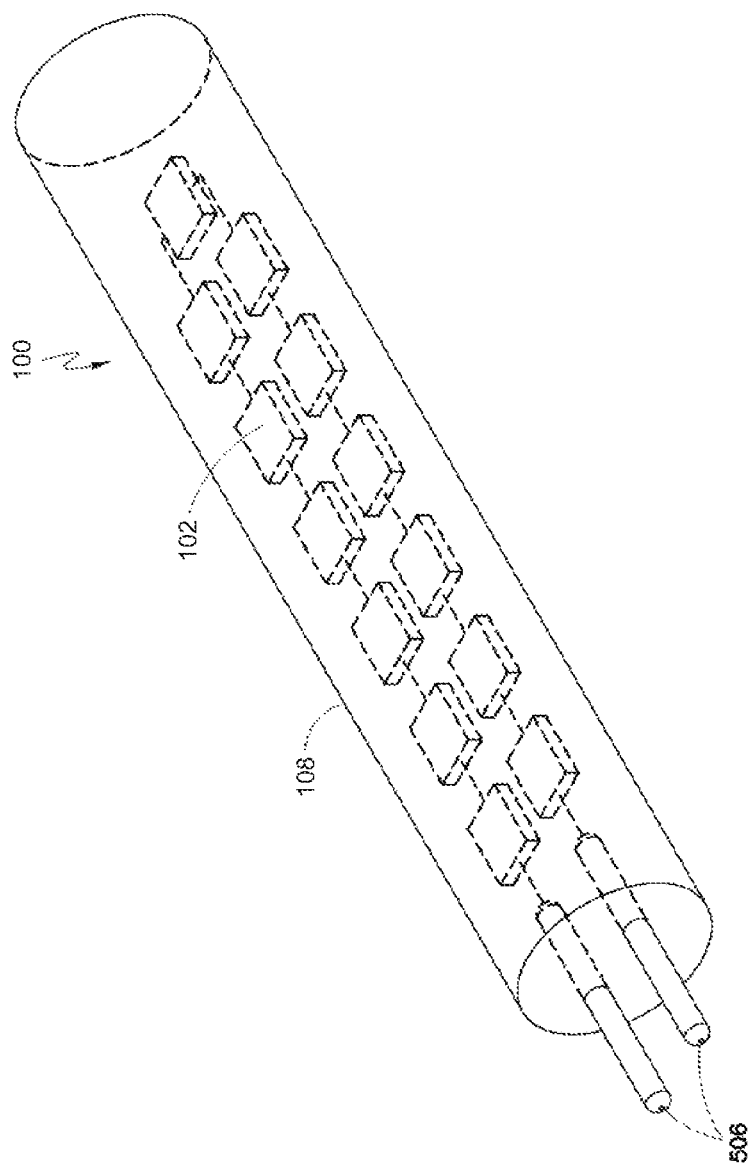
FIG. 2 is a see-through view of the LED filament in accordance with an embodiment of the present invention.
Figure 3:
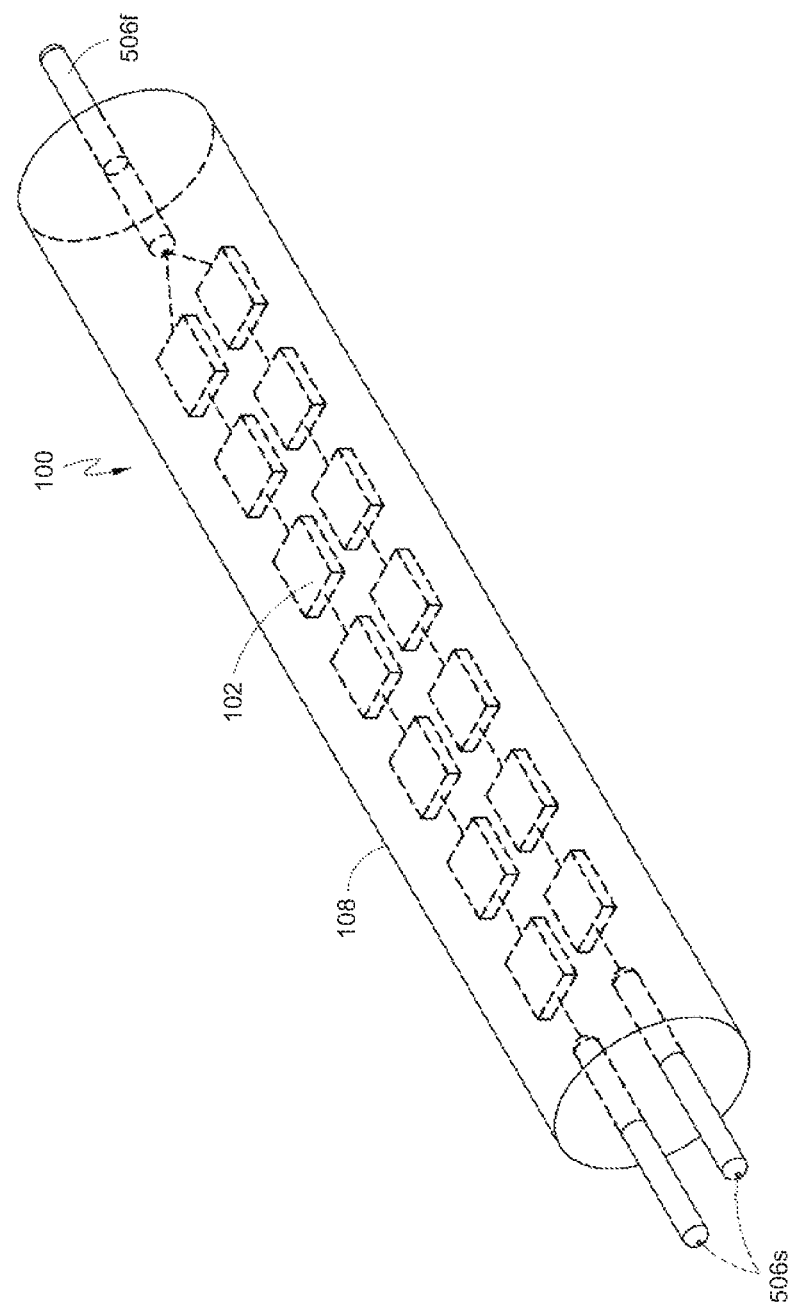
FIG. 3 is a see-through view of the LED filament in accordance with an embodiment of the present invention.

The linear array of LED devices 102 includes a plurality of LED devices 102 electrically coupled in parallel, in series or in a combination of both ways. In FIGS. 1 and 2, the linear array of LED devices 102 is formed by serially coupling a plurality of LED devices 102. In FIG. 1, the linear array of LED devices 102 defines a straight line in the enclosure 108 along the longitudinal axis. In FIG. 2, the linear array of LED devices 102 defines a U-shaped curve extending axially in the enclosure 108. In FIG. 3, the linear array of LED devise 102 includes a first set of serially coupled LED devices 102 and a second set of serially coupled LED devices 102. The first set of LED devices 102 is in parallel connection with the second set of LED devices 102. The linear array of LED devices 102 defines a straight pair of parallel lines extending axially in the enclosure 108. Because there is only one path in which the current can flow in a series circuit, opening or breaking the circuit at any point causes the entire array of LED devices 102 to stop operating. By contrast, the same voltage is applicable to all circuit components connected in parallel. The total current is the sum of the currents through the individual components.

Other things equal including luminary output, lower current in an individual LED device 102 results in better thermal performance.

The linear array of LED devices includes a liner array of single-die devices, multi-die devices or both to enable the LED filament 100 to glow across a broad field of angle. Going back to FIG. 1, in some embodiments, the linear array of LED devices 102 includes a plurality of individual LED dies connected by conductive glue, solder or welds. LED devices 102 having different colors can be mixed together to create white light. In other embodiments, the linear array of LED devices 102 includes a plurality of multi-die LED devices coupled together by a wire frame structure or in some other manner. The linear array of LED devices 102 emits light in a substantially omnidirectional or 360-degree pattern from the LED filament 100. Light is given off around the enclosure roughly perpendicular to the envelope of the enclosure in all directions. While the desired light intensity distribution may comprise any light intensity distribution, in one embodiment, the desired light intensity distribution conforms to the JEL801 standards or ENERGY STAR® Partnership Agreement Requirements for Luminous Intensity Distribution, each of which is incorporated herein by reference. Under ENERGY STAR® standards, an omnidirectional lamp is one configured to emit "an even distribution of luminous intensity (candelas) within the 0° to 135° zone (vertically axially symmetrical). Luminous intensity at any angle within this zone shall not differ from the mean luminous intensity for the entire 0° to 135° zone by more than 20%. At least 5% of total flux (lumens) must be emitted in the 135°-180° zone. Distribution shall be vertically symmetrical as measures in three vertical planes at 0°, 45°, and 90°." The Japanese standard JEL 801 stipulates that the luminary flux within 120 degrees from the beaming axis must be equal to or greater than 70% of the total flux of the light bulb.

Staying on FIG. 1, the linear array of LED devices 102 is made to be enclosed by the enclosure 108 in a variety of ways. In some embodiments, the enclosure 108 is formed directly on the linear array of LED devices 102 by dispensing a binder material such as liquid polymer coating containing various particles on the LED device 102. Simple as this may seem, the coating formed this way, could be unduly thick or undesirably nonuniform. In other embodiments, the enclosure 108 is fabricated and tested independently of the linear array of LED devices 102. Subsequently, the enclosure 108 is adhesively bonded to the linear array of LED devices 102. Bonding may be direct via a single adhesive layer or via one or more intermediate adhesive layers to form the LED filament 100 in a unitary structure comprising the linear array of LED devices 102 and the enclosure 108. In an embodiment, the enclosure 108 is combined with the LED device 102 at the wafer level. Alternatively, the enclosure 108 is mounted onto individual LED dice. The cost for making the LED filament 100 decreases when we form the enclosure 108 separately because defective enclosures 108 can be identified and discarded before packaging. Optionally, the enclosure 108 is sized to fit the lighting surface of the LED device 102.

Figure 4:
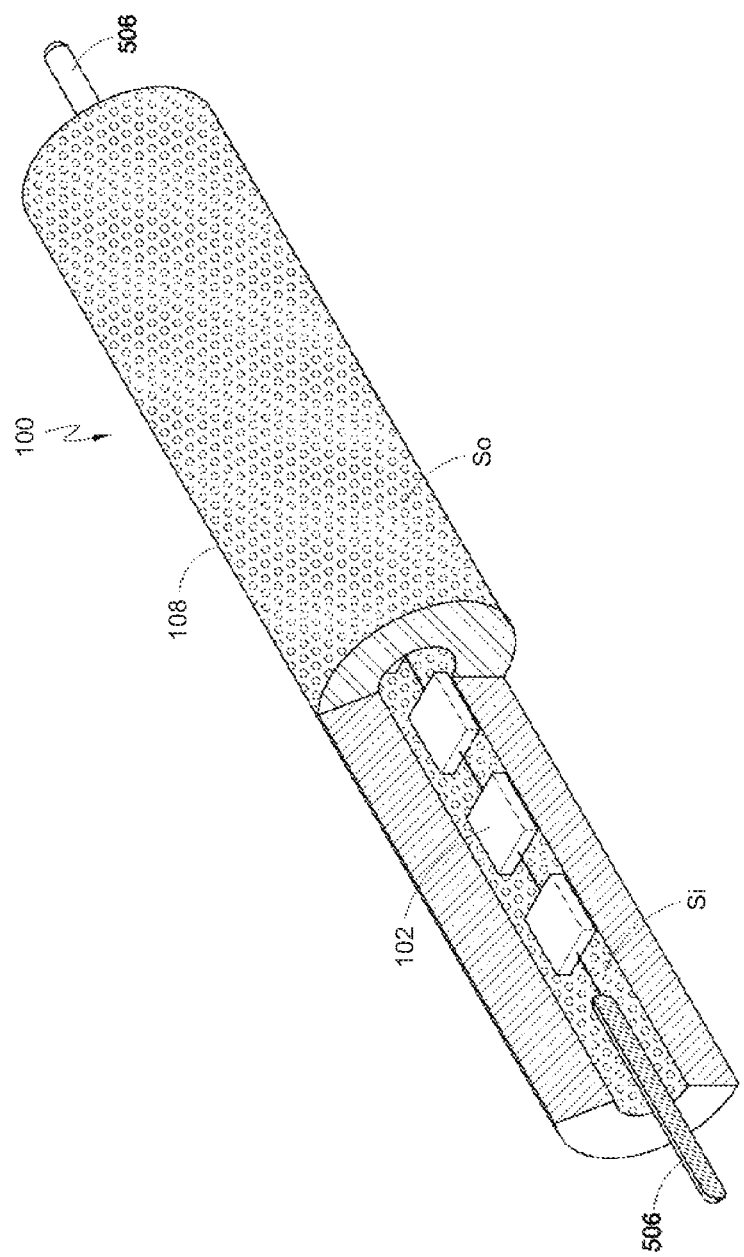
FIG. 4 includes a see-through view and a cut-open view of the LED filament in accordance with an embodiment of the present invention.

In FIG. 4, the LED filament 100 is radially severed into two sections. One of the sections is further axially sliced and disemboweled to show the inner surface Si of the enclosure 108. The outer surface So interfaces the air and the enclosure 108. When the linear array of LED devices 102 is conformally wrapped around by the enclosure 108, the inner surface Si interfaces the enclosure 108 and the LED device 102. When the linear array of LED devices 102 is spaced apart from the enclosure 108, the inner surface Si interfaces the enclosure 108 and the filler in the space such as the air. In an embodiment, the enclosure 108 includes a texturized or patterned surface So, Si for improving light extraction. In some embodiments, the enclosure 108 includes an outer surface So texturized to interface the air and the enclosure 108. In other embodiments, the enclosure 108 includes an inner surface Si texturized to interface the enclosure 108 and the adjacent media such as the LED device 102 or the air.

Figure 5B:
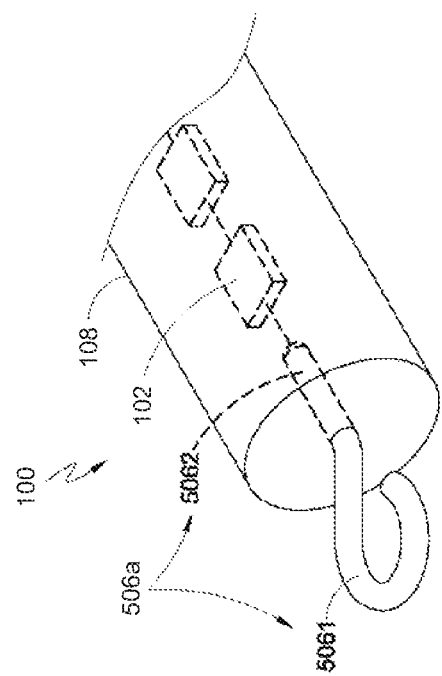
FIGS. 5A to 5D are schematic views of the electrical connector in accordance with an embodiment of the present invention.
Figure 5A:
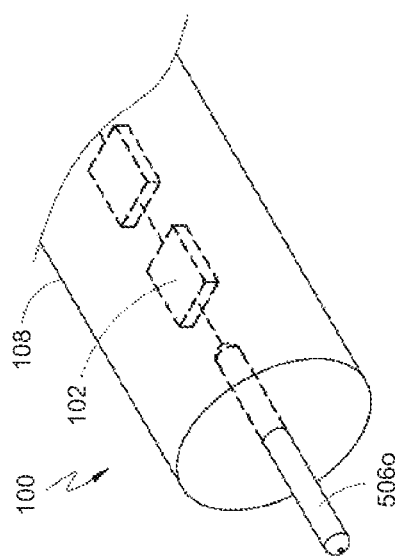
Figure 5D:
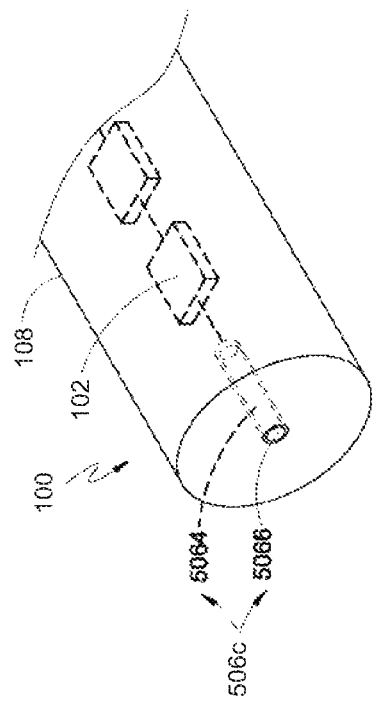
Figure 5C:
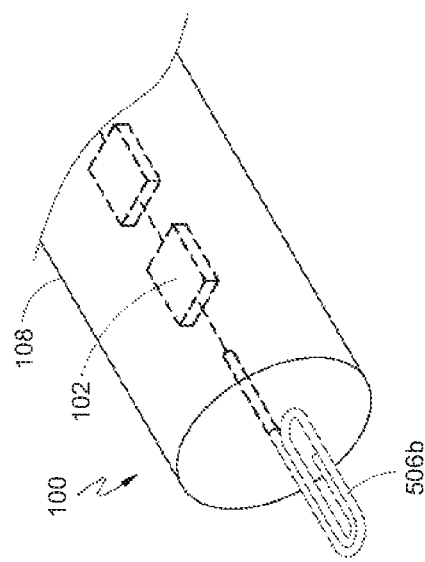

Going back to FIG. 1, the electrical connector 506, which is electrically connected to the linear array of LED devices 102, is configured to receive electrical power for energizing the linear array of LED devices 102. The number, shape and position of the electrical connectors 506 depends on intended purposes of an application. FIGS. 5A to 5C show a truncated LED filament 100 for highlighting the electrical conductor 506. For example, in FIG. 5A, the electrical connector 506 includes a metallic pin 506o electrically connected to the linear array of LED devices 102. A portion of the pin 506o is rooted in the enclosure 108 in electrical connection with the linear array of LED devices 102. The other portion of the pin 506o sticks out from the enclosure 108 for receiving electrical power. Alternatively, in FIG. 5B, the electrical connector 506 includes a metallic hook 506a. The shank 5062 of the hook 506a is rooted in the enclosure 108 in electrical connection with the linear array of LED devices 102. The throat 5060 of the hook 506a sticks out from the enclosure 108 for receiving electrical power. Alternatively, in FIG. 5C, the electrical connector 506 includes a metallic fastener 506b such as binder or clip for physically and electrically attaching to the power source. Alternatively, in FIG. 5D, the electrical connector 506 includes a metallic receptacle 506c. The well 5064 of the receptacle 506c is embedded in the enclosure 108 in electrical connection with the linear array of LED devices 504. The opening 5066 of the receptacle 506c is pluggable by the male element of a power source for receiving electrical power. In some embodiments, the electrical connector 506 includes an aperture as a female element for receiving a male element of the LED light bulb. In FIG. 1, the LED filament 100 includes exactly two electrical connectors 506. A first electrical connector 506f, which is attached to a first end of the enclosure 108, is positive. A second electrical connector 506s, which is attached to a second end of the enclosure 108, is negative. In FIG. 2, the enclosure 108 includes exactly two electrical connectors 506. A first electrical connector 506f is positive and a second electrical connectors 506 is negative. However, both electrical connectors 506 are attached to a same end of the enclosure 108. In FIG. 3, the enclosure 108 includes exactly three electrical connectors 506. A first electrical connector 506f, which is attached to a first end of the enclosure 108, is the common ground. A second electrical connector 506s, which is attached to a second end of the enclosure 108, is positive. A third electrical connector 506s, which is also attached to the second end of the enclosure 108, is positive. In some embodiments, the LED filament 100 is configured to maintain the desired posture by and only by physically attaching the electrical conductors 506 of the LED filament 100 to the lead wire of the LED light bulb (e.g. FIG. 44A). The LED filament 100 is like an arch bridge and the lead wire abutment. The LED filament 100 maintains its posture in the LED light bulb by pressing its compression forces against the lead wire.

Figure 5E:
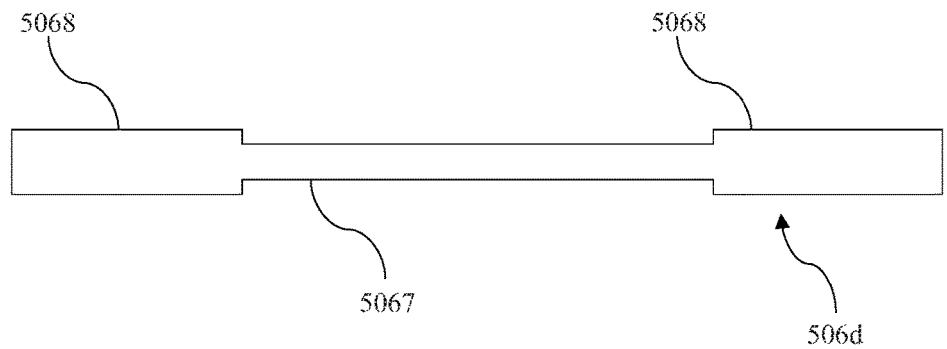
FIGS. 5E and 5F are top views of conductive electrodes of filaments in accordance with an embodiment of the present invention.

The design of shape of a conductive electrode (e.g., the electrical connector 506) may consider factors such as wire bonding and filament bending. For example, as show in FIG. 5E, the conductive electrode 506d comprises a connecting region 5068 and a transition region 5067. The connecting region 5068 is at an end of the conductive electrode 506*d* for being electrically connected with other components. In the embodiment, the conductive electrode 506*d* comprises two connecting regions 5068.

The transition region 5067 is between the two connecting regions 5068 for connecting the connecting regions 5068. A width of the connecting region 5068 is greater than that of the transition region 5067. Because the connecting region 5068 is utilized to form a joint point (or a welding point), it is required that the connecting region 5068 has sufficient width. For example, if a width of a filament is W, the width of the connecting region 5068 of the conductive electrode 506*d* may be between 1/4W to 1W. The number of the connecting region 5068 may be plural, and the width of the connecting regions 5068 may be not identical. Because the transition region 5067 between the connecting regions 5068 is not required to form any joint point, a width of the transition region 5067 may be less than that of the connecting region 5068. For example, if a width of a filament is W, the width of the transition region 5067 may be between 1/10W to 1/5W. The conductive electrode 506*d* is easier to be bended along with the bending of the filament due to the less width of the transition region 5067 of the conductive electrode 506*d*; therefore, the risk that a wire close to the conductive electrode may be easily broken by stress of bending is lower.

Figure 5F:
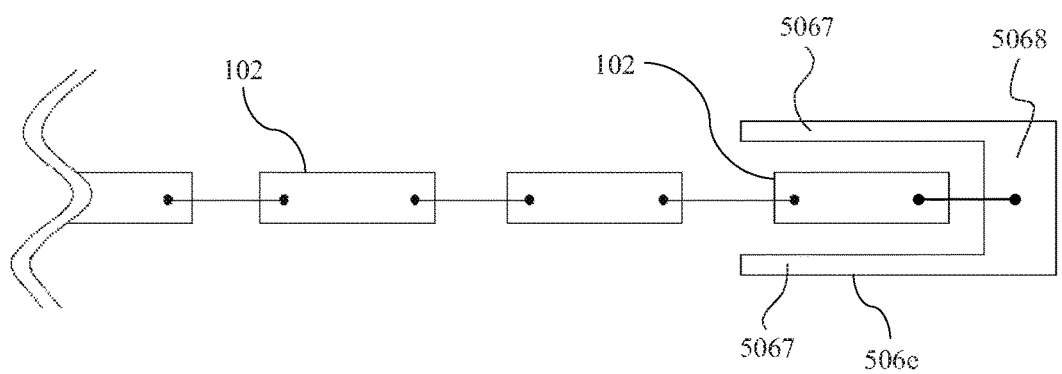

As shown in FIG. 5F, in an embodiment, an LED chip 102 located at an end of an array of plural LED chips 102 comprised in a filament is connected to the conductive electrode 506*e* via a wire. The conductive electrode 506*e* has a shape surrounding the LED chip 102 at the end by three sides in a top view. Three sides of the conductive electrode 506*e* surrounding the LED chip 102 comprise two transition regions 5067 and one connecting region 5068. A sum of widths of the two transition regions 5067 is less than a width of the connecting region 5068. A side of the LED chip 102 at the end not surrounded by the conductive electrode 506*e* is connected to another LED chip 102 via a wire. A wire between the LED chip 102 at the end and the conductive electrode 506*e* is shorter than those between the LED chips 102 not at the end. In such case, the risk that the wire may be broken by elastic buckling stress is lower.

Figure 6A:
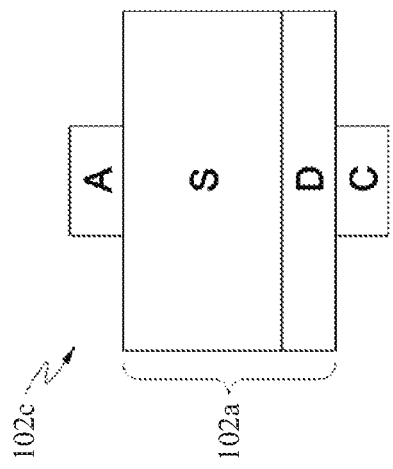
Figure 6B:
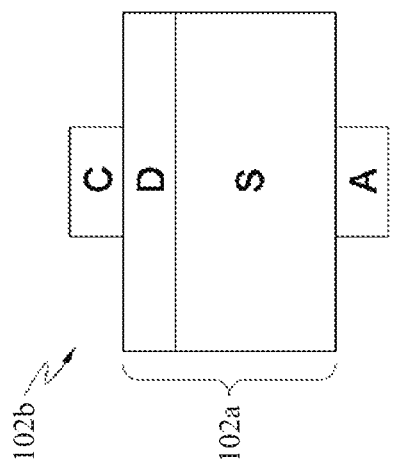
Figure 6D:
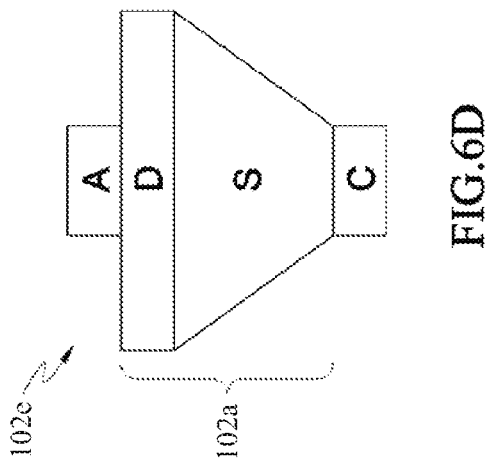
Figure 6C:
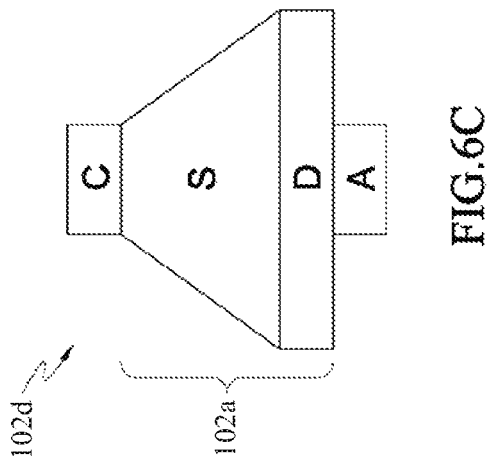

FIGS. 6A to 6E are diagrams of the LED device 102 configured to glow in the LED filament 100 in FIG. 1. The LED device 102 includes an LED die 102*a* that comprises a diode layer D and a substrate S. The diode layer D is configured to emit light upon energization, by applying a voltage between an anode contact A and a cathode contact C through the electrical connector 506 in FIG. 1. The diode layer D may comprise organic or inorganic materials. In inorganic devices, the substrate S is made of silicon carbide, sapphire or any other single element or compound semiconductor material. The diode layer D comprises silicon carbide, gallium nitride, gallium arsenide, zinc oxide or any other single element or compound semiconductor material, which may be the same as or different from the substrate S. The thickness of the substrate S is between about 100 μm and about 250 μm. Thinner and thicker substrates may be used or the substrate may not be used at all. The cathode C and anode A contacts are formed of metal or other conductors, and may be at least partially transparent, reflective or both. In FIG. 6A, light emission takes place directly from the diode layer D. Alternatively, in FIG. 6B, light emission takes place from diode layer D through the substrate S. In FIGS. 6C and 6D, the substrate S is shaped to enhance emission from sidewalls of the substrate S to provide other desirable effects. In FIG. 6E, the substrate itself may be thinned considerably or eliminated entirely, so that only a diode layer D is present. In FIGS. 6A-6E, the anode A and the cathode C are provided on opposite sides of the LED die 510. In FIG. 6F, the anode A and the cathode C are provided on the same side of the LED die 102*a*. In each of the above embodiments, the anode A and cathode C contacts may be of various configurations. Multiple contacts of a given type also may be provided. The linear array of LED devices 102 are electrically connected by electrically connecting the anode and cathode contacts of each of the LED devices 102 in proper sequence. In some embodiments, the anode and cathode contacts are totally absent from the LED device 102, which includes a p-junction and an n-junction. The linear array of LED devices 102 are electrically connected by electrically connecting the p-junction and the n-junction of each of the LED device 102 in proper sequence. FIG. 6G is a generalization of FIGS. 6A-6F. The LED device 102 comprises a LED die 102*a* that includes a diode layer D of FIGS. 6A-6F and may also include a substrate S of FIGS. 6A-6D. The LED device 102 is configured to emit light upon energization through one or more electrical contacts, which may include the anode A and the cathode C of FIGS. 6A-6F. The LED device 102 can emit light of different colors and can also emit radiation outside the visible spectrum such as infrared or ultraviolet. The color of the emitted light is determined by the material properties of the semiconductor used in the LED die 102*a*. The LED die 102*a* can be made from many different materials, e.g. gallium nitride (GaN). Referring to FIG. 6H, in an embodiment, the LED die 102*a* includes a texturized surface. Roughening the surface of the LED die 102*a* increases light extraction of the nitride-based LED device. Texturization is obtainable by using plasma etching directly on the top epilayer. However, the etching process destroys a large portion of the junction, reducing the amount of area in which the light is supposed to be generated. To avoid damaging the thin p-GaN layer, an indiumtin-oxide layer (ITO) can be used as the roughened layer. After completing the traditional planar GaN LED device, the surface of the LED die is texturized using natural lithography, in which the randomly deposited polystyrene spheres (PSs) were distributed as a natural mask for dry etching. After the surface-texturing process, the output power of the GaN LED device is significantly increased as compared to that of the conventional LED devices.

Going back to FIG. 6G, most of the electricity in an LED device 102*a* becomes heat rather than light (about 70% heat and 30% light). Thus, it is necessary to limit the junction temperature to a value that guarantees a desired lifetime. In some embodiments, the LED device 102 comprises a high-power LED die 102*a* capable of being loaded at a high voltage but at a lower current. Other things equal, the LED device 102 maintains an acceptable luminary output without comprising thermal performance.

Staying on FIG. 6G, in some embodiments, the linear array of LED devices 102 includes a plurality of LED devices 102 in which an individual LED die 102*a* has an elongated top view approximating a hypothetical rectangle having a longitudinal axis substantially parallel to the longitudinal axis of the linear array of LED devices 102. Other things equal, the greater the aspect ratio of the hypothetical rectangle, the less likely light gets blocked by opaque components in an LED filament such as the electrical contacts 512 and wirings for connecting the electrical contacts 512. Preferably, the aspect ratio is from 2:1 to 10:1. Examples are 15×8, 28×14, 30×10, and 20×10.

The LED filament is configured to emit white light in a variety of ways. Although illustrated as having exactly one LED die 102a in FIGS. 6A-6H, the LED device 102 may be provided to have a plurality of LED dies 102a as well, each of which may be configured to emit the same or different colors of light, mounted on a common substrate S. The multi-die device may be grouped on the substrate S in clusters or other arrangements such that the linear array of LED devices 102 outputs a desired pattern of light. In some embodiments, the multi-die LED devices 102 is configured to provide white light based on the combination of the colors of light emitted by each of its component LED dies 102a. For example, a multi-die LED device 102 is configured to emit light having a spectral distribution including at least four different color peaks (i.e., having local peak wavelengths in wavelength ranges corresponding to at least four different colors of light) to provide the white light. Alternatively, to produce white light, a plurality of LED devices 102 emitting light of different colors may be used. The light emitted by the plurality of LED device 102 is combined to produce white light of a desired intensity, color or both. For example, when red-, green- and blue-emitting LED devices 102 are energized simultaneously, the resulting combined light appears white, or nearly white, depending on the relative intensities of the component red, green and blue sources. Alternatively, the light from a single-color LED device 102 may be converted into white light by surrounding the LED device 102 with a wavelength conversion material, such as phosphor particles. The term "phosphor" may be used herein to refer to any materials that absorb light at one wavelength and re-emit light at a different wavelength, regardless of the delay between absorption and re-emission and regardless of the wavelengths involved. Accordingly, the term "phosphor" is used herein to refer to materials that are sometimes called fluorescent or phosphorescent. In general, phosphors absorb light having shorter wavelengths and re-emit light having longer wavelengths. As such, some or all of the light emitted by the LED device 102 at a first wavelength may be absorbed by the phosphor particles, which may responsively emit light at a second wavelength. For example, a single blue emitting LED device 102 may be surrounded with a yellow phosphor, such as cerium-doped yttrium aluminum garnet (YAG). The resulting light, which is a combination of blue light and yellow light, may appear white to an observer. In an embodiment, the LED die 102a emits blue light. The white light many applications require may be achieved by converting a portion of the blue light into yellow light. When emitted, the combination of blue and yellow light appears white.

Going back to FIG. 1, the linear array of LED devices is electrically connected to emit light upon energization by applying a voltage through the electrical connectors 506. Electrical connections between the LED devices and the electrical connector can be made in a variety of ways depending on the advantages an LED filament is expected to pursue. Examples include wire bonding, conductive glue, flexible printed circuit (FPC) film and any combination of the above. In FIG. 7A, interconnections between the LED devices 102 are made by wire bonding. Wire bonding is a method known in the art for making interconnections between electronic components. The bonding wire 504a is made of copper, gold or any suitable alloy. In some embodiments, the bonding wire 504a includes a spring between the LED devices 102 it connects. When the linear array of LED devices 102 is stretched or compressed in the LED filament, the bonding wire 504a, when shaped like a spring, absorbs the mechanical energy that could otherwise open the circuit or damage the structure of the linear array of LED devices 102. Generally, the greater the sinuosity of the bond wire 504a, the more mechanical energy the bond wire 504a is capable of storing. The sinuosity is the ratio of the curvilinear length along the bond wire 504a and the Euclidean distance between the end points of the bond wire 504a. Preferably, the sinuosity is from 2 to 8. Most preferably, the sinuosity is from 3 to 6. In FIGS. 7B and 7C, the bonding wire 504b/504c includes a bow-shaped spring between the LED devices 102 it connects. In FIG. 7D, the bonding wire 504d includes a helical spring between the LED devices 102 it connects.

Figure 8A:
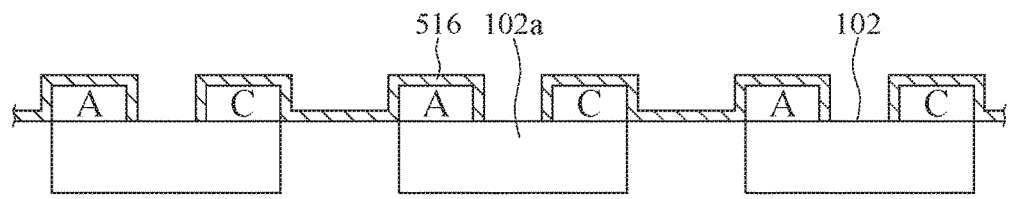
FIGS. 8A to 8F are schematic views of the linear array of LED devices in accordance with an embodiment of the present invention.
Figure 8B:
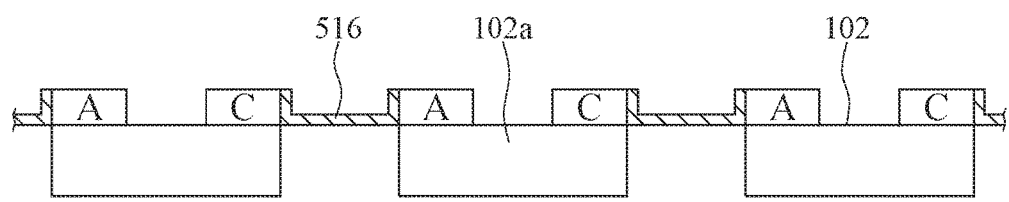
Figure 8C:
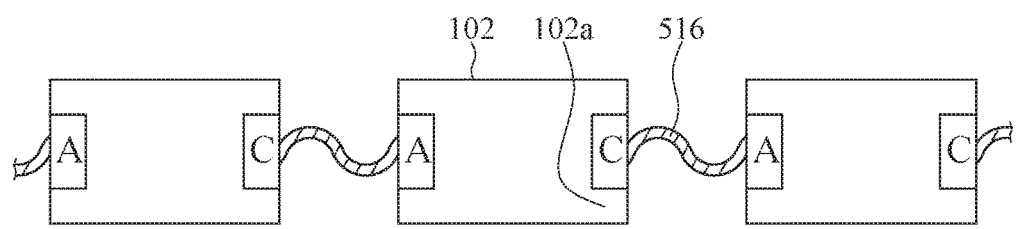
Figure 8D:
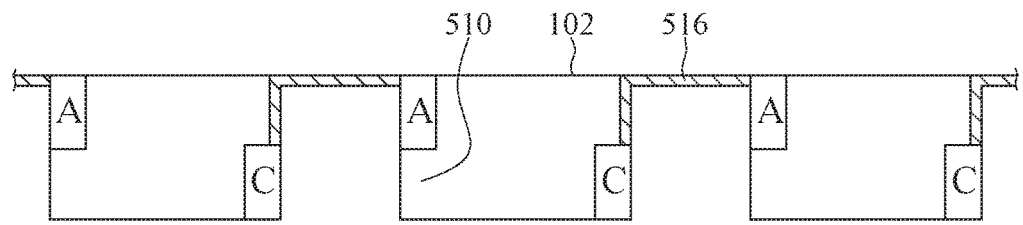
Figure 8E:
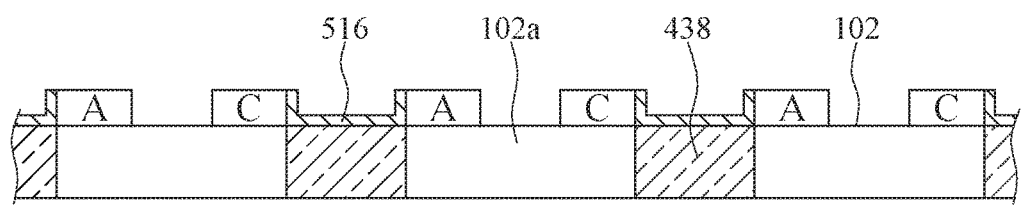
Figure 8F:
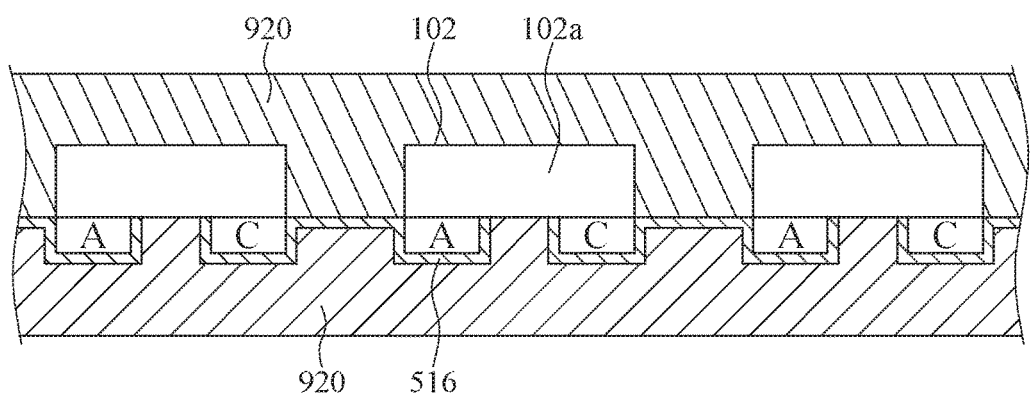

Staying on FIGS. 7A-7D, when the enclosure is formed directly on the linear array of LED devices 102 by dispensing a liquid binder such as polymer coating on the LED device 102, a variety of incidents may negatively impact the quality of the LED filament produced through wire bonding. During wire bonding, the bonding wire is attached at both ends to the ohmic contacts of the LED device 102 using a combination of downward pressure, ultrasonic energy, and in some cases heat, to make a weld. The LED device 102 could be inadvertently shattered or burned during wire bonding. Moreover, ohmic contacts of the LED device 102, if having a tarnished or uneven surface, will comprise bond strength and subject the LED filament to potential failure. Furthermore, the bonding could be dislocated when the liquid polymer is being dispensed on the bonding wire attaching, otherwise properly or improperly, to the adjacent LED devices 102. To mitigate such problems, in some embodiments, interconnections between the LED devices 102 are made with glue wires made from electrically conductive glue continuously applied between the anode and cathode contacts of adjacent LED devices 102. Electrically conductive glue is formed by doping electrically conductive particles in an elastic binder. The electrically conductive particle can be gold or silver. Preferably, the electrically conductive particle is made from optically transmissive materials such as nano-silver, nano-carbon tubes and graphene. In some embodiments, wavelength conversion particles are blended in the electrically conductive glue for enhanced light conversion. The elastic binder can be silicone, epoxy or polyimide. Preferably, the elastic binder for the electrically conductive glue is the same material from which the enclosure is made. The glue wire is thus seamlessly integrated into the enclosure and is made capable of stretching or compressing in perfect sync with the enclosure. The glue wire can be fabricated with the aid of glue dispenser capable of 3-D maneuvers. FIGS. 8A and 8B are side views of the linear array of the LED devices 102 where, for example, the anode A and cathode C contacts are provided on the same side of the LED die 102a. In FIG. 8A, the glue wire 516 connecting the adjacent LED devices 504 covers substantially the entire surface of the anode A and cathode C contacts. In FIG. 8B, the glue wire 516 connecting the adjacent LED devices 102 partially covers the anode A and cathode C contacts. FIGS. 8C and 8D are top views of the linear array of LED devices 102 where the anode A and cathode C contacts are provided on the same side of the LED die 102a. In FIGS. 8A and 8B, the glue wire 516 follows a straight line to connect the adjacent LED devices 504. In some embodiments, the glue wire 516 includes a curve of any kind depending for absorbing potentially destructive mechanical energy. Preferably, the sinuosity of the curve us from 3 to 8. Most preferably, the sinuosity of the curve is from 2 to 6. In FIG. 8C, the glue wire 516 is drawn to define an S-shaped curve between the LED devices 102 it connects in anticipation of deformation resulting from the LED filament being stretched or compressed. In FIG. 8D, when the anode A and cathode C contacts are not exactly aligned along the longitudinal axis of the linear array of the LED devices 102, the glue wire 516 makes a turn—for example—at the corner of the LED device 102 to complete the electrical connection for the adjacent LED devices 102. In FIG. 8E, the linear array of LED devices 504 includes a plurality of platforms 438 to fill the gap between the adjacent LED devices 102. Preferably, the platform 438 is made from the same material from which the enclosure is made. The upper surface of the platform 438 provides a continuous path for the glue wire 516 to run from the anode A contact of the LED devices 102 to the cathode C contact of the adjacent LED device 102. In FIG. 8F, alternatively, a mold 920 is made to follow the contour of the anode A and cathode C contacts of the linear array of LED devices 102. The mold 920, when properly deployed, defines a gap between the mold 920 and the linear array of LED devices 102. The glue wire 516 is formed by filling the gap with electrically conductive glue. In some embodiments, the anode A and cathode C contacts—potentially blocking light where they are disposed over the diode region—are eliminated from the LED die 102*a*. The glue wire 516 is thus configured to connect the p-junction of an LED device 102 and the n-junction of an adjacent LED device 102.

In yet another embodiment, interconnections between the LED devices is made with a strip of flexible printed circuit (FPC) film 432. FIG. 9A is a top view of the FPC film 432 prior to connecting with the linear array of LED devices and the electrical connector. FIG. 9B is a top view of the FPC film 432 after connecting with the linear array of LED devices 504 and the electrical connectors 506. The strip of FPC film 432 includes a plurality of conductive tracks 524 laminated onto a strip of thin and nonconductive substrate 430. The strip of FPC film 432 mechanically supports the linear array of LED devices 504 with the strip of nonconductive substrate 430. The conductive track 524 electrically connects the linear array of LED devices 504 by connecting the anode A contact of the LED device 102 to the cathode contact C of the adjacent LED device 102. The nonconductive substrate 430 is an optically transmissive film, preferably having transmittance of 92% or more. For example, the nonconductive substrate 430 is a thin film made from Polyimide. The conductive track 524 can be made from electrical conductors such as indium tin oxide (ITO), silver nanoparticles or carbon nanotubes (CNTs). In an embodiment, the conductive track 524 is made from silver nanoparticles doped with gold for reliable connection with the ohmic contact of the LED device 504. The conductive track 524 can come in many patterns. For example, in FIG. 9A the conductive track 524 defines a set of slanted parallel lines. In FIG. 9B, the conductive track 524 defines a slanted grid. Preferably, the conductive track 524 has a thickness of from 1 nm to 1 mm. Preferably, the line in the set of the parallel lines and the grid has a width of from 1 µm to 1 cm. Some light is blocked by the conductive track 524 even when the conductive track 524 is made from transparent materials such as ITO. In some embodiments, the plurality of conductive tracks 524 cover less than 100% of the nonconductive substrate 430 to maximize the light traveling both ways through the nonconductive substrate 430. Preferably, the ratio of the total area covered by the plurality of conductive tracks 524 to the area of the FPC film 432 is from 0.1% to 20%. The strip of FPC film 432 is suitable for the LED filament designed to be bendable. When the conductive track 524 is properly patterned, e.g. a set of slanted parallel lines, a reliable electrical connection for the linear array of LED devices 102 is assured because a broken line would not break the connection.

According to an embodiment of the present invention, the method of making the LED filament includes the following steps:

S20: Arrange a linear array of LED devices 102 spaced apart from one another and an electrical connector 506 on a mount surface;

S22: Electrically and physically connect the linear array of LED devices 102 and the electrical connector 506; and S24: Dispose the linear array of LED devices 102 in an enclosure.

Figure 10C:
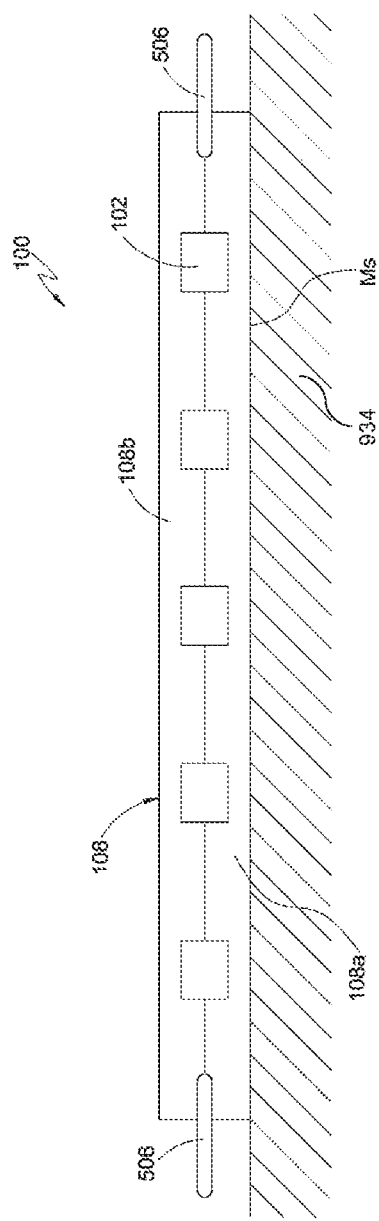

S20 and S22 have been performed in FIG. 10A. S24 is being performed in FIG. 10B. In FIG. 10C, S20, S22 and S24 have all been performed. The mount surface Ms is any surface capable of supporting the linear array of LED devices 102 and the electrical connectors 506 throughout the steps of the method. Usually, the mount surface Ms is a substantially planar surface. In some embodiments, the mount surface Ms is a three dimensional surface whose shape depends on a desired totality of considerations such as: the posture the LED filament is expected to maintain in the LED light bulb; the posture each individual LED device 102 is expected to maintain in relation to the rest of the linear array of LED devices 102; the shape of the enclosure 108; the texture of the outer surface of the enclosure 108; and the position of the linear array of LED devices 504 in the enclosure 108. Each one of the linear array of LED devices 102 is properly aligned with the adjacent LED device 102 on the mount surface Ms depending on the location of the anode and cathode contacts on the LED device 504 and depending on the type of electrical connection to be made for the linear array of LED devices 102 in S22. In S22, the electrical connection is made with bond wire, conductive glue, FPC film or a combination of the above. The linear array of LED devices 102 is electrically connected in parallel, in series or in a combination of both ways.

In some embodiments where a cluster of LED filaments is assembled on a large mount surface, the method of making an LED filament further includes the following step:

S26: Depanel the cluster of LED filaments.

In S26, an LED filament depaneled from the cluster may include a linear array of LED devices or a plurality of linear arrays of LED devices depending on the application.

Staying on FIGS. 10A, 10B and 10C, in an embodiment, the enclosure 108 is made from a cured transparent binder such as a cured transparent polymer. The enclosure 108 includes a first portion 108*a*, which is made first; and a second portion 108*b*, which is made later. The first portion 108*a* of the enclosure 108 is or is not structurally or otherwise distinguishable from the second portion 108*b* of enclosure 108. The mount surface Ms in S20 is provided by a panel 934 separable from the linear array of LED devices 102. The panel is made of suitable solid materials such as glass or metal. In some embodiments, the panel further includes a side wall for containing and sometimes shaping the enclosure 108 on the panel especially when, for example, a pre-curing liquid polymer is involved during manufacturing. In an embodiment, S24 includes the following steps:

S240: Dispense a first strip of transparent polymer over the linear array of LED devices;

S242: Reverse the linear array of LED devices on the panel; and

S244: Dispense a second strip of transparent polymer over the linear array of LED devices.

Staying on FIGS. 10A, 10B and 10C, in S240, the first strip of liquid polymer is dispensed over the linear array of LED devices 102 to form the first portion 108a of the enclosure 108. Surface tension, which at the size of an LED device 102 is large in relation to gravitational forces, in combination with viscosity allows the strip of liquid polymer to conformally cover all corners of the linear array of LED devices 102, including the gaps between the LED devices 102. It is desirable to do a fast cure, such as a UV cure, because the normal drop in viscosity during a thermal cure would cause most liquid polymers to flow away from the linear array of LED devices 102. In S242, the linear array of LED devices 102, which is now at least partially enclosed by the first portion 108a of the enclosure, is flipped over on the panel and remains unharmed without additional care when the linear array of LED devices 102 was not adhesively attached to the panel 934 in S20. In some embodiments, the linear array of LED devices 102 was adhesively attached on the mount surface Ms of the panel 934 with adhesive materials such as photoresist for semiconductor fabrication and die bond glue. The linear array of LED devices 102 can be separated from the panel 934 after dissolving the adhesive material with proper solvents such as acetone. Residuals of adhesive material remaining on the linear array of LED devices 102 are flushed away before moving to S244. In S244, like in S240, the second strip of liquid polymer is dispensed over the linear array of LED devices 102, which has been enclosed, at least partially, by the first portion 108a of the enclosure 108. The second strip of liquid polymer is then cured and forms the second portion 108b of enclosure 108. We now have an LED filament 100 comprising the linear array of LED devices 102 disposed in the enclosure 108 operable to emit light when energized through the electrical connector 506.

In another embodiment, the enclosure is made from, for example, cured transparent polymer. However, the mount surface in S20 for the linear array of LED device and the electrical connector is provided by a strip of cured transparent polymer that will form the first portion of the enclosure. S20 includes the following steps:

S200: Dispense a first strip of transparent polymer on a panel; and

S202: Arrange a linear array of LED devices spaced apart from one another and an electrical connector on the first strip of transparent polymer.

In the embodiment, S24 includes the following step:

S244: Dispense a second strip of transparent polymer over the linear array of LED devices.

Figure 11C:
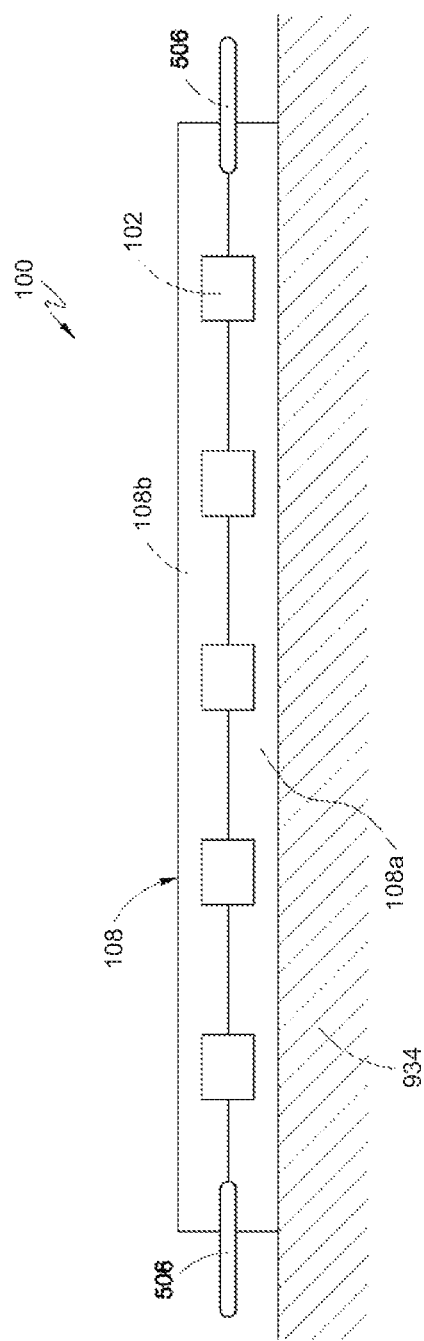

S200 has been performed in FIG. 11A. S202 has been performed in FIG. 11B. S244 has been performed in FIG. 11C. In S200, the first strip of liquid polymer is dispensed on a panel 934. The first strip of liquid polymer is then cured on the panel to form the first portion 108a of the enclosure 108. The mount surface Ms in S20 is provided by the first strip 108a of cured polymer separable from the panel 934. The first portion 108a of the enclosure 108 provides a surface capable of supporting the linear array of LED devices 102 and the electrical connectors 506 throughout the steps of the method. The first strip of liquid polymer is then cured on the panel to form the first portion 108a of the enclosure 108. The mount surface Ms in S20 is provided by the first strip of cured polymer separable from the panel 934. The panel 934 is made of suitable solid materials such as glass or metal. In other embodiments, the panel 934 further includes a side wall for containing and sometimes shaping the enclosure 108 on the panel 934 especially when, for example, pre-curing liquid polymer is involved during manufacturing. In S202, to strengthen the combination when the linear array of LED devices 102 and the electrical connector 506 are disposed on the first portion 108a of the enclosure 108, optionally, an upper surface of the first portion 108a of the enclosure 108 is melted. The linear array of LED devices 102 and the electrical connector 506 are then at least partially immersed into the first portion 108a of the enclosure 108 before the upper surface cools down. In S244, like in S200, the second strip of liquid polymer is dispensed over the linear array of LED devices 102, which has been disposed on or at least partially enclosed by the first portion 108a of the enclosure 108. The second strip of liquid polymer is then cured and forms the second portion 108b of enclosure 108. The linear array of LED devices 504, which is now enclosed by the unitary structure of the first portion 108a of the enclosure 108 and the second portion 108b of the enclosure 108, can be taken away from the panel 934 and remains unharmed without additional care when the first portion 108a of the enclosure 108 was not adhesively attached to the panel 934. In some embodiments, the first portion 108a of enclosure 108 was adhesively attached to the panel 934 with adhesive materials such as photoresist for semiconductor fabrication and die bond glue. The first portion 108a of enclosure 108 can be separated from the panel 934 after dissolving the adhesive material with proper solvents such as acetone. Residuals of adhesive material remaining on first portion 108a of the enclosure 108 are flushed away. We now have an LED filament 100 comprising the linear array of LED devices 504 disposed in the enclosure 108 operable to emit light when energized through the electrical connector 506.

In some embodiments, the first portion of the tubular in S200 is configured to be capable of withstanding potential destructions resulting from manufacturing procedures such as wire bonding. In some embodiments, the first portion of the tubular includes a hardener. For example, the hardener includes a pre-determined concentration of particles harder than the liquid polymer in which the particles are embedded. Light conversion particles such as phosphor participles are harder than the binder materials such as silicone and resin. Thus, the first portion of the tubular can be made harder by increasing the concentration of the light conversion particles in the transparent binder. In an embodiment, the first portion of enclosure is configured to have a Shore hardness of from D20 to D70 when the ratio of the volume of the light conversion particles in the first portion of the enclosure to the volume of the transparent binder in the first portion of the enclosure is from 20% to 80%. Alternatively, the ratio of the weight of the light conversion particles in the first portion of the enclosure to the weight of the transparent binder in the first portion of the enclosure is from 20:80 to 99:1. In other embodiments, the first portion of the enclosure is thickened such that the thickness enables the first portion of the enclosure to withstand potential destructions resulting from manufacturing procedures such as wire bonding. Preferably, the thickness of the first portion of the enclosure is from 0.01 to 2 mm. Most preferably, the thickness of the first portion of the enclosure is from 0.1 to 0.5 mm.

In yet another embodiment, the enclosure is made from, for example, cured transparent polymer. However, the mount surface in S20 for the linear array of LED device and the electrical connector is provided by a strip of cured transparent polymer that will form a first portion of the enclosure. S20 includes the following steps:

S210: Dispense a first strip of transparent polymer on a panel;

S212: Dispose a strip of FPC film on the first strip of transparent polymer; and S214: Arrange a linear array of LED devices spaced apart from one another and an electrical connector on the strip of FPC film.

In the embodiment, S24 includes the following step:

S244: Dispense a second strip of transparent polymer over the linear array of LED devices.

Figure 12D:
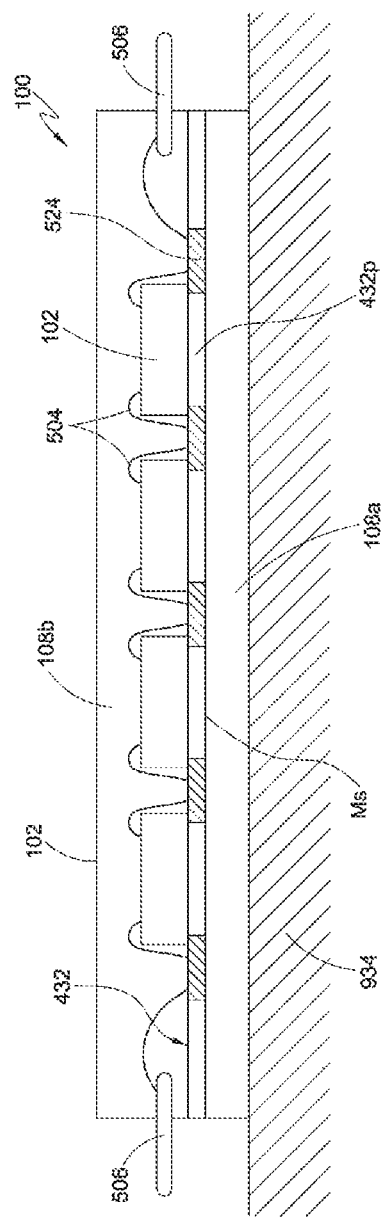

S210 has been performed in FIG. 12A. S212 has been performed in FIG. 12B. S214 has been performed in FIG. 12C. S244 has been performed in FIG. 12D. In S210, the first strip of liquid polymer is dispensed on a panel 934. The panel 934 is made of suitable solid materials such as glass or metal. In other embodiments, the panel 934 further includes a side wall for containing and sometimes shaping the enclosure 108 on the panel 934 especially when, for example, pre-curing liquid polymer is involved during manufacturing. The first strip of liquid polymer is then cured on the panel 934 to form the first portion 108a of the enclosure 108. The mount surface Ms in S20 is provided by the first strip of cured polymer separable from the panel 934. The first portion 108a of the enclosure provides a surface capable of supporting the linear array of LED devices 504 and the electrical connector 506 throughout the steps of the method. In S212, to strengthen the combination when the strip of FPC film 432 is disposed on the first portion 108a of the enclosure 108, optionally, an upper surface of the first portion 108a of the enclosure is melted. The strip of FPC film 432 is then at least partially immersed into the first portion 108a of the enclosure 108 before the upper surface cools down. In some embodiments, the strip of PFC film 432 includes a linear array of apertures 432p punched by, for example, a stamping press. Optionally, the aperture 432p is dimensionally smaller than the LED device 504. In these embodiments, each of the linear array of LED devices 102 straddles exactly one of the linear array of the apertures 432p. Thus, light coming from the linear array of LED devices 102 will not be blocked by the strip of FPC film 432. In S22, a combination of wire bonding and FPC film 432 is employed to electrically and connect the linear array of LED devices 102. The bonding wire 514 is attached to a conductive track 524 of the strip of FPC film 432 on a first end and attached to an ohmic contact of the LED device 504 on a second end. In S244, like in S210, the second strip of liquid polymer is dispensed over the linear array of LED devices 102, which has been disposed on or at least partially enclosed by the first portion 108a of the enclosure 108. The second strip of liquid polymer is then cured and forms the second portion 108b of enclosure 108. The linear array of LED devices 102, which is now enclosed by the unitary structure of the first portion 108a of the enclosure 108 and the second portion 108b of the enclosure 108, can be taken away from the panel 934 and remains unharmed without additional care when the first portion 108a of the enclosure 108 was not adhesively attached to the panel 934. In some embodiments, the first portion 108a of enclosure 108 is adhesively attached to the panel 934 with adhesive materials such as photoresist for semiconductor fabrication and die bond glue. The first portion 108a of enclosure 108 can be separated from the panel after dissolving the adhesive material with proper solvents such as acetone. Residuals of adhesive material remaining on first portion 108a of the enclosure 108 are flushed away. We now have an LED filament 500 comprising the linear array of LED devices 102 disposed in the enclosure 108 operable to emit light when energized through the electrical connector 506.

In an embodiment, the enclosure is a monolithic structure. In some embodiments, the monolithic structure shares a uniform set of chemical and physical properties throughout the entire structure. Being structurally indivisible, the monolithic structure need not be a uniform structure. In other embodiments, the monolithic structure includes a first portion and a second portion having a different property from the first portion. In another embodiment, the enclosure includes a set of otherwise divisible layers or modules interconnected to form a unitary structure of the enclosure. In FIGS. 14 to 19, the enclosure includes a set of interconnected layers configured to form a unitary structure of the enclosure. In FIGS. 20 to 23C, the enclosure includes a set of interconnected modules configured to form a unitary structure of enclosure.

Figure 24:
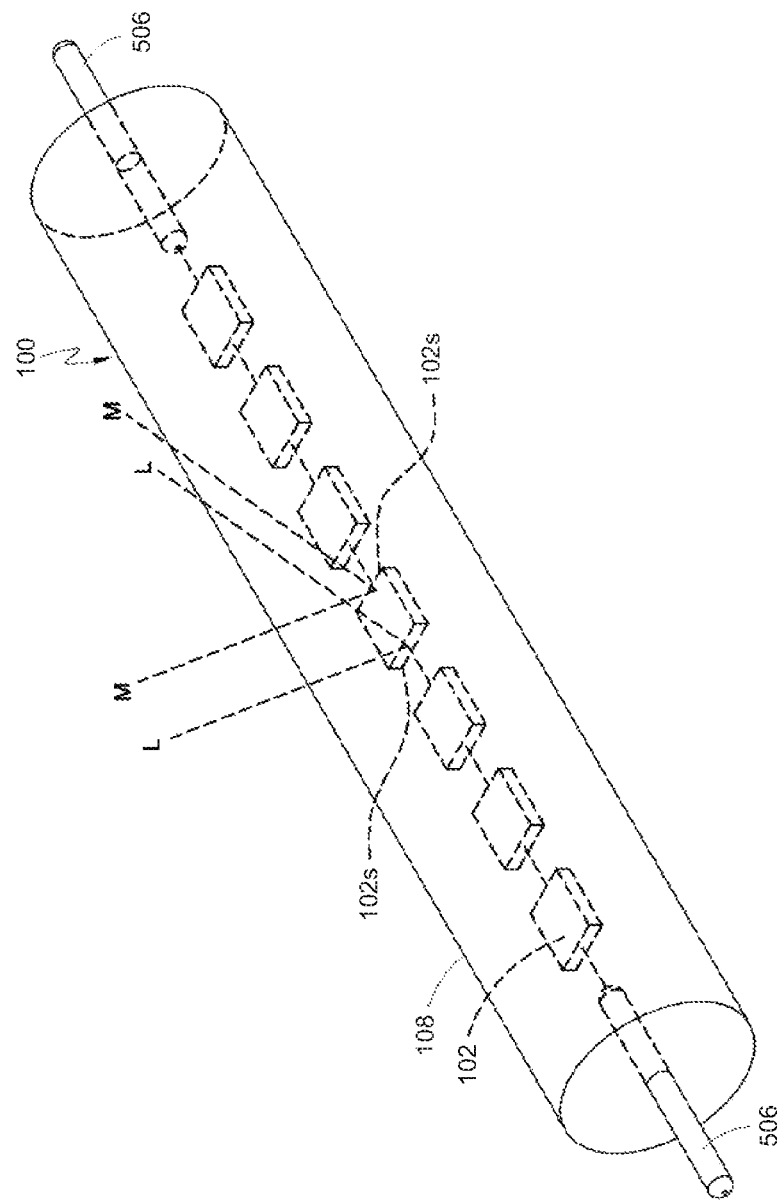
FIG. 24 is a see-through view of the LED filament in accordance with an embodiment of the present invention.
Figure 25A:
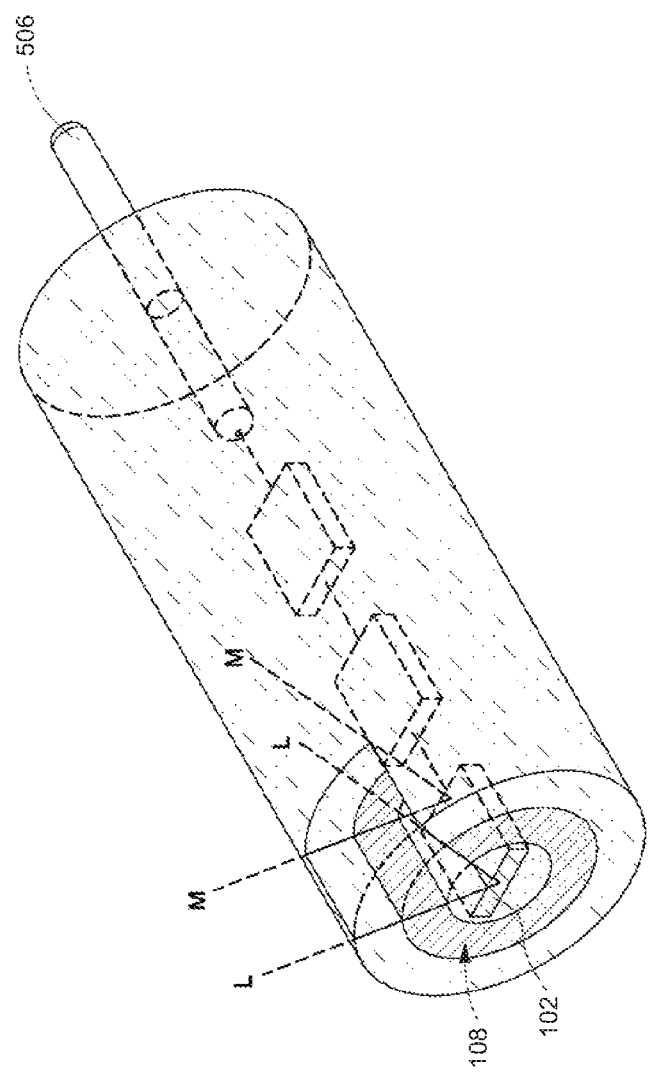
FIGS. 25A and 25B are cutaway views of the LED filament in accordance with an embodiment of the present invention.
Figure 25B:
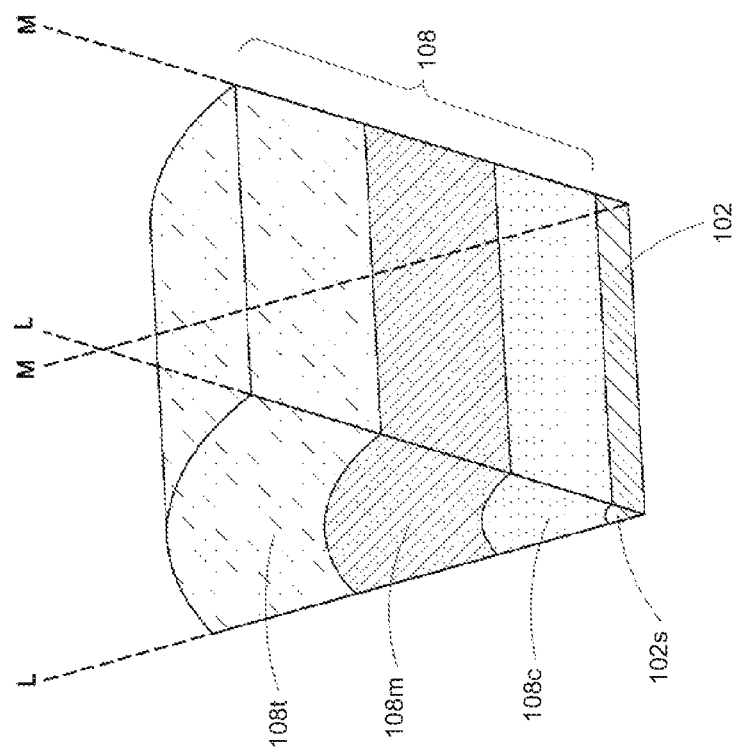

Shifting to FIG. 24, the line L-L cuts the LED filament 100 in FIG. 24 radially exactly along a lateral surface 102s of the LED device 102. Likewise, the line M-M cuts the LED filament 100 radially exactly along the other lateral surface 102s of the LED device 102. FIG. 25A is a perspective view showing the cross section of the LED filament 100 cut by the line L-L. Carved out along the cross section in FIG. 25A, FIG. 25B shows a cutaway of the LED filament defined by the line L-L and the line M-M. The enclosure is a tubular structure having exactly one layer or a plurality of distinct layers. In the embodiment in FIG. 26, the enclosure 108 has exactly one layer over the LED device 102. In the embodiment in FIG. 25B, the enclosure 108 is a multi-layered structure over the LED device 102. Each layer of the enclosure 108 is configured to add a distinctive function to the LED filament 100. For example, the enclosure 108 in FIG. 25A includes three layers 108c, 108m, 108t.

Figure 26:
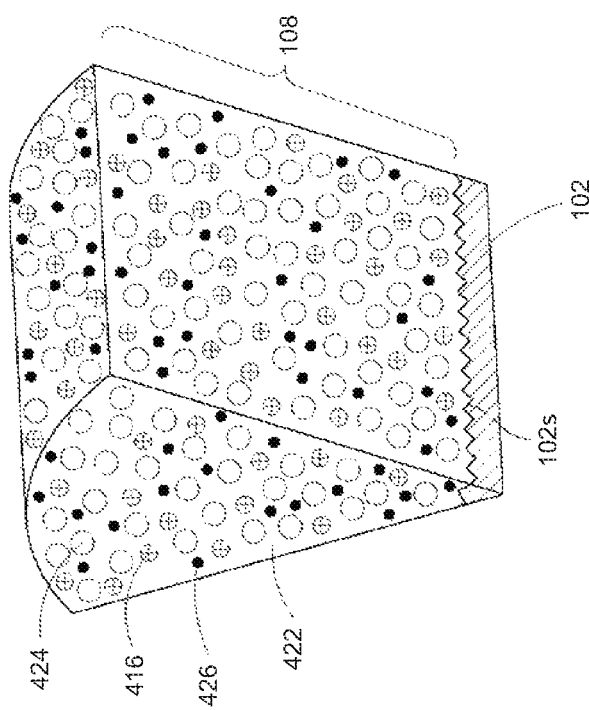
FIG. 26 is a cutaway view of the LED filament in accordance with an embodiment of the present invention.

FIG. 26 shows a cutaway of the LED filament in FIG. 24 in which the enclosure 108 has exactly one unitary layer over the LED device 102. In an embodiment, the LED device 102 has a textured light emission surface 102s to increase light extraction from the diode layer by reducing total internal reflection. The light emission surface 102s includes the surface of the diode layer D, the surface of the substrate S or both. The light emission surface 102s is treated with subtractive processes such as etching, cutting and grinding wherein material is removed from the light emission surface 102s to create the desired texture.

In an embodiment, the enclosure includes a wavelength conversion layer, such as a phosphor film layer or a phosphor glue layer. The wavelength conversion layer includes a transparent binder 422 in which a plurality of light conversion particles 424, such as phosphor particles, are embedded. The phosphor particles may be formed from any suitable phosphor capable of converting light of one wavelength into another wavelength. Cerium(III)-doped YAG is often used for absorbing the light from the blue LED device 106 and emits in a broad range from greenish to reddish, with most of output in yellow. This yellow emission combined with the remaining blue emission gives the white light, which can be adjusted to color temperature as warm (yellowish) or cold (blueish) white. The pale yellow emission of the Ce3+:YAG can be tuned by substituting the cerium with other rare earth elements such as terbium and gadolinium and can even be further adjusted by substituting some or all of the aluminium in the YAG with gallium. Alternatively, some rare-earth doped Sialons are photoluminescent and can serve as phosphors. Europium(II)-doped β-SiAlON absorbs in ultraviolet and visible light spectrum and emits intense broadband visible emission. Its luminance and color does not change significantly with temperature, due to the temperature-stable crystal structure. Thus, it is suitable for using as green down-conversion phosphor for white-light LED filaments; a yellow variant is also available. To generate white light, a blue LED device is used with a yellow phosphor, or with a green and yellow SiAlON phosphor and a red CaAlSiN3-based (CASN) phosphor. In an embodiment, the wavelength conversion layer is configured to convert light emitting from the LED device into light having a color temperature from 2400 to 2600 K by, for example, embedding in the transparent binder an appropriate combination of yellow-and-green phosphor and red phosphor.

The amount of light absorbed and re-emitted by the light conversion particles is generally proportional to the amount of light conversion particles that the light passes through before egressing the LED filament. However, if the light passes through too much light conversion particles, part of the re-emitted light can be blocked from emitting from the LED filament, by the excess light conversion particles. This reduces the overall light emitting efficiency of the LED filament. The amount of light conversion particles that the LED light passes through can be varied by varying the concentration of light conversion particles, the thickness of the wavelength conversion layer, or both. In an embodiment, light from the linear array of LED devices passes through a sufficient amount of light conversion particles so that substantially all of the light is absorbed and re-emitted at a different wavelength of light. At the same time, the re-emitted light does not pass through an excess light conversion material so that the re-emitted light is not blocked from emitting from LED filament. By providing a sufficient amount of light conversion particles to provide full conversion without blocking, the light conversion particles are in state of optimal conversion. The amount of light conversion particles for optimal conversion depends on the size and luminous flux of the LED filament. The greater the size and luminous flux, the greater the amount of light conversion particles needed. Under optimal conversion, the light emitted from the LED filament is composed primarily of photons produced by the light conversion particles. Preferably, the ratio of the volume of the light conversion particles in the wavelength conversion layer to the volume of the transparent binder in the wavelength conversion layer is from 20:80 to 99:1. Preferably, the ratio of the weight of the light conversion particles in the wavelength conversion layer to the weight of the transparent binder in the wavelength conversion layer is from 20% to 50%. In some embodiments, however, it may be desirable to allow a small portion of the light to be transmitted through the light conversion particles without absorption for purposes of modifying the chromaticity of the resulting radiation of the LED filament. For example, the LED filament emits less than 10% of the emission power of primary radiation in the absence of the light conversion material particles. In other words, the conversion particles absorb 90% or more of the light from the linear array of LED devices.

Figure 30A:
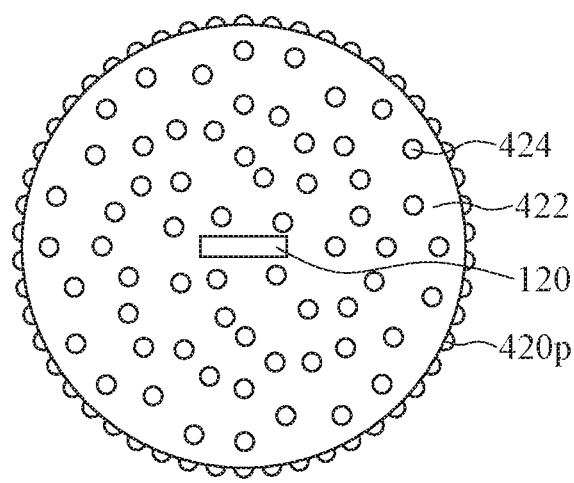
FIGS. 30A to 30C are cross sectional views of the LED filament in accordance with an embodiment of the present invention.
Figure 30B:
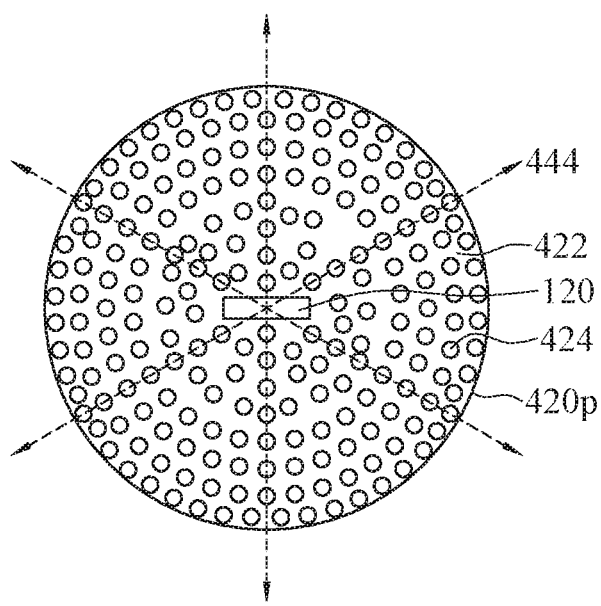
Figure 30C:
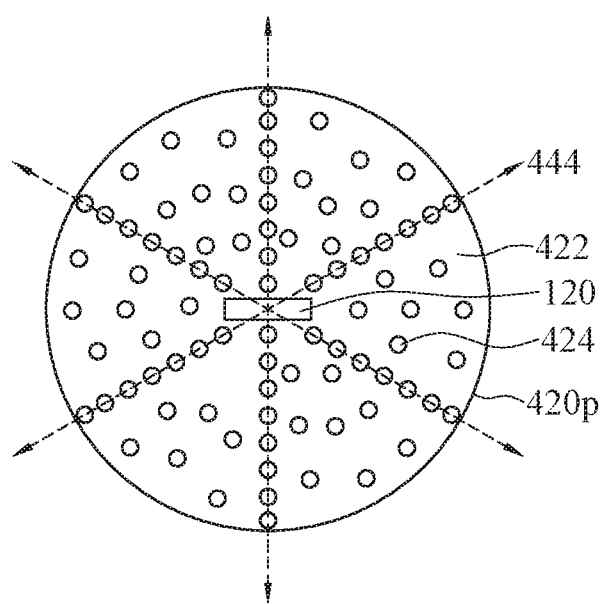

Referring to FIG. 30A, suitable materials for the transparent binder (i.e. adhesive) 422 include silicone, resin and epoxy. However, these materials, having a thermal conductivity from 0.01 to 2 W/(m·K), are poor thermal conductors in relation to the light conversion particles 424 like phosphor, which has a thermal conductivity of from 1 to 20 W/(m·K). Excess heat trapped inside the wavelength conversion layer (e.g. a phosphor glue layer or a phosphor film layer) 420p compromises the performance of the heat-sensitive LED devices 102. Moreover, the transparent binder 422, when bathed in excess heat, becomes brittle and unpleasantly yellow over time. Thus, it is desirable to configure the wavelength conversion layer 420p in a way heat is efficiently transferred away from the LED device 102 from the wavelength conversion layer 420p. In an embodiment, the wavelength conversion layer 420p includes a plurality of heat transfer paths 444 extending in a substantially radial direction for transferring heat away from the LED device 102 and the wavelength conversion layer 420p. In FIG. 30A, the concentration of light conversion particles 424 in the transparent binder 422 is so low that the heat transfer paths are mostly broken because the majority of the light conversion particles 424, sealed by the transparent binder 422, are far apart from one another. By contrast, in FIG. 30B, the concentration of the light conversion particles 424 is high enough for the light conversion particles 424 to form a plurality of heat transfer paths 444 by lining up the light conversion particles 424 successively along a substantially radial direction because the majority of the light conversion particles 424, not being completely sealed by the transparent binder 422, are at least partially in direct contact with neighboring light conversion particles 424 on a same light transfer path 444. Preferably, the ratio of the volume of the light conversion particles in the wavelength conversion layer to the volume of the transparent binder in the wavelength conversion layer is from 20:80 to 99:1. Preferably, the ratio of the weight of the light conversion particles in the wavelength conversion layer to the weight of the transparent binder in the wavelength conversion layer is from 20% to 50%. As previously discussed, if the light passes through too much light conversion particles 424, part of the re-emitted light can be blocked from emitting from the wavelength conversion layer 420p by the excess light conversion particles (e.g. phosphors) 424. By providing a sufficient concentration of light conversion particles 424 for sufficient heat transfer paths 444 without blocking, the light conversion particles 424 are in state of thermal optimum. Preferably, under the thermal optimum, the ratio of the volume of the light conversion particles 424 in the wavelength conversion layer 420p to the volume of the transparent binder 422 in the wavelength conversion layer 402 is from 20:80 to 99:1. Preferably, the ratio of the weight of the light conversion particles 424 in the wavelength conversion layer 420p to the weight of the transparent binder 422 in the wavelength conversion layer is from 20% to 50%. Given the same concentration, the plurality of heat transfer paths 444 that otherwise would not exist if the light conversion particles 424 are evenly dispersed throughout the transparent binder 422 can be formed by maneuvering the distribution of the light conversion particles 424 in the transparent binder 422 where the plurality of heat transfer paths 444 are planned. The concentration of the light conversion particles 424 in FIG. 30C is comparable to the concentration of the light conversion particles 424 in FIG. 30A. As previously stated, the heat transfer paths in FIG. 30A are mostly broken. By contrast, in FIG. 30C, the wavelength conversion layer 420p includes the plurality of heat transfer paths 444 similar in shape to a spoke having the LED device 102 as a hub. The concentration of the light conversion particles 424 along the planned paths is high enough for the light conversion particles 424 to form a plurality of heat transfer paths 444, e.g. like a spoke, by lining up the light conversion particles 424 successively along a substantially radial direction because the majority of the light conversion particles 424 are at least partially in direct contact with neighboring light conversion particles 424. The heat transfer path 444 passes through the wavelength conversion layer 420p in which the concentration of the light conversion particles 424 is appreciably lower than the concentration of the light conversion particles 424 that lays out the heat transfer path 444. By elevating the concentration of the light conversion particles 424 only where the heat transfer path 444 is planned in the transparent binder 422, the heat transfer paths 444 can be obtained while mitigating the problem of light blocking resulting from excessive concentration of the light conversion particles 424. In some embodiments, the heat transfer path 444 further includes a gap filler for tightening up the contact between the light conversion particles 424 on the heat transfer path 1002. For example, the heat transfer path 444 further includes a plurality of heat dissipation particles such as $TiO_2$, $Al_2O_3$, $SiO_3$, $ZrO_2$, CaO, SrO, BaO, AIN, silicon carbide, silicon nanoparticles. The heat dissipation particles are preferably nanoparticles having a thermal conductivity from 10 to 50 W/(m·K) or higher (preferably higher than the phosphors), or/and having a thermal emissivity higher than the adhesive, are dimensionally much smaller than the light conversion particles that constitute the primary ingredient of the heat transfer path 444. For example, the nanoparticle is from 10 to 300 nm. Preferably, the nanoparticle is from 20 to 100 nm. The nanoparticles help close the gaps between the light conversion particles 424 on the heat transfer path 444. Other things equal, the heat transfer path 444, when further including nanoparticles, becomes a more efficient heat conduit because the light conversion particles 424 on the heat transfer path 444 are in a tighter contact with one another than in the absence of nanoparticles. In some embodiments, the heat dissipation particles may be microparticles having a particle diameter less than 100 um.

Soft materials such as silicone and resin are suitable materials for the transparent binder. A bendable LED filament is made possible with these highly elasto-plastic materials. However, sometimes it is desirable to use these inherently soft materials to provide a LED filament capable of self-sustained plastic deformation such that external support structures can be minimized or even eliminated when the LED filament is expected to maintain a particular posture when it is connected to a lighting fixture such as LED light bulb. The posture could be a straight line extending vertically, horizontally or in any other direction. The posture could be curves of any kind, including simple curves such as arc and polygon and complex curves such as helix, petal and gift ribbon. In an embodiment, the wavelength conversion layer includes a posture maintainer such that the LED filament is capable of self-sustained plastic deformation. For example, the posture maintainer includes a pre-determined concentration of particles harder than the transparent binder in which the particles are embedded. Alternatively, the posture maintainer includes a wire system embedded in the transparent binder. Moreover, the posture maintainer includes an aperture system embedded in the transparent binder. Light conversion particles such as phosphor participles are harder than the binder materials such as silicone and resin. Thus, the wavelength conversion layer can be made harder by increasing the concentration of the light conversion particles in the transparent binder. In an embodiment, the hardened wavelength conversion layer includes alternate coatings of the transparent binder and the phosphor particles. The wavelength conversion layer is thus configured to exhibit an even concentration of the phosphor particles throughout the wavelength conversion layer. In some embodiments, the wavelength conversion layer is configured to have a Young's modulus from $0.1 \times 10^{10}$ to $0.3 \times 10^{10}$. In other embodiments to be used with LED light bulbs, the wavelength conversion layer is configured to have a Young's modulus from $0.15 \times 10^{10}$ to $0.25 \times 10^{10}$ Pa. In an embodiment, the smallest radius of curvature of the LED filament 100 is 1 cm to 3 cm. In another embodiment, the smallest radius of curvature of the LED filament 100 is 1 mm to 10 mm.

Figure 32A:
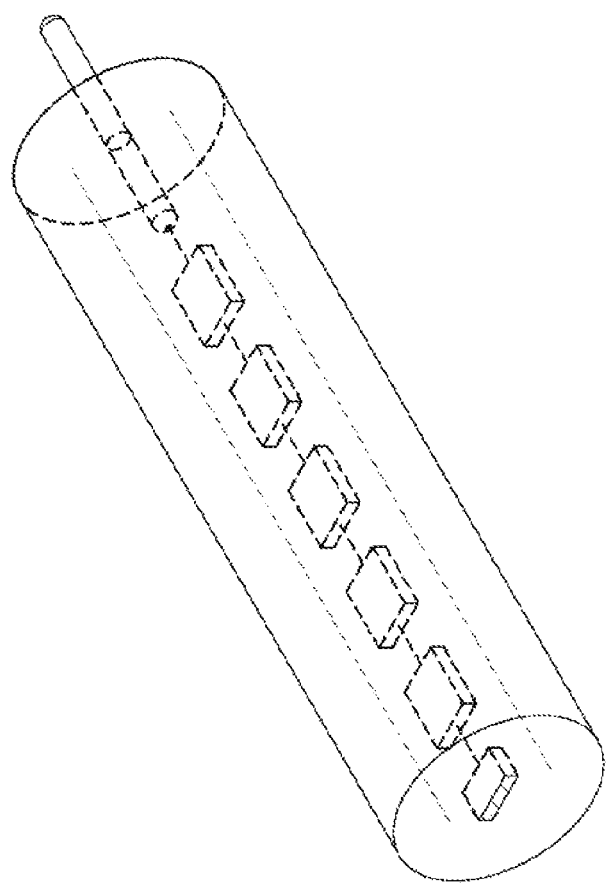
FIGS. 32A to 32G are see-through views of the LED filament in accordance with an embodiment of the present invention.
Figure 32B:
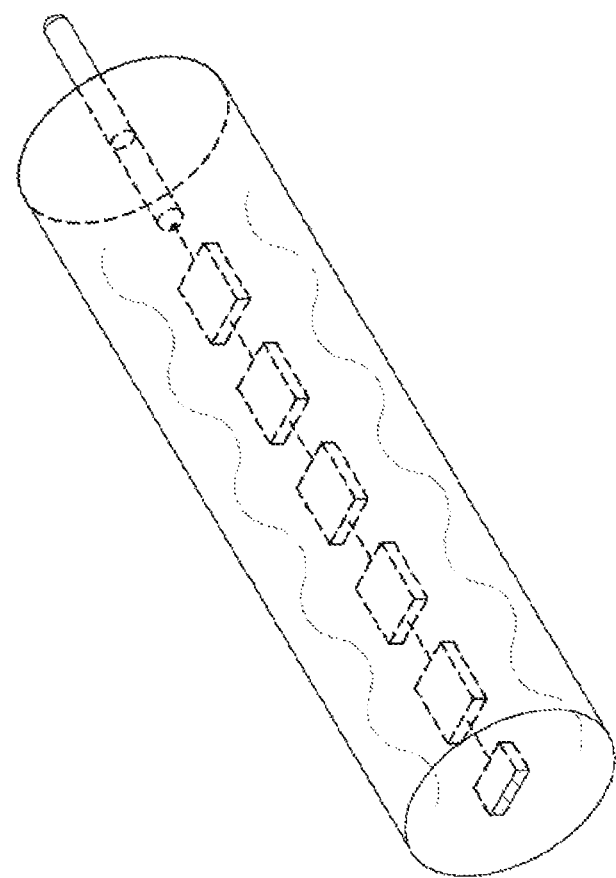
Figure 32C:
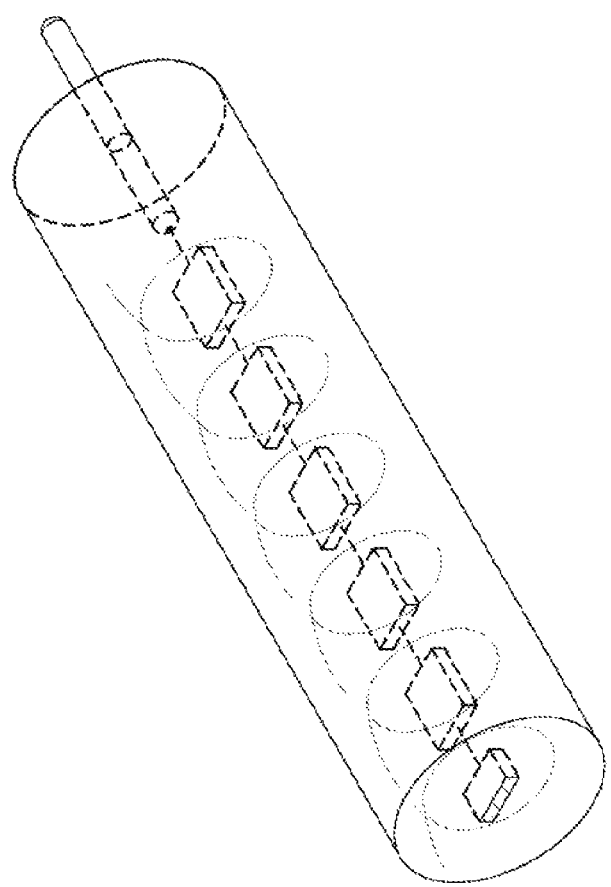
Figure 32D:
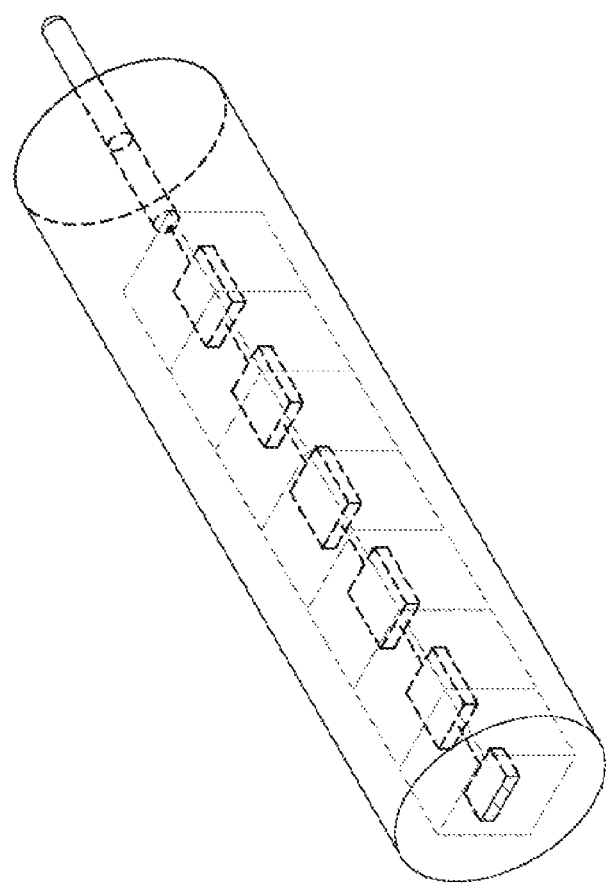
Figure 32E:
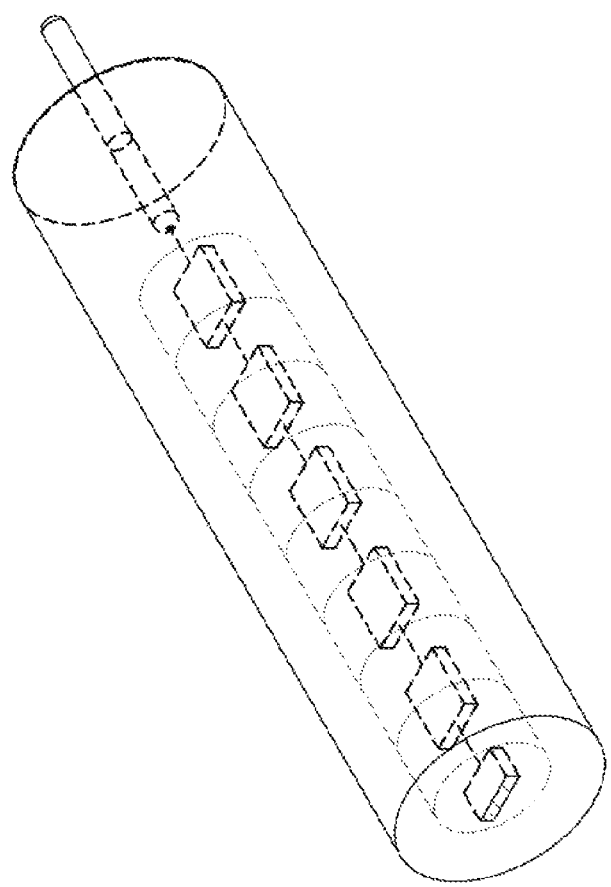

In another embodiment, the posture maintainer includes a wire system embedded in the transparent binder to reinforce the wavelength conversion layer comprising primarily elastic binder materials such as silicone or resin. The wire is made from resilient materials such as copper and glass fiber and preferably light transmissive materials such as nanotubes. The wire system comes in many structures of 2-D (e.g. FIGS. 32A-B) or 3-D (e.g. FIGS. 32C-F) depending on the application. In FIG. 32A, the wire system includes a simple set of straight wires extending longitudinally in the wavelength conversion layer. In FIG. 32B, the wire system includes a set of sinuous springs extending longitudinally in the wavelength conversion layer. In FIG. 32C, the wire system includes a helical spring extending longitudinally in the wavelength conversion layer. In FIGS. 32D and 32E, the wire system includes a grid structure extending in the wavelength conversion layer along the longitudinally axis of the LED filament. In FIG. 32D, the wire system includes a rectilinear grid extending in the wavelength conversion layer along the longitudinally axis of the LED filament. In FIG. 32E, the wire system includes a curvilinear grid extending in the wavelength conversion layer along the longitudinally axis of the LED filament.

Figure 32F:
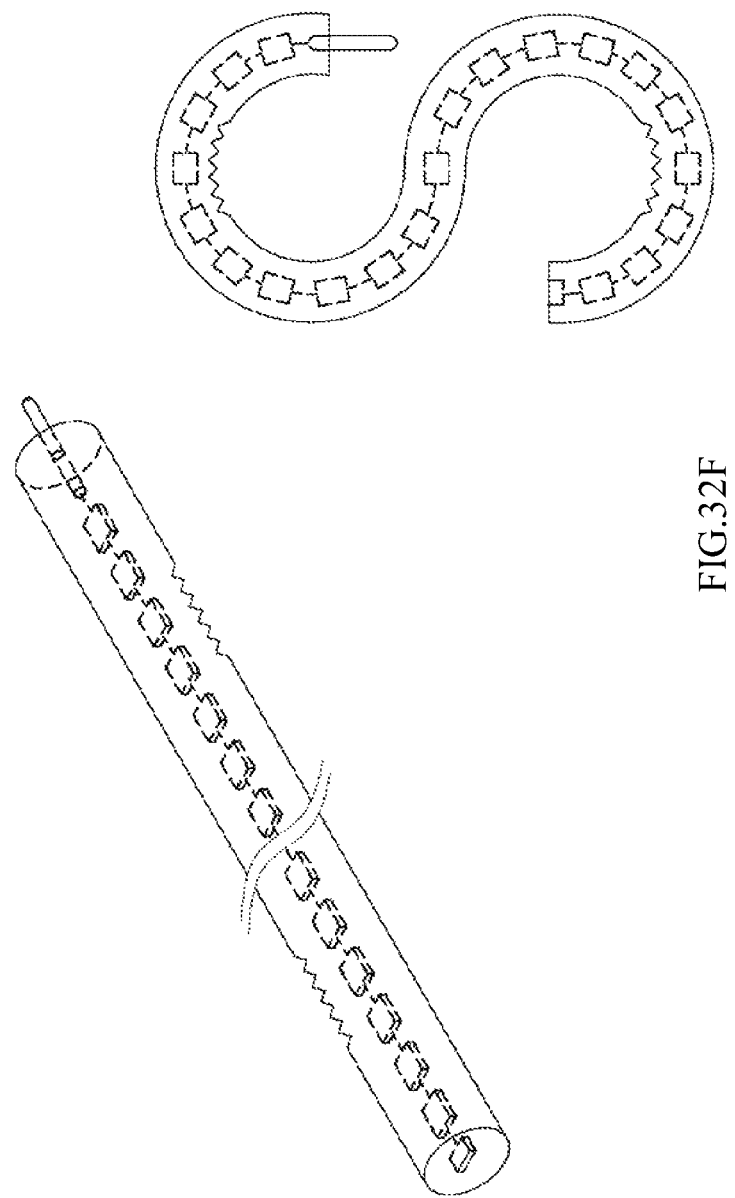
Figure 32G:
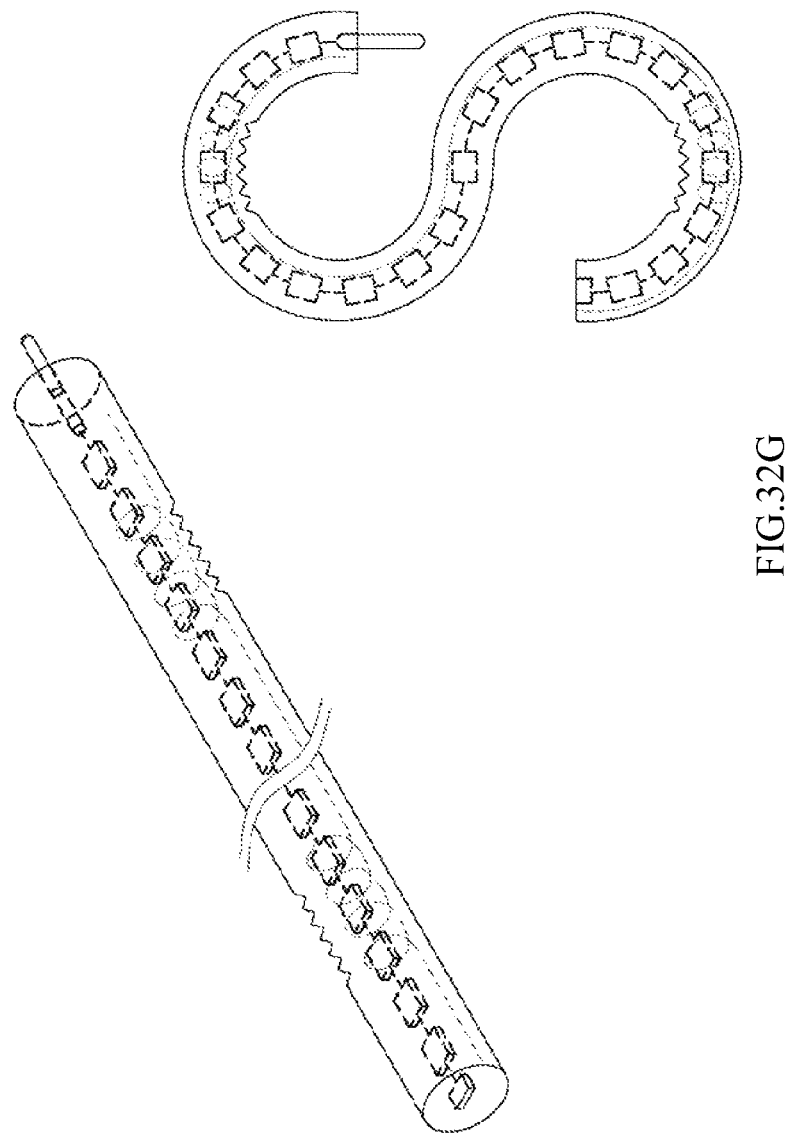

In yet another embodiment, the posture maintainer includes an aperture system on the surface of the wavelength conversion layer where tight turns are planned for the posture the LED filament is expected to maintain in an application. In FIG. 32F, for example, the LED filament is expected to maintain an S-shaped posture. A set of apertures is deployed at the inner part of the wavelength conversion layer where the tight turn is planned. The set of apertures makes it easier for the LED filament to maintain the S-shaped posture by accommodating compression at the inner part of the tight turn. In some embodiments, the wire system includes a combination of the structures illustrated above. In FIG. 12G, for example, the wire system includes a combination of straight wire, helical spring and aperture system. The helical spring is deployed in the wire system only where the tight turns are planned for the posture the LED filament is expected to maintain in an application. Otherwise, only the straight line is deployed. A set of apertures is deployed at the inner part of the wavelength conversion layer where the tight turn is planned.

Figure 31A:
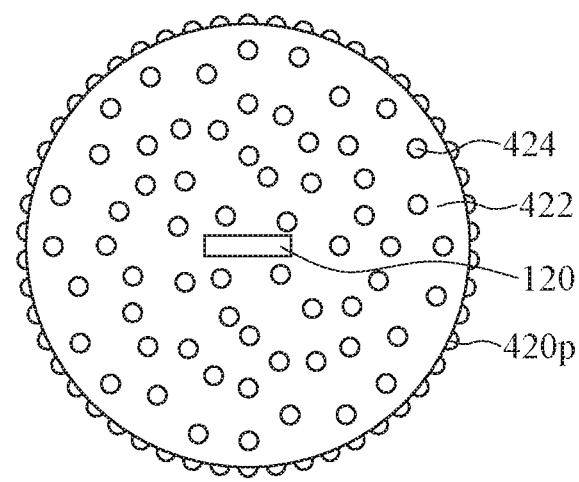
FIGS. 31A to 31C are cross sectional views of the LED filament in accordance with an embodiment of the present invention.
Figure 31B:
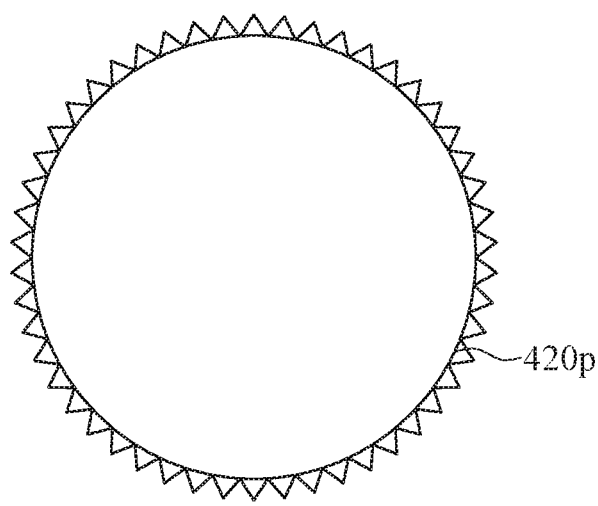
Figure 31C:
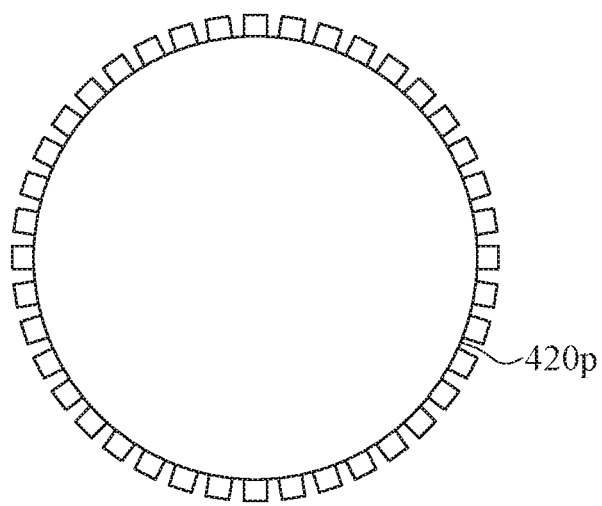

In an embodiment, the outer surface of the enclosure is provided by a polished layer. An LED filament having a glossy finish may be aesthetically appealing to some people. However, the LED filament may suffer from total internal reflection or poor heat dissipation. In another embodiment, the outer surface of the enclosure is provided by a texturized layer. The texturized layer improves light extraction by reducing total internal reflection. The texturized layer enhances heat dissipation by providing the enclosure with a greater surface area than a polished layer does. In FIG. 31A, for example, the enclosure comprises light conversion particles such as phosphors, heat dissipation particles, and adhesive. The textured layer is formed by a sufficient concentration of the light conversion particles 424 and/or the heat dissipation particles found close to but bulging from the outer surface of the wavelength conversion layer 420p. By contrast, in FIGS. 31B and 31C, the enclosure includes a dedicated texturized layer (e.g., the wavelength conversion layer 420p) having different patterns such as wedge and cube.

Figure 49A:
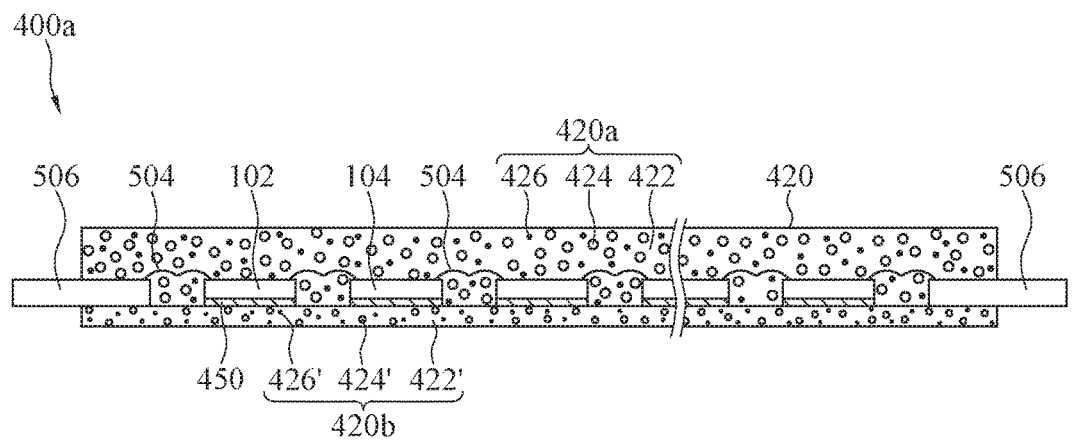
FIGS. 49A to 49G and FIG. 54 illustrate cross-sectional views of LED filaments according to embodiments of the present disclosure.

In an embodiment, the filament comprises multiple layers as shown in FIG. 49A including the base layer 420b formed by phosphor film and the top layer 420a formed by phosphor glue. An outer surface of the base layer 420b and/or an outer surface of the top layer 420a may be processed in a surface roughening manner; alternatively, the outer surface of the base layer 420b and/or the outer surface of the top layer 420a may be provided with (applied with) dissipating particles with greater transmittance (e.g. aluminum oxide, silica, or aluminum nitride) or phosphor powders. As a result, the effects of heat dissipating and light reflection and scattering can be improved.

Yttrium aluminum garnet (YAG), typically having a refractive index (RI) of about 1.8, is an example of a common phosphor that may be used. The RI of the phosphor particles and the RI of the binder material can be the same or different. In an embodiment, the binder material includes a transparent material having an RI that is substantially matched to that of the wavelength conversion particles embedded therein. For example, the binder material includes a high-index silicone having an RI of about 1.6 or greater. By providing the wavelength conversion particles in a substantially index-matched binder material, light scattering losses due to differences in the RI of the binder material and the wavelength conversion particles can be reduced or eliminated.

Figure 27:
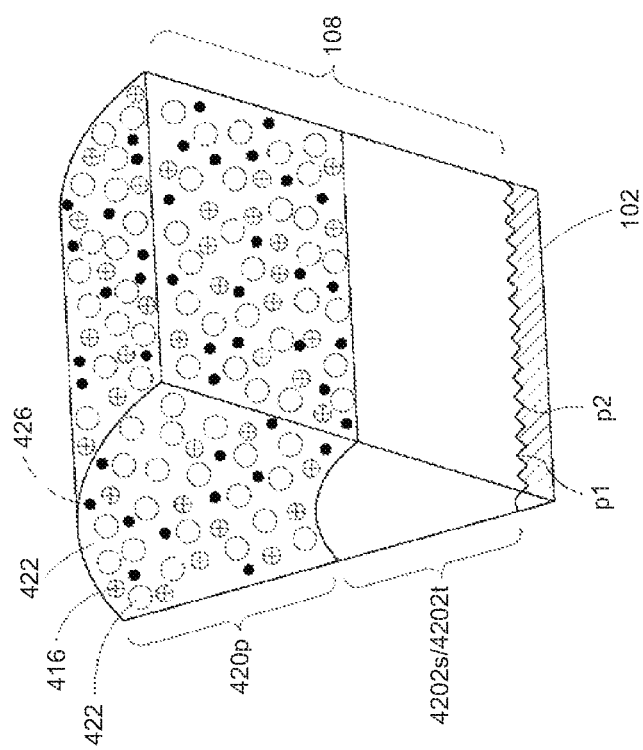
FIG. 27 is a cutaway view of the LED filament in accordance with an embodiment of the present invention.

Referring to FIG. 27, in some embodiments, a plurality of nanoparticles 426 is embedded in the transparent binder 422 that formed the wavelength conversion layer 420p. The nanoparticles are dispersed throughout the transparent binder 422 of the wavelength conversion layer 1404. By including nanoparticles with a RI higher than that of the host medium—the transparent binder—the effective RI of the host medium is increased. The presence of nanoparticles in the transparent binder brings the RI of the transparent binder (e.g., regular silicone with an RI of about 1.5) closer to the RI of the phosphor particles (with an RI of about 1.8). When these two elements are not closely index-matched, the difference in RI results in light scattering because typical phosphor particles are substantially larger (about 5.5 µm) than the wavelength of light emitted from the LED device (450 nm for a blue LED). Light extraction efficiency increases when the difference in RI between the phosphor particle and the transparent binder is reduced. However, the efficiency only increases up to a point. If the effective RI of the transparent binder gets too high, the light extraction efficiency will decrease due to total internal reflection at the flat interface of the wavelength conversion layer and any surrounding medium having a lower RI (e.g., silicone or air). An acceptable effective RI for the wavelength conversion layer is approximately 1.7, providing optimal index-matching with manageable levels of total internal reflection. The nanoparticles may comprise several different materials such as $TiO_2$, $Al_2O_3$, $SiO_3$, $ZrO_2$, CaO, SrO, BaO, diamond, silicon carbide, silicon nanoparticles. The RI of both $TiO_2$ and diamond is approximately 2.5. The volume of nanoparticles that is needed to adjust the effective RI of the wavelength conversion layer by a certain amount can be easily calculated using Vegard's Law which states that the relationship between volume and RI is linear. For example, if the wavelength conversion layer material has a RI of 1.5 and the target effective RI is 1.7, then the wavelength conversion layer should comprise approximately 20% TiO2 nanoparticles by volume. Other material combinations and compositions may also be used. For example, some embodiments may have greater than 5% nanoparticles by volume. Other embodiments may have greater than 10% nanoparticles by volume. Still other embodiments may include 20-40% by volume. The concentration of the nanoparticles depends on such factors as the material being used and the desired RI adjustment.

Figure 28:
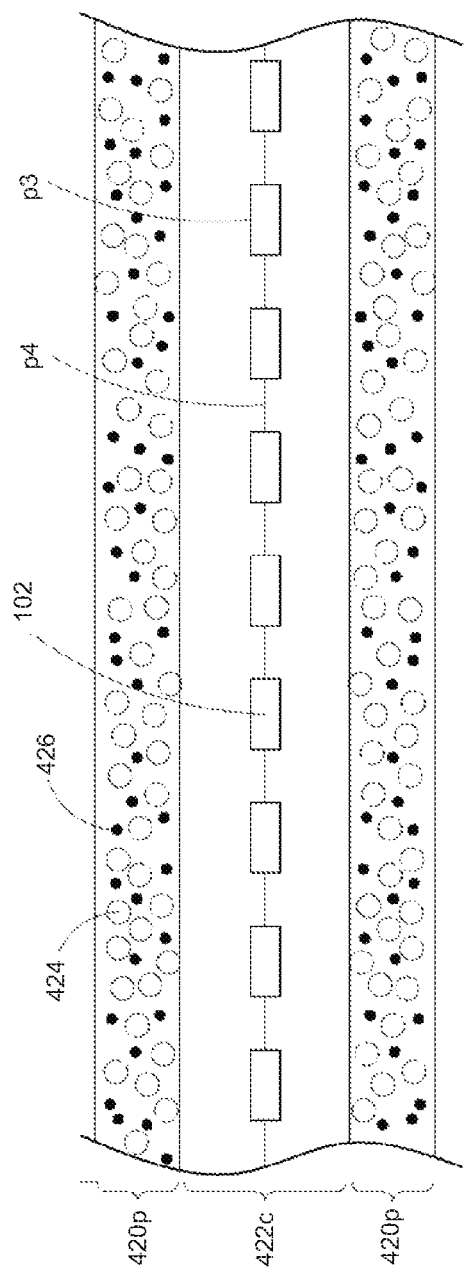
FIG. 28 is a cross-sectional view of the LED filament in accordance with an embodiment of the present invention.
Figure 29:
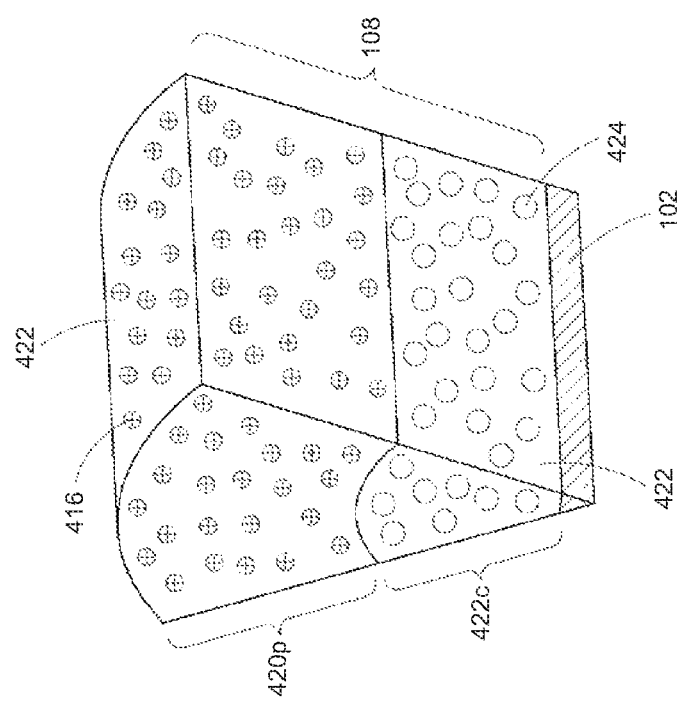
FIG. 29 is a cutaway view of the LED filament in accordance with an embodiment of the present invention.

Referring to FIG. 27, sometimes it is desirable to load the wavelength conversion layer 420p with a high volume of light conversion particles 424. There would be less space in the wavelength conversion layer 420p for nanoparticles 426. As discussed above, the nanoparticles 426 are used to adjust the effective RI of the wavelength conversion layer 420p. When the nanoparticles 426 do not produce a large enough RI shift in the wavelength conversion layer 420p, the spacer layer 4202s can compensate for those cases. In addition to shifting RI, the spacer layer 4202s, when interposed between the LED device 102 and the wavelength conversion layer 420p, enables a uniform thickness of the wavelength conversion layer 420p to produce uniform white light, which entails a proper combination of blue light and the phosphor light. However, a variety of factors cause the thickness of the wavelength conversion layer to be uneven when it is disposed directly over the LED device. The surface of the LED device might be, intentionally or unintentionally, uneven. For example, in FIG. 27, the wavelength conversion layer would be thinner at the point p1 than at the point p2 when the surface of the LED device 102 is texturized. Moreover, the array of LED devices does not define a perfectly even interface for the wavelength conversion layer to sit on. In FIG. 28, for example, the wavelength conversion layer would be thinner at the point p3 than at the point p4. Where the wavelength conversion layer is relatively thin, blue light would dominate because there would be insufficient contribution of light from the phosphors. The spacer layer 4202s in FIGS. 27 and 28 eliminates the problem by forming a level interface for the wavelength conversion layer to sit on. The spacer layer 4202s can be made of many different materials such as silicone, epoxy, oil, dielectrics, and other materials. The material should be chosen such that the RI of the spacer layer 4202s is smaller than the RI of the LED device 102 and the RI of the wavelength conversion layer 420p. A portion of the light that enters the spacer layer 4202s is then incident on the interface between the spacer layer 4202s and the wavelength conversion layer 420p. At the interface the light sees a step-up in RI and passes into wavelength the conversion layer 420p with minimal reflection. If the light is reflected or backscattered in the wavelength conversion layer 420p, it will see the RI step-down at the spacer layer 4202s interface and has a finite chance of being reflected back into the wavelength conversion layer 420p because of the TIR phenomenon.

Index-matching the transparent binder 422 with the phosphor particles 424 reduces scattering within the wavelength conversion layer 420p. However, such reduction in scattering adversely affects the uniformity of the color temperature distribution in the LED filament. To mitigate the negative effect, light scattering particles (LSPs) 416 are disposed proximate to the LED device 102. The LSPs 416 are distributed around the LED device so that the individual photons are redirected before they are emitted to randomize the point where they exit the device. This has the effect of evening out the color temperature distribution such that an outside observer sees roughly the same color over a broad range of viewing angles. The LSPs should have a high RI relative to the surrounding medium, creating a large RI differential between the materials. Because the RI differential causes refraction, it would also be possible to use an LSP material that has a low RI relative to the surrounding medium. The LSPs create localized non-uniformities in the medium that force the light to deviate from a straight path. When the light strikes one or more of the scattering particles the RI differential between the medium and the particles causes the light to refract and travel in a different direction.

A large RI differential yields a more drastic direction change for an incident photon. For this reason, materials with a high RI work well in mediums such as silicone or epoxy. Another consideration when choosing a light scattering material is the optical absorbance of the material. Large particles backscatter more of the light inside the package before it can escape the device, decreasing the total luminous output of the device. Thus, preferred scattering particle materials have a high RI relative to the medium and a particle size comparable to the wavelength of the light propagating through the host medium. Ideally, LSPs ensure maximum forward or sideways scattering effect for a given spectrum while minimizing light loss due to backscattering and absorption. The LSPs can comprise many different materials, e.g., silica gel, silicon nanoparticles and zinc oxide (ZnO). Various combinations of materials or combinations of different forms of the same material may be used to achieve a desired scattering effect. Various percentages of composition of the LSPs can be used as dictated by the application. Depending on the materials used, the LSPs will typically be found in concentrations ranging from 0.01% to 5% by volume. Other concentrations can be used; however, the loss due to absorption increases with the concentration of the scattering particles. Thus, the concentrations of the LSPs should be chosen to maintain an acceptable loss figure. In some embodiments, the light scattering particles have diameters that range from 0.1 μm to 2 μm. In some cases, it may be desirable to use LSPs of different sizes. For example, in one embodiment a first plurality of LSPs may comprise titania, silica and diamond, and a second plurality of LSPs may comprise fused silica, titania and diamond. Many other combinations are possible to achieve a desired color temperature distribution.

The LSPs can be dispersed anywhere in the LED filament so long as they are proximate to the LED device such that substantially all of the emitted light has a good probability of interacting with the LSPs. In the embodiment shown in FIG. 26, the LSPs 416 are dispersed in the wavelength conversion layer 420p throughout the binder material 1404 along with the nanoparticles 426 and the phosphor particles 424. Because the wavelength conversion layer is disposed on the LED device 102, substantially all of the light travels through the wavelength conversion layer 420p where the LSPs are dispersed before egressing the LED filament. In other embodiments, the LSPs are dispersed throughout a binder material in a dedicated light scattering layer disposed over the LED device. In FIG. 27, the wavelength conversion layer 420p is sandwiched by the light scattering layer 4202t and LED device 102. The LSPs 416 are dispersed in the light scattering layer 4202t throughout the binder material. Because the light scattering layer 4202t is disposed all over the LED device 102, all of the light, converted by wavelength conversion layer 420p, must subsequently travel through the light scattering layer 4202t before egressing the LED filament.

Figure 13:
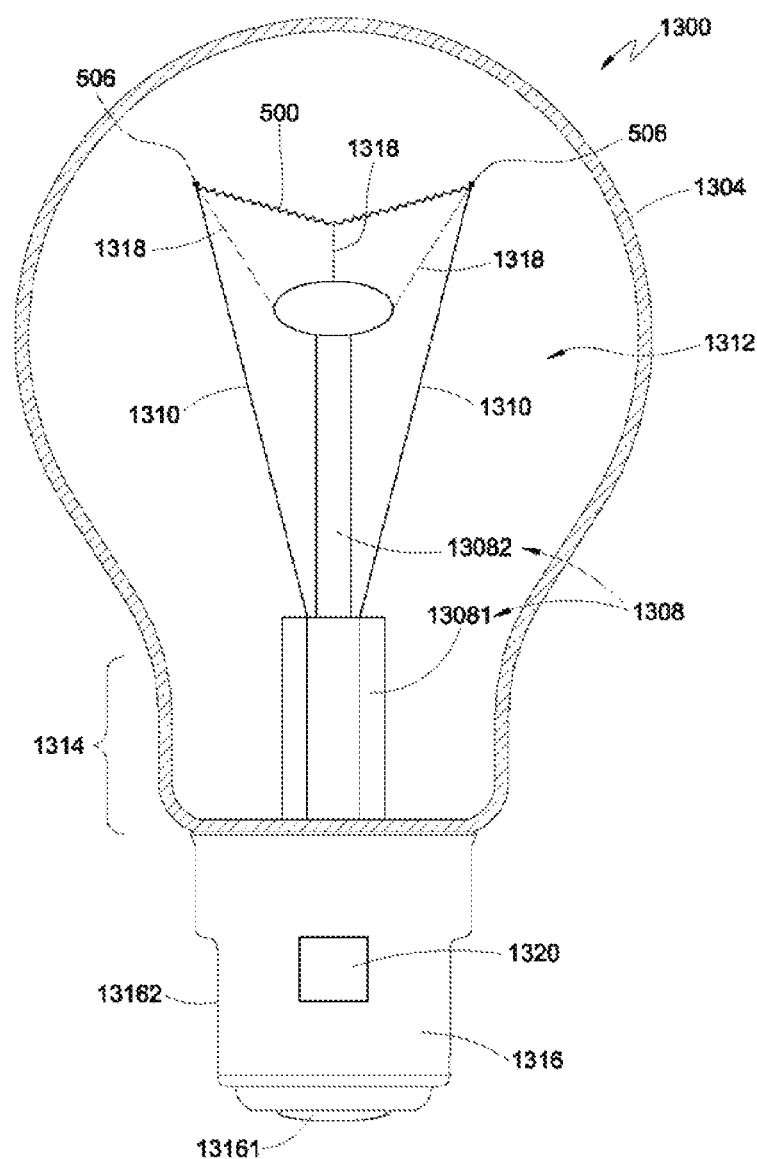
FIG. 13 is a front view of the LED light bulb in accordance with an embodiment of the present invention.
Figure 14:
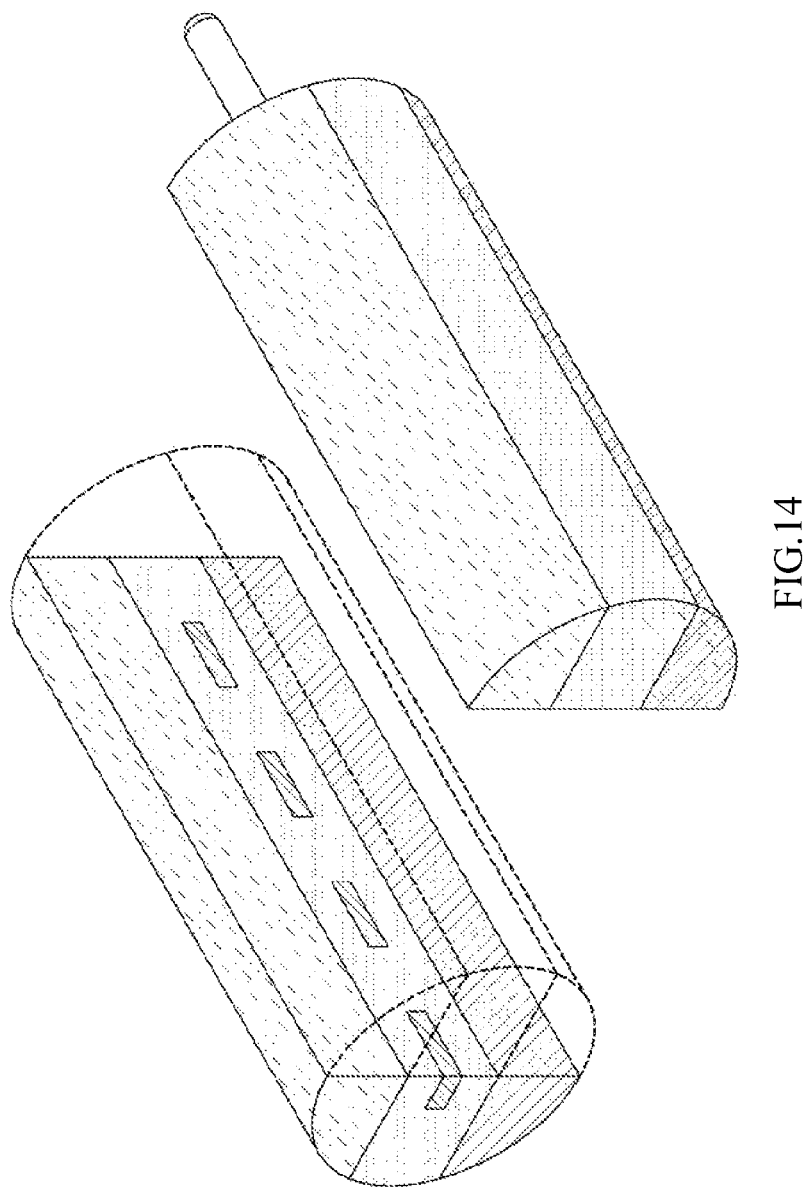
FIG. 14 is a cutaway view of the LED filament in accordance with an embodiment of the present invention.
Figure 15:
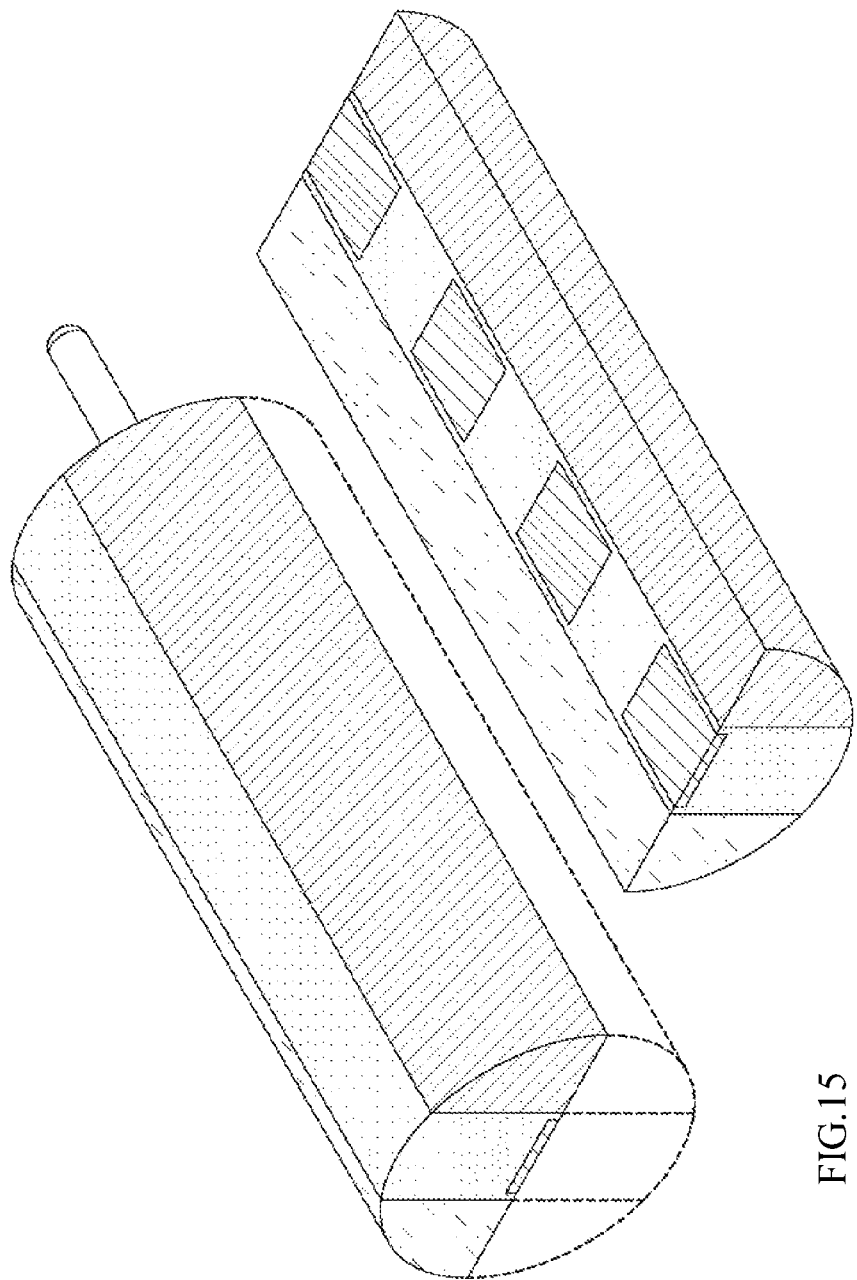
FIG. 15 is a cutaway view of the LED filament in accordance with an embodiment of the present invention.
Figure 16:
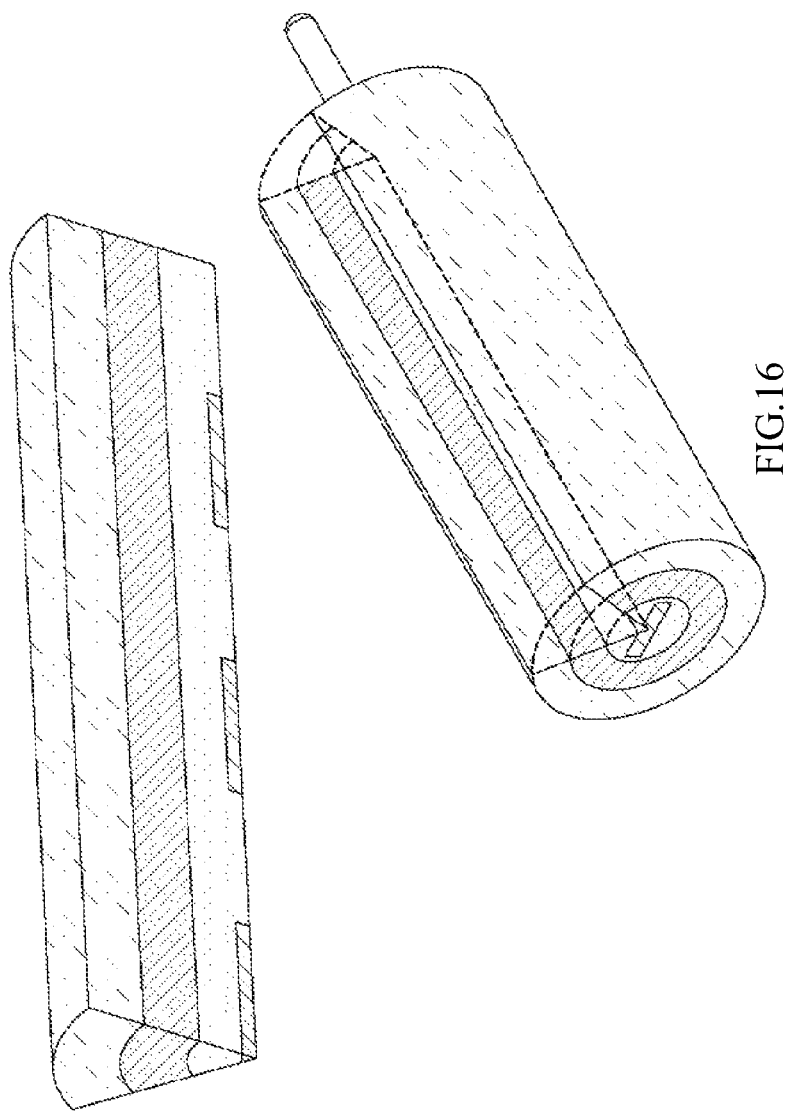
FIG. 16 is a cutaway view of the LED filament in accordance with an embodiment of the present invention.
Figure 17:
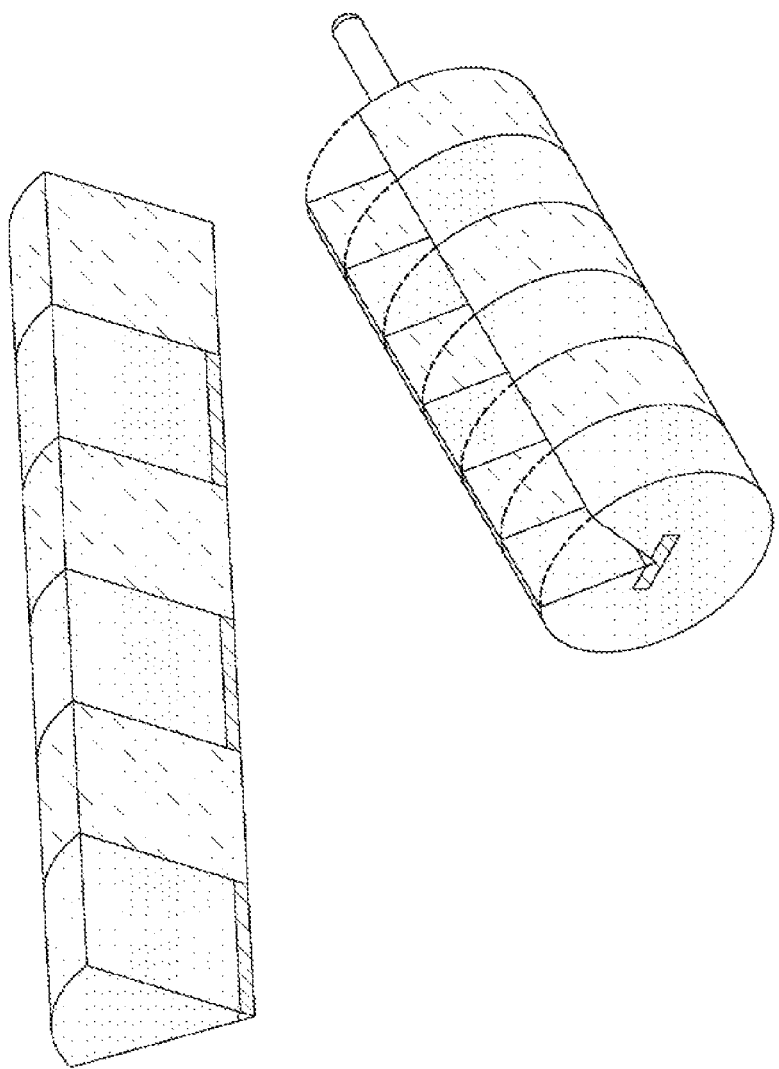
FIG. 17 is a cutaway view of the LED filament in accordance with an embodiment of the present invention.
Figure 18:
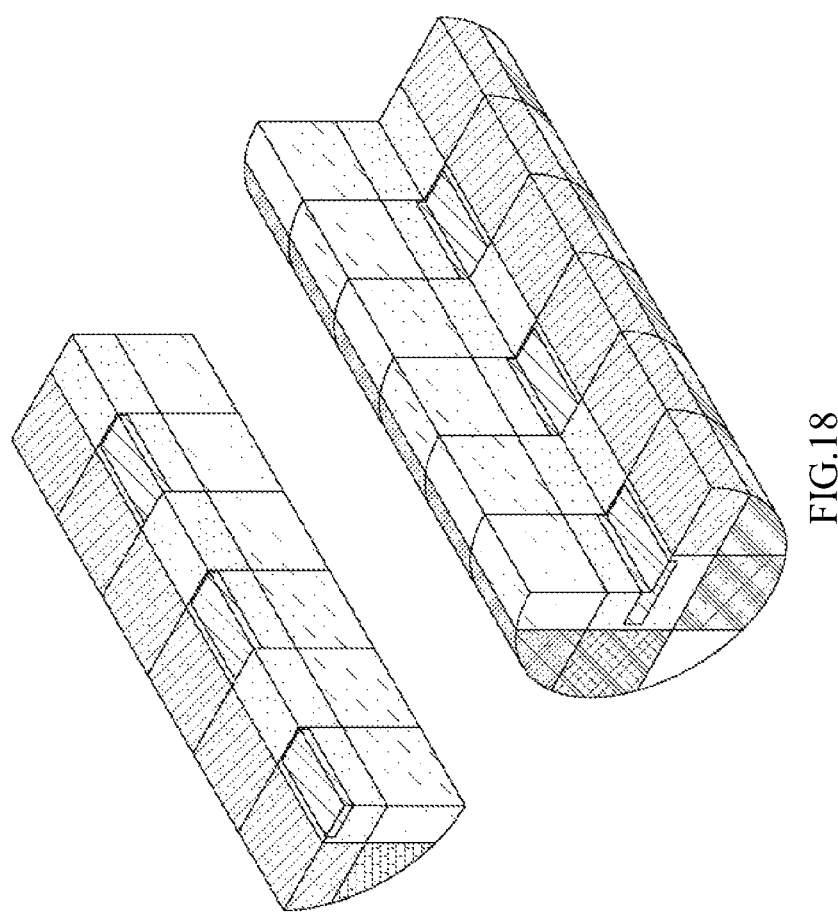
FIG. 18 is a cutaway view of the LED filament in accordance with an embodiment of the present invention.
Figure 19:
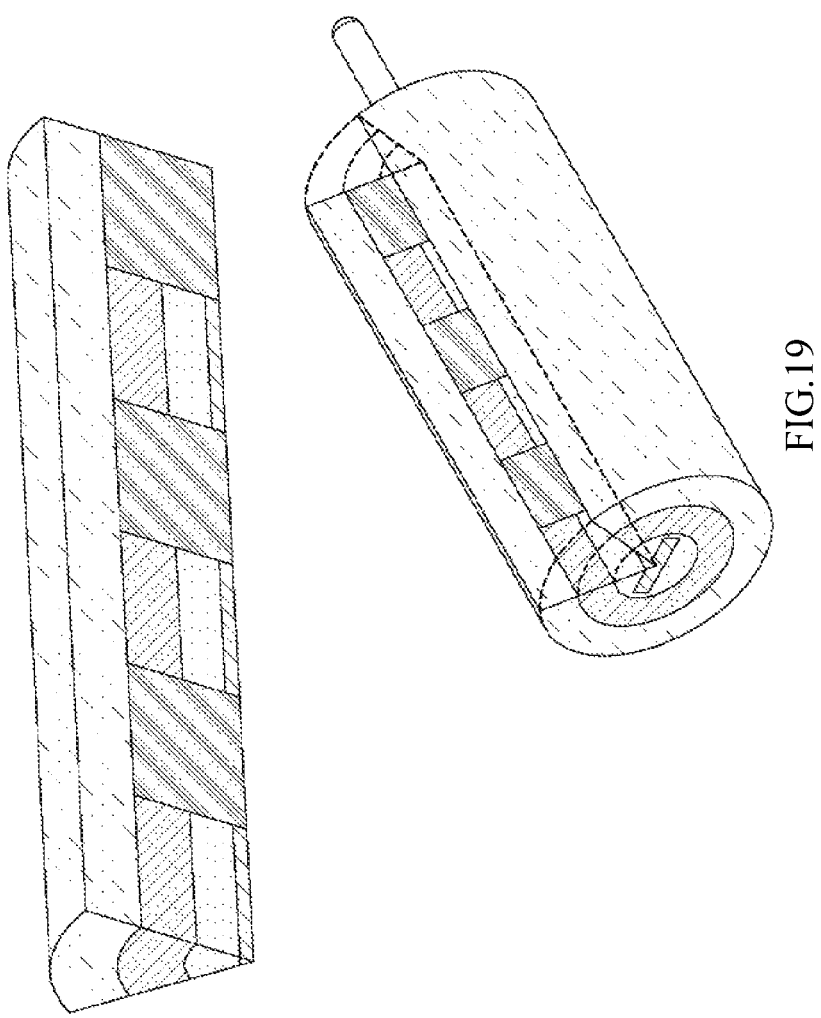
FIG. 19 is a cutaway view of the LED filament in accordance with an embodiment of the present invention.
Figure 20:
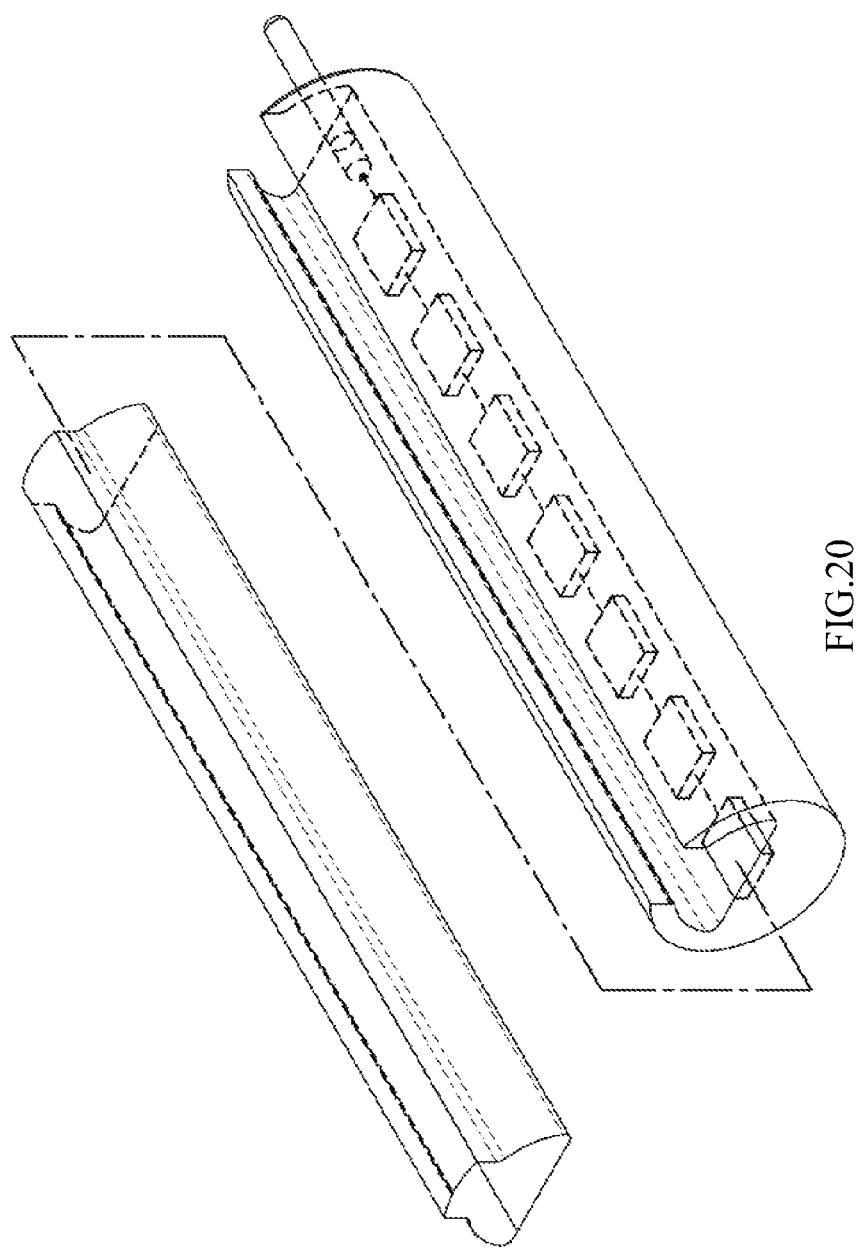
FIG. 20 is a cutaway view of the LED filament in accordance with an embodiment of the present invention.
Figure 21:
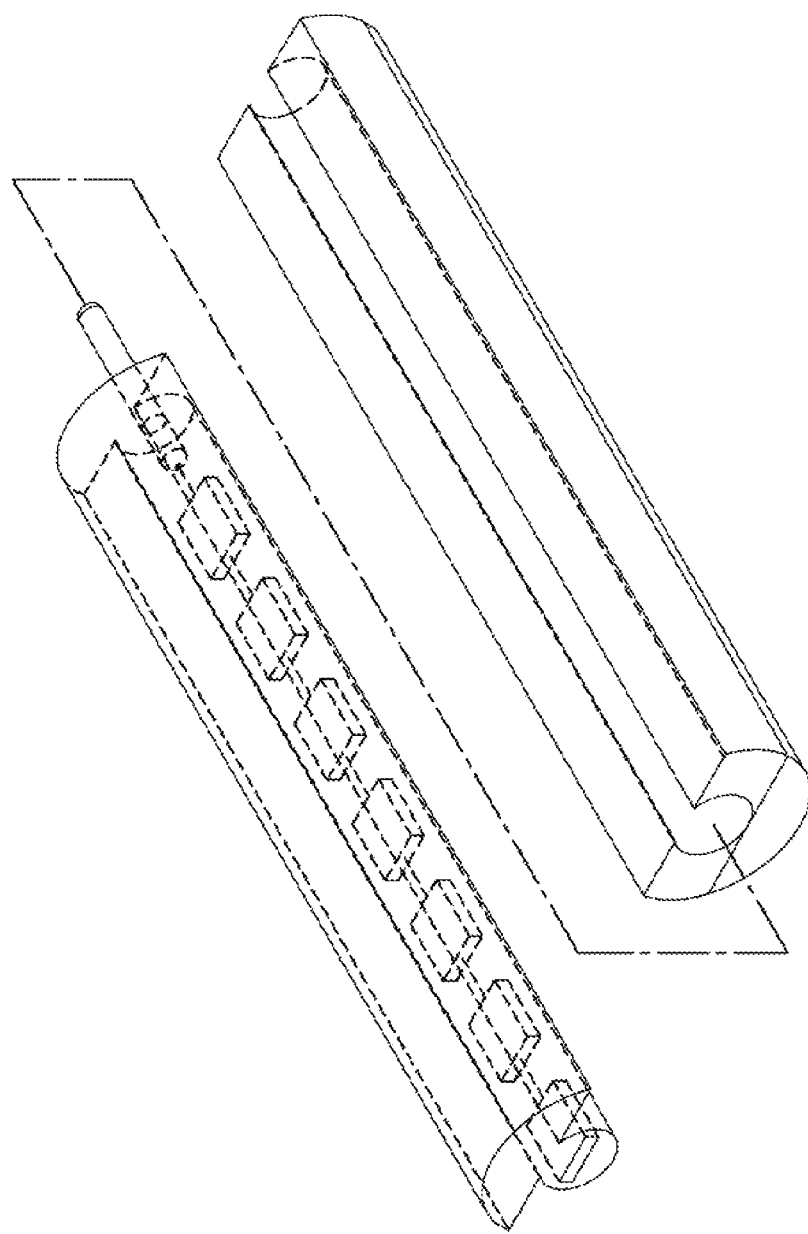
FIG. 21 is a cutaway view of the LED filament in accordance with an embodiment of the present invention.
Figure 22:
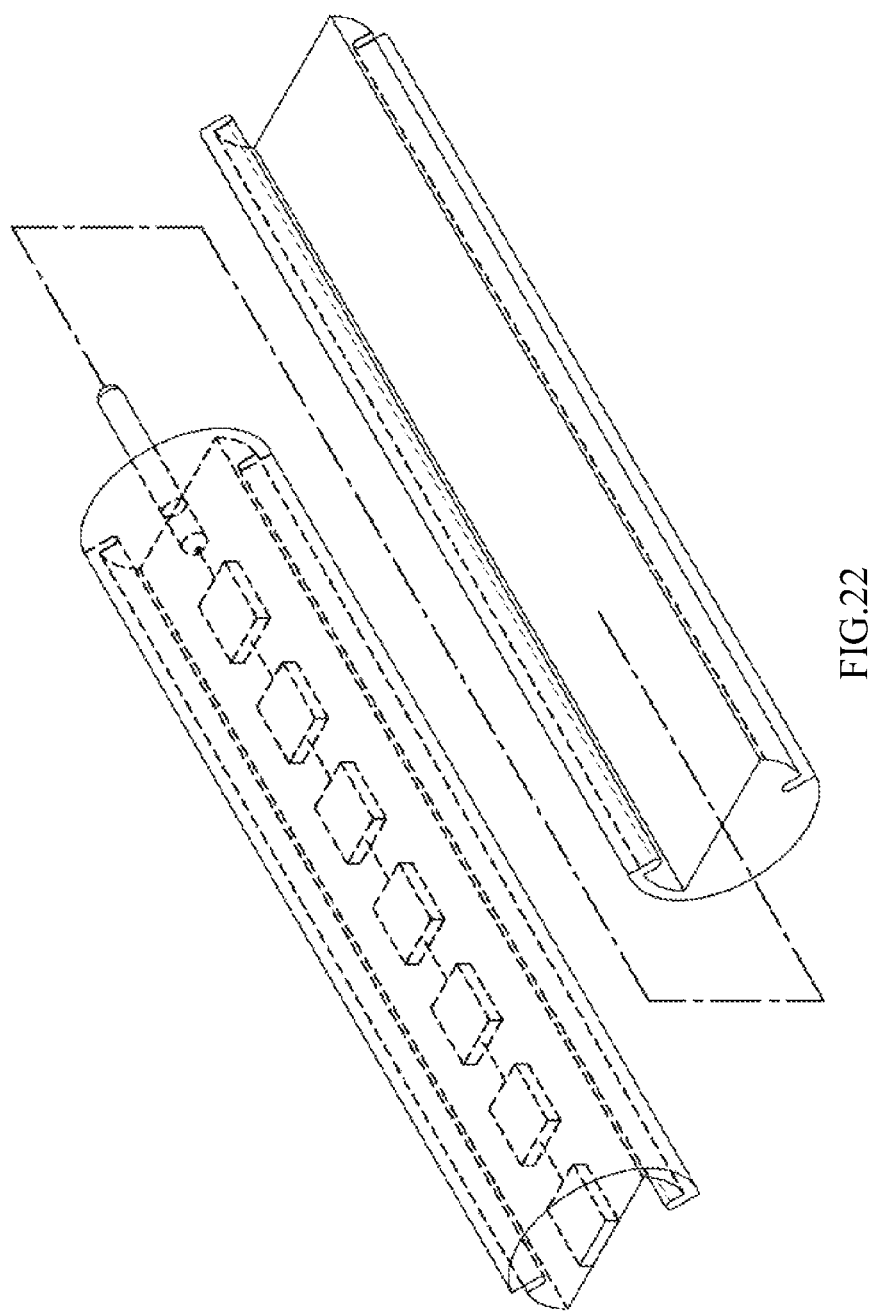
FIG. 22 is a cutaway view of the LED filament in accordance with an embodiment of the present invention.
Figure 23A:
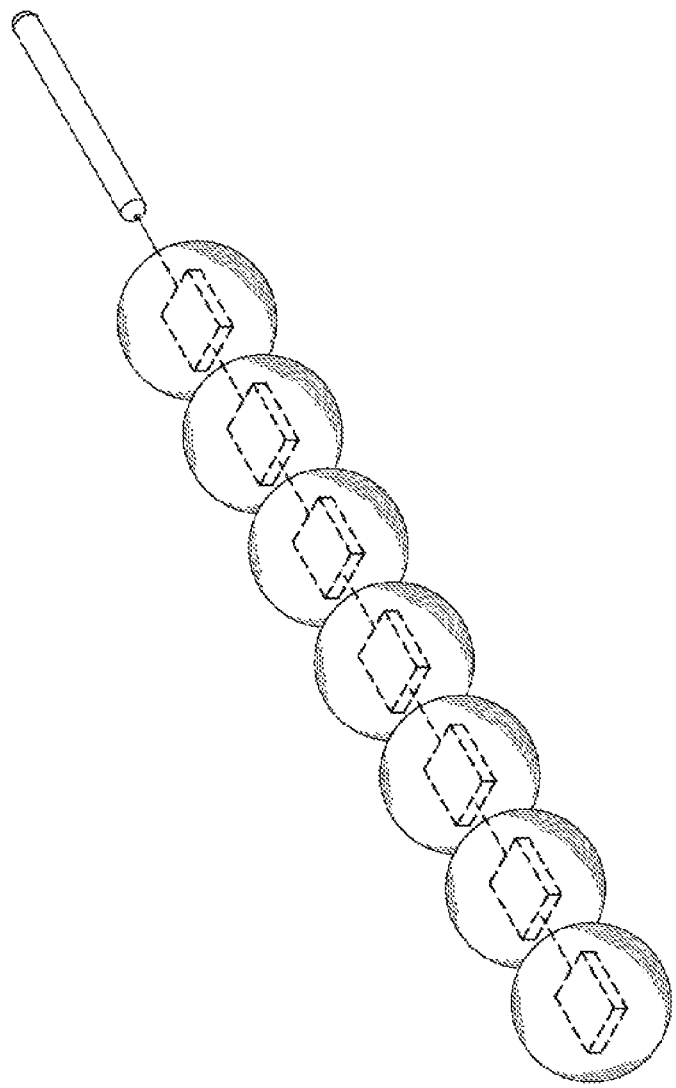
FIGS. 23A-23C are cutaway views of the LED filament in accordance with an embodiment of the present invention.
Figure 23B:
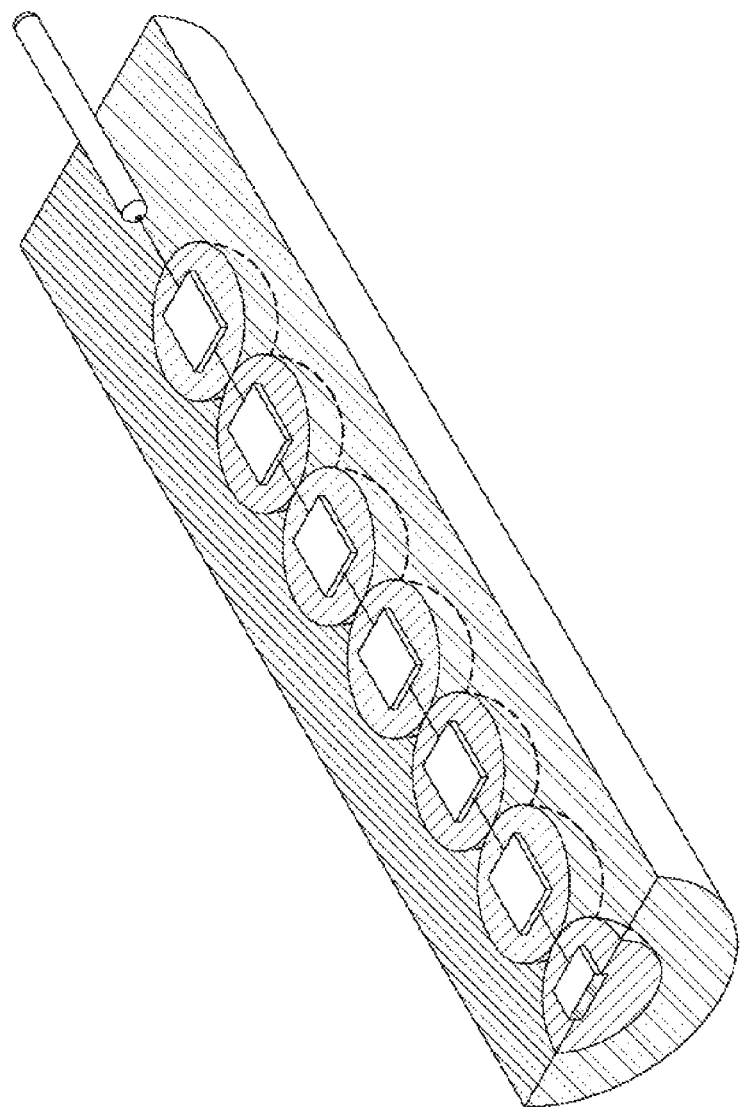
Figure 23C:
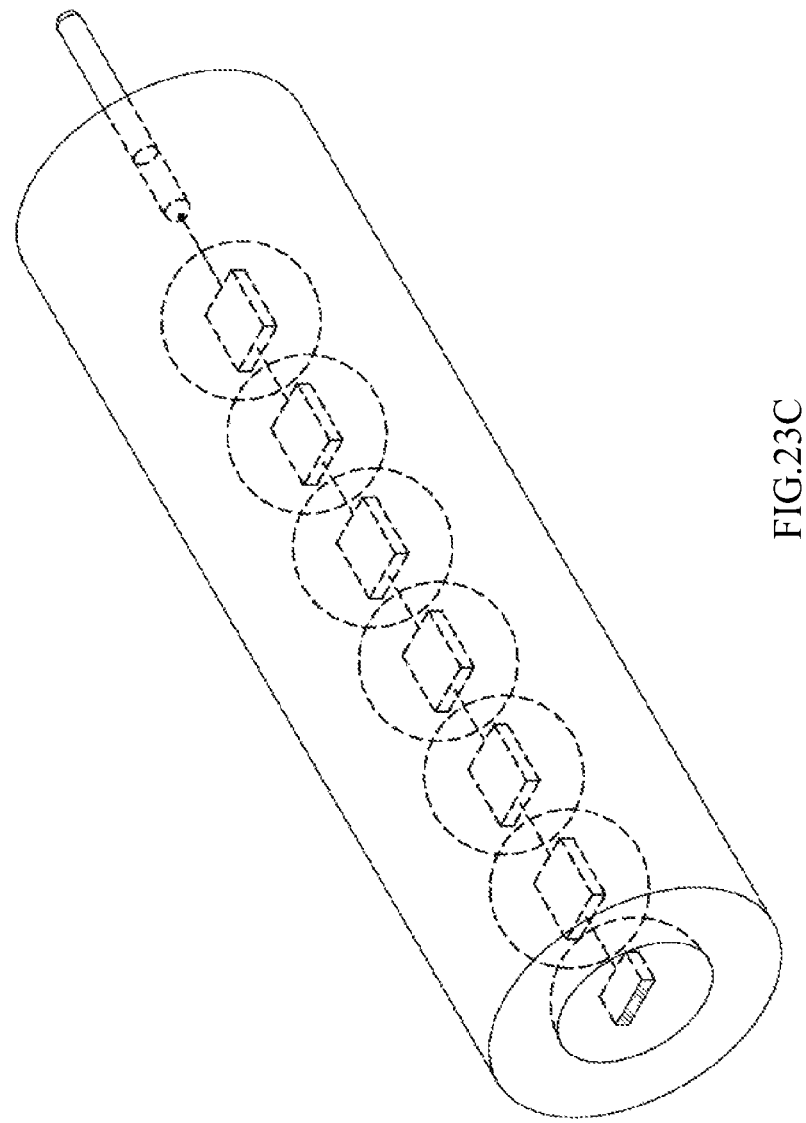

FIG. 13 shows an LED light bulb 1300 having an LED filament 1302 of the present invention as the light source. In an embodiment, the LED light bulb 1300 comprises a light transmissive envelope 1304, a base 1306, a stem press 1308, an LED filament 1302 and a plurality of lead wires 1310. The light transmissive envelope 1304 is a bulbous shell made from light transmissive materials such as glass and plastic. The light transmissive envelope 1304 includes a bulbous main chamber 1312 for housing the LED filament 1302 and sometimes a neck 1314 dimensionally adapted for attaching to the base 1306. At least part of the 1306 base is metal and includes a plurality of electrical contacts 1316 for receiving electrical power from a lampholder. The light transmissive envelope 1304 is mounted with its neck 1314 on the base 1306. The stem press 1308 is mounted on the base 1306 within the light transmissive envelope 1304 for holding the lead wire 1310 and the LED filament 1302 in position while keeping the positive and negative currents insulated from each other. The lead wire 1310 extends in a substantially axial direction from the base 1306 through the neck 1314 all the way into the main chamber 1312. The lead wire 1310 physically and electrically connects the electrical contact 1316 of the base 1306 and an electrical connector 506 of the LED filament. Electrical power is communicated from the lampholder to the base 1306 and all the way to the LED filament 1302 through the lead wire 1310 when the base 1306 and the lampholder are properly connected. The LED light bulb 1300 is thus configured to emit light omni-directionally. In some embodiments, the LED light bulb 1300, including exactly one LED filament 1302, is configured to emit light omnidirectionally. In other embodiments, the LED light bulb 1300, including a plurality of LED filaments 1302, is configured to emit light omnidirectionally. In addition to brining electrical power for the LED filament 1302, the lead wire 1310 also supports the LED filament 1302 to main a desired posture in the main chamber 1312.

In some embodiment where the lead wire 1310 alone do not provide sufficient support, the LED light bulb 1300 further includes a plurality of support wires 1318 to help the LED filament 1302 maintain a desired posture in the main chamber 1312. In some embodiments, the support wire 1318 is made of carbon spring steel for additional damping protection. Preferably, the support wire 1318 is not in electrical communication with any part of the LED light bulb 1300. Thus, negative impact resulting from thermal expansion or heat is mitigated. When the LED filament 1302 defines a sinuous curve in the main chamber 1312, the lead wire 1310 supports the LED filament 1302 either at the crest of the curve, the trough of the curve or anywhere between the crest and the trough. The support wire 1318 attaches to the LED filament 1302 in a variety of ways. For example, the lead wire 1310 includes a hook or claw at a tip. The throat of the hook is snugly closed around the LED filament. Alternatively, the claw is snugly closed around the LED filament.

In an embodiment, the LED light bulb include exactly two lead wires 1310. The base includes a top end, a bottom end and a side surface. The light transmissive envelope 1304 is mounted with its neck 1314 on the top end of the base 1306. The base 1306 includes a foot electrical contract 1316 at the bottom end and a base electrical contact 1316 on the side surface. A first lead wire 1310 physically and electrically connects the foot electrical contact 1316 and a first electrical connector 506f of the LED filament 1302. A second lead wire 1310 physically and electrically connects the base electrical contact 1316 and a second electrical connector 506s of the LED filament 1302. For example, the lead wire 1310 and the electrical contact 506 is fastened together by soldering. The filler metal includes gold, silver, silver-based alloy or tin. Alternatively, when the electrical connector 506 includes an aperture and the lead wire 1310 includes a hook structure at a tip, the lead wire 1310 and the electrical connector 506 is fastened by closing the throat of the hook against the aperture. In some embodiments, the LED light bulb 1300 further includes a rectifier 1320, which is in electrical connection with the electrical contact 1316 of the base 1306 and the lead wire 1310, for converting AC electricity from the lampholder into DC electricity to drive the LED filament 1302.

Preferably, the base 1306 has a form factor compatible with industry standard light bulb lampholder. Specifications for light bulb bases and sockets largely overseen by two organizations. The American National Standards Institute (ANSI) is an organization that publishes C81.61 and C81.62, while International Electrotechnical Commission (IEC) publishes 60061-1 and 60061-2. Edison screw lamp base and lampholder examples include but are not limited to the E-series described in ANSI C81.61 and C81.62: E5 midget, E10 miniature, E11 mini-candelabra, E12 candelabra, E17 intermediate, E26/24 single-contact medium, E26d double-contact medium, E26/50x39 skirted medium, E26/53x39 extended skirted medium, E29/53x39 extended skirted admedium, E39 single-contact mogul, E39d double-contact mogul, EP39 position-oriented mogul, and EX39 exclusionary mogul. Multiple-pin lamp base and lampholder examples include but are not limited to the G-series described in ANSI C81.61 and C81.62: GY two-pin for T, G4 two-pin for single-ended TH, GU4 two-pin for MR11 GLS lamps, GZ4 two-pin for projection lamps, G5 fluorescent miniature two-pin, 2G7 four-pin compact fluorescent, GZ10 bipin, G16t three-contact lug for PAR lamps, G17t three-pin prefocus for incandescent projection lamps. Bayonet lamp base and lampholder examples include but are not limited to the B-series described in ANSI C81.61 and C81.62: B/BX8.4d small instrument panel, BA9/12.5 miniature, BAW9s for HY21 W, BA15s candelabra single contact, BAZ15d double contact with offset, and BY22d multipurpose sleeved double contact.

In an embodiment, the light transmissive envelope 1304 is made from a light transmissive material with good thermal conductively, e.g. glass, plastic. In another embodiment, the light transmissive envelope 1304 is configured to absorb a portion of the blue light emitted by the LED filament to obtain a warmer color temperature. To make the light warmer, for example, the light transmissive envelope 1304 is made from a material doped with yellow particles. Alternatively, the light transmissive envelope is coated with a yellow film. In yet another embodiment, the light transmissive envelope 1304, which is hermetically connected to the base 1306, is charged with a gas having greater thermal conductivity than the air such as hydrogen, nitrogen and a mixture of both. In additional to greater heat dissipation, humidity, potentially undermining the electronics of the LED light bulb 1300, is thus removed from the light transmissive envelope 1304. In an embodiment, hydrogen accounts for from 5% to 50% of the volume of the light transmissive envelope 1304. In still another embodiment, the light transmissive envelope 1304 is sealed at an internal pressure of from 0.4 to 1.0 ATM.

The stem press 1308 is made from an electrically insulative material such as glass or plastic. The shape and dimension of the stem press 1308 depends a totality of considerations such as the number of LED filaments 1302 the LED light bulb 1300 has, the posture the LED filament 1302 is expected to maintain in the main chamber 1312; the manner the lead wire 1310 supports the LED filament 1302; the number of lead wires 1310 the LED light bulb 1300 has; whether the LED light bulb 1300 further includes support wires 1318; and whether or how a heatsink finds itself in the LED light bulb. In an embodiment, the stem press 1308 extends barely above the base. In another embodiment, the stem press extends above the base 1306 and into the neck 1314. In yet another embodiment, the stem press 1308 extends above the base 1306, through the neck 1314 and into the main chamber 1312. In some embodiments, the stem press 1308 is made from an electrically insulative material have good thermal conductivity such as aluminium oxide and aluminium nitride. In other embodiments, the stem press 1308 includes an opening for evacuating the air from the light transmissive envelope 1304 and for charging the light transmissive envelope 1304 with the desired amount of gas.

In some embodiments, the LED light bulb further includes a heatsink. The heatsink is made from materials have good thermal conductivity such as metal, thermal ceramics and thermal plastic. In some embodiments, the stem press, the base or both is made from a same material from which the heatsink is made. In other embodiments, an integral piece including a combination of at least two of the stem press, the base and the heat sink is formed with a same material to reduce the thermal resistance of the LED light bulb. The heatsink is in thermal communication with the LED filament and ambient air for transferring heat coming from the LED device to the ambient air. Preferably, the heatsink is in thermal communication with, in addition to the LED filament and ambient air, the stem press, the lead wire, the support wire, the base or any combination of the above.

Figure 44A:
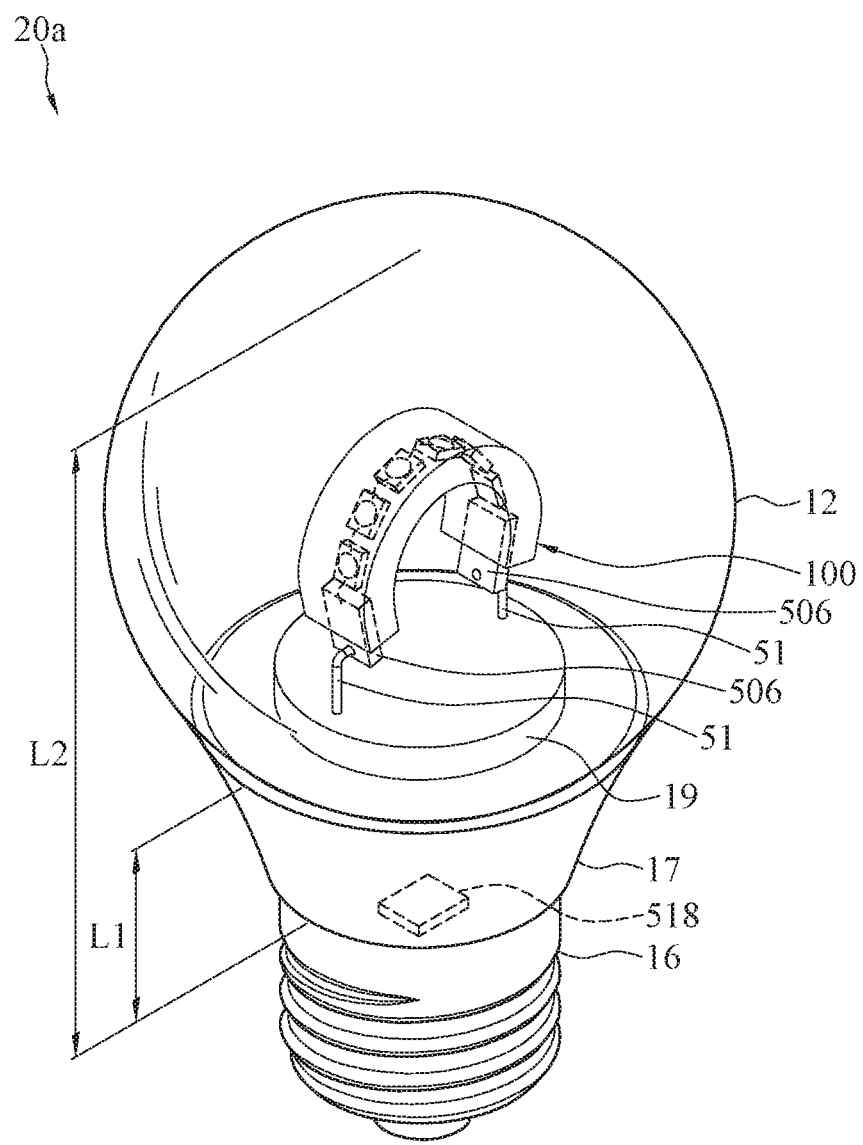
FIGS. 44A and 44B illustrate a perspective view of an LED light bulb according to a first and a second embodiments of the present disclosure.

The LED filament is designed to maintain a posture within the chamber to obtain an omnidirectional light emission. In FIG. 44A, the LED light bulb comprises a light transmissive envelope, a base, a stem press, exactly one LED filament, exactly a pair of lead wires, a heatsink and a rectifier. The heatsink is disposed between the light transmissive envelope and the base. The rectifier is disposed within the heatsink. The stem press includes a stump-like structure projecting from the base. The LED filament defines an arc extending substantially vertically in the light transmissive envelope. For easy reference, a Cartesian coordinate system is oriented for the LED light bulb where: (1) the interface connecting the light transmissive envelope and heatsink falls on the x-y plane; and (2) the z-axis, also the central axis of the LED light bulb, intersects the interface at point O. In the embodiment, the end point of the arc reaches as high as point H1 on the y-axis. The distance between the end points of the LED filament on the x-y plane is D. The length of LED filament on the y-axis is A. The posture of the LED filament in the LED light bulb is defined by all points in the set (0, y, z+H1), where z goes up from 0 to A and then from A back to 0 as y goes from −D/2 to 0 and then from 0 to D/2. The length of the heatsink along the z-axis is L1. The length of the combination of the light transmissive envelope and the heatsink along the z-axis is L2. The greater the ratio L1/L2 is, the LED light bulb is configured to have a better heat dissipation but potentially compromised filed of angle when the LED filament is elevated to a higher position within the light transmissive envelope. Preferably, the ratio L1/L2 is from 1/30 to 1/3.

Figure 44B:
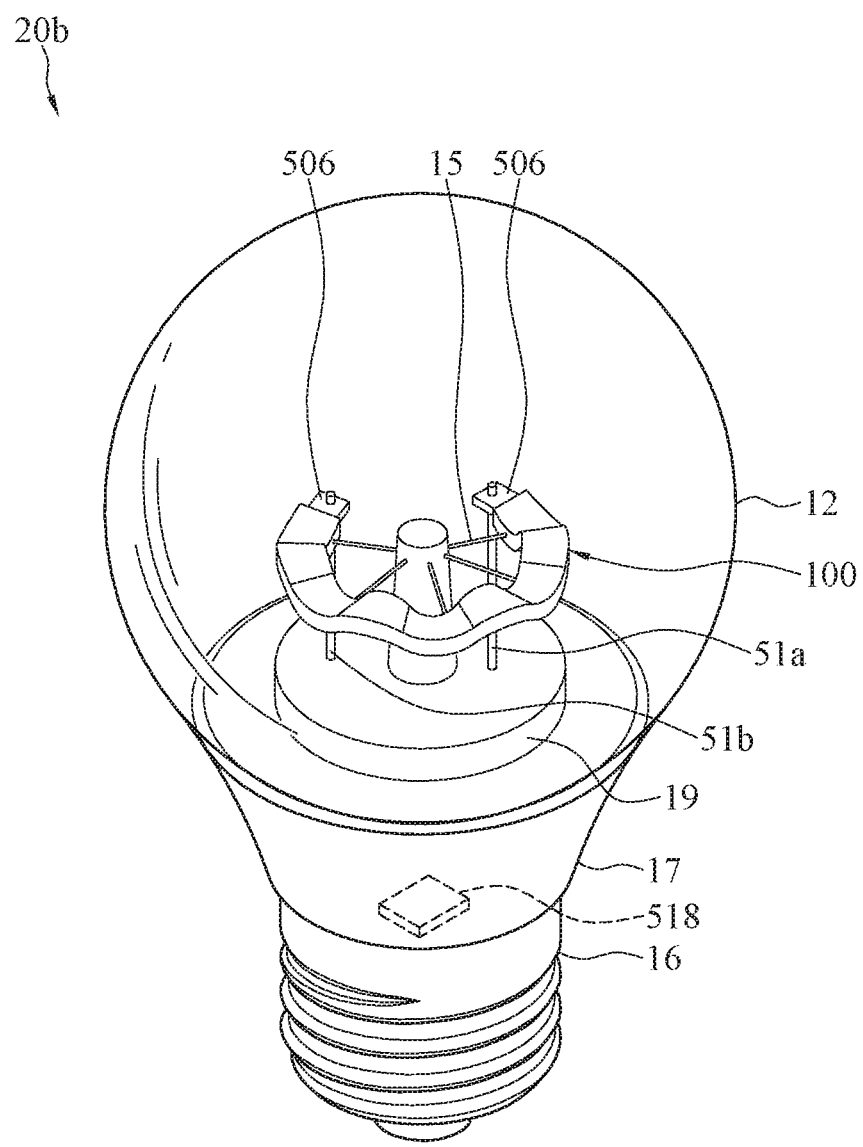

In FIG. 44B, the LED light bulb comprises a light transmissive envelope, a base, a stem press, exactly one LED filament, exactly a pair of lead wires, a heatsink, a rectifier and a plurality of support wires. The heatsink is disposed between the light transmissive envelope and the base. The rectifier is disposed within the heatsink. The stem press, unlike the one in FIG. 12A, further includes a post portion for elevating the LED filament to a desired position in the light transmissive envelope. The plurality of support wires radiate (horizontally, for example) from the post portion to form a spoke-and-hub structure in the light transmissive envelope. The support wire is attached to the post portion at a first end and to the LED filament at a second end. In the embodiment, the LED filament defines a sinuous curve along an arc meandering substantially horizontally in the light transmissive envelope. The sinuous curve oscillates in the range from H1+A1 to H1−A1 on the y-axis, where H1 represents the average height of the LED filament in the LED light bulb and A1 the amplitude of the sinuous curve the LED filament defines. The plurality of support wires have a same length R. The posture of the LED filament in the LED light bulb is defined by all points in the set (x, y, z+H1), where −R=<x=<R; −R=<y=<R; and −A1=<z=<A1. The LED filament, seen through the light transmissive envelope, is aesthetically pleasing when it is glowing or not. Moreover, omnidirectional light emission is made possible with only one LED filament having a posture like this. The quality as well the cost for producing omnidirectional LED light bulbs is thus improved because fewer interconnections of parts are needed when only one LED filament is involved.

Figure 45A:
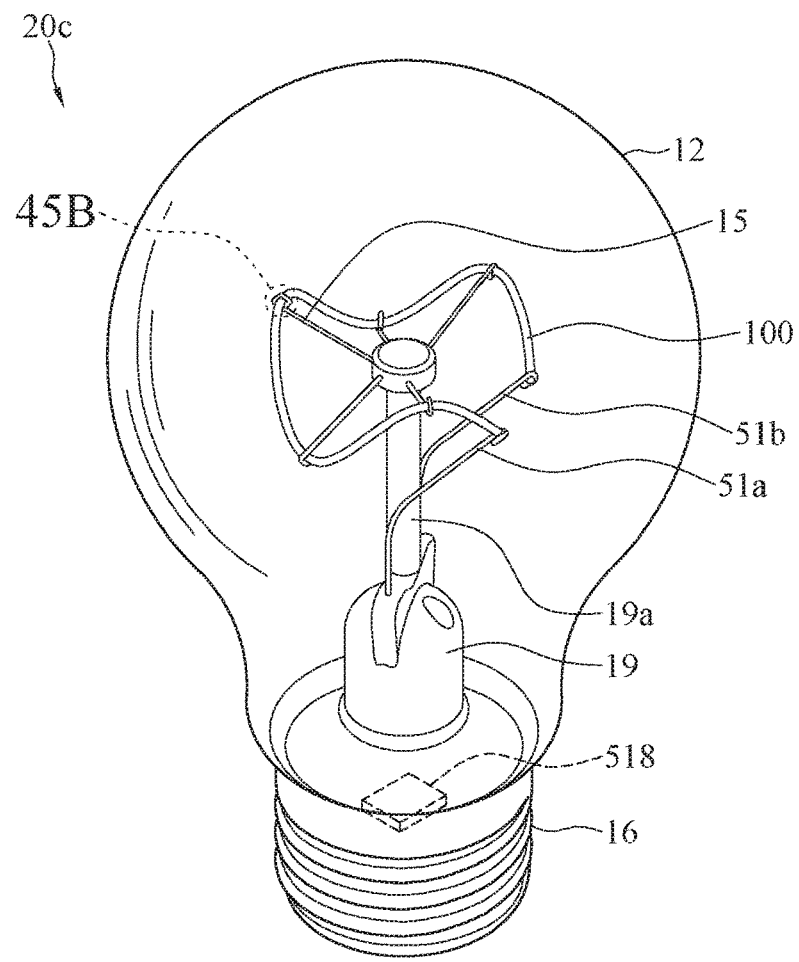
FIG. 45A illustrates a perspective view of an LED light bulb according to a third embodiment of the present disclosure.

In FIG. 45A, the LED light bulb comprises a light transmissive envelope, a base, a stem press, exactly one LED filament, exactly a pair of lead wires, a rectifier and a plurality of support wires. The light transmissive envelope has a bulbous main chamber for housing the LED filament and a neck for connecting the light transmissive envelope to the base. The rectifier is disposed within the base. The plurality of support wires radiate (slightly deviating from the horizon, for example) from the post portion to form a spoke-and-hub structure in the light transmissive envelope. The support wire is attached to the post portion at a first end and to the LED filament at a second end. In the embodiment, the LED filament defines a sinuous curve along an arc meandering substantially horizontally in the light transmissive envelope. The sinuous curve oscillates in the range from H2+A2 to H2−A2 on the y-axis, where H2 represents the average height of the LED filament in the LED light bulb and A2 the amplitude of the sinuous curve the LED filament defines. A2 is greater than A1; likewise, H2 is greater than H1. Consequently, the stem press in FIGS. 44A and 44B is a shorter structure projecting from projecting from the base. By contrast, the stem press we need in FIG. 45A to elevate the LED filament to a higher position in the main chamber becomes a longer structure having, for example, a basal portion and an elongated post portion. The plurality of support wires have a same length R. The posture of the LED filament in the LED light bulb is defined by all points in the set (x, y, z+H2), where −R=<x=<R; −R=<y=<R; and −A2=<z=<A2.

Figure 46A:
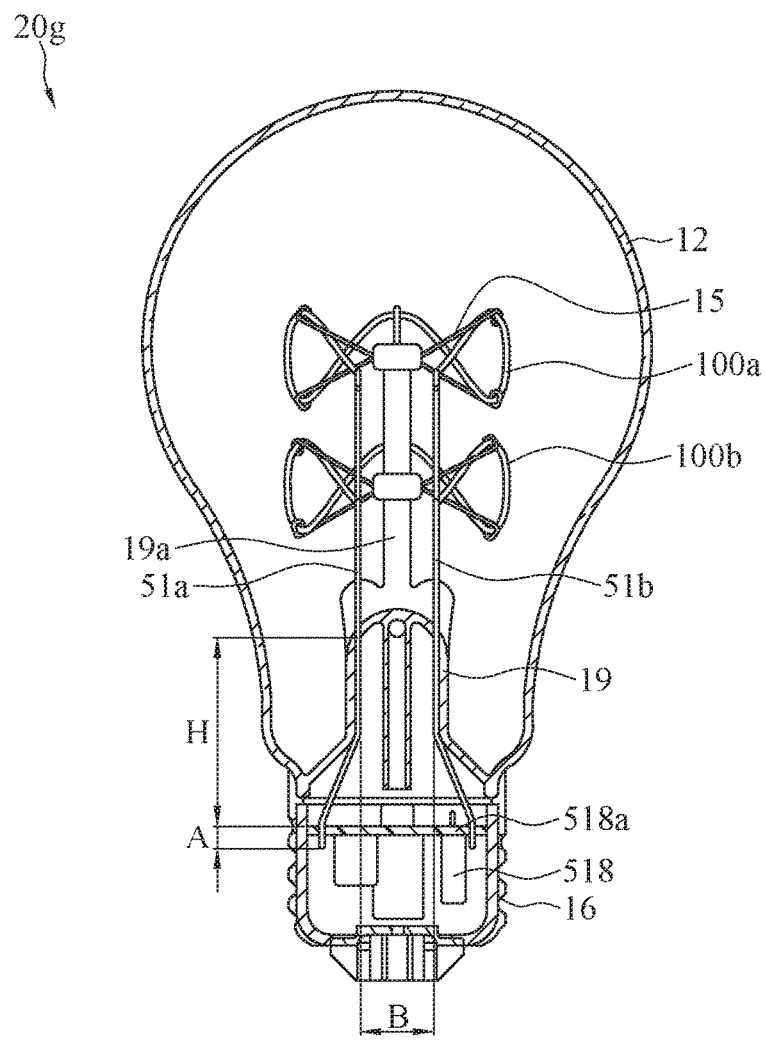
FIG. 46A illustrates a cross-sectional view of an LED light bulb according to a fourth embodiment of the present disclosure.

In FIG. 46A, the LED light bulb comprises a light transmissive envelope, a base, a stem press, an upper LED filaments, a lower LED filament, an upper set of lead wires, a lower set of lead wire, a rectifier and exactly two sets of support wires. The light transmissive envelope has a bulbous main chamber for housing the LED filament and a neck for connecting the light transmissive envelope to the base. The rectifier is disposed within the base. The set of support wires radiate (slightly deviating from the horizon, for example) from the post portion to form a spoke-and-hub structure in the light transmissive envelope. The support wire is attached to the post portion at a first end and to the LED filament at a second end. The upper set of support wires is configured to hold the upper LED filament in position. The lower set of support wires is configured to hold the lower LED filament in position. Other things equal, a shorter LED filament is needed to produce the same luminosity of omnidirectional light with the LED light bulb in FIG. 46A than the LED light bulb in FIG. 45A. Likewise, the LED light bulb in FIG. 46A is amenable to a smaller girth than the LED light bulb in FIG. 45A. In the embodiment, the LED filament defines a sinuous curve along an arc meandering substantially horizontally in the light transmissive envelope. The higher LED filament defines a higher sinuous curve oscillating in the range from H3+A3 to H3−A3 on the y-axis, where H3 represents the average height of the higher LED filament in the LED light bulb and A3 the amplitude of the first sinuous curve the higher LED filament defines. The lower LED filament defines a lower sinuous curve oscillating in the range from H4+A3 to H4−A3 on the y-axis, where H4 represents the average height of the lower LED filament in the LED light bulb and A3 the amplitude of the lower sinuous curve the lower LED filament defines. H4 is less than H3 on the y-axis, making one LED filament higher in the light transmissive envelope than the other one. A3 is chosen to be, for example, the same as that of the higher sinuous curve. The plurality of support wires have a same length R. The posture of the higher LED filament in the LED light bulb is defined by all points in the set (x, y, z+H3), where −R=<x=<R; −R=<y=<R; and −A3=<z=<A3. The posture of the lower LED filament in the LED light bulb is defined by all points in the set (x, y, z+H4), where −R=<x=<R; −R=<y=<R; and −A3=<z=<A3.

In the embodiment in FIG. 46A, the rectifier, which is disposed in the base, includes a circuit board in electrical communication with the lead wire. The pair of lead wires are parallelly spaced apart from each other. The upper portion of the lead wire is attached to the pair of LED filaments. The intermediate portion of the lead wire is fixedly attached to the basal portion of the stem press by passing through the basal portion. The lower portion of the lead wire is fixedly attached to the rectifier. In an embodiment, the circuit board includes an L-shaped aperture cut into the circumference of the circuit board. The lead wire includes a hook at the tip. The hook is configured to interlock the aperture for reliable soldering between the lead wire and the circuit board.

The lead wire has a proper length for connecting the circuit board and the LED filament. In an embodiment, for purposes of safety, the lead wire has a length determined by D (mm). D=A+√((B−3.2)^2+C^2), where 3.2 is the electricity safety spacing; A is the aggregate of the thickness of the circuit board and the length of the lead wire projecting downwards from the circuit board; B is the distance between the pair of lead wires; and C is distance from the entry point of the lead wire into the basal portion to the entry point of lead wire into the circuit board. Preferably, the length of the lead wire we need to reach the lower LED filament (L1) is from 0.5D to 2D. Most preferably, L1 is from 0.75D to 1.5D. The length of the lead wire we need to reach the upper LED filament (L2) is L1+(H3−H4).

In some embodiments, a layer of reflective materials, e.g. white paint, is coated to the support wire, the stem press, the upper surface of the base in the light transmissive envelope or any combination of the above for directing light outwards. In other embodiments, a layer of graphene, which has good thermal conductivity, is coated to the support wire, the stem press, the upper surface of the base in the light transmissive envelope or any combination of the above for better heat dissipation.

FIGS. 47A to 48C show a LED filament module comprising the LED filament of the present invention. The LED filament module includes a frame and a plurality of LED filaments operably connected to the frame. The frame comes in a variety of shapes to enable the plurality of LED filaments to jointly glow omnidirectionally in the LED light bulb. In some embodiments, the frame is made of an electrically conductive material such as copper. The plurality of LED filaments, in electrically communication with the frame, receive electrical power from the frame. In other embodiments, the frame is made of an electrically insulative material such as plastic. The LED filament module further includes an electrical wire system embedded in the frame.

The plurality of LED filaments, in electrical communication with the electrical wire system, receives electrical power from the electrical wire system. Preferably, the frame is made from materials having good thermal conductivity such as aluminum alloy. Preferably, the frame is made from flexible materials such as copper wire to accommodate the shape of the LED filament module. Preferably, the frame is made from light transmissive materials such as plastic. The plurality of LED filaments are electrically interconnected in series, in parallel or in a combination of both. In FIG. 15A, the LED module looks like a balcony rail. The frame includes a top rail and a bottom rail defining a pair of concentric arcs. The LED filament is attached to the top rail at one end and to the bottom rail at the other end. The plurality of LED filaments, spaced apart from one another, straddle the top rail and the bottom rail. In FIG. 47C, the top rail and the bottom rail define a pair of parallel lines. The LED filament is attached to the top rail at one end and to the bottom rail at the other end. The plurality of LED filaments, pairwise parallel, straddle the top rail and the bottom rail. In FIGS. 47D to 47F, the frame further includes a plurality of balusters configured to spatially coincide the plurality of LED filaments throughout the frame. The baluster is attached to the top rail at one end and the bottom rail at the other end. The baluster is either electrically conductive or insulative. In FIG. 47D, the plurality of balusters, spaced apart from one another, straddle the top rail and the bottom rail. While the top rail and the bottom rail are physically connected with the baluster, the baluster is not supposed to put the top rail and the bottom rail in electrical communication with each another. Insulation is obtained in a variety of ways. The entire baluster is made from or coated with an electrically insulative material. Alternatively, the interface where the baluster and the rail are joined is electrically insulative. Alternatively, the otherwise electrically conductive baluster includes an insulator. In FIG. 47E, the insulator is, for example, a piece of plastic or ceramics. In FIG. 47F, the insulator is air. In the embodiments in FIGS. 47A to 47F, the plurality of LED filaments are electrically connected in parallel. In other embodiments, the plurality of LED filaments are electrically connected in series. In FIG. 47G, the frame includes a plurality of insulators to form a serial circuit. The plurality of LED filaments are connected in series. The top rail includes a plurality of electrical conductors and a plurality of electrical insulators. The insulator is interposed between the conductors. Likewise, the bottom rail includes a plurality of electrical conductors and a plurality of electrical insulators. The insulator is interposed between the conductors. The frame is configured to form a serial circuit as shown in FIG. 47H. In some embodiments, the frame includes a plurality of diodes to form a serial circuit.

A spindle is provided to facilitate assembly of the LED filament module. The shape of the spindle depends on the posture the LED filament module is expected to maintain when it is deployed in the LED light bulb. In FIGS. 47I and 47J, the spindle approximates a truncated cone for constructing LED filament modules like those shown in FIGS. 47K and 47L. The plurality of LED filaments and the frame are assembled on the lateral surface of the cone. The frame is given shape by pressing the upper rail against the tapered portion of the spindle and by pressing lower rail against the base portion of the spindle. The LED filament is lined up one by one around the cone straddling the upper rail and the lower rail. In FIG. 47K, the LED filament module is constructed with the spindle for using with the LED light bulb in FIG. 47A. Exactly one opening is left with the circle defined by the upper rail. Exactly one opening is left with the circle defined by the lower rail. In FIG. 47L, the LED filament module is constructed with the spindle for using with the LED light bulb in FIG. 48C. Exactly two openings are left in the circle defined by the upper rail. Exactly two openings are left in the circle defined by the lower rail. In FIG. 48D, exactly one opening is left with the circle defined by the upper rail. However, exactly two openings are left with the circle defined by the lower rail. In FIG. 48A, the LED filament module is mounted within the main chamber of the light transmissive envelope axially around the post portion of the stem press. The LED filament module is kept in position with a plurality of support wires and a plurality of lead wires. The support wire is attached to the tip of the post portion of the stem press at one end and attached to the upper rail of the frame at the other end. The lead wire is attached to the basal portion of the stem press at one end and attached to the lower rail of the frame at the other end. In the embodiment, a pair of the support wires extend diametrically from the tip of the post portion of the stem press. Referring to FIG. 48B, the post portion includes a swollen portion at the top end. The support wire is fixedly embedded in the swollen portion at one end. The support wire includes a hook at the other end. The throat of the hook, facing upwards, is configured to receive the upper rail of the frame in the throat. In FIG. 48C, the left half of the LED filament module is disposed within the left half of main chamber of the light transmissive envelope axially around the post portion of the stem press. The right half of LED filament module is disposed within the right half of main chamber of the light transmissive envelope axially around the post portion of the stem press. The LED filament module is kept in position with a plurality of support wires and a plurality of lead wires. In the embodiment, the left support wire is attached to the tip of the post portion of the stem press at one end and attached to the left upper rail of the frame at the other end. The left lead wire is attached to the basal portion of the stem press at one end and attached to the left upper rail of the frame at the other end. Similarly, the right support wire is attached to the tip of the post portion of the stem press at one end and attached to the right upper rail of the frame at the other end. The right lead wire is attached to the basal portion of the stem press at one end and attached to the right upper rail of the frame at the other end. In FIG. 48D, the LED filament module is mounted within the main chamber of the light transmissive envelope axially around the post portion of the stem press. The LED filament module is kept in position with a plurality of support wires and a plurality of lead wires. In the embodiment, the support wire is attached to the tip of the post portion of the stem press at one end and attached to the upper rail of the frame at the other end. The left lead wire is attached to the basal portion of the stem press at one end and attached to the left lower rail of the frame at the other end. Similarly, the right lead wire is attached to the basal portion of the stem press at one end and attached to the right lower rail of the frame at the other end. In some embodiments, the plurality of lead wires extend vertically to the frame of the LED filament module. In other embodiments like the one in FIG. 48D, the pair of lead wires project from the basal portion in a V-pattern.

Figure 33:
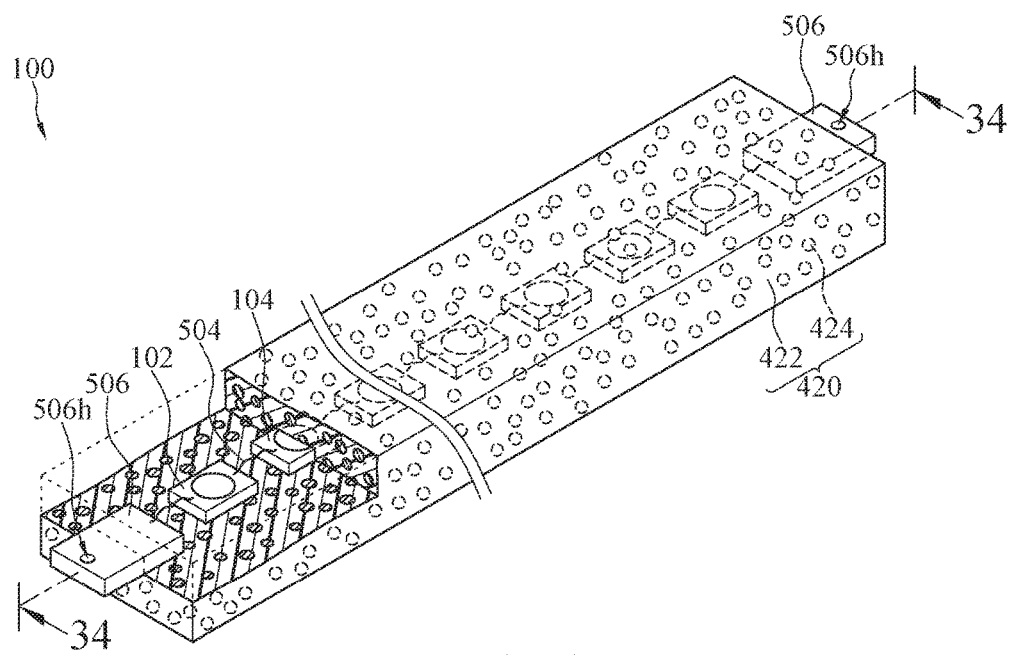
FIG. 33 illustrates a perspective view of an LED light bulb with partial sectional view according to a first embodiment of the LED filament.
Figure 34:
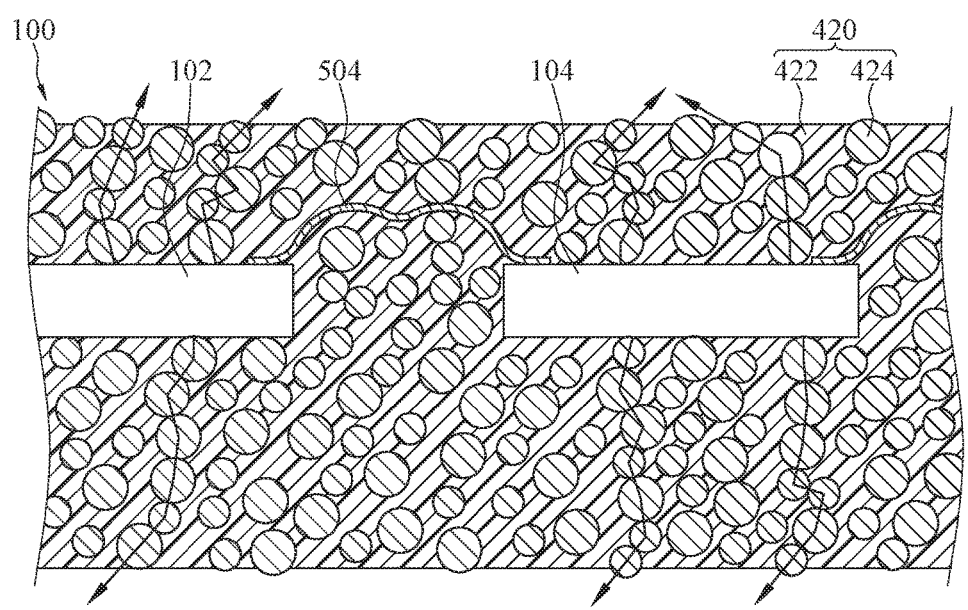
FIG. 34 illustrates a partial cross-sectional view at section 34-34 of FIG. 33.

Please refer to FIGS. 33 and 34. FIG. 33 illustrates a perspective view of an LED filament with partial sectional view according to a first embodiment of the present disclosure while FIG. 34 illustrates a partial cross-sectional view at section 34-34 of FIG. 33. According to the first embodiment, the LED filament 100 comprises a plurality of LED chips 102, 104, at least two conductive electrodes 506, and a light conversion coating 420. The conductive electrodes 506 are disposed corresponding to the plurality of LED chips 102, 104. The LED chips 102, 104 are electrically coupled together. The conductive electrodes 506 are electrically connected with the plurality of LED chips 102, 104. The light conversion coating 420 coats on at least two sides of the LED chips 102, 104 and the conductive electrodes 506. The light conversion coating 420 exposes a portion of two of the conductive electrodes 506. The light conversion coating 420 comprises an adhesive 422 and a plurality of phosphors 424.

LED filament 100 emits light while the conductive electrodes 506 are applied with electrical power (electrical current sources or electrical voltage sources). In this embodiment, the light emitted from the LED filament 100 is substantially close to 360 degrees light like that from a point light source. An LED light bulb 20a, 20b, illustrated is in FIGS. 44A and 44B, utilizing the LED filament 100 is capable of emitting omnidirectional light, which will be described in detailed in the followings.

As illustrated in the FIG. 33, the cross-sectional outline of the LED filament 100 is rectangular. However, the cross-sectional outline of the LED filament 100 is not limited to rectangular, but may be triangle, circle, ellipse, square, diamond, or square with chamfers.

Each of LED chips 102, 104 may comprise a single LED die or a plurality of LED dies. The outline of the LED chip 102, 104 may be, but not limited to, a strip shape. The number of the LED chips 102, 104 having strip shapes of the LED filament 100 could be less, and, correspondingly the number of the electrodes of the LED chips 102, 104 is less, which can improve the illuminating efficiency since the electrodes may shield the illumination of the LED chip, thereby affecting the illumination efficiency. In addition, the LED chips 102, 104 may be coated on their surfaces with a conductive and transparent layer of Indium Tin Oxide (ITO). The metal oxide layer contributes to uniform distribution of the current diffusion and to increase of illumination efficiency. Specifically, the aspect ratio of the LED chip may be 2:1 to 10:1; for example, but not limited to, 14×28 or 10×20. Further, the LED chips 102, 104 may be high power LED dies and are operated at low electrical current to provide sufficient illumination but less heat.

The LED chips 102, 104 may comprise sapphire substrate or transparent substrate. Consequently, the substrates of the LED chips 102, 104 do not shield/block light emitted from the LED chips 102, 104. In other words, the LED chips 102, 104 are capable of emitting light from each side of the LED chips 102, 104.

The electrical connections among the plurality of LED chips 102, 104 and the conductive electrodes 506, in this embodiment, may be shown in FIG. 33. The LED chips 102, 104 are connected in series and the conductive electrodes 506 are disposed on and electrically and respectively connected with the two ends of the series-connected LED chips 102, 104. However, the connections between the LED chips 102, 104 are not limited to that in FIG. 33. Alternatively, the connections may be that two adjacent LED chips 102, 104 are connected in parallel and then the parallel-connected pairs are connected in series.

Figure 35A:
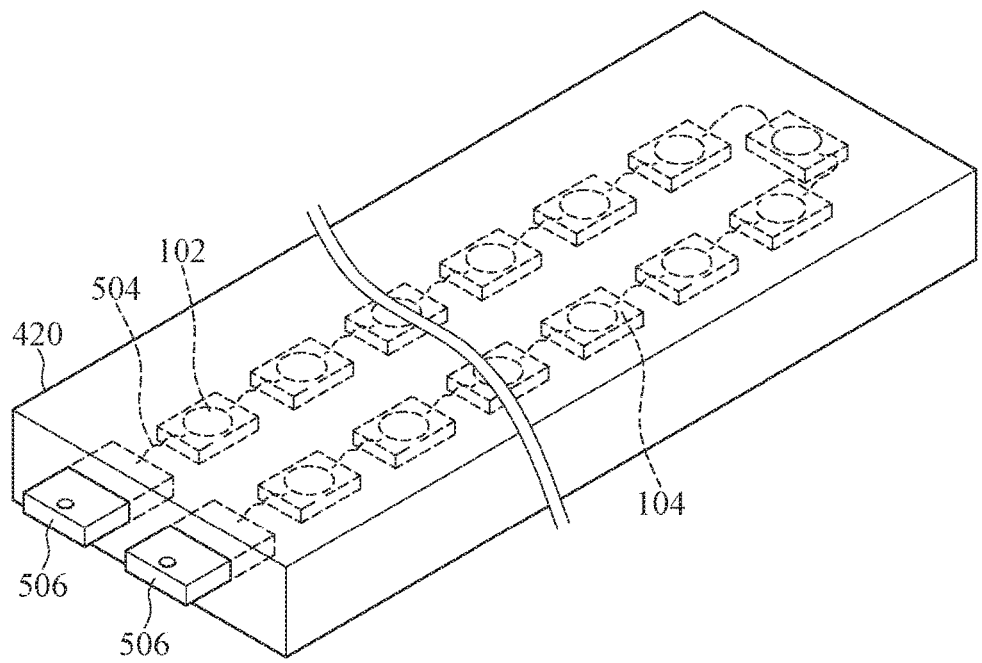
FIGS. 35A and 35B illustrate disposition of the metal electrodes and the plurality of LED chips according to other embodiments of the LED filament.
Figure 35B:
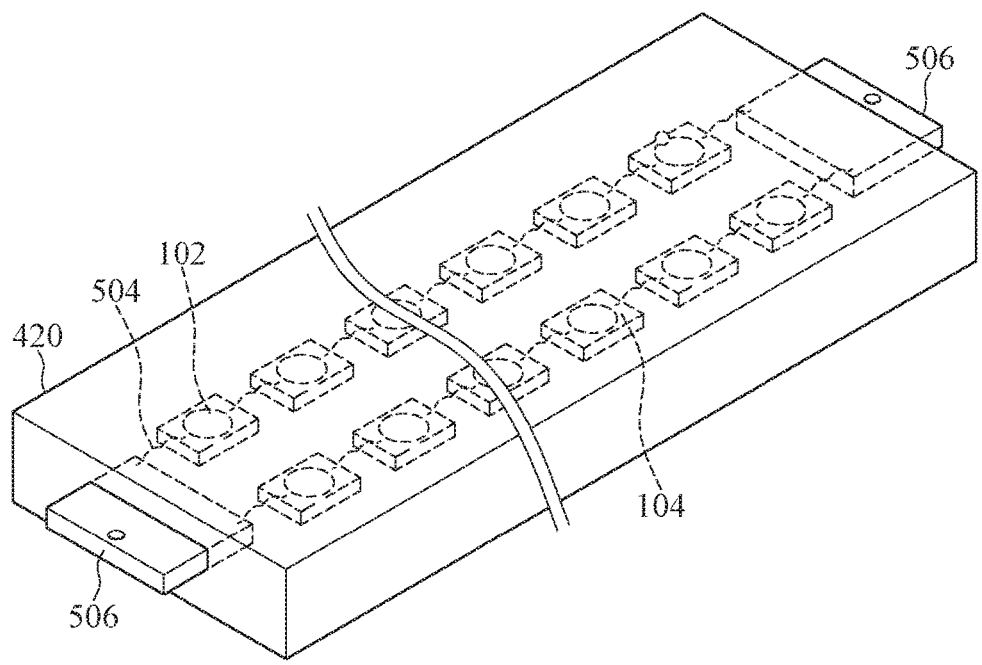

According to this embodiment, the conductive electrodes 506 may be, but not limited to, metal electrodes. The conductive electrodes 506 are disposed at two ends of the series-connected LED chips 102, 104 and a portion of each of the conductive electrodes 506 are exposed out of the light conversion coating 420. The arrangement of the conductive electrodes 506 is not limited to the aforementioned embodiment. Please refer to FIGS. 35A and 35B which illustrate disposition of metal electrodes and a plurality of LED chips according to other embodiments of the LED filament. In the embodiment of FIG. 35A, the LED chips 102, 104 are connected in series and the two ends of the series-connected LED chips 102, 104 are positioned at the same side of the LED filament 100 to form an U shape. Accordingly, the two conductive electrodes 506 are positioned at the same side as the ends of the series-connected LED chips 102, 104. According to the embodiment of FIG. 35B, the LED chips 102, 104 are disposed along two parallel LED strips and the LED chips 102, 104 along the same LED strip are connected in series. Two conductive electrodes 506 are disposed at two ends of the two parallel and series-connected LED chips 102, 104 and electrically connected to each of ends of the series-connected LED chips 102, 104. In this embodiment of FIG. 35B, there are, but not limited to, only two conductive electrodes 506. For examples, the LED filament 100, in practices, may comprise four sub-electrodes. The four sub-electrodes are connected to four ends of the series-connected LED chips 102, 104, respectively. The sub-electrodes may be connected to anode and ground as desired. Alternatively, one of two conductive electrodes 506 may be replaced with two sub-electrodes, depending upon the design needs.

Please further refer to FIG. 44A. The conductive electrodes 506 has through holes 506h (shown in FIG. 33) on the exposed portion for being connected with the conductive supports 51a, 51b of the LED light bulb 20a.

Please refer to FIGS. 33 and 34 again. According to this embodiment, the LED filament 100 further comprises conductive wires 540 for electrically connecting the adjacent LED chips 102, 104 and conductive electrodes 506. The conductive wires 540 may be gold wires formed by a wire bond of the LED package process, like Q-type. According to FIG. 34, the conductive wires 540 are of M shape. The M shape here is not to describe that the shape of the conductive wires 540 exactly looks like letter M, but to describe a shape which prevents the wires from being tight and provides buffers when the conductive wires 540 or the LED filament 100 is stretched or bended. Specifically, the M shape may be any shape formed by a conductive wire 540 whose length is longer than the length of a wire which naturally arched between two adjacent LED chips 102, 104. The M shape includes any shape which could provide buffers while the conductive wires 104 are bended or stretched; for example, S shape.

The light conversion coating 420 comprises adhesive 422 and phosphors 424. The light conversion coating 420 may, in this embodiment, wrap or encapsulate the LED chips 102, 104 and the conductive electrodes 506. In other words, in this embodiment, each of six sides of the LED chips 102, 104 is coated with the light conversion coating 420; preferably, but not limited to, is in direct contact with the light conversion coating 420. However, at least two sides of the LED chips 102, 104 may be coated with the light conversion coating 420. Preferably, the light conversion coating 420 may directly contact at least two sides of the LED chips 102, 104. The two directly-contacted sides may be the major surfaces which the LED chips emit light. Referring to FIG. 33, the major two surfaces may be the top and the bottom surfaces. In other words, the light conversion coating 420 may directly contact the top and the bottom surfaces of the LED chips 102, 104 (upper and lower surfaces of the LED chips 102, 104 shown in FIG. 34). Said contact between each of six sides of the LED chips 102, 104 and the light conversion coating 420 may be that the light conversion coating 420 directly or indirectly contacts at least a portion of each side of the LED chips 102, 104. Specifically, one or two sides of the LED chips 102, 104 may be in contact with the light conversion coating 420 through die bond glue. The light conversion coating 420 may further comprise heat dissipation particles (such as nanoparticle oxide) to improve the effect of heat dissipation. In following embodiments, the heat dissipation particles may be nanoparticle oxide. In some embodiments, the die bond glue may be mixed with phosphors to increase efficiency of light conversion. The die bond glue may be silica gel or silicone resin mixed with silver powder or heat dissipating powder to increase effect of heat dissipation thereof. The adhesive 422 may be silica gel. In addition, the silica gel may be partially or totally replaced with polyimide, resin materials (e.g., silicone resin), or other transparent material with greater transmittance (e.g., glass or graphene oxide) to improve the toughness of the light conversion coating 420 and to reduce possibility of cracking or embrittlement.

The phosphors 424 of the light conversion coating 420 absorb some form of radiation to emit light. For instance, the phosphors 424 absorb light with shorter wavelength and then emit light with longer wavelength. In one embodiment, the phosphors 424 absorb blue light and then emit yellow light. The blue light which is not absorbed by the phosphors 424 mixes with the yellow light to form white light. According to the embodiment where six sides of the LED chips 102, 104 are coated with the light conversion coating 420, the phosphors 424 absorb light with shorter wavelength out of each of the sides of the LED chips 102, 104 and emit light with longer wavelength. The mixed light (longer and shorter wavelength) is emitted from the outer surface of the light conversion coating 420 which surrounds the LED chips 102, 104 to form the main body of the LED filament 100. In other words, each of sides of the LED filament 100 emits the mixed light.

The light conversion coating 420 may expose a portion of two of the conductive electrodes 506. Phosphors 424 are harder than the adhesive 422. The size of the phosphors 424 may be 1 to 30 um (micrometer) or 5 to 20 um. The size of the same phosphors 424 are generally the same. In FIG. 34, the reason why the cross-sectional sizes of the phosphors 424 are different is the positions of the cross-section for the phosphors 424 are different. The adhesive 422 may be transparent, for example, epoxy resin, modified resin or silica gel, and so on.

The composition ratio of the phosphors 424 to the adhesive 422 may be 1:1 to 99:1, or 1:1 to 50:1. The composition ratio may be volume ratio or weight ratio.

Please refer to FIG. 34 again. The amount of the phosphors 424 is greater than the adhesive 422 to increase the density of the phosphors 424 and to increase direct contacts among phosphors 424. The arrow lines on FIG. 34 show thermal conduction paths from LED chips 102, 104 to the outer surfaces of the LED filament 100. The thermal conduction paths are formed by the adjacent and contacted phosphors. The more direct contacts among the phosphors 424, the more thermal conduction paths forms, the greater the heat dissipating effect the LED filament 100 has, and the less the light conversion coating becomes yellow. Additionally, the light conversion rate of the phosphors 424 may reach 30% to 70% and the total luminance efficiency of the LED light bulb 20a, 20b is increased. Further, the hardness of the LED filament 100 is increased, too. Accordingly, the LED filament 100 may stand alone without any embedded supporting component like rigid substrates. Furthermore, the surfaces of cured LED filament 100 are not flat due to the protrusion of some of the phosphors 424. In other words, the roughness of the surfaces and the total surface area are increased. The increased roughness of the surfaces improves the amount of light passing the surfaces. The increased surface area enhances the heat dissipating effect. As a result, the overall luminance efficiency of the LED light filament 100 is raised. In some embodiments, the surface of the light conversion coating may be of a lens shape. Different lens shape may cause different optical effects. In some embodiments, there may be one or more gaps inside the light conversion coating to improve the effect of heat dissipation. In another embodiment, the percentage of the adhesive 422 (or other transparent resins) by weight may be 60 wt % or less, and the percentage of the phosphors 424 by weight may be 30 wt % or greater Next, LED chips 102, 104 may comprise LED dies which emit blue light. The phosphors 424 may be yellow phosphors (for example Garnet series phosphors, YAG phosphors), so that the LED filament 100 may emit white light. In practices, the composition ratio of phosphors 424 to the adhesive 422 may be adjusted to make the spectrum of the white light emitted from the LED filament 100 closer to that emitted from incandescent bulbs. Alternatively, the phosphors 424 may be powders which absorb blue light (light with shorter wavelength) and emit yellow green light (hereinafter referred to yellow green powders) or emit red light (hereinafter referred to red powders) (light with longer wavelength). The light conversion coating 420 may comprise less red powders and more yellow green powders, so that the CCT (corrected color temperature) of the light emitted from the LED filament 100 may close to 2,400 to 2,600 K (incandescent light). The ratio of the red powders and yellow green powders may be 1:5 to 1:7.

As mention above, a desired deflection of the LED filament 100 may be achieved by the adjustment of the ratio of phosphors 424 to the adhesive 422. For instance, the Young's Modulus (Y) of the LED filament 100 may be between $0.1 \times 10^{10}$ to $0.3 \times 10^{10}$ Pa. If necessary, the Young's Modulus of the LED filament 100 may be between $0.15 \times 10^{10}$ to $0.25 \times 10^{10}$ Pa. Consequently, the LED filament 100 would not be easily broken and still possess adequate rigidity and deflection.

Figure 36:
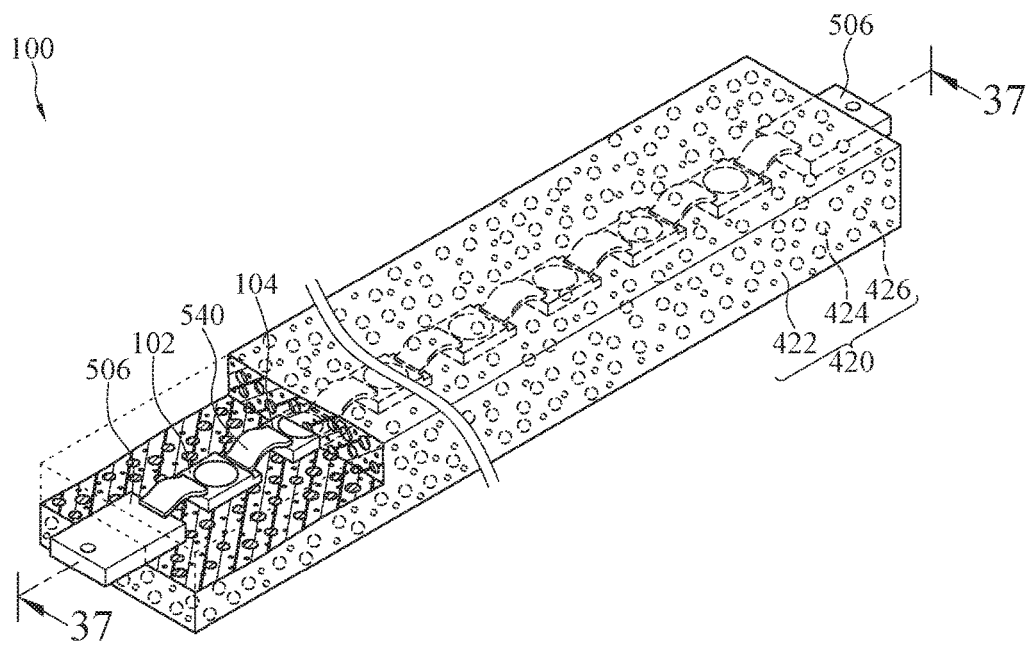
FIG. 36 illustrates a perspective view of an LED filament with partial sectional view according to a second embodiment of the present disclosure.
Figure 37:
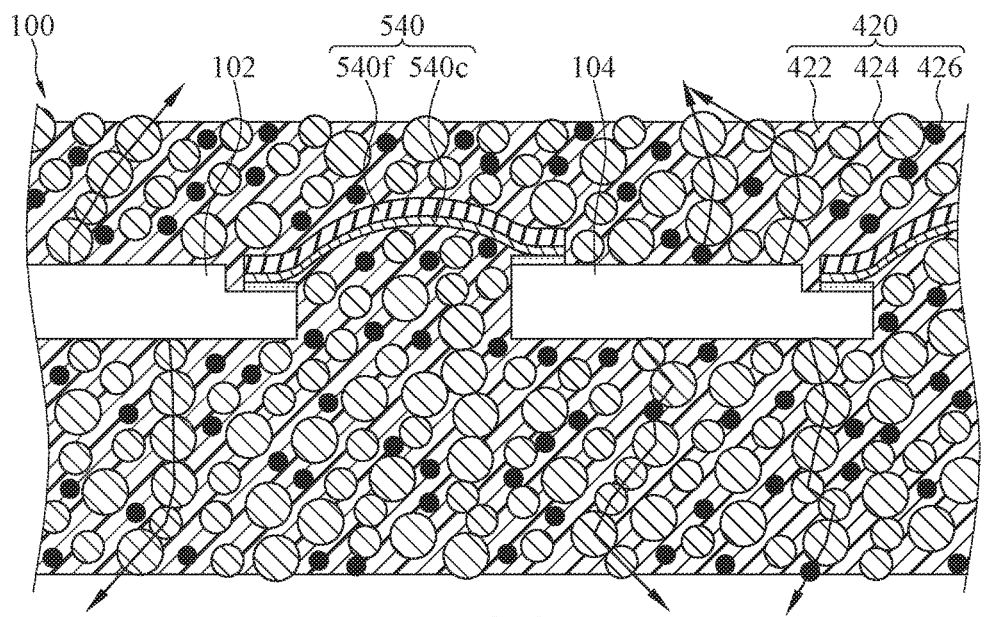
FIG. 37 illustrates a partial cross-sectional view at section 37-37 of FIG. 36.

Please refer to FIGS. 36 to 37. FIG. 36 illustrates a perspective view of an LED light bulb with partial sectional view according to a second embodiment of the LED filament and FIG. 37 illustrates a partial cross-sectional view at section 37-37 of FIG. 36.

According to the second embodiment of the LED filament 100, the LED filament 100 comprises a plurality of LED chips 102, 104, at least two conductive electrodes 506, and a light conversion coating 420. The conductive electrodes 506 are disposed corresponding to the plurality of LED chips 102, 104. The plurality of LED chips 102, 104 and the conductive electrodes 506 are electrically connected therebetween. The light conversion coating 420 coats on at least two sides of the LED chips 102, 104 and the conductive electrodes 506. The light conversion coating 420 exposes a portion of two of the conductive electrodes 506. The light conversion coating 420 comprises an adhesive 422, a plurality of inorganic oxide nanoparticles 426 and a plurality of phosphors 424.

The size of the plurality of inorganic oxide nanoparticles 426 is around 10 to 300 nanometers (nm) or majorly is around 20 to 100 nm. The size of the plurality of inorganic oxide nanoparticles 426 is lesser than that of the phosphors 424.

The plurality of the inorganic oxide nanoparticles 426 which server as heat dissipation particles may be, but not limited to, aluminium oxides (Al$_2$O$_3$), silicon oxide (SiO$_2$), zirconium oxide (Zirconia, ZrO$_2$), titanic oxide (TiO$_2$), Calcium oxide (CaO), strontium oxide (SrO), and Barium oxide (BaO). The inorganic oxide nanoparticles 426 may also be other heat dissipation particles having greater thermal conductivity or/and thermal emissivity for heat dissipation and transmittance. For example, the reaction metals of the aforementioned oxide can be replaced by nitride generated by the reaction of nitrogenization, such as Aluminum nitride (AlN). The average size of the inorganic nanoparticles may be from 10 to 300 nm. The size of most of the inorganic nanoparticles is from 20 to 100 nm. In addition, there are heat dissipation nanoparticles with sizes less than 100 nm. Further, the size of the heat dissipation nanoparticles may be less than 100 um.

As shown in FIG. 37, the inorganic oxide nanoparticles 426 and the phosphors 424 are mixed with the adhesive 422. The unit prices and the hardness of the inorganic oxide nanoparticles 426 and the phosphors 424 are different. Therefore, a desired deflection, thermal conductivity, hardness, and cost of the LED filament 100 may be reached by adjustment of the ratio of the adhesive 422, phosphors 424 to the inorganic oxide nanoparticles 426 affects. In addition, due that the size of the inorganic oxide nanoparticles 426 is lesser than that of the phosphors 424, the inorganic oxide nanoparticles 426 may fill into the gaps among the phosphors 424. Hence, the contact area among the phosphors 424 and the inorganic oxide nanoparticles 426 is increased and thermal conduction paths are increased as shown by arrow lines on FIG. 37, too. The thermal conductivity of typical transparent glue may be 0.2 W/mk to 3 W/mk. The thermal conductivity of a phosphor film/phosphor glue formed with phosphor powders/heat dissipation particles may be 0.5 W/mk to 3 W/mk. Further, the inorganic oxide nanoparticles 426 may deflect or scatter light incident thereon. The light deflection and scattering make the light emitted from phosphors 424 mixed more uniformly and the characteristics of the LED filament 100 becomes even better. Furthermore, the impedance of the inorganic oxide nanoparticles 426 is high and no electrical leakage would happen through the inorganic oxide nanoparticles 426.

In some embodiments, the phosphors 424 are substantially uniformly distributed in the adhesive 422 (for instance, in silica gel, the polyimide or resin materials). Each of the phosphors 424 may be partially or totally wrapped by the adhesive 422 to improve the cracking or embrittlement of the light conversion coating 420. In the case that not each of the phosphors 424 is totally wrapped by the adhesive 422, the cracking or embrittlement of the light conversion coating 420 is still improved. In some embodiments, silica gel may be mixed with the polyimide or resin materials to form the light conversion coating 420.

The LED filament 100 further comprises a plurality of circuit film 540 (or call as transparent circuit film) for electrically and correspondingly connected among the plurality of LED chips and the conductive electrodes. Specifically, the plurality of circuit film 540 is electrically connecting the adjacent LED chips 102, 104 and conductive electrodes 506. The light conversion coating 420 may encapsulate the plurality of circuit film 540.

Figure 38A:
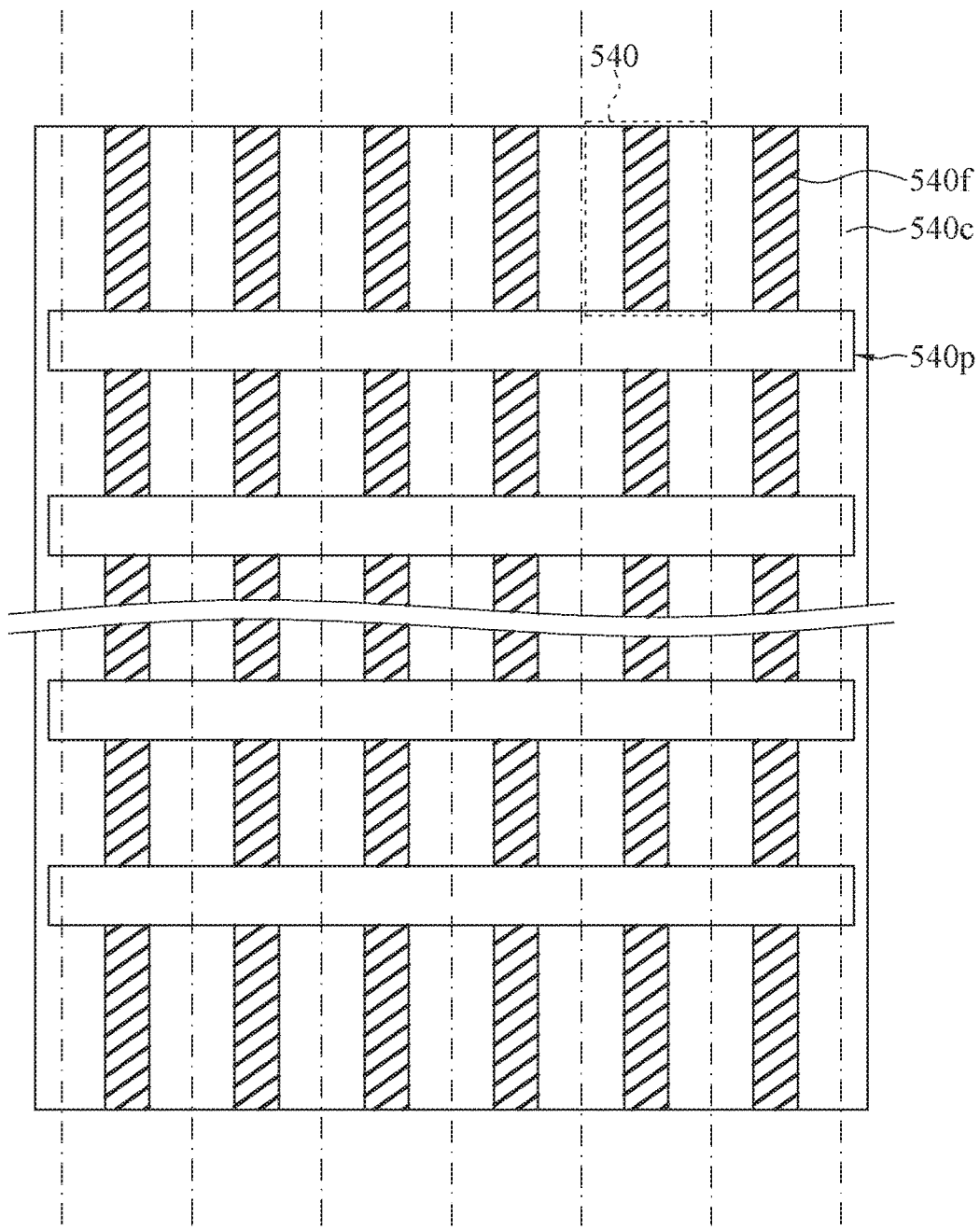
FIG. 38A illustrates a first embodiment of the uncut circuit film according to the second embodiment of the LED filament.

Please refer to FIG. 38A. FIG. 38A illustrates a first embodiment of the uncut circuit film according to the second embodiment of the LED filament 100. Each of the circuit films 540 comprises a first film 540f and a conductive circuit 540c disposed on the first film 540f. The first film 540f in one embodiment may be, but not limited to, a thin film. In order to be easily understood the embodiments, the following description uses thin film as an example for the first film 540f. However, the thin film 540f is not the only embodiment for the first film 540f. The thin film 540f may be a transparent or translucent film. The transparent film may allow light emitted from the LED chips 102, 104 and/or phosphors 424 to pass. The conductive circuits 540c are electrically and correspondingly connected among the plurality of LED chips 102, 104 and the conductive electrodes 506. In this embodiment, the conductive circuits 540c are of bar shape and substantially parallel to each other. However, the conductive circuits 540c may be in other shape or pattern. Please refer to FIG. 39A which illustrates a second embodiment of the uncut circuit film according to the second embodiment of the LED filament. Each of the circuit films 540a comprises a thin film 540f and a conductive circuit 540c disposed on the thin film 540f. The conductive circuits 540c are substantially parallel lines electrically connected with pads of adjacent LED chips 102, 104 as shown in FIG. 39B. Please refer to FIG. 40A which illustrates a third embodiment of the uncut circuit film according to the second embodiment of the LED filament. Each of the circuit films 540b comprises a thin film 540f and a conductive circuit 540c disposed on the thin film 540f. The conductive circuits 540c are crossover lines electrically connected with pads of adjacent LED chips 102, 104 as shown in FIG. 40B. The width of the lines may be 10 micrometers (um) and the thickness of the lines may be 2 um. The pattern or shape of the conductive circuits 540c are not limited to the above-mentioned embodiments, any pattern or shape which is capable of connecting pads of adjacent LED chips 102, 104 and conductive electrodes 506 are feasible.

The thin film 540f may be, but not limited to, Polyimide film (PI film). Transmittance of the polyimide film is above 92%. The material of the conductive circuit 540c may be, but not limited to, indium tin oxide (ITO), nano-silver plasma, metal grids, or nano-tubes. The advantages of Silver include good reflection and low light absorption. Nano-scaled silver lines in grid shape have advantages of low resistance and high penetration of light. In addition, gold-doped nano-silver lines may enhance the adherence between the pads of the LED chips 202, 204 and the sliver lines (conductive circuits).

Please refer to FIG. 38A again. The circuit film 540 may be made by firstly forming conductive circuits 540c on a thin film 540f, and then forming slots 540p on the thin film 540f with the conductive circuits 540c.

Please refer to FIG. 6A. The conductive circuits 540c do not cover the whole surface of the thin film 540f. Consequently, light emitted from the LED chips 102, 104 can pass through the circuit film 540 at least from the portion of the thin film 540f where the conductive circuits 540c do not occupy. In the second embodiment, the circuit film 540 is used to electrically connect with adjacent LED chips 102, 104 and the conductive electrodes 506. The circuit film 540 has the advantages of wider conductive lines, better deflection, and better toughness (less possibility of being broken) than the conductive wires 540 in the first embodiments.

Regarding the electrical connection among the circuit film 540, LED chips 102, 104, and the conductive electrodes 506, conductive glues may be applied on the surfaces of the LED chips 102, 104 and the conductive electrodes 506 where the conductive circuits 540c are going to electrically connect. The conductive glues may be, but not limited to, silver paste, solder paste (tin paste), or conductive glues doped with conductive particles. Then, dispose the circuit film 540 on the LED chips 102, 104 and the conductive electrodes 506 with adequate alignment and cure the circuit film 540 and the conductive glues by heat or UV.

Figure 41A:
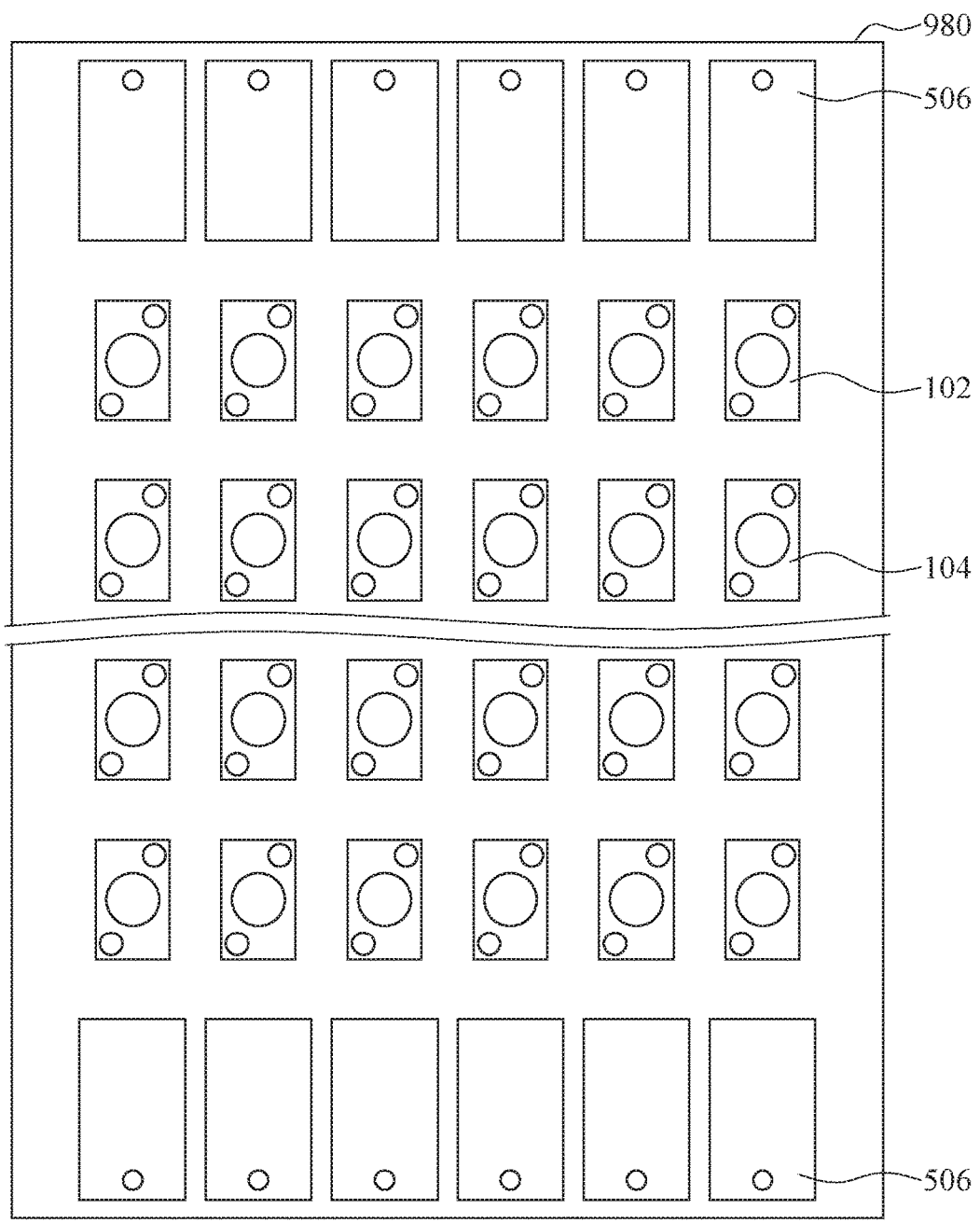
FIGS. 41A to 41E illustrate a manufacturing method of an LED filament according to a first embodiment of the present disclosure.
Figure 41B:
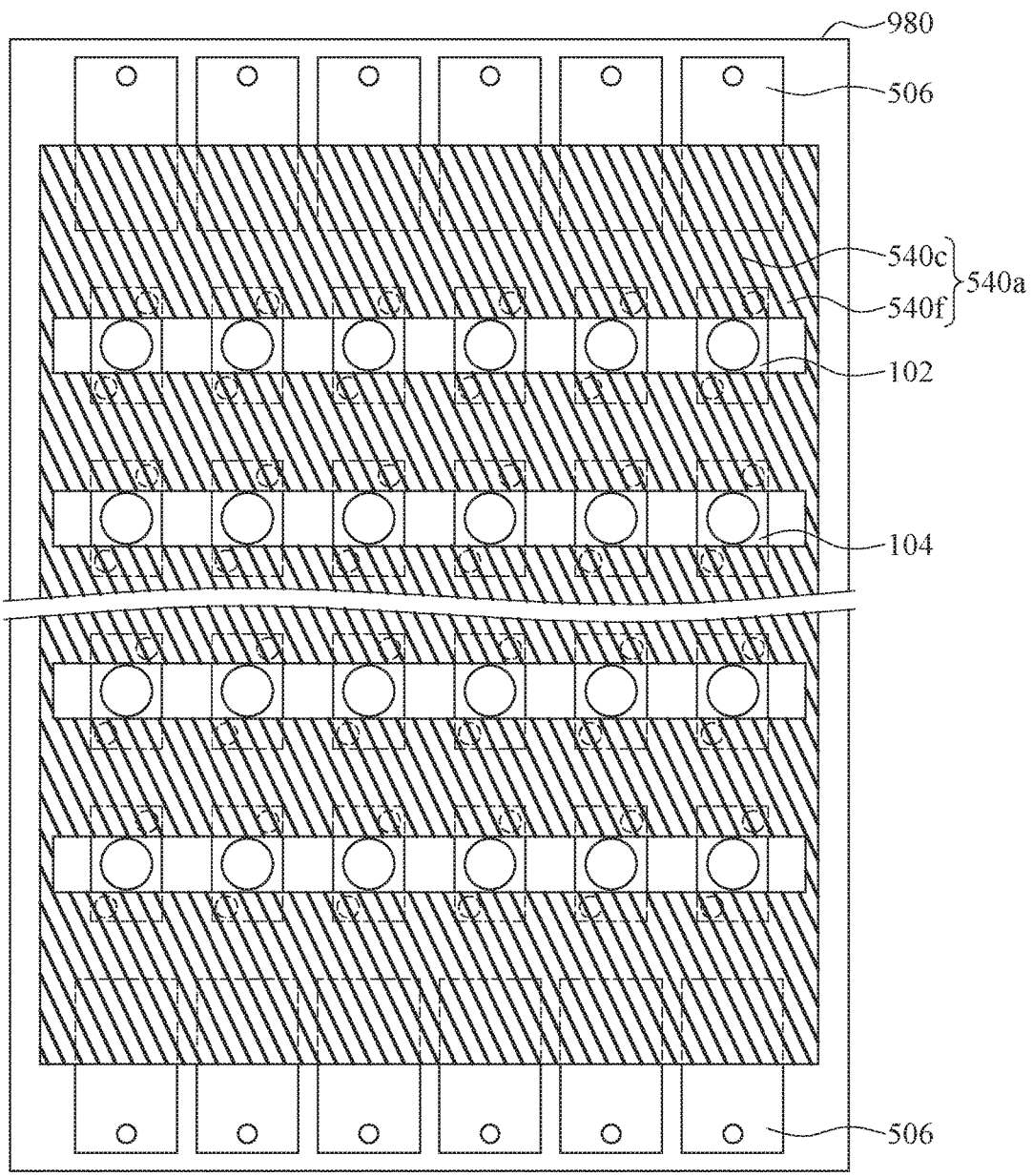

Please refer to FIGS. 41A to 41E which illustrate a manufacturing method of an LED filament according to a first embodiment. The manufacturing method of the LED filament 100 shown in FIG. 36 comprises:

S20: dispose LED chips 102, 104 and at least two conductive electrodes 506 on a carrier 980, referring to FIG. 41A;

S22: electrically connect the LED chips 102, 104 with the conductive electrodes 506, referring to FIG. 41B; and S24: dispose a light conversion coating 420 on the LED chips 102, 104 and the conductive electrodes 506. The light conversion coating 420 coats on at least two sides of the LED chips 102, 104 and the conductive electrodes 506. The light conversion coating 420 exposes a portion of at least two of the conductive electrodes 506. The light conversion coating 420 comprises adhesive 422 and a plurality of phosphors 424, referring to FIG. 41C to 41E.

In S20, the plurality of LED chips 102, 104 are disposed in a rectangular array. Each column of the LED chips 102, 104, at the end of the manufacturing process, may be cut into a single LED filament 100. During disposition of the LED chips 102, 104, the anodes and cathodes of the LED chips 102, 104 should be properly orientated for later connected in series or parallel. The carrier 980 may be, but not limited to, glass substrate or metal substrate. The carrier 980 may be, but not limited to, a plate like that shown in FIG. 41A, or a plate with a groove like the carrier 980 shown in FIG. 42. The groove is for being disposed with the base layer 420b.

Figure 39A:
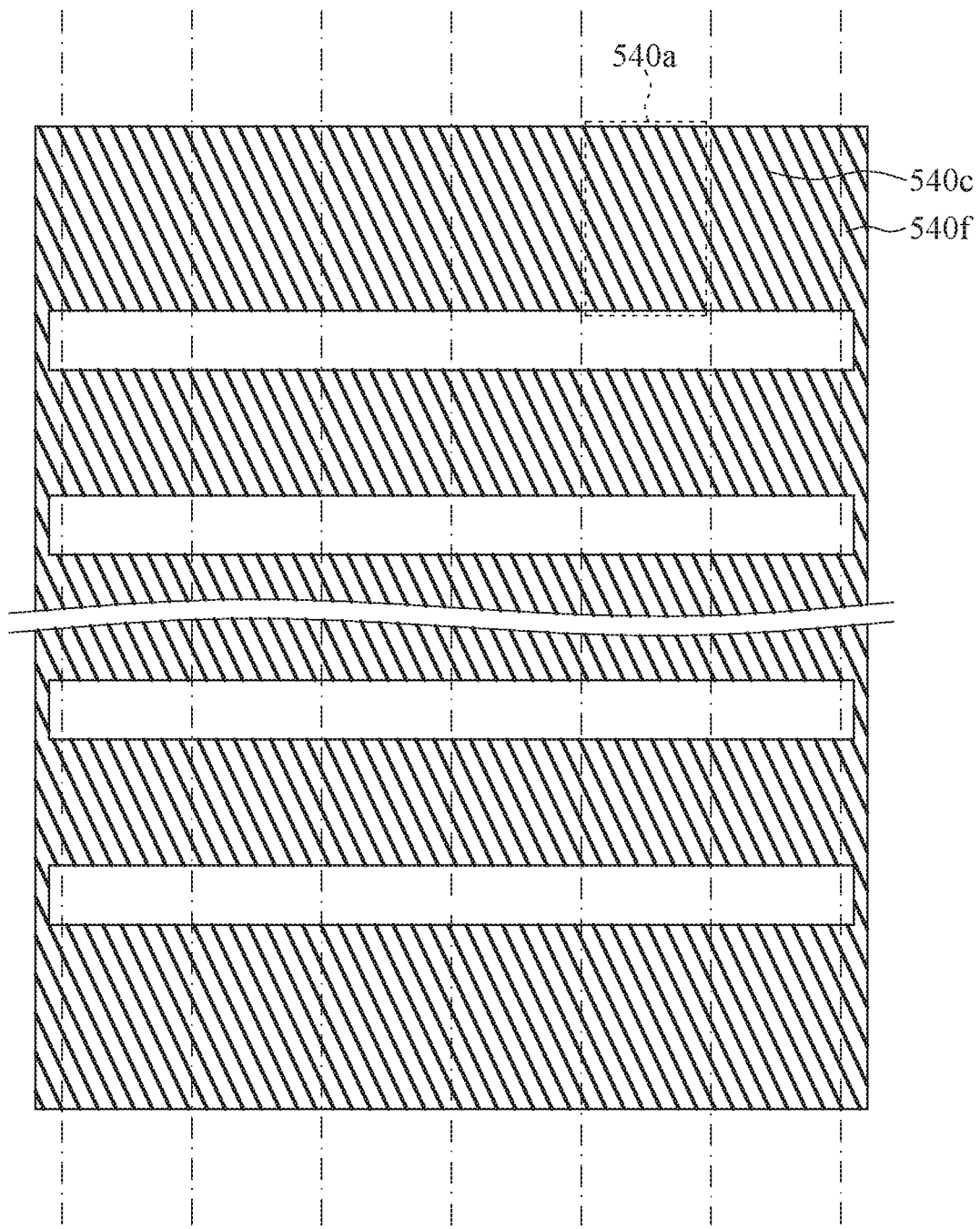
FIG. 39A illustrates a second embodiment of the uncut circuit film according to the second embodiment of the LED filament.
Figure 39B:
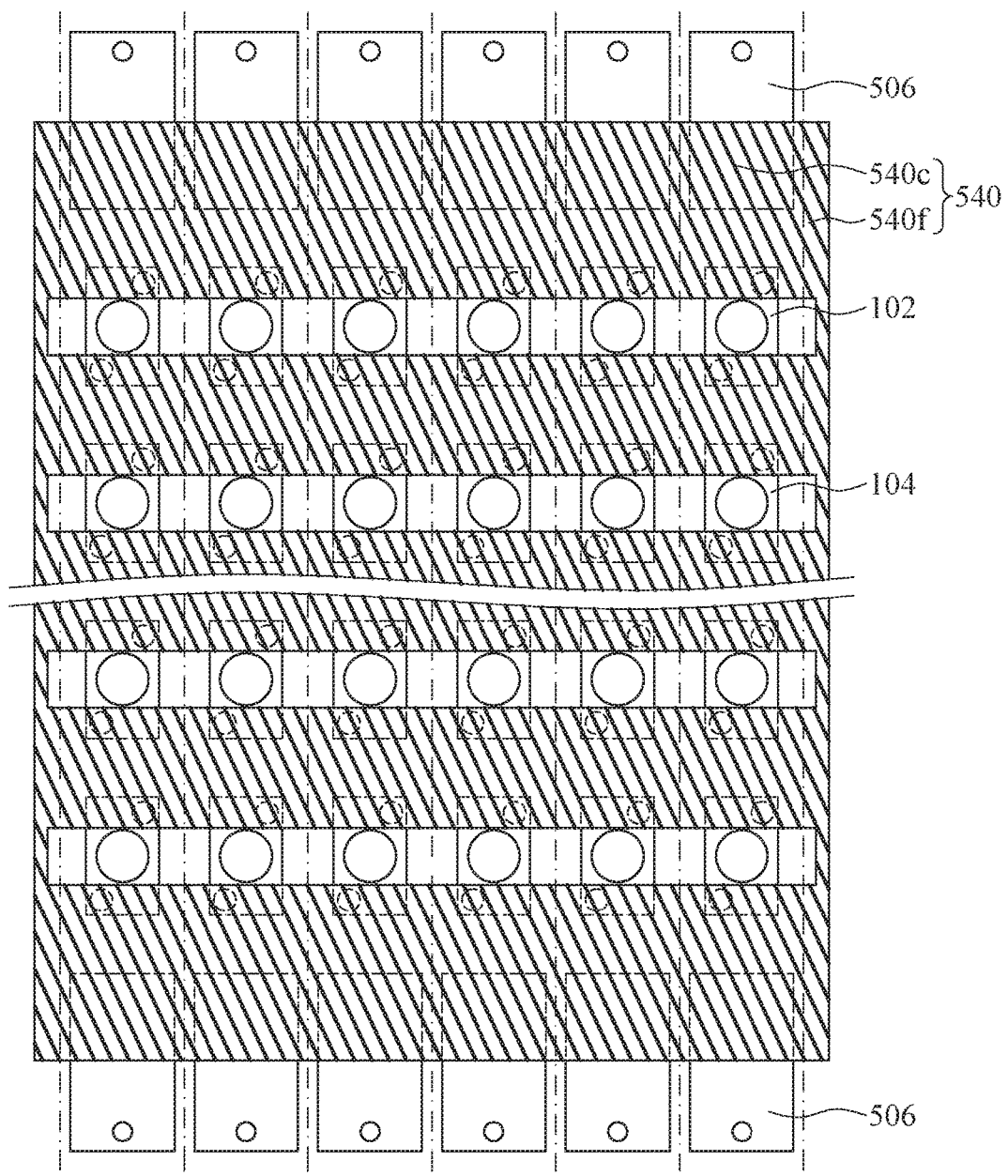
FIG. 39B illustrates the alignment between the LED chips and the second embodiment of the uncut circuit film of FIG. 39A.

In S22, the uncut circuit film 540a is similar to the circuit film 540a shown in FIG. 39A. The LED chips 102, 104 and the conductive electrodes 506 are electrically connected by the parallel conductive lines. Alternatively, the circuit film 540, 240b shown, respectively, in FIG. 38A or 40A may be used in S22. The conductive wires 540 shown in FIG. 34 can be used in S22, too.

In S24, the light conversion coating 420 may be coated on the LED chips 102, 104 and the conductive electrodes 506 by different method. Firstly, taking FIG. 41C to 41E as an example, the manufacturing method of S24 comprises:

S240: coat a light conversion sub-layer (top layer 420a) on a surface of the LED chips 102, 104 and the conductive electrodes 506 which is not contact with the carrier 980;

S242: flip over the LED chips 102, 104 and the conductive electrodes 506 disposed with the top layer 420a; and S244: coat a light conversion sub-layer (base layer 420b) on a surface of the LED chips 102, 104 and the conductive electrodes 506 which are not coated with the top layer 420a.

In order to distinguish the light conversion sub-layers in S240 and in S244, the light conversion sub-layer in S240 is referred to top layer 420a and the light conversion sub-layer in S244 is referred to base layer 420b hereinafter.

In S240, after the LED chips 102, 104 and the conductive electrodes 506 are coated with the top layer 420a, the adhesive 422 and the phosphors 424 will fill out the gaps among the LED chips 102, 104 and the conductive electrodes 506. Then, proceed with a curing process to harden the top layer which encapsulates the upper part of the LED chips 102, 104 and the conductive electrodes 506 and exposes a portion of at least two of the conductive electrodes 506. The curing process may be done by heat or UV.

In S242, the flip-over of the semi-finished piece may be done by two different ways in accordance with different situations. Concerning the first flip-over way, the LED chips 102, 104 and the conductive electrodes 506 are disposed on the carrier 980 without any adherences with the carrier 980.

S242 can be done by flip the cured semi-finished piece over directly. Then, place the flipped-over semi-finished piece on the carrier 980 again. (The semi-finished piece is the cured the LED chips 102, 104 and the conductive electrodes 506 covered with the top layer 420a.)

As for the second way, glues are applied on the carrier 980. The glues are, for instance, photoresist in semiconductor process, or die bond glues. The glues (photoresist or die bond glues) is for temporarily fixing the LED chips 102, 104 and the conductive electrodes 506 on the carrier 980. The glue may be removed by acetone or solvent and the semi-finished piece is separated from the carrier 980. If necessary, the remained glues may be removed by an additional cleaning process.

Figure 41C:
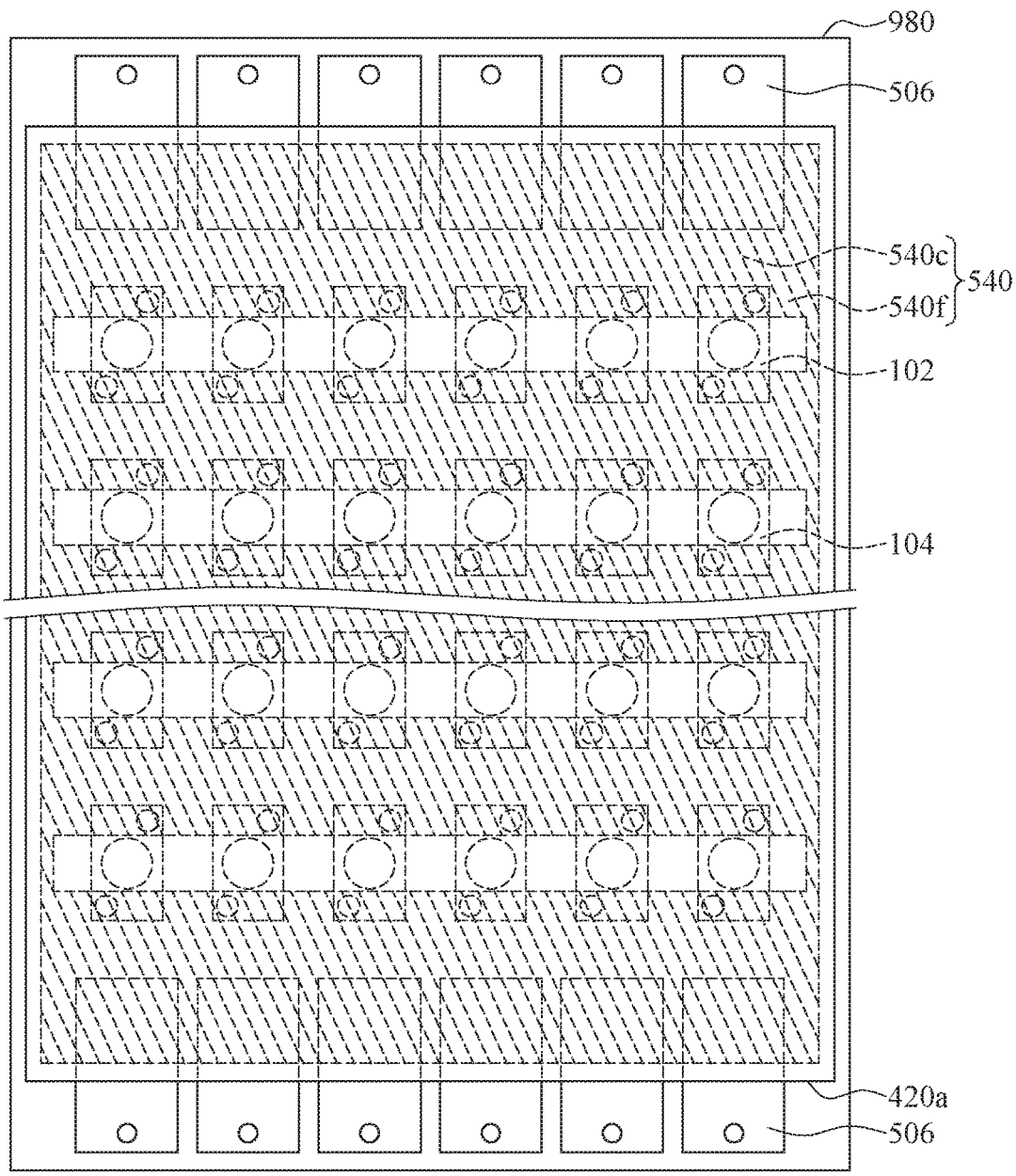
Figure 41D:
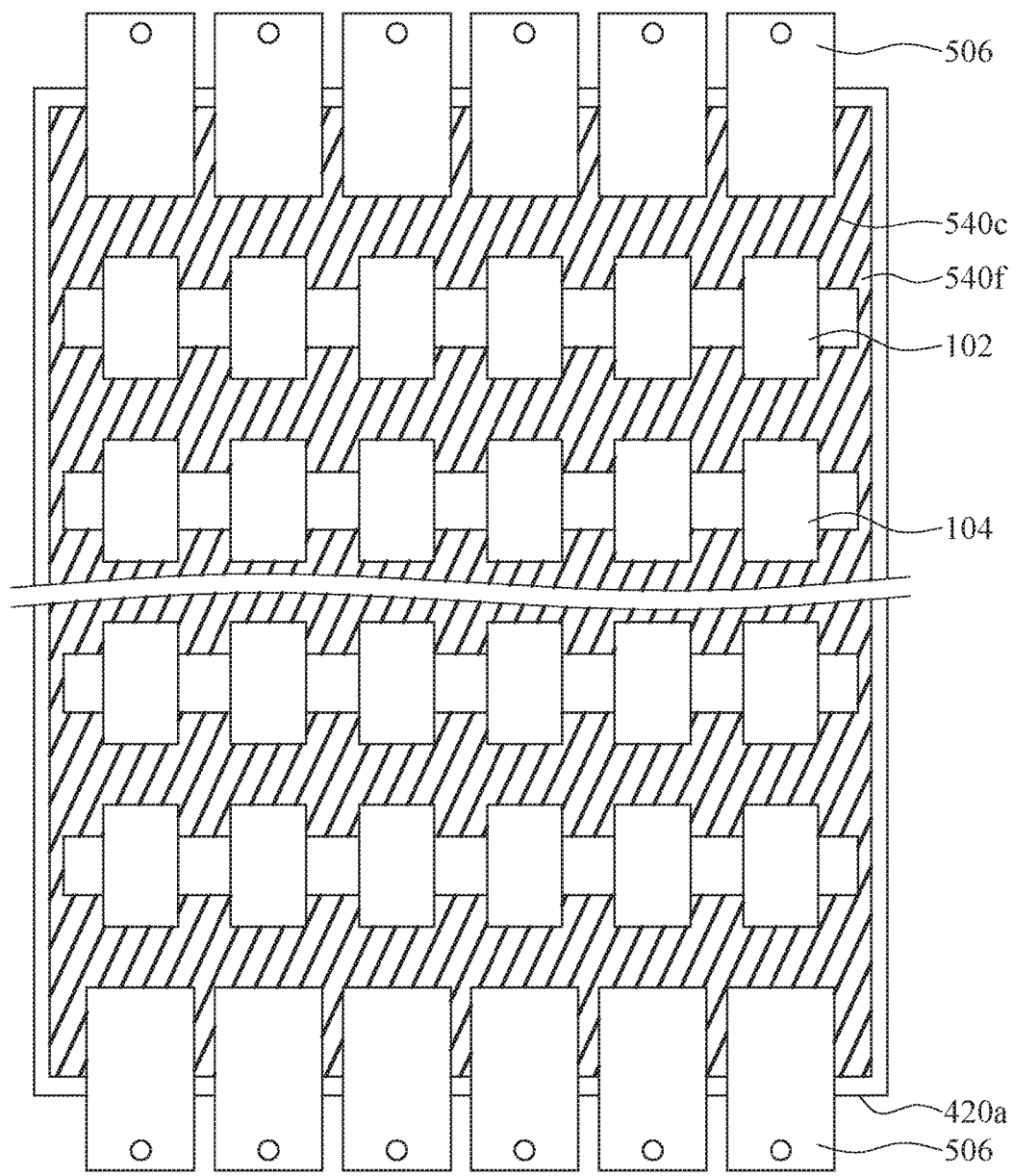
Figure 41E:
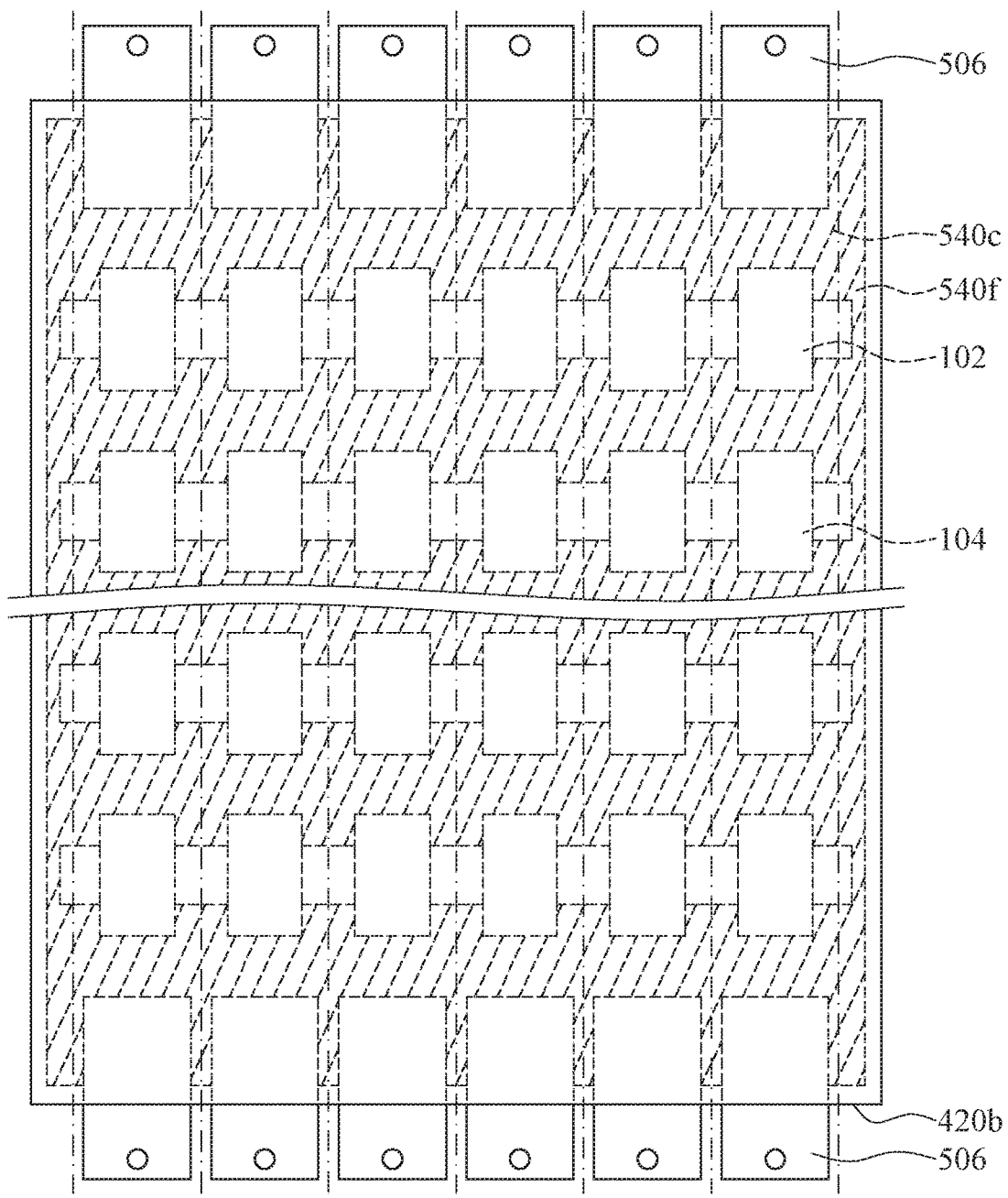

In S244, referring to FIG. 41E, cure the base layer 420b after the base layer 420b is coated on the surface of the LED chips 102, 104 and the conductive electrodes 506.

Referring to FIG. 41C, the top layer 420a is slightly greater than the uncut circuit film 540a. However, it is not a requirement. The sizes of the top layer 420a may be the same as or lesser than that of the uncut circuit film 540a. Referring to FIG. 41E, the area of the top layer 420a is substantially the same as that of the base layer 420b. It is not a requirement, either. In implementation, the area of the top layer 420a may be greater or lesser than the area of the base layer 420b. FIG. 41E illustrates a semi-finished LED filament where a plurality of LED filaments 100 are integrated into one piece.

After S24, the method may further comprise S26: cut the semi-finished LED filament along the dot-and-dash lines shown in FIG. 41E. Each cut portion is an LED filament 100. The semi-finished LED may be cut every other two dot-and-dash lines.

Figure 38B:
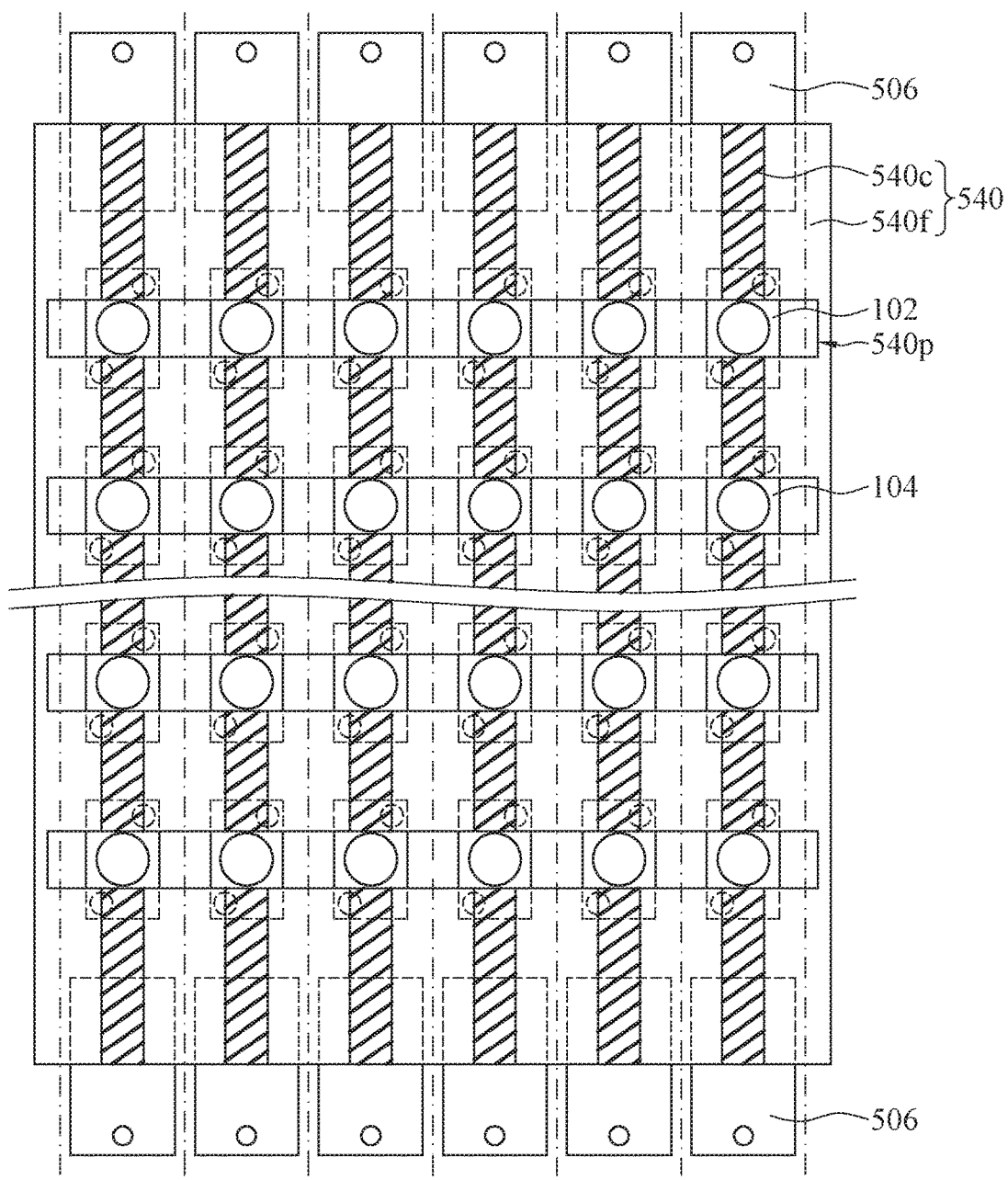
FIG. 38B illustrates the alignment between the LED chips and the first embodiment of the uncut circuit film of FIG. 38A.
Figure 40A:
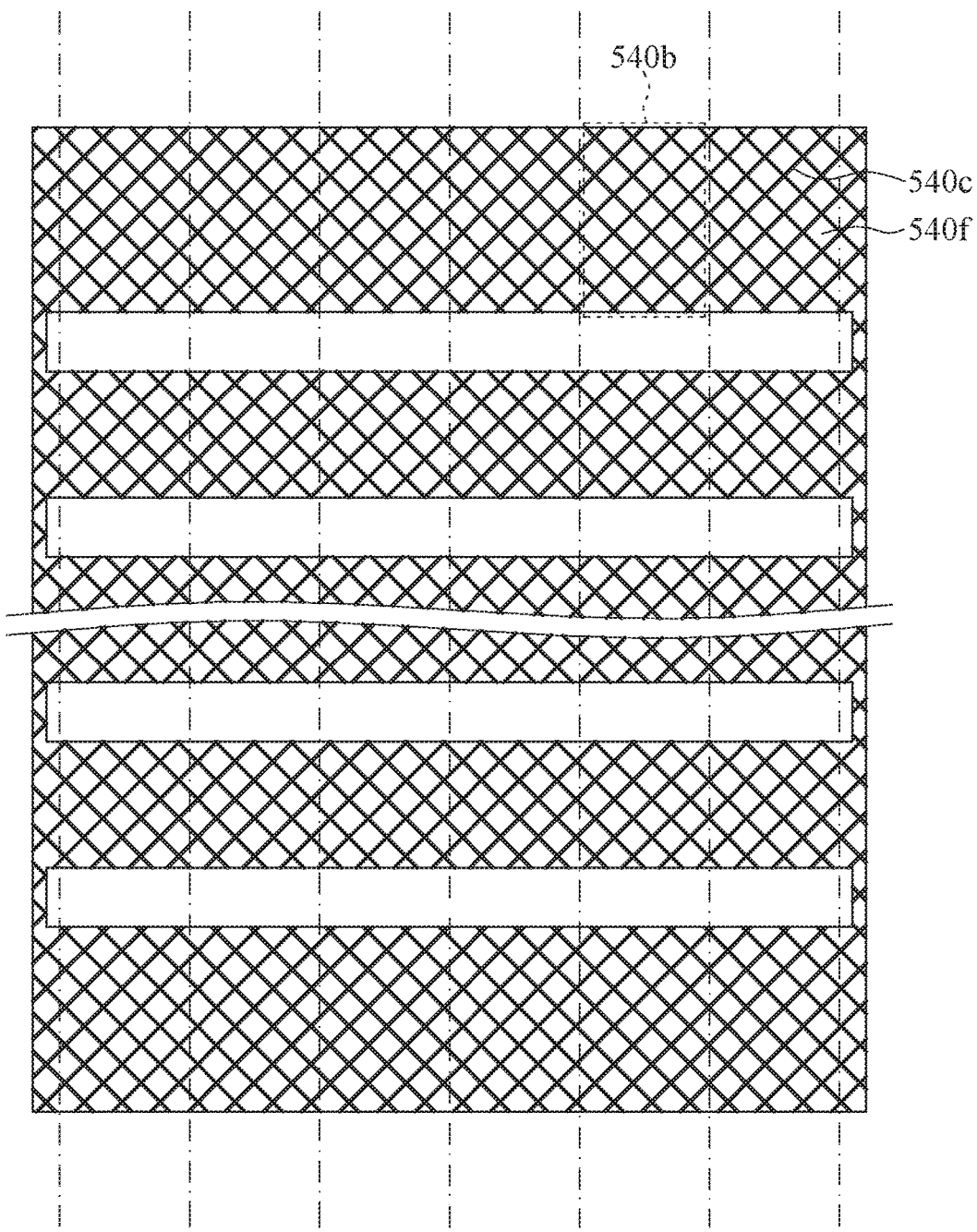
FIG. 40A illustrates a third embodiment of the uncut circuit film according to the second embodiment of the LED filament.
Figure 40B:
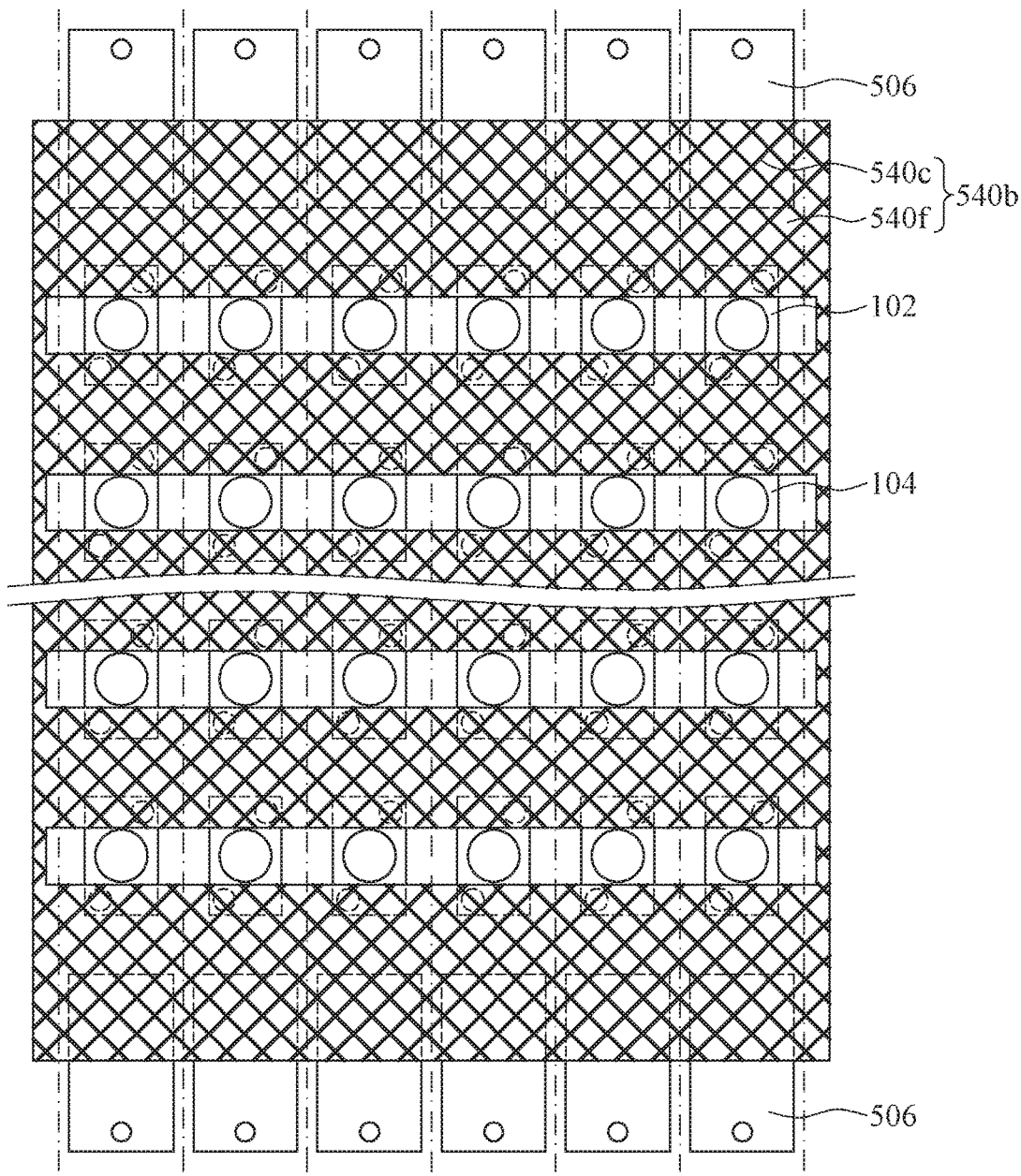
FIG. 40B illustrates the alignment between the LED chips and the third embodiment of the uncut circuit film of FIG. 40A.

FIGS. 38B, 39B and 40B illustrate uncut circuit films 540, 540b of FIGS. 38A, 39A and 40A covering the LED chips 102, 104 and the conductive electrodes 506 with proper alignment.

The method of FIGS. 41A to 41E illustrates each LED filament are disposed in a rectangular array manner. Alternatively, the disposition of S20 may be a single column of LED chips 102, 104. In the consequence, S26 may be omitted.

Figure 42:
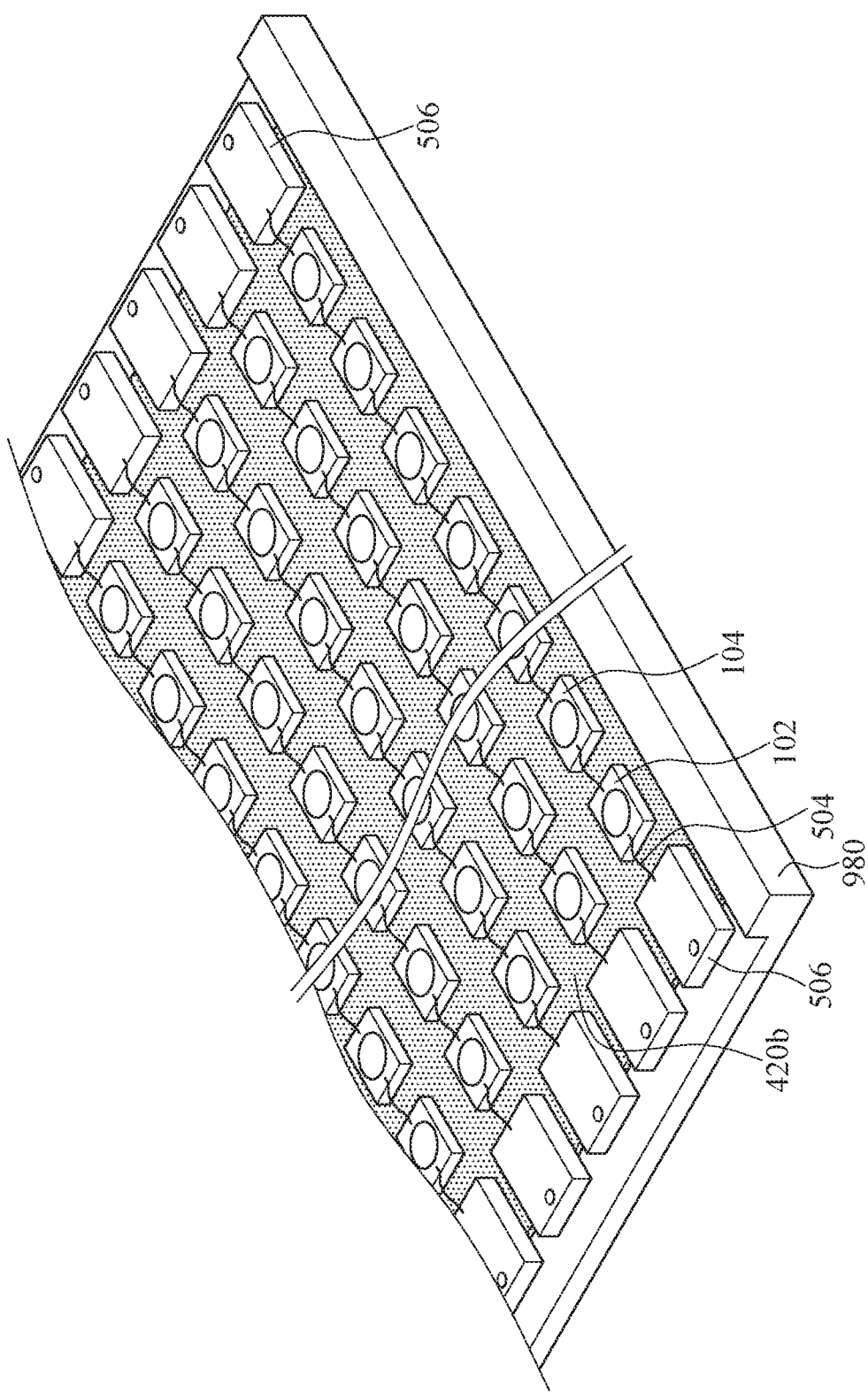
FIG. 42 illustrates a manufacturing method of an LED filament according to a second embodiment of the present disclosure.

Please refer to FIG. 42 for the second embodiment of the manufacturing method for the LED filament 100. The method comprises:

S20A: coat a light conversion sub-layer (a base layer 420b) on a carrier 980;

S20B: dispose LED chips 102, 104 and conductive electrodes 506 on the base layer 420b;

S22: electrically connect the LED chips 102, 104 with the conductive electrodes 506; and S24: coat a light conversion sub-layer (top layer 420a) on the LED chips 102, 104 and the conductive electrodes 506. The top layer 420a coats on the LED chips 102, 104 and the conductive electrodes 506. The top layer 420a and the base layer 420b expose a portion of at least two of the conductive electrodes 506. The light conversion coating 420 (top layer 420a and the base layer 420b) comprises adhesive 422 and a plurality of phosphors 424.

As shown in FIG. 42, the base layer 420b is a part of the light conversion coating 420 and comprises an adhesive 422 and phosphors 424. In the embodiment of FIG. 42, the base layer 420b is, but not limited to, coated on the carrier 980 with a groove. Alternatively, the carrier 980 can be omitted. In other words, the base layer 420b may be place on a work table without any carrier 980. The LED chips 102, 104 and the conductive electrodes 506 are disposed on the base layer 420b. Additionally, before the step S20B, the phosphor film formed by curing the base layer 420b can be manufactured in advance and is attached to a periphery of the carrier by adhesives later. In such case, the phosphor film is partially attached to the carrier and thus is easily separated from the carrier in a stamping manner during the process of filament cutting and carrier removing.

The thickness of the base layer 420b may be 50 to 100 um. The composition ratio of phosphors 424 to the adhesive 422 can be adjusted and the thickness of the base layer 420b may be around 60 to 80 um. After S20, a pre-curing process may be used to slightly cure the base layer 420b so that the LED chips 102, 104 and the conductive electrodes 506 can be fixed on the base layer 420b. Besides, the LED chips 102, 104 and the conductive electrodes 506 may be fixed on the base layer 420b by die bond glues.

After the electrical connection of S22, the top layer 420a is coated on the LED chips 102, 104 and the conductive electrodes 506 and then a curing process is proceeded with to cure the top layer 420a. Consequently, the flip-over of S242 and glue-removing process are omitted.

According to the embodiment of FIG. 42, after S24, the process of S26 may be proceeded with.

The base layer 420b is used for carrying the LED chips 102, 104 and the conductive electrodes 506 and its thickness may be 0.5 to 3 millimeters (mm) or 1 to 2 mm.

The composition ratio of phosphors 424 to the adhesive 422 may be adjusted accordingly to make the base layer 420b hard enough to sufficiently carry the LED chips 102, 104 and the conductive electrodes 506 and for the following process like wire bond. The Shore D Hardness of the base layer 420b may be at least 60 HD. Hence, the overall LED filament 100 will have enough hardness, rigidity and deflection. The electrical conductivity of the connection among the LED chips 102, 104 and the conductive electrodes 506 can be maintained even though the LED filament 100 is bent.

In accordance with the embodiment of FIG. 42, the hardness of the cured base layer 420b is better to be sufficient to carry the LED chips 102, 104 and the conductive electrodes 506 and to support for the wire bonding process. However, the top layer 420a is not required to have the same hardness as the base layer 420b. Accordingly, the adjustment of ratio of the phosphors 424 to the adhesive 422 is more flexible. Alternatively, the light conversion coating 420 may comprise inorganic oxide nanoparticles (not shown in FIG. 42).

Figure 43A:
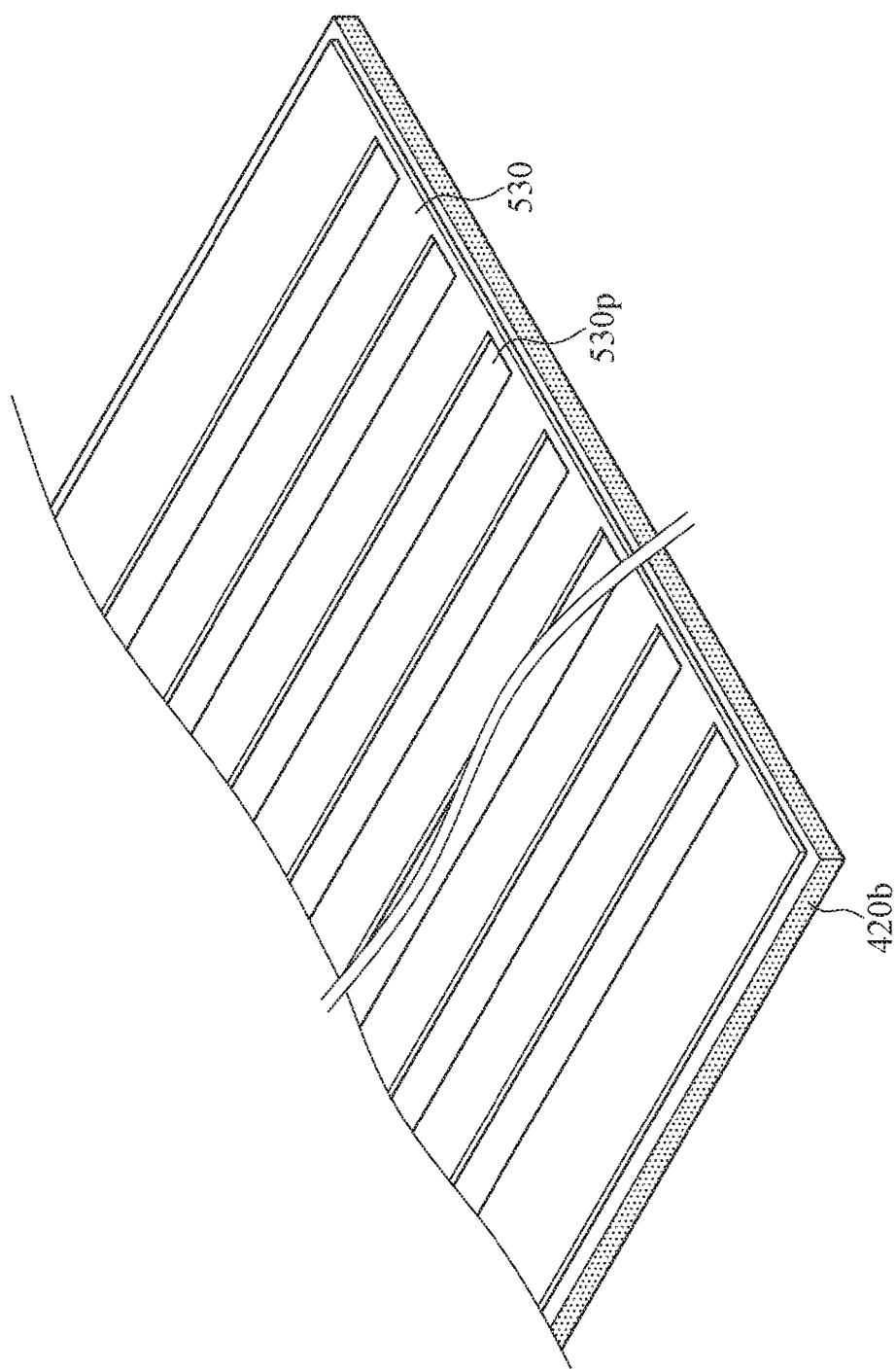
FIGS. 43A to 43E illustrate a manufacturing method of an LED filament according to a third embodiment of the present disclosure.
Figure 43B:
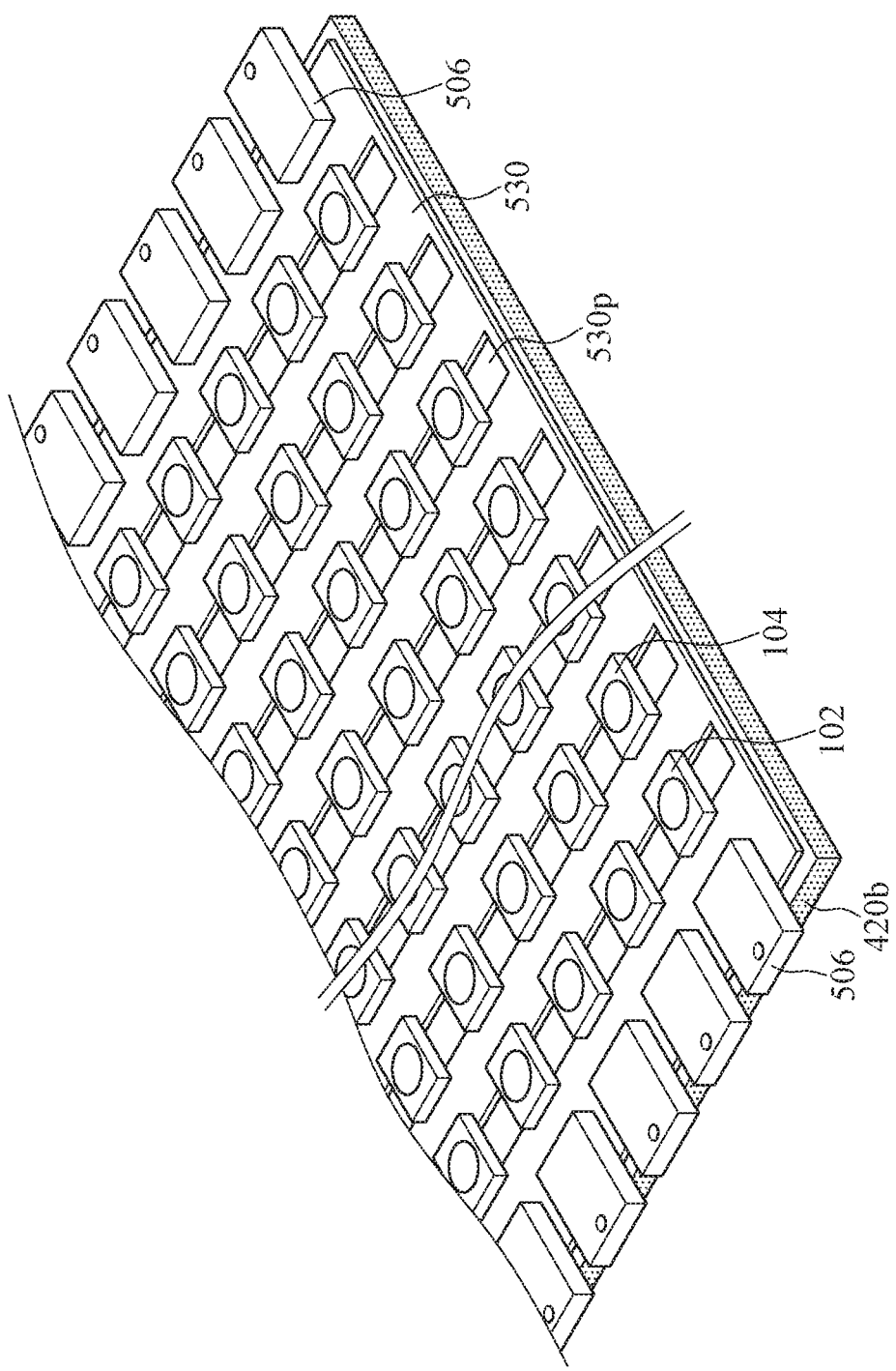
Figure 43C:
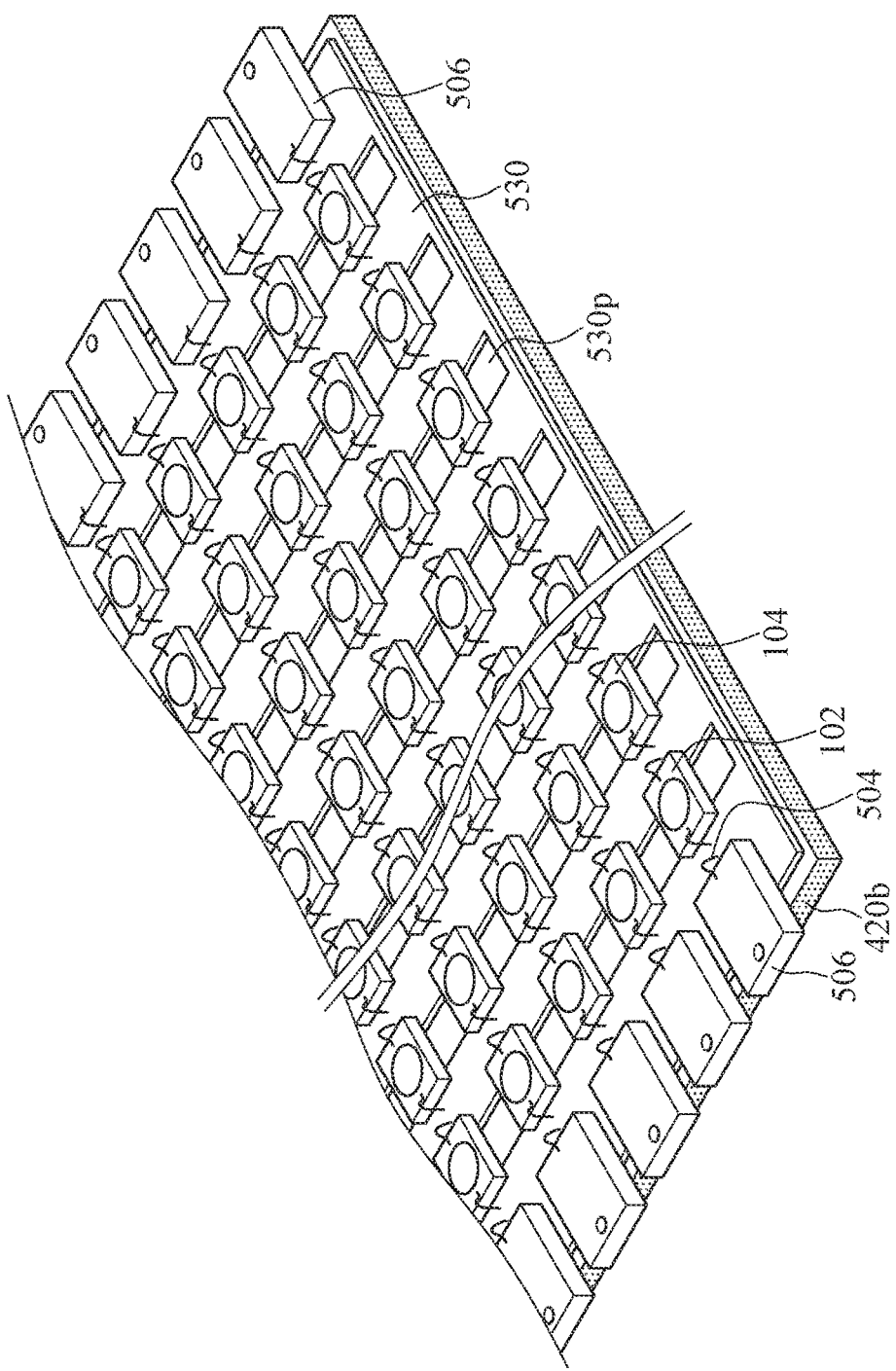

Next, please refer to FIGS. 43A to 43E which illustrate a manufacturing method of an LED filament according to a third embodiment. The manufacturing method for an Led filament 100 comprises:

S202: dispose conductive foil 530 on a light conversion sub-layer (base layer 420b), referring to FIG. 43A;

S204: dispose a plurality of LED chips 102, 104 and a plurality of conductive electrodes 506 on the conductive foil 530, referring to FIG. 43B;

S22: electrically connect the LED chips 102, 104 with the conductive electrodes 506, referring to FIG. 43C; and S24: coat a light conversion sub-layer (top layer 420a) on the surfaces of the LED chips 102, 104 and the conductive electrode 506 where may be not in contact with the conductive foil 530. The light conversion coating 420 (including the base layer 420b and the top layer 420a) coats on at least two sides of the LED chips 102, 104 and the conductive electrodes 506. The light conversion coating 420 exposes a portion of at least two of the plurality of conductive electrodes 506. The light conversion coating 420 comprises adhesive 422 and phosphors 424.

Please refer to FIG. 43A, the light conversion coating of S202 is called as the base layer 420b. The conductive foil 530 may have a plurality of openings 530p. The width of each of the openings 530p may be lesser than the length of the LED chips 102, 104 and each of the openings 530p is aligned with the portion of the LED chips 102, 104 which emits light. Therefore, light emitted from LED may pass through the openings 530p without any shielding or blocking.

The conductive foil 530 may be, but not limited to, a copper foil coated with silver. The openings 530p may be formed by punching or stamping on a copper foil.

Before S202, the method may comprise a pre-step: dispose the base layer 420b on a carrier (like 980 of FIG. 42) or on a work table.

In S204, please refer to FIG. 11B. The LED chips 102, 104 and the conductive electrodes 506 are disposed on the conductive foil 530. As above-mentioned, the light emitting portions of the LED chips 102, 104 are better to align with the openings 530p.

Please refer to FIG. 43C. The electrical connection of S22 may be accomplished by wire bonding process like that shown in FIG. 33. As shown in FIG. 43C, the LED chips 102, 104 and the conductive electrodes 506 are electrically connected together in series.

Figure 43D:
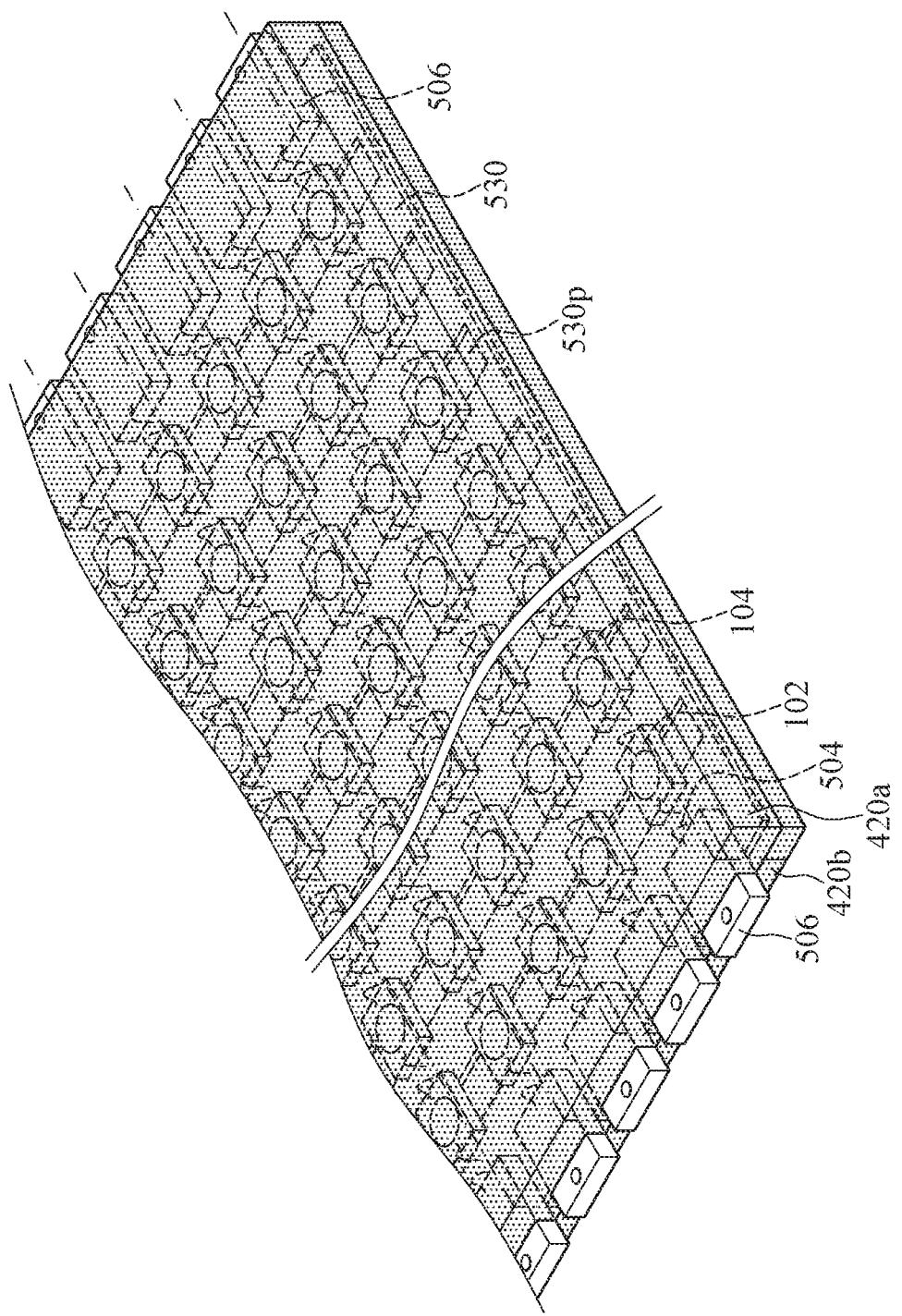

Next, please refer to FIG. 43D. Like the embodiment of FIG. 42, the light conversion sub-layer may be referred to top layer 420a. The top layer 420a fills out the gaps among the LED chips 102, 104 and the conductive electrodes 506 including the gaps under the LED chips 102, 104 and the openings 530p.

Regarding the disposition of the top layer 420a, there are a few methods to proceed with. The first one is to coat a mixture of the adhesive 422 and the phosphors 424 on the LED chips 102, 104 and the conductive electrodes 506. The second one is to firstly coat a layer of phosphors 424 on the LED chips 102, 104 and the conductive electrodes 506, and secondly coat a layer of adhesive 422 thereon (two disposition steps). Thereafter, cure the layer of adhesive 422 and the layer of phosphors 424. The third one is to repeat the above two disposition steps until a required thickness is reached. Thereafter, a curing process is proceeded with. In comparison with the three methods, the uniformity of the light conversion coating 420 done by the third method might be better. Additionally, the disposition (coating) of the adhesive 422 or the phosphors 424 may be done by spraying.

Figure 43E:
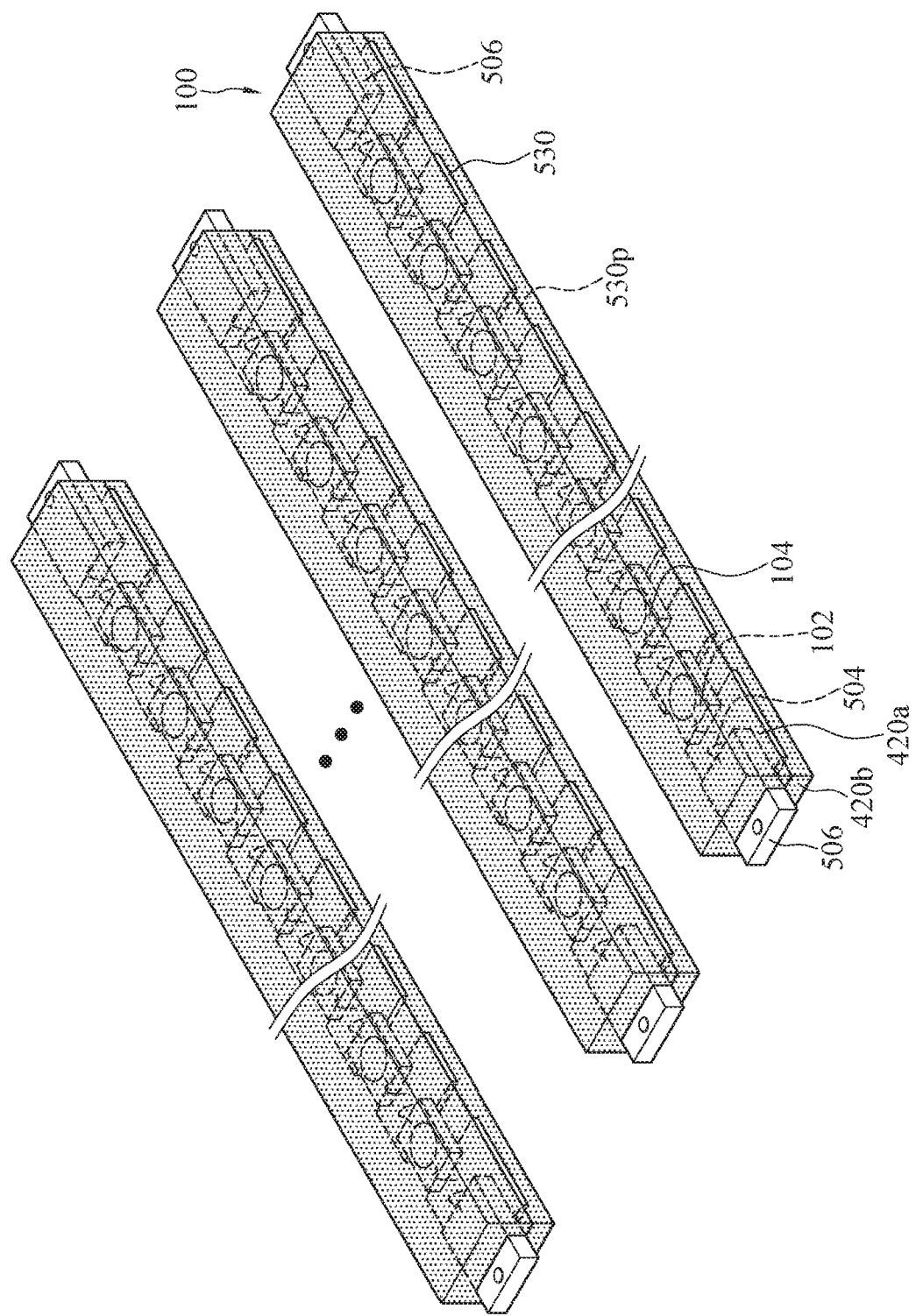

After S24, a cut process may be proceeded with, referring to FIG. 43E. Cut LED filaments 100 are manufactured as shown in FIG. 43E.

In accordance with the embodiment of FIG. 43A to 43E, the LED chips 102, 104 and the conductive electrodes 506 are electrically connected together through conductive foil 530 and conductive wire 540. The flexibility of the electrical connections is enhanced. Accordingly, when the LED filament 100 is bent, the electrical connections would not be easily broken.

Please refer to FIGS. 44A and 44B which illustrate a perspective view of LED light bulb applying the LED filaments according to a first and a second embodiments. The LED light bulb 20a, 20b comprises a bulb shell 12, a bulb base 16 connected with the bulb shell 12, at least two conductive supports 51a, 51b disposed in the bulb shell 12, a driving circuit 518 electrically connected with both the conductive supports 51a, 51b and the bulb base 16, and a single LED filament 100 disposed in the bulb shell 12.

The conductive supports 51a, 51b are used for electrically connecting with the conductive electrodes 506 and for supporting the weight of the LED filament 100. The bulb base 16 is used to receive electrical power. The driving circuit 518 receives the power from the bulb base 16 and drives the LED filament 100 to emit light. Due that the LED filament 100 emits light like the way a point light source does, the LED light bulb 20a, 20b may emit omnidirectional light. In this embodiment, the driving circuit 518 is disposed inside the LED light bulb. However, in some embodiments, the driving circuit 518 may be disposed outside the LED bulb.

The definition of the omnidirectional light depends upon the area the bulb is used and varies over time. The definition of the omnidirectional light may be, but not limited to, the following example. Page 24 of Eligibility Criteria version 1.0 of US Energy Star Program Requirements for Lamps (Light Bulbs) defines omnidirectional lamp in base-up position requires that light emitted from the zone of 135 degree to 180 degree should be at least 5% of total flux (lm), and 90% of the measured intensity values may vary by no more than 25% from the average of all measured values in all planes (luminous intensity (cd) is measured within each vertical plane at a 5 degree vertical angle increment (maximum) from 0 degree to 135 degree). JEL 801 of Japan regulates the flux from the zone within 120 degrees along the light axis should be not less than 70% of total flux of the bulb.

In the embodiment of FIG. 44A, the LED light bulb 20a comprises two conductive supports 51a, 51b. In an embodiment, the LED light bulb may comprise more than two conductive supports 51a, 51b depending upon the design.

The bulb shell 12 may be shell having better light transmittance and thermal conductivity; for example, but not limited to, glass or plastic shell. Considering a requirement of low color temperature light bulb on the market, the interior of the bulb shell 12 may be appropriately doped with a golden yellow material or a surface inside the bulb shell 12 may be plated a golden yellow thin film for appropriately absorbing a trace of blue light emitted by a part of the LED chips 102, 104, so as to downgrade the color temperature performance of the LED bulb 20a, 20b. A vacuum pump may swap the air as the nitrogen gas or a mixture of nitrogen gas and helium gas in an appropriate proportion in the interior of the bulb shell 12, so as to improve the thermal conductivity of the gas inside the bulb shell 12 and also remove the water mist in the air. The air filled within the bulb shell 12 may be at least one selected from the group substantially consisting of helium (He), and hydrogen ($H_2$). The volume ratio of Hydrogen to the overall volume of the bulb shell 12 is from 5% to 50%. The air pressure inside the bulb shell may be 0.4 to 1.0 atm (atmosphere).

According to the embodiments of FIGS. 44A and 44B, each of the LED light bulbs 20a, 20b comprises a stem 19 in the bulb shell 12 and a heat dissipating element (i.e. heat sink) 17 between the bulb shell 12 and the bulb base 16. In the embodiment, the bulb base 16 is indirectly connected with the bulb shell 12 via the heat dissipating element 17. Alternatively, the bulb base 16 can be directly connected with the bulb shell 12 without the heat dissipating element 17. The LED filament 100 is connected with the stem 19 through the conductive supports 51a, 51b. The stem 19 may be used to swap the air inside the bulb shell 12 with nitrogen gas or a mixture of nitrogen gas and helium gas. The stem 19 may further provide heat conduction effect from the LED filament 100 to outside of the bulb shell 12. The heat dissipating element 17 may be a hollow cylinder surrounding the opening of the bulb shell 12, and the interior of the heat dissipating element 17 may be equipped with the driving circuit 518. The exterior of the heat dissipating element 17 contacts outside gas for thermal conduction. The material of the heat dissipating element 17 may be at least one selected from a metal, a ceramic, and a plastic with a good thermal conductivity effect. The heat dissipating element 17 and the stem 19 may be integrally formed in one piece to obtain better thermal conductivity in comparison with the traditional LED light bulb whose thermal resistance is increased due that the screw of the bulb base is glued with the heat dissipating element.

Referring to FIG. 44A, the height of the heat dissipating element 17 is L1 and the height from the bottom of the heat dissipating element 17 to the top of the bulb shell 12 is L2. The ratio of L1 to L2 is from 1/30 to 1/3. The lower the ratio, the higher the cutoff angle of illumination of the light bulb. In other words, the lower ratio increases the higher light-emission angle and the light from the bulb is closer to omnidirectional light.

Please referring to FIG. 44B, the LED filament 100 is bent to form a portion of a contour and to form a wave shape having wave crests and wave troughs. In the embodiment, the outline of the LED filament 100 is a circle when being observed in a top view and the LED filament 100 has the wave shape when being observed in a side view. Alternatively, the outline of the LED filament 100 can be a wave shape or a petal shape when being observed in a top view and the LED filament 100 can have the wave shape or a line shape when being observed in a side view. In order to appropriately support the LED filament 100, the LED light bulb 20b further comprises a plurality of supporting arms 15 which are connected with and supports the LED filament 100. The supporting arms 15 may be connected with the wave crest and wave trough of the waved shaped LED filament 100. In this embodiment, the arc formed by the filament 100 is around 270 degrees. However, in other embodiment, the arc formed by the filament 100 may be approximately 360 degrees. Alternatively, one LED light bulb 20b may comprise two LED filaments 100 or more. For example, one LED light bulb 20b may comprise two LED filaments 100 and each of the LED filaments 100 is bent to form approximately 180 degrees arc (semicircle). Two semicircle LED filaments 100 are disposed together to form an approximately 360 circle. By the way of adjusting the arc formed by the LED filament 100, the LED filament 100 may provide with omnidirectional light. Further, the structure of one-piece filament simplifies the manufacturing and assembly procedures and reduces the overall cost.

In some embodiment, the supporting arm 15 and the stem 19 may be coated with high reflective materials, for example, a material with white color. Taking heat dissipating characteristics into consideration, the high reflective materials may be a material having good absorption for heat radiation like graphene. Specifically, the supporting arm 15 and the stem 19 may be coated with a thin film of graphene.

Please refer to FIG. 45A and FIG. 46A. FIG. 45A illustrates a perspective view of an LED light bulb according to a third embodiment of the present disclosure. FIG. 46A illustrates a cross-sectional view of an LED light bulb according to a fourth embodiment of the present disclosure. According to the third embodiment, the LED light bulb 20c comprises a bulb shell 12, a bulb base 16 connected with the bulb shell 12, two conductive supports 51a, 51b disposed in the bulb shell 12, a driving circuit 518 electrically connected with both the conductive supports 51a, 51b and the bulb base 16, a stem 19, supporting arms 15 and a single LED filament 100. The LED light bulb 20d of the fourth embodiment is similar to the third embodiment illustrated in FIG.

45A and comprises two LED filaments 100a, 100b arranged at the different vertical level in FIG. 46A. The LED filaments 100a, 100b are bent to form a contour from the top view of FIG. 46A.

The cross-sectional size of the LED filaments 100, 100a, 100b is small than that in the embodiments of FIGS. 44A and 44B. The conductive electrodes 506 of the LED filaments 100, 100a, 100b are electrically connected with the conductive supports 51a, 51b to receive the electrical power from the driving circuit 518. The connection between the conductive supports 51a, 51b and the conductive electrodes 506 may be a mechanical pressed connection or soldering connection. The mechanical connection may be formed by firstly passing the conductive supports 51a, 51b through the through holes 506h (shown in FIG. 33 and secondly bending the free end of the conductive supports 51a, 51b to grip the conductive electrodes 506. The soldering connection may be done by a soldering process with a silver-based alloy, a silver solder, a tin solder.

Similar to the first and second embodiments shown in FIGS. 44A and 44B, each of the LED filaments 100, 100a, 100b shown in FIG. 45A/46A is bent to form a contour from the top view of FIGS. 45A and 46A. In the embodiments of FIGS. 45A, 46A, each of the LED filaments 100, 100a, 100b is bent to form a wave shape from side view. The shape of the LED filament 100 is novel and makes the illumination more uniform. In comparison with a LED bulb having multiple LED filaments, single LED filament 100 has less connecting spots. In implementation, single LED filament 100 has only two connecting spots such that the probability of defect soldering or defect mechanical pressing is decreased.

The stem 19 has a stand 19a extending to the center of the bulb shell 12. The stand 19a supports the supporting arms 15. The first end of each of the supporting arms 15 is connected with the stand 19a while the second end of each of the supporting arms 15 is connected with the LED filament 100, 100a, 100b. Please refer to FIG. 45B which illustrates an enlarged cross-sectional view of the dashed-line circle of FIG. 45A. The second end of each of the supporting arms 15 has a clamping portion 15a which clamps the body of the LED filament 100, 100a, 100b. The clamping portion 15a may be, but not limited to, clamp at either the wave crest or the wave trough. Alternatively, the clamping portion 15a may clamp at the portion between the wave crest and the wave trough. The shape of the clamping portion 15a may be tightly fitted with the outer shape of the cross-section of the LED filament 100, 100a, 100b. The dimension of the inner shape (through hole) of the clamping portion 15a may be a little bit smaller than the outer shape of the cross-section of the LED filament 100, 100a, 100b. During manufacturing process, the LED filament 100, 100a, 100b may be passed through the inner shape of the clamping portion 15a to form a tight fit. Alternatively, the clamping portion 15a may be formed by a bending process. Specifically, the LED filament 100, 100a, 100b may be placed on the second end of the supporting arm 15 and a clamping tooling is used to bend the second end into the clamping portion to clamp the LED filament 100, 100a, 100b.

The supporting arms 15 may be, but not limited to, made of carbon steel spring to provide with adequate rigidity and flexibility so that the shock to the LED light bulb caused by external vibrations is absorbed and the LED filament 100 is not easily to be deformed. Since the stand 19a extending to the center of the bulb shell 12 and the supporting arms 15 are connected to a portion of the stand 19a near the top thereof, the position of the LED filaments 100 is at the level close to the center of the bulb shell 12. Accordingly, the illumination characteristics of the LED light bulb 20c are close to that of the traditional light bulb including illumination brightness. The illumination uniformity of LED light bulb 20c is better. In the embodiment, at least a half of the LED filaments 100 is around a center axle of the LED light bulb 20c. The center axle is coaxial with the axle of the stand 19a.

In the embodiment, the first end of the supporting arm 15 is connected with the stand 19a of the stem 19. The clamping portion of the second end of the supporting arm 15 is connected with the outer insulation surface of the LED filaments 100, 100a, 100b such that the supporting arms 15 are not used as connections for electrical power transmission. In an embodiment where the stem 19 is made of glass, the stem 19 would not be cracked or exploded because of the thermal expansion of the supporting arms 15 of the LED light bulb 20c. Additionally, there may be no stand in an LED light bulb. The supporting arm 15 may be fixed to the stem or the bulb shell directly to eliminate the negative effect to illumination caused by the stand.

The supporting arm 15 is thus non-conductive to avoid a risk that the glass stem 19 may crack due to the thermal expansion and contraction of the metal filament in the supporting arm 15 under the circumstances that the supporting arm 15 is conductive and generates heat when current passes through the supporting arm 15.

In different embodiments, the second end of the supporting arm 15 may be directly inserted inside the LED filament 100 and become an auxiliary piece in the LED filament 100, which can enhance the mechanical strength of the LED filament 100. Relative embodiments are described later.

Figure 45B:
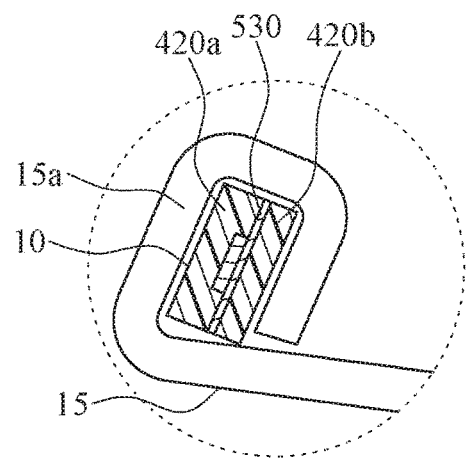
FIG. 45B illustrates an enlarged cross-sectional view of the dashed-line circle of FIG. 45A.

Since the inner shape (shape of through hole) of the clamping portion 15a fits the outer shape of the cross-section of the LED filament 100, the orientation of the cross-section of the LED filament 100, if necessary, may be properly adjusted. As shown in FIG. 45B, the top layer 420a is fixed to face around ten o'clock direction such that illumination surfaces of the LED filament 100 are facing substantially the same direction.

Figure 46B:
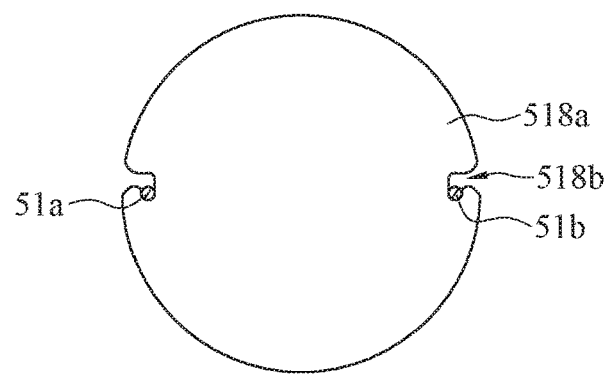
FIG. 46B illustrates the circuit board of the driving circuit of the LED light bulb according to the fourth embodiment of the present disclosure.

Please refer to FIG. 46B which illustrates the circuit board of the driving circuit of the LED light bulb from the top view of FIG. 46A according to the fourth embodiment of the present disclosure. The driving circuit 518 comprises a circuit board 518a which is fixed to the bulb base 16. The conductive supports 51a, 51b are electrically connected with the circuit board 518a and passes through the stand 19a to be electrically connected with the conductive electrodes 506 of the LED filament 100a, 100b. The circuit board 518a comprises notches 518b. The notches 518b are of hook shape. The size of the tip of the notches 518b is slightly smaller than that of the cross-section of the conductive supports 51a, 51b for fixing the conductive supports 51a, 51b. The tip of the notches 518b is beneficial to the soldering between the circuit board 518a and the conductive supports 51a, 51b.

In the embodiments of FIGS. 45A and 46A, the length of the conductive supports 51a, 51b is better to meet the below equation to prevent two conductive supports 51a, 51b from short circuit or to prevent the conductive supports 51a, 51b from unable to reach the circuit board 518a.

$$L = A + \sqrt{[(B-3.2)]^2 + H^2}$$

Wherein, referring to FIG. 46A, 3.2 is the electricity safety spacing; L is the calculated length of the conductive supports 51a, 51b and its unit is mini-meter; A is the sum of the thickness of the circuit board 518a and the height of the portion of the conductive supports 51a, 51b exposed from the surface of the circuit board 518a; B is the horizontal distance between the two conductive supports 51a, 51b; and H is the height from the circuit board 518a to the point the conductive supports 51a, 51b enters the stem 19. The actual length of the conductive supports 51a, 51b may be, but not limited to, between 0.5L and 2L, and more particularly between 0.75L and 1.5L.

In the embodiment of FIG. 46A, the LED light bulb 20d has two LED filaments 100a, 100b disposed on different vertical levels. The conductive supports 51a, 51b for the upper LED filaments 100a has a length Z=L+Y. Y is the distance between the upper LED filament 100a and the lower LED filament 100b.

Figure 45C:
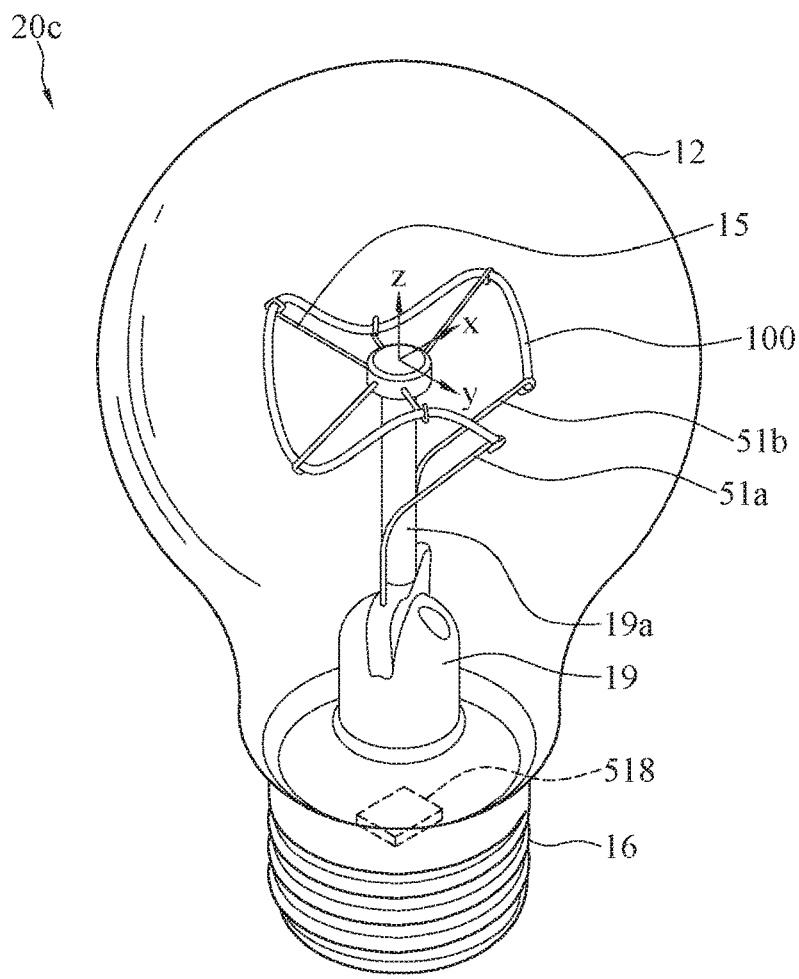
FIG. 45C is a perspective view of an LED light bulb according to an embodiment of the present invention.

Please refer to FIG. 45C. FIG. 45C is a perspective view of an LED light bulb according to an embodiment of the present invention. The LED light bulb 20c shown in FIG. 45C is similar to that shown in FIG. 45A but is added with a xyz coordinates. The LED light bulb 20c shown in FIG. 45C can be referred to the aforementioned description of the LED light bulb 20c shown in FIG. 45A, and it is thus unnecessary to go into details repeatedly. The LED filament 100 shown in FIG. 45C is curved to form a circular shape in a top view while the LED filament is curved to form a wave shape in a side view. The wave shaped structure is not only novel in appearance but also guarantees that the LED filament 100 illuminates evenly. In the meantime, the single LED filament 100, comparing to multiple LED filaments, requires less joint points (e.g., pressing points, fusing points, or welding points) for being connected to the conductive supports 51a, 51b. In practice, the single LED filament 100 (as shown in FIG. 45C) requires only two joint points respectively formed on the two conductive electrodes, which effectively lowers the risk of fault welding and simplifies the process of connection comparing to the mechanically connection in the tightly pressing manner.

Figure 45D:
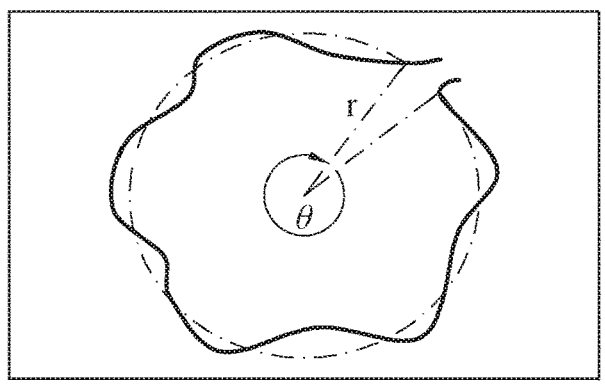
FIG. 45D is a projection of a top view of an LED filament of an LED light bulb of FIG. 45C.

Please refer to FIG. 45D. FIG. 45D is a projection of a top view of an LED filament of the LED light bulb 20c of FIG. 45C. As shown in FIG. 45D, in an embodiment, the LED filament may be curved to form a wave shape observed in a top view to surround the center of the light bulb or the stem. In different embodiments, the LED filament observed in the top view can form a quasi-circle or a quasi U shape.

In an embodiment, the LED light bulb 20c shown in FIG. 45C may be a light bulb with an A size. The two joint points for electrical connection between the two conductive supports 51a, 51b and the LED filament 100 is spaced by a distance, which is within 3 cm and is preferably within 2 cm. The LED filament 100 surrounds with the wave shape; therefore, the LED filament 100 may generate an effect of an omnidirectional light, and the two joint points may be close to each other such that the conductive supports 51a, 51b are substantially below the LED filament 100. Visually, the conductive supports 51a, 51b keeps a low profile and is integrated with the LED filament 100 to show an elegance curvature. While being observed from a side of the LED filament 100 in the LED light bulb 20c, a distance between the highest point and the lowest point of the wave of the LED filament 100 is from 2.2 cm to 3.8 cm and is preferably from 2.2 cm to 2.8 cm. Thus it could be ensured that there would be a space for heat dissipation above the LED filament 100.

As shown in FIG. 45C, the shape of the LED filament 100 may satisfy a curve equation. The position of the LED filament 100 in space relates to the Cartesian coordinates (i.e., an xyz coordinates) shown in FIG. 1. An x-y plane of the xyz coordinates is a plane passing through a top of the stem 19 (i.e., a top of the stand 19a in the embodiment in which the stand 19a is deemed as a part of the stem 19). An origin of the xyz coordinates is at the top of the stem 19 (the origin may be at a center of a sphere body of a bulb shell of a light bulb without any stems). The x-y plane is perpendicular to a height direction of the LED light bulb 20c.

The two conductive electrodes (i.e., the welding points, the joint points, the contacting points, or the fusing points) are symmetrically disposed at two sides of a y-axis of the xyz coordinates. A z-axis of the xyz coordinates is coaxial with stem 19 (or is coaxial with a central axis passing through a horizontal plane of the LED light bulb 20c). The shape of the LED filament 100 varies along an x-direction, a y-direction, and a z-direction according to t, and t is a variable between 0 and 1. A position of points of the LED filament 100 in the xyz coordinates is defined as X, Y, and Z and satisfies the curve equation. Herein, the term "points of the LED filament" means "most of points of the LED filament", or "more than 60% of points of the LED filament." The curve equation is:

$$X = m1 * \cos(t*360),$$

$$Y = m2 * \sin(t*360),$$

$$Z = n * \cos(t*360*k),$$

The LED filament 100 varies along the x-direction, the y-direction, and the z-direction according to t. When X=0, |Y|max=m2 (a max value of |Y| is m2), and |Z|max=n (a max value of |Z| is n). When Y=0, |X|max=m1 (a max value of |X| is m1), and |Z|max=n (the max value of |Z| is n). When Z=0, |X|max=m1 (the max value of |X| is m1), and |Y|max=m2 (the max value of |Y| is m2). m1 is a length (projection length) in the x-direction, and 24≤m1≤27 (mm). m2 is a length (projection length) in the y-direction, and 24≤m2≤27 (mm). Based upon the above configuration, the LED filament 100 in the bulb shell 12 may provide good luminous flux. n is a height of the highest point of the LED filament 100 from the x-y plane in the z-direction, and 0<n≤14 (mm). Based upon the above condition, wires in turning points of the LED filament 100 may hard to break. k is a number of the highest point(s). The more the supporting arms (or supporting bars), the hard the manufacture is; therefore, k is configured as: 2≤k≤8. A curve line drawn by the above curve equation may be deemed as a reference for the LED filament 100 being distributed in space. According to conditions of different arts and equipment, the configuration of the LED filament 100 in practice may have about 0 to 25% in spatial difference different from the reference based upon the curve equation. Certain region(s) on the filament with supporting point(s) may be relatively highest point(s) and lowest point(s). The spatial difference of the certain region(s) may be less, e.g., 0 to 20%. In an embodiment, r is the radius of a cross section of the bulb shell on the horizontal plane. Cross sections of the bulb shell on the horizontal plane from the bottom to the top of the bulb shell along the height direction may have varied radii, and the radius r is the one with the largest value. In such case, the values of m1, m2, and n may be set as: 0.8*r≤m1≤0.9*r; 0.8*r≤m2≤0.9*r; 0<n≤0.47*r. Additionally, p is the radius of an interface of the bulb base utilized for being connected to the bulb shell, G is the length of the LED filament, and, in such case, the values of G may be set as: 1.2*p≤G≤5.6*r. Based upon the above setting, the LED filament may not only achieve the aforementioned effect, but may also need the least length and the least number of the LED chips. As a result, the cost of materials for the manufacture of the LED light bulb may reduce, and the temperature of the LED light bulb during operation can be suppressed.

In another embodiment, as shown in FIG. 45D, a projection of the LED filament 100 on the x-y plane may be deemed as a quasi-circle. r is a distance from a center point defined by the projection to the projection itself. r is deemed as a radius of the projection the LED filament 100. θ is an angle of an arc formed by the projection. θ of a projection point of one of the two ends of the LED filament 100 is 0. The arc angle θ is from 180° to 360°. In certain embodiments, the LED filament 100 may be adjusted via the height in the z-axis to form an arc of which θ is greater than 360°. According to different arts and equipment, the radius r of the projection of the LED filament 100 may have variations with about ±20% difference. A relation between the LED filament 100 varying along the z-axis and θ satisfies a function: $Z=n*\cos(k\theta+\pi)$, wherein n is a height of the highest point from the x-y plane in the z-direction, and $0<n\leq14$ (mm); k is a number of the highest point(s), and $2\leq k\leq 8$. According to different arts and equipments, these parameters may have variations with about ±20% difference.

Additionally, the inner shape (the hole shape) of the clamping portion 15a fits the outer shape of the cross section of the LED filament 100; therefore, based upon a proper design, the cross section may be oriented to face towards a predetermined orientation. For example, as shown in FIG. 45B, the top layer 420a of the LED filament 100 is oriented to face towards ten o'clock. A lighting face of the whole LED filament 100 may be oriented to face towards the same orientation substantially to ensure that the lighting face of the LED filament 100 is visually identical. The LED filament 100 comprises a main lighting face and a subordinate lighting face corresponding to the LED chips. If the LED chips in the LED filament 100 are wire bonded and are aligned in line, a face of the top layer 420a away from the base layer 420b is the main lighting face, and a face of the base layer 420b away from the top layer 420a is the subordinate lighting face. The main lighting face and the subordinate lighting face are opposite to each other. When the LED filament 100 emits light, the main lighting face is the face through which the largest amount of light rays passes, and the subordinate lighting face is the face through which the second largest amount of light rays passes. In the embodiment, there is, but is not limited to, a conductive foil 530 formed between the top layer 420a and the base layer 420b, which is utilized for electrical connection between the LED chips. In the embodiment, the LED filament 100 wriggles with twists and turns while the main lighting face is always towards outside. That is to say, any portion of the main lighting face is towards the bulb shell 12 or the bulb base 16 at any angle, and the subordinate lighting face is always towards the stem 19 or towards the top of the stem 19 (the subordinate lighting face is always towards inside). Whereby, the LED light bulb 20c as a whole may generate an effect of an omnidirectional light close to a 360 degrees illumination.

Figure 45E:
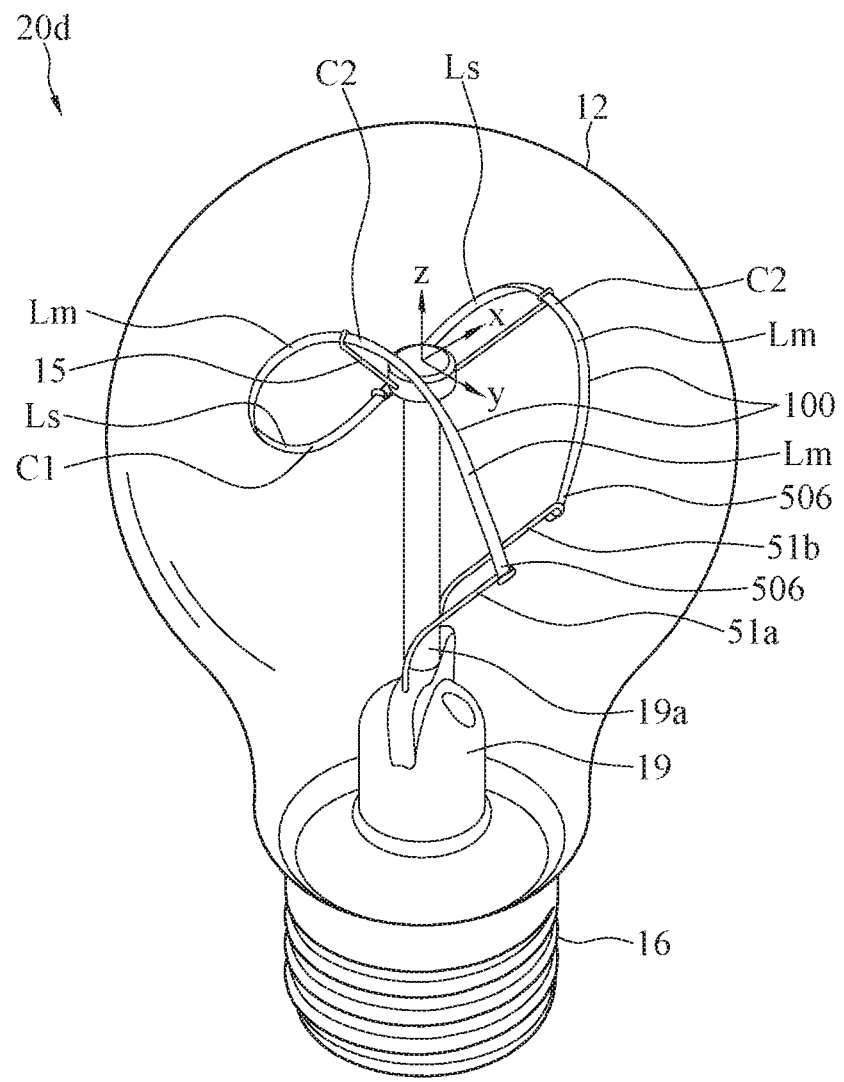
FIG. 45E is a perspective view of an LED light bulb according to an embodiment of the present invention.

Please refer to 45E. FIG. 45E is a perspective view of an LED light bulb according to an embodiment of the present invention. The LED light bulb 20d shown in FIG. 45E is analogous to the LED light bulb 20c shown in FIGS. 45A and 45C. As shown in FIG. 45E, the LED light bulb 20d comprises a bulb shell 12, a bulb base 16 connected to the bulb shell 12, two conductive supports 51a, 51b disposed in the bulb shell 12, supporting arms 15, a stem 19, and one single LED filament 100d. The stem 19 comprises a stem bottom and a stem top opposite to each other. The stem bottom is connected to the bulb base 16. The stem top extends to inside of the bulb shell 12 (to the center of the bulb shell 12). For example, the stem top may be substantially located at a center of the inside of the bulb shell 12. In the embodiment, the stem 19 comprises the stand 19a. Herein the stand 19a is deemed as a part of the whole stem 19 and thus the top of the stem 19 is the same as the top of the stand 19a. The two conductive supports 51a, 51b are connected to the stem 19. The LED filament 100d comprises a filament body and two conductive electrodes 506. The two conductive electrodes 506 are at two opposite ends of the filament body. The filament body is the part of the LED filament 100d without the conductive electrodes 506. The two conductive electrodes 506 are respectively connected to the two conductive supports 51a, 51b. The filament body is around the stem 19. An end of the supporting arm 15 is connected to the stem 19 and another end of the supporting arm 15 is connected to the filament body.

Figure 45F:
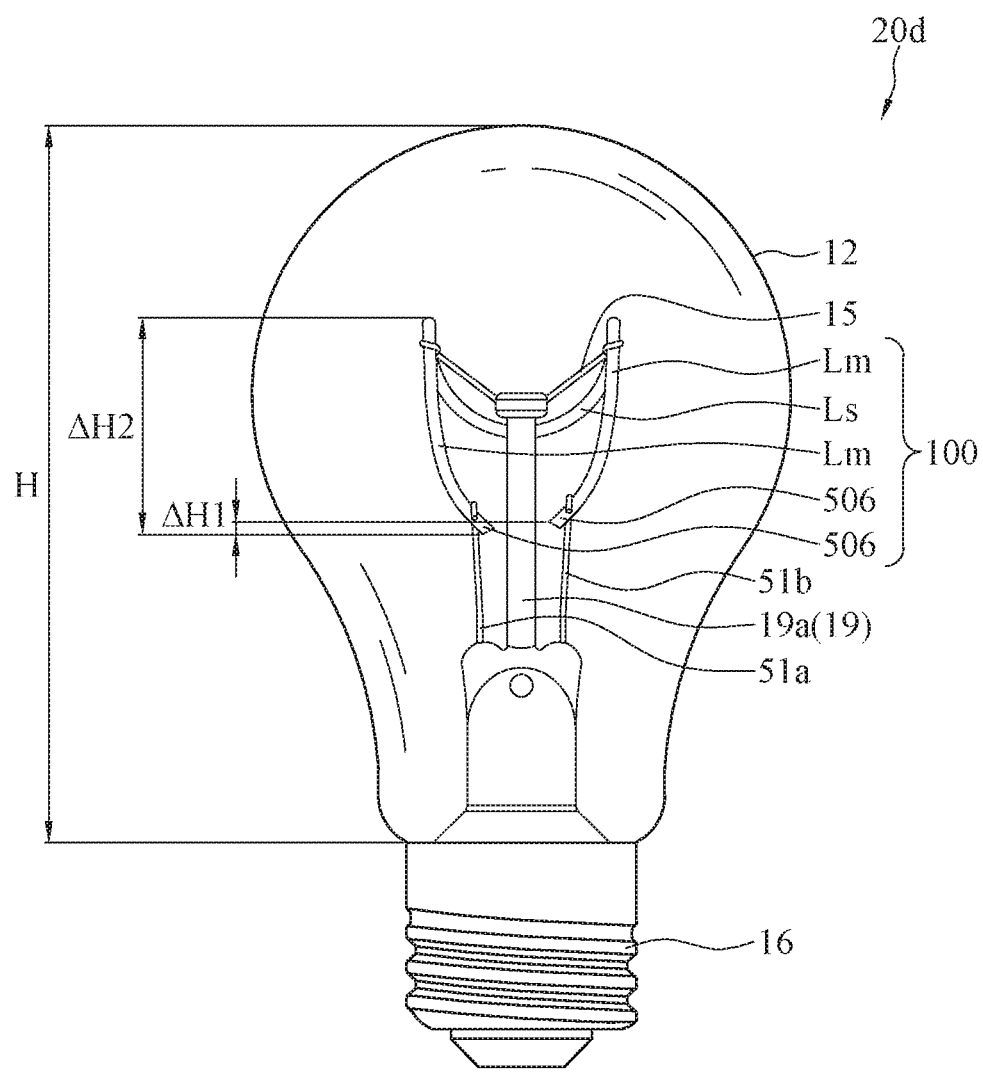
FIG. 45F is a front view of an LED light bulb of FIG. 45E.
Figure 45G:
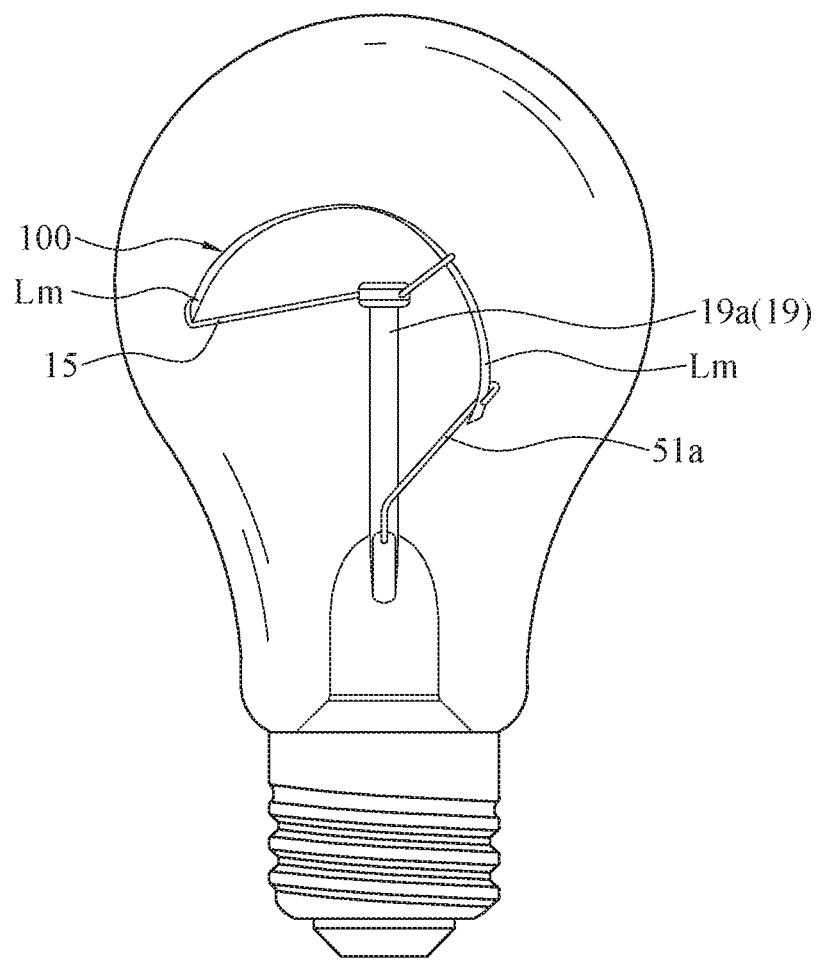
FIG. 45G is a side view of an LED light bulb of FIG. 45E.
Figure 45H:
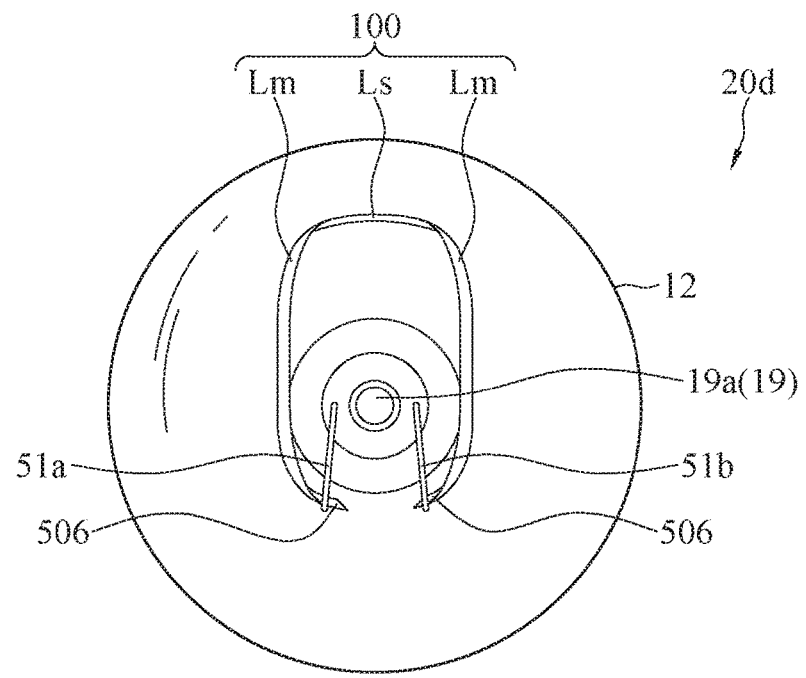
FIG. 45H is a top view of an LED light bulb of FIG. 45E.

Please refer to FIG. 45E to FIG. 45H. FIG. 45F is a front view of an LED light bulb of FIG. 45E. FIG. 45G is a side view of the LED light bulb of FIG. 45E. FIG. 45H is a top view of the LED light bulb of FIG. 45E. In a height direction of the LED light bulb 20d (i.e., the z-direction), H is a distance from a bottom of the bulb shell 12 to a top of the bulb shell 12, and a first height difference ΔH1 is defined between the two conductive electrodes 506. The first height difference ΔH1 is from 0 to 1/10H. In other words, the minimum of the height difference between the two conductive electrodes 506 may be 0 and, in such case, the two conductive electrodes 506 are at the same level. The maximum of the height difference between the two conductive electrodes 506 may be 1/10H. Preferably, the first height difference ΔH1 may be from 0 to 1/20H. In an embodiment, the first height difference ΔH1 may be from 0 mm to 5 mm. In addition, the first height difference ΔH1 may be from 1 mm to 5 mm. Further, the first height difference ΔH1 may be from 1 mm to 2 mm.

In an embodiment, the minimum straight-line distance between the two conductive electrodes 506 is less than 3 cm. In the height direction, the two conductive electrodes 506 are located between 1/2H and 3/4H from the bottom of the bulb shell 12.

As shown in FIG. 45F, the filament body is curved and rises and falls to form a highest point and a lowest point. A second height difference ΔH2 is defined between the highest point and the lowest point. In the embodiment, the lowest point of the filament body is an end adjacent to the conductive electrode 506. In another embodiment, if the filament body has a downward curving portion (which is curved towards the bulb base 16) lower than the conductive electrodes 506 in the z-direction, the lowest point is on the downward curving portion of the filament body. The first height difference ΔH1 is less than the second height difference ΔH2. The second height difference ΔH2 is from 2/10H to 4/10H. In an embodiment, the second height difference ΔH2 is from 2.2 cm to 3.8 cm, and, preferably, the second height difference ΔH2 is from 2.2 cm to 2.8 cm.

In an embodiment, all of the highest point(s) and the lowest point(s) are between 1/3H to 4/5H from the bottom of the bulb shell in the height direction (i.e., the z-direction). Additionally, the filament body between the two conductive electrodes 506 is a lighting segment. More than 50% (preferably 95%) of a height of the lighting segment is higher than the two conductive electrodes 506 in the height direction. Preferably, more than 30% of the height of the lighting segment is higher than the stem top of the stem 19 (i.e., the top of the stand 19a) in the height direction.

In an embodiment, when the LED light bulb 20*d* is projected to a side projection plane parallel with the height direction of the LED light bulb 20*d* (the z-direction), a filament side projection of the filament body on the side projection plane (which may be referred to FIG. 45F and FIG. 45G) comprises a highest point and a lowest point. A height difference is defined between the highest point and the lowest point of the filament side projection in the height direction. The height difference is from 1/8 to 3/8 of the height H of the bulb shell 12.

In an embodiment, when the LED light bulb 20*d* is projected to a horizontal projection plane perpendicular to the height direction of the LED light bulb 20*d* (which may be referred to FIG. 45H), a filament horizontal projection of the filament body on the horizontal projection plane is of a quasi-circle or a quasi U shape. As shown in FIG. 45H, the filament horizontal projection of the filament body on the horizontal projection plane is of a quasi U shape. In addition, a shortest distance between the two ends of the filament horizontal projection (two projection points of the two conductive electrodes 506 on the horizontal projection plane) is from 0 cm to 3 cm.

In an embodiment, the filament body is around the stem 19 by an angle greater than 270 degrees. For example, as shown in FIG. 45D and FIG. 45H, The arc angle θ of the projection of the filament body on the x-y plane is greater than 270 degrees. Consequently, the effect of illumination is better. In different embodiments, as shown in FIG. 45D, r is the distance from the center point defined by the filament horizontal projection to the projection itself. θ is an arc angle formed by the filament horizontal projection, and θ is greater than or equal to 30 degrees and is less than or equal to 360 degrees. In an embodiment, a number of the LED filament 100 is one, and, in such case, when the LED light bulb 20*d* is projected to a projection plane at a particular angle (which may be referred to a side view of the LED light bulb 20*d*), a projection of the two conductive supports 51*a*, 51*b* overlaps (only the conductive support 51*a* is shown in FIG. 45G while the conductive supports 51*a*, 51*b* overlap with each other), a projection of the filament body crosses over two sides of a projection of the stem 19, and the projection of the two conductive supports 51*a*, 51*b* is at one of the two sides of the projection of the stem 19. Because the projections of the conductive supports 51*a*, 51*b* are at the same side of the projection of the stem 19, i.e., there is no conductive support at the other side of the projection of the stem 19, the light emitted from the LED filament 100 is hard to be blocked, and it is easier to align or correct the posture of the LED light bulb 20*d*.

In an embodiment, the filament body comprises multiple LED chips which are wire bonded and are aligned in line, and, as aforementioned, the filament body is defined with the main lighting face and the subordinate lighting face opposite to each other in accordance with the LED chips. In the embodiment, as shown in FIG. 45E to FIG. 45H, the filament body comprises a main lighting face Lm and a subordinate lighting face Ls. Any portion of the main lighting face Lm is towards the bulb shell 12 or the bulb base 16 at any angle, and any portion of the subordinate lighting face Ls is towards the stem 19 or towards the top of the stem 19, i.e., the subordinate lighting face Ls is towards inside of the LED light bulb 20*d* or towards the center of the bulb shell 12. In other words, when a user observes the LED light bulb 20*d* from outside, the user would see the main lighting face Lm of the LED filament 100*d* at any angle. Based upon the configuration, the effect of illumination is better.

In the embodiment, as shown in FIG. 45E to FIG. 45H, the shape of the LED filament 100*d* satisfies the aforementioned curve equation: $X=m1*\cos(t*360)$, $Y=m2*\sin(t*360)$, and $Z=n*\cos(t*360*k)$. The curve equation can be referred to the above description, and it is unnecessary to go into details.

In addition, as shown in FIG. 45E, the LED filament 100*d* may be defined as the following description according to its appearance. The filament body of the LED filament 100 comprises at least one first curving segment C1 and at least two second curving segments C2. The first curving segment C1 is between the two second curving segments C2. The two conductive electrodes 506 are respectively at an end of each of the two second curving segments C2 away from the first curving segment C1. In the embodiment, multiple supporting arms 15 are respectively connected to bended portions of the first curving segment C1 and the second curving segment C2 to well support different curving segments of the filament body. The first curving segment C1 curves towards a first direction and the second curving segments C2 curve towards a second direction. The first curving segment C1 and the two second curving segments C2 form a wave shaped annular structure.

In the embodiment, as shown in FIG. 45E, the first direction is towards the bulb base 16, and the second direction is away from the bulb base 16. In other words, referred to FIG. 45E, the first curving segment C1 curves downwardly (i.e., the bended portion of the first curving segment C1 is closer to the bulb base 16), and the second curving segments C2 curve upwardly (i.e., the bended portion of the second curving segment C2 is more away from the bulb base 16). In different embodiments, the first direction is away from the bulb base 16, and the second direction is towards the bulb base 16. In other words, the first curving segment C1 curves upwardly and the second curving segments C2 curve downwardly.

In the embodiment, when the LED light bulb 20*d* is respectively projected to a first side projection plane and a second side projection plane perpendicular to each other and both parallel with the height direction (the z-direction) of the LED light bulb 20*d*, a projection of the first curving segment C1 and the two second curving segments C2 on the first side projection plane is of a reversed U shape, and a projection of the first curving segment C1 and the two second curving segments C2 on the second side projection plane is of a U shape or an M shape. The first side projection plane may be referred to the side view shown in FIG. 45G, and the filament body shown in FIG. 45G is of a reversed U shape. The second side projection plane may be referred to the front view shown in FIG. 45F, and the filament body shown in FIG. 45F is of an M shape. If a height of a lowest point of the bended portion of the first curving segment C1 is close to that of the conductive electrodes 506, the filament body shown in FIG. 45F is of a U shape. In the embodiment, as shown in FIG. 45H, the projection of the first curving segment C1 and the second curving segments C2 on the horizontal projection plane of the LED light bulb 20*d* is of a U shape or a reversed U shape (which is a reversed U shape in FIG. 45H according the direction of observation). The horizontal projection plane is perpendicular to the height direction of LED light bulb 20*d* (the z-direction) and is parallel with the x-y plane.

Figure 45I:
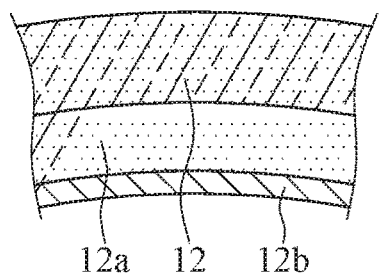
FIG. 45I is a partially enlarged, cross-sectional view of a bulb shell of an LED light bulb according to a first embodiment of the present invention.
Figure 45J:
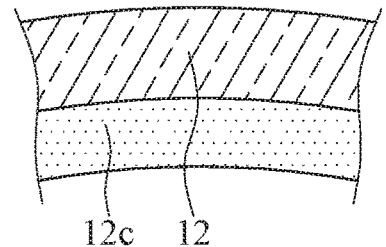
FIG. 45J is a partially enlarged, cross-sectional view of a bulb shell of an LED light bulb according to a second embodiment of the present invention.
Figure 45K:
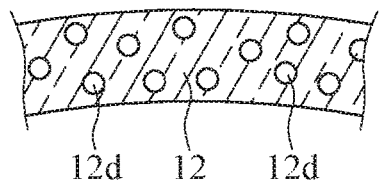
FIG. 45K is a partially enlarged, cross-sectional view of a bulb shell of an LED light bulb according to a third embodiment of the present invention.

Please refer to FIG. 45I to FIG. 45K. FIG. 45I is a partially enlarged, cross-sectional view of a bulb shell of an LED light bulb according to a first embodiment of the present invention. FIG. 45J is a partially enlarged, cross-sectional view of a bulb shell of an LED light bulb according to a second embodiment of the present invention. FIG. 45K is a partially enlarged, cross-sectional view of a bulb shell of an LED light bulb according to a third embodiment of the present invention. The bulb shell 12 comprises an adhesive layer 12a and a diffusing film 12b. The adhesive layer 12a is disposed between the bulb shell 12 and the diffusing film 12b. The adhesive layer 12a may be utilized for enhancing the solidity between the diffusing film 12b and the bulb shell 12. The diffusing film 12b may be utilized for diffusing light rays passing through the bulb shell 12 such that the LED light bulb 20c, 20d may create a more even illumination effect. In addition, the diffusing film 12b may also attach to the bulb shell 12 directly without the adhesive layer 12a. The diffusing film 12b may be attached to an outside or an inside of the bulb shell 12. In other embodiments, the diffusing film 12b may be replaced by a color toning film. The color toning film is capable of adjusting the color temperature of light emitted from the LED light bulb 20c, 20d. Alternatively, the diffusing film 12b may also have the capability of adjusting the color temperature. In such case, for example, the diffusing film 12b may be added with light conversion substances. The light conversion substances may be wavelength conversion particles.

As shown in FIG. 45J, in an embodiment, the bulb shell 12 may comprise an adhesive film 12c to improve the safety of the bulb shell. The adhesive film 12c may be attached to an outside or an inside of the bulb shell 12. In the embodiment, the adhesive film 12c is located at the inside of the bulb shell 12. The material of the adhesive film 12c may be calcium carbonate or strontium phosphate. The thickness of the adhesive film 12c relates to the weight of the LED light bulb 20c, 20d. If the LED light bulb 20c, 20d is provided with a heat dissipator (e.g., heat dissipating fins between the bulb shell 12 and the bulb base 16) and the heat dissipator has a weight over 100 grams (the heat dissipator includes 70% of heat conductive glue of 0.7 W/m*K to 0.9 W/m*K), the thickness of the adhesive film 12c may be between 200 µm and 300 µm. When the heat dissipator has no heat conductive glue and has a weight below 80 grams, the thickness of the adhesive film 12c may be from 40 µm to 90 µm, which is sufficient to prevent explosion. Considering the explosion proof of the Light bulb, a lower bound of the thickness relates to the weight of the light bulb; however, an upper bound of the thickness greater than 300 µm may result in a poor transmittance of light and an increased cost of material. The material of the adhesive film 12c may be a combination of calcium carbonate and strontium phosphate. During the manufacturing process of the adhesive film 12c, organic solvent may be added and mixed. When the bulb shell 12 is broken, broken pieces of the bulb shell 12 can be connected by the adhesive film 12c to avoid breaches so as to prevent users from electric shock due to accidently contacting conductive components inside the broken light bulb.

As shown in FIG. 45K, in an embodiment, the bulb shell 12 may comprise light conversion substances 12d in order to changing the color temperature of light emitted from the LED light bulb 20c, 20d. The bulb shell 12 is capable of adjusting the color temperature of light emitted from the LED light bulb 20c, 20d by the light conversion substances 12d. The light conversion substances 12d are mixed with the bulb shell 12. In other words, the light conversion substances 12d are added into an original material of the bulb shell 12 during the manufacturing process of the bulb shell 12.

In different embodiments, the color temperature of light emitted from the LED light bulb 20c, 20d may be adjusted by phosphor powders in a phosphor powder glue/film of the LED light filament 100, 100d around the LED chips. In addition, the bulb shell 12, the stem 19, or the stand 19a could also be utilized for adjusting the color temperature. For example, the light conversion substances 12d may be added in a fritting process while the bulb shell 12 is made by glass to form the bulb shell 12 with the light conversion substances 12d, as shown in FIG. 45J. Alternatively, the color toning film with the light conversion substances can be applied to the inside or the outside of the transparent glass. The stem 19/stand 19a may also be mixed with the light conversion substances 12d.

According to the color temperature, the LED light bulb may be divided into two types, which are for decoration and for illumination. While the LED light bulb is mainly for decoration, the color temperature may be 1700K to 2700K, and the general color rendering index (Ra) may be 70 to 100 and preferably be 90 to 100. While the LED light bulb is mainly for illumination, the color temperature may be 2500K to 3500K, the luminaire efficiency may be 80 lumens/watt to 100 lumens/watt, and the general color rendering index (Ra) may be 60 to 100 and preferably be 80 to 100. The light conversion substance (e.g., the light conversion substances 12d shown in FIG. 45J) may be, for example, phosphor powders or dyes (e.g., nanoparticles of silver compound, gold, titanium, silver enclosed by gold, or gold enclosed by silver).

Additionally, a diffusing film (e.g., the diffusing film 12b shown in FIG. 45I or a diffusing coating) may be applied to the outside or the inside of the bulb shell 12. Alternatively, the diffusing film may be applied to the stem 19 or the stand 19a; therefore, the diffusion of light rays may be increased. A main material of the diffusing film may be any one of, a combination of any two of, or a combination of any three of calcium carbonate, halogen calcium phosphate, and aluminum oxide. The diffusing coating mainly formed by calcium carbonate and adequate solution may have a better effect of diffusion and transmittance (the transmittance may be up to 90%). While the diffusing film 12b is applied to the outer surface of the bulb shell 12, the friction between the diffusing coating and the bulb base 16 (alternatively the heat dissipator or plastic lamp holder) below the bulb shell 12 is increased, and the issue that the bulb shell 12 may be loose is significantly resolved.

In different embodiments, the composition of the diffusing coating comprises calcium carbonate, strontium phosphate (e.g., white powders of CMS-5000), thickener, and ceramic activated carbon. (e.g., colorless liquid of ceramic activated carbon of SW—C) during compounding, Specifically, while the diffusing coating is mainly made by calcium carbonate compounded with thickener, ceramic activated carbon, and deionized water and is applied to an inner surface or an outer surface of the bulb shell, the thickness of the coating is between 20 µm and 300 µm and preferably is between 20 µm and 30 µm. The diffusing film formed by the above materials may have transmittance about 90%. In general, the transmittance of the diffusing film may range from 85% to 96%. In addition, the diffusing film not only achieves the effect of light diffusing, but also achieves the effect of electric insulation. While the bulb shell is provided with the diffusing film, the risk of electric shock to users in the case of the glass shell being broken is lowered. The diffusing film diffuses light rays while the light source emits light, such that light rays from the light source passing through the diffusing film may be distributed circumferentially to avoid dark spaces and to bring the comfort of illumination. Additionally, different effects may be achieved while the diffusing coating is made by different materials or has different thickness.

In another embodiment, the diffusing coating is mainly made by calcium carbonate and compounded with a few of reflecting material (e.g., strontium phosphate or barium sulfate), thickener, ceramic activated carbon, and deionized water. The compounded diffusing coating is applied to the bulb shell. The mean thickness of the diffusing coating may be between 20 μm and 30 μm. The diffusing file is to make light diffused. In terms of micro observation, the phenomenon of diffusion is the refection of light rays being reflected by particles. The size of particles of reflecting materials such as strontium phosphate or barium sulfate is much greater than that of the calcium carbonate. Thus the diffusing coating added with a few of reflecting material is significantly beneficial of increasing the effect of diffusion.

Nevertheless, in other embodiments, the diffusing coating can be mainly made by halogen calcium phosphate or aluminum oxide. The size of particles of calcium carbonate is substantially between 2 μm and 4 μm. The size of particles of halogen calcium phosphate and aluminum oxide are substantially respectively between 4 μm and 6 μm and between 1 μm and 2 μm. For example, the mean thickness of the diffusing coating mainly made by calcium carbonate is substantially between 20 μm and 30 μm while the transmittance is required to be between 85% and 92%. Under the same requirement of the transmittance (between 85% and 92%), the mean thickness of the diffusing coating mainly made by halogen calcium phosphate is substantially between 25 μm and 35 μm, and the mean thickness of the diffusing coating mainly made by aluminum oxide is substantially between 10 μm and 15 μm. While the transmittance is required to be greater, e.g., greater than 92%, the diffusing coating mainly made by calcium carbonate, halogen calcium phosphate, or aluminum oxide is required to be thinner.

Figure 45L:
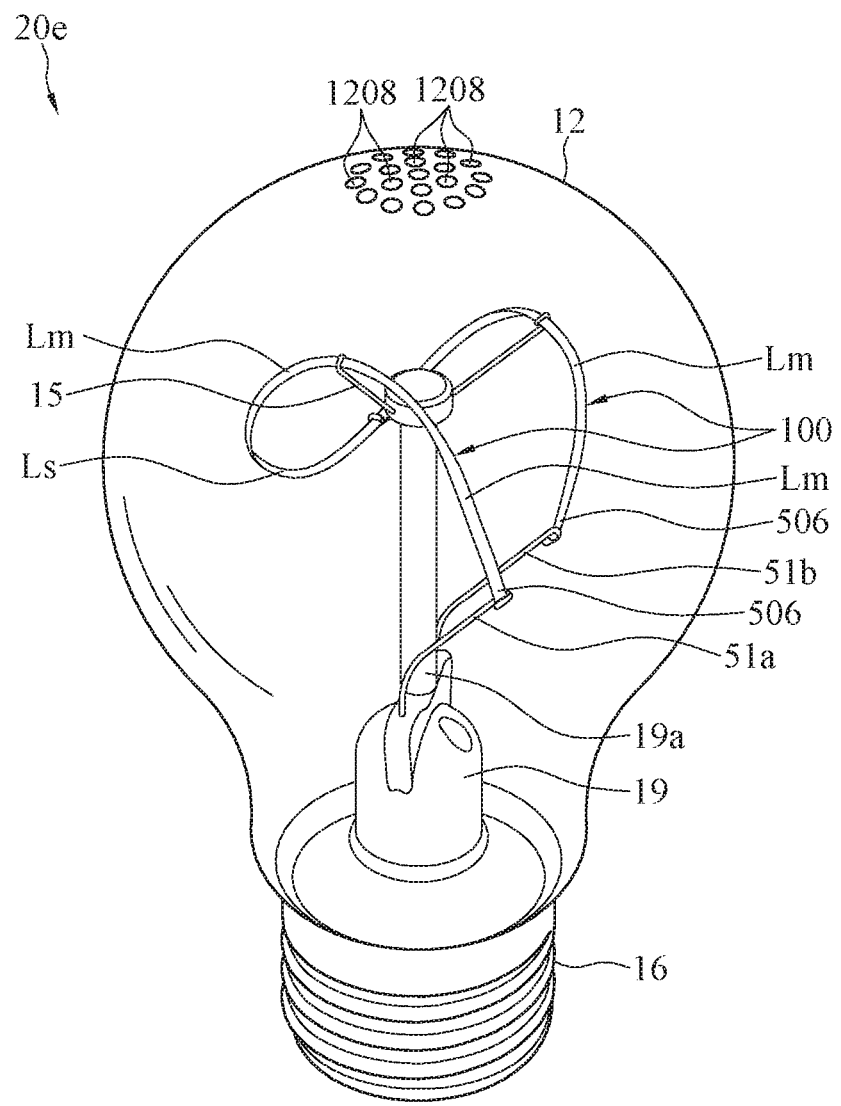
FIG. 45L is a perspective view of an LED light bulb according to another embodiment of the present invention.

Please refer to FIG. 45L. FIG. 45L is a perspective view of an LED light bulb according to another embodiment of the present invention. The difference between the LED light bulb 20e shown in FIG. 45L and the LED light bulb 20d shown in FIG. 45E is that the bulb shell 12 of the LED light bulb 20e shown in FIG. 45L further comprises a plurality of ventilation hole 1208. The ventilation holes 1208 penetrate through the bulb shell 12. The ventilation holes 1208 are distributed on the top of the bulb shell 12 in the height direction and are corresponding to the position of the LED filament 100d to allow the heat of the LED filament 100d generated during operation to be dissipated by air flow through the ventilation holes 1208. In different embodiments, the bulb shell 12 may further comprise a ventilation hole disposed on the bottom of the bulb shell 12.

Figure 45M:
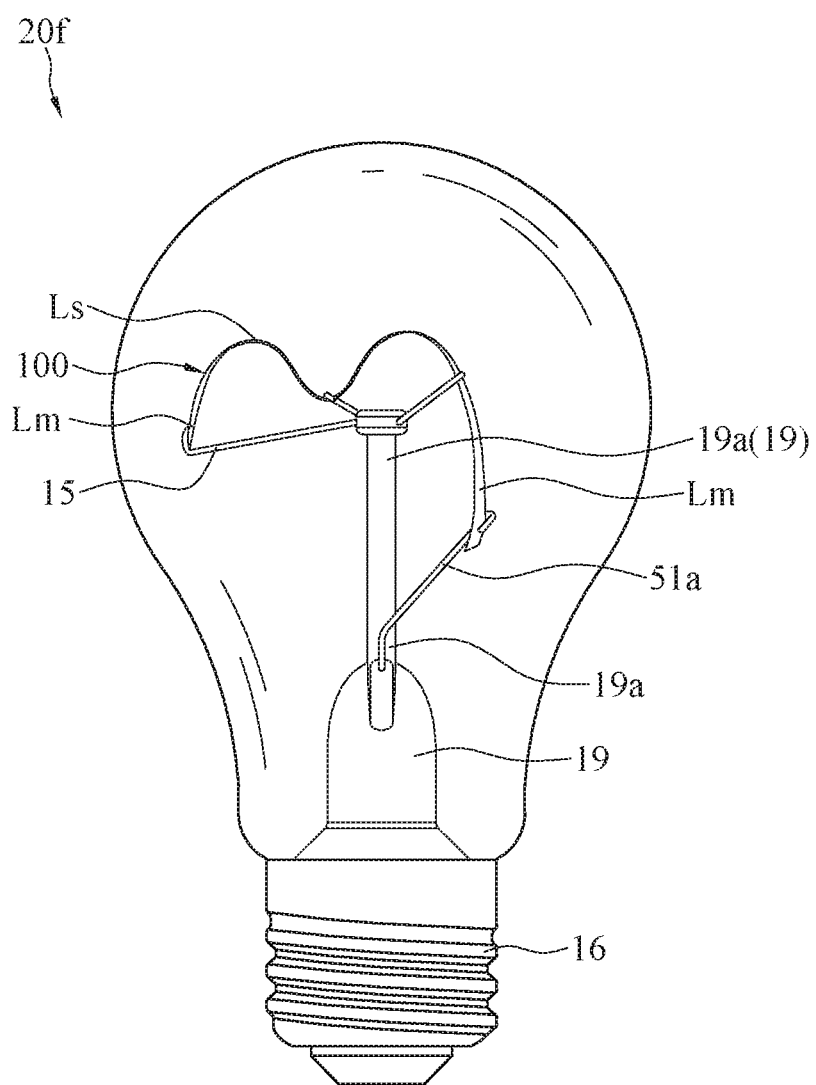
FIG. 45M is a side view of an LED light bulb according to yet another embodiment of the present invention.

Please refer to FIG. 45M. FIG. 45M is a side view of an LED light bulb according to yet another embodiment of the present invention. The difference between the LED light bulb 20f shown in FIG. 45M and the LED light bulb 20d shown in FIG. 45E is that the shape of the LED filament 100 is different from that of the LED filament 100 shown in FIG. 45E. Nevertheless, the variations of the shapes of the LED filaments 100 of FIG. 45E/45M satisfy the aforementioned curve equation. In the embodiment, the LED filament 100 of FIG. 45M has more bending portions than the LED filament 100 of FIG. 45E has. In other embodiments, the shape of the LED filament of the LED light bulb may be varied and is not limited to the embodiments shown in the drawings if the shape of the LED filament satisfies the curve equation.

Figure 45N:
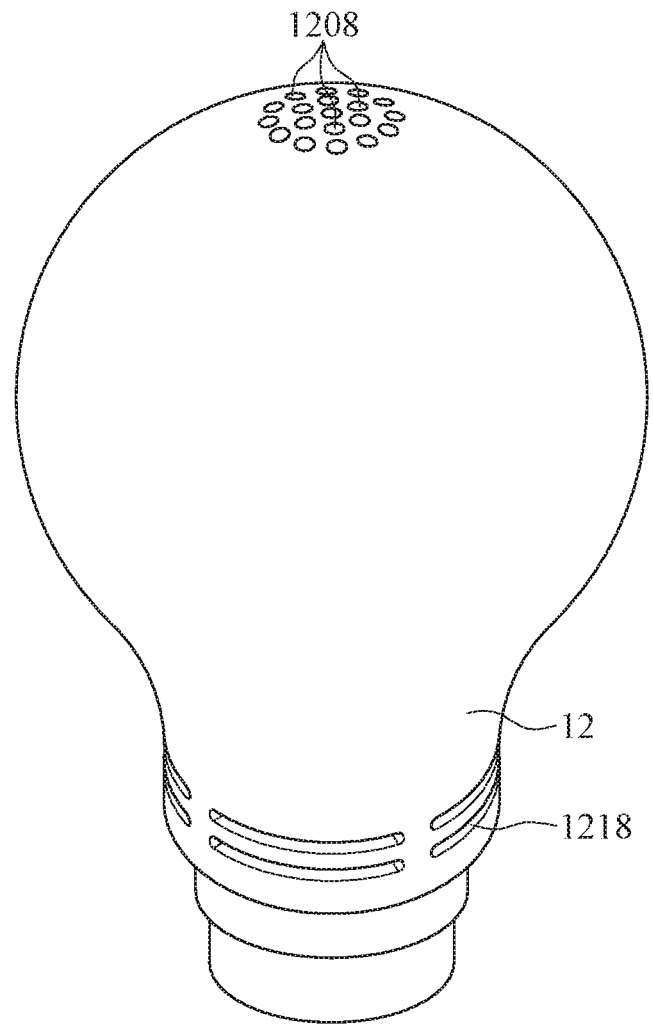
FIG. 45N is a perspective view of a bulb shell of an LED light bulb according to an embodiment of the present invention.

Please refer to FIG. 45N. FIG. 45N is a perspective view of a bulb shell of an LED light bulb according to an embodiment of the present invention. In the embodiment, the bulb shell 12 comprises two sets of ventilation holes 1208, 1218. The ventilation holes 1208 are disposed on the top of the bulb shell 12 in the height direction of the LED light bulb. The ventilation holes 1218 are disposed on the bottom of the bulb shell 12 in the height direction of the LED light bulb. In an embodiment, an area of an opening of the ventilation hole 1208 on the top of the bulb shell 12 is between 100 $mm^2$ and 500 $mm^2$ and is preferably between 150 $mm^2$ and 450 $mm^2$. An area of an opening of the ventilation hole 1218 on the bottom of the bulb shell 12 is between 200 $mm^2$ and 1200 $mm^2$ and is preferably between 450 $mm^2$ and 1000 $mm^2$. The two sets of ventilation holes 1208, 1218 are benefit to the convection of air.

Figure 47A:
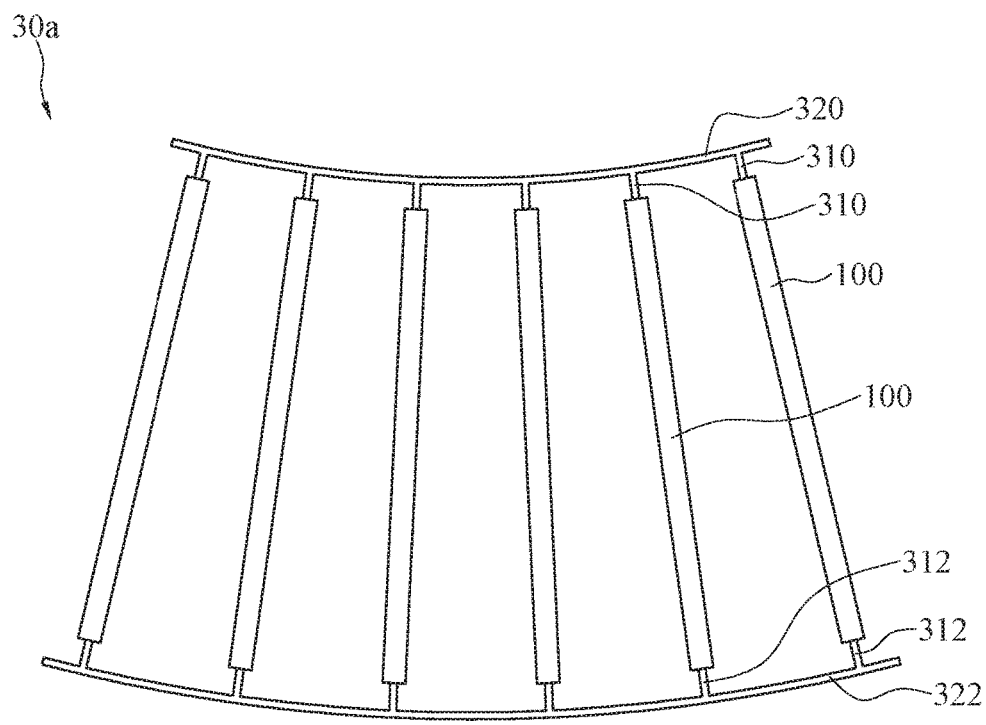
FIGS. 47A to 47D illustrate top views of LED filament modules according to embodiments of the present disclosure.
Figure 48A:
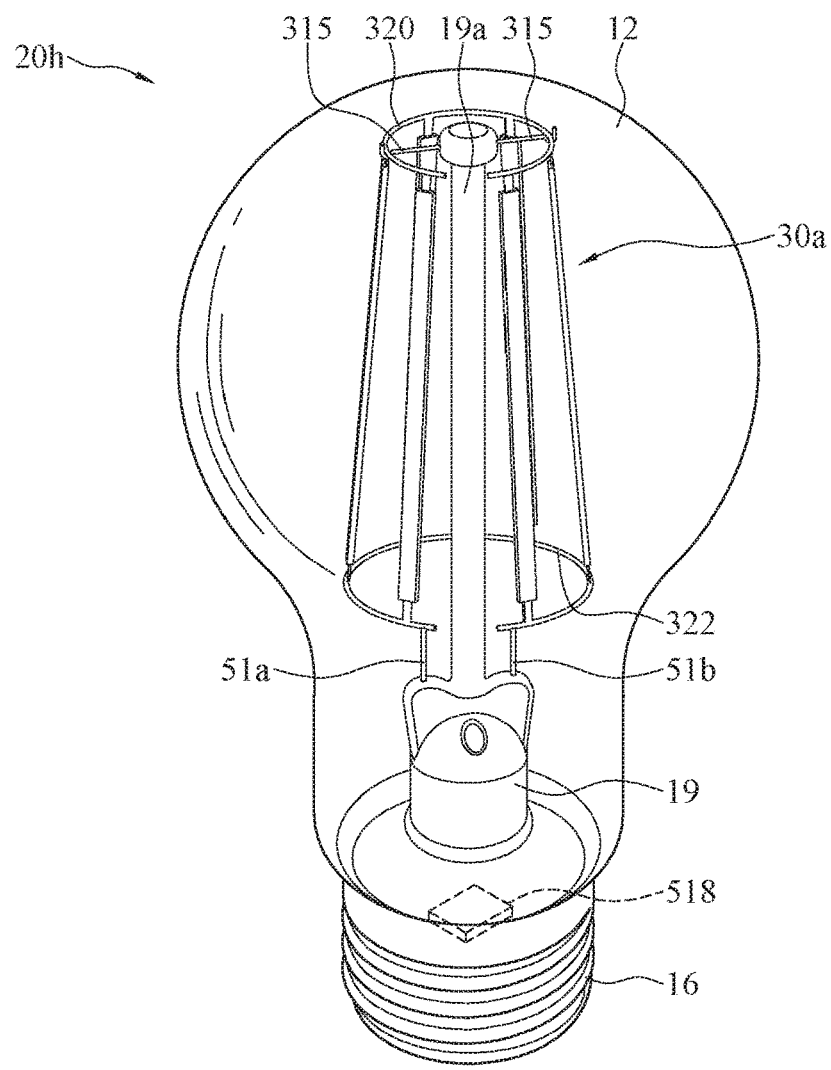
FIG. 48A illustrates a perspective view of an LED light bulb according to another embodiment of the present disclosure.
Figure 48B:
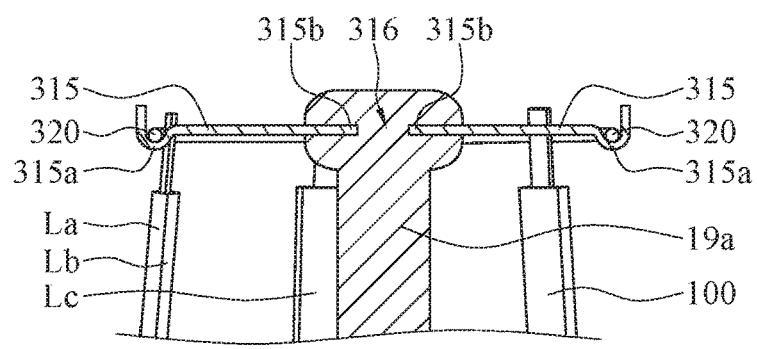
FIG. 48B illustrates a partial cross-sectional view of FIG. 48A.
Figure 48C:
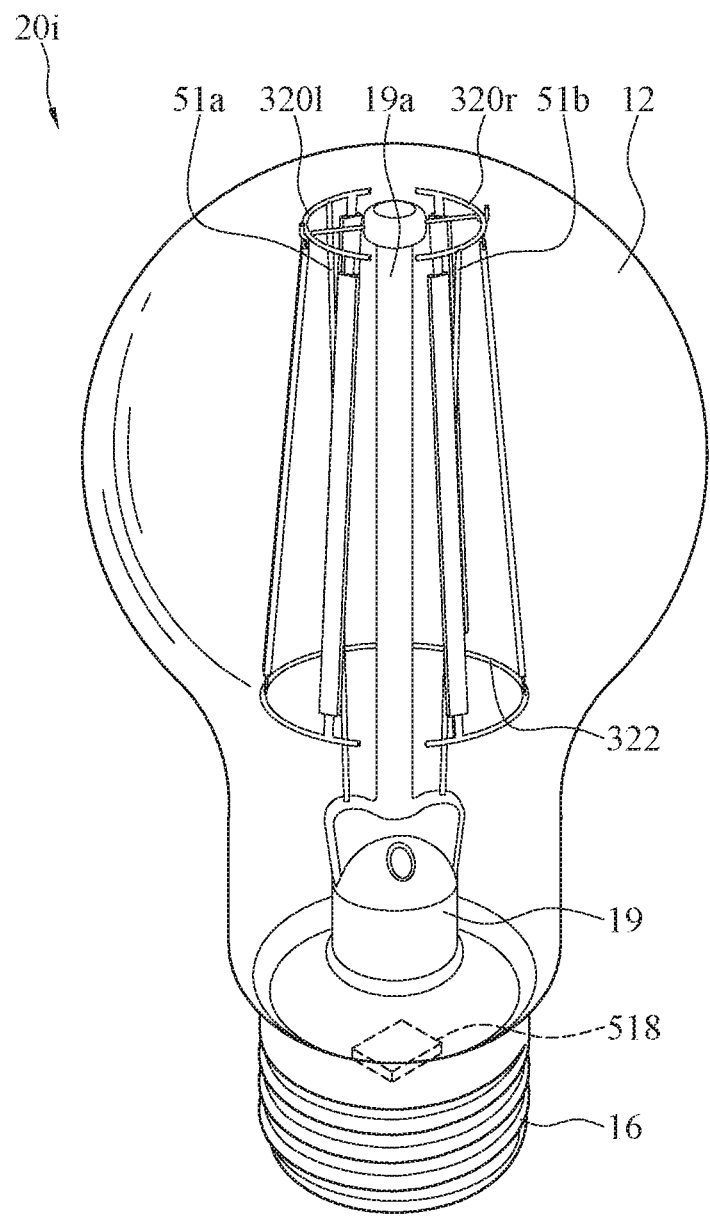
FIGS. 48C and 48D illustrate perspective views of LED light bulbs according to other embodiments of the present disclosure.
Figure 48D:
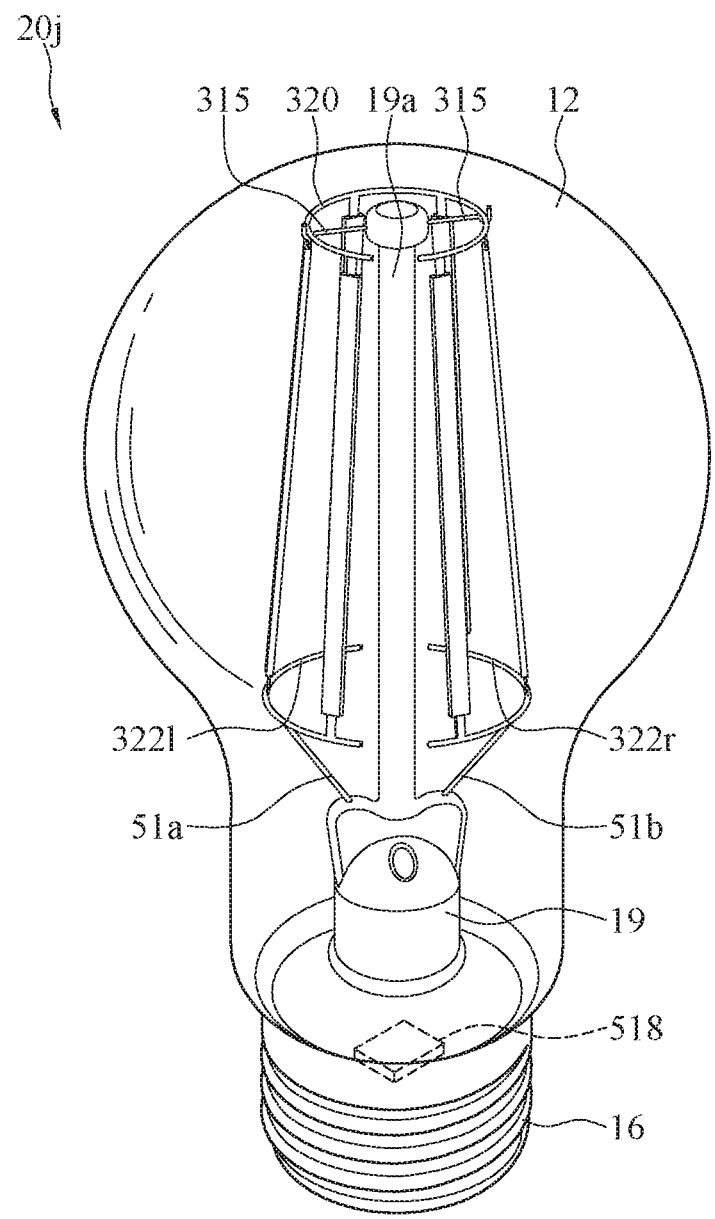

Please refer to FIG. 47A. FIG. 47A illustrates a top view of an LED filament module 30a according to an embodiment of the present disclosure. Specifically, the LED filament module 30a shown in FIG. 47A is not shaped yet and is going to be shaped by a jig. A shaping process of the LED filament module 30a is described later. As shown in FIG. 47A, the LED filament module 30a comprises a plurality of LED filaments 100, a first connecting portion 320, and a second connecting portion 322. Two conductive electrodes 310, 312 of each of the LED filaments 100 are respectively connected to the first connecting portion 320 and the second connecting portion 322. In the embodiment, the LED filament 100 can be referred to, but not limited to, the aforementioned description of the LED filaments 100 regarding structures, materials, and manufacturing processes. In other embodiments, the LED filament 100 can be different from the LED filaments illustrated in FIG. 33-45E. For example, the LED filament 100 can comprise a substrate such as glass and therefore is harder than the LED filaments illustrated in FIG. 33-45E.

In the embodiment, a difference between the LED filament 100 herein and the LED filaments illustrated in FIG. 33-45E is that all of the conductive electrodes 310 of the LED filaments 100 herein are connected to the first connecting portion 320, and all of the conductive electrodes 312 of the LED filaments 100 are connected to the second connecting portion 322. In the embodiment, the LED filaments 100, the first connecting portion 320, and the second connecting portion 322 are formed in a manufacturing process. In the embodiment, the first step of a manufacturing process of the LED filament module 30a is that the conductive electrodes 310 are formed with the first connecting portion 320, and the conductive electrodes 312 are formed with the second connecting portion 322. For example, the conductive electrodes 310 and the first connecting portion 320 are formed in a molding process, and the conductive electrodes 312 and the second connecting portion 322 are formed in another molding process. Alternatively, the conductive electrodes 310 are respectively soldered to the first connecting portion 320 in a soldering process, and the conductive electrodes 312 are respectively soldered to the second connecting portion 322 in another soldering process. The molding process is efficiency since the molded elements (e.g., the conductive electrodes 310 and the first connecting portion 320) can be formed in single procedure. The soldering process is easily practiced since the soldered elements can be soldered along two dimension directions but not three dimension directions.

The second step of the manufacturing process of the LED filament module 30a is that the LED filaments 100 are formed and are respectively connected to the conductive electrodes 310 and the conductive electrodes 312. A manufacturing process of the LED filaments 100 can be referred to, but not limited to, that of the LED filaments illustrated in FIG. 33-45E. The LED filaments 100, the first connecting portion 320, and the second connecting portion 322 are formed on a two-dimension plane into a two-dimensional form in the beginning, which is benefit to productivity and is of convenience regarding manufacturing, and are going to be shaped into three-dimension pose in a later process.

The first connecting portion 320 and the second connecting portion 322 are made by materials with conductibility. That is to say, currents can flow between the first connecting portion 320, the LED filaments 100, and the second connecting portion 322. For example, the first connecting portion 320 can be anode of the LED filament module 30a, and the second connecting portion 322 can be cathode of the LED filament module 30a. Under the circumstances, the LED filaments 100 are connected in parallel. One power line of a power source is connected to the first connecting portion 320, and the other one power line of the power source is connected to the second connecting portion 322. Positive charges flow into the LED filaments 100 via the first connecting portion 320 and the conductive electrodes 310, and positive charges leave the LED filaments 100 via the conductive electrodes 312 and the second connecting portion 322.

In the embodiment, the LED filament module 30a being not shaped yet has a sector outline in the top view. The first connecting portion 320 and the second connecting portion 322 respectively have arc shapes. The arc length of the first connecting portion 320 is less than that of the second connecting portion 322.

Figure 47B:
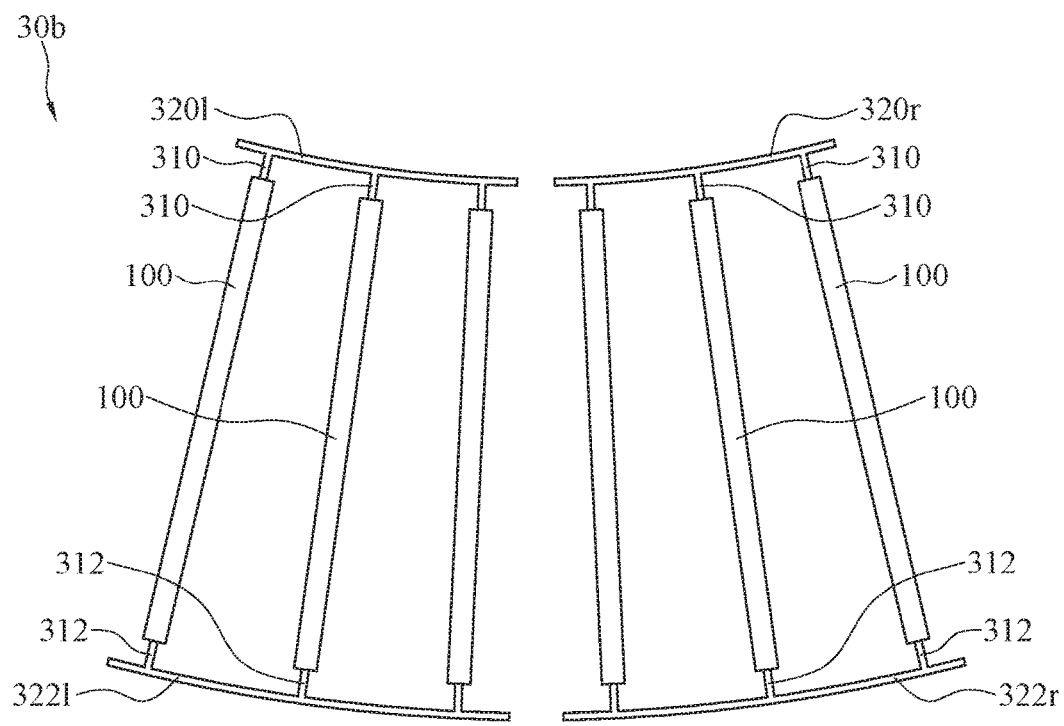
Figure 47C:
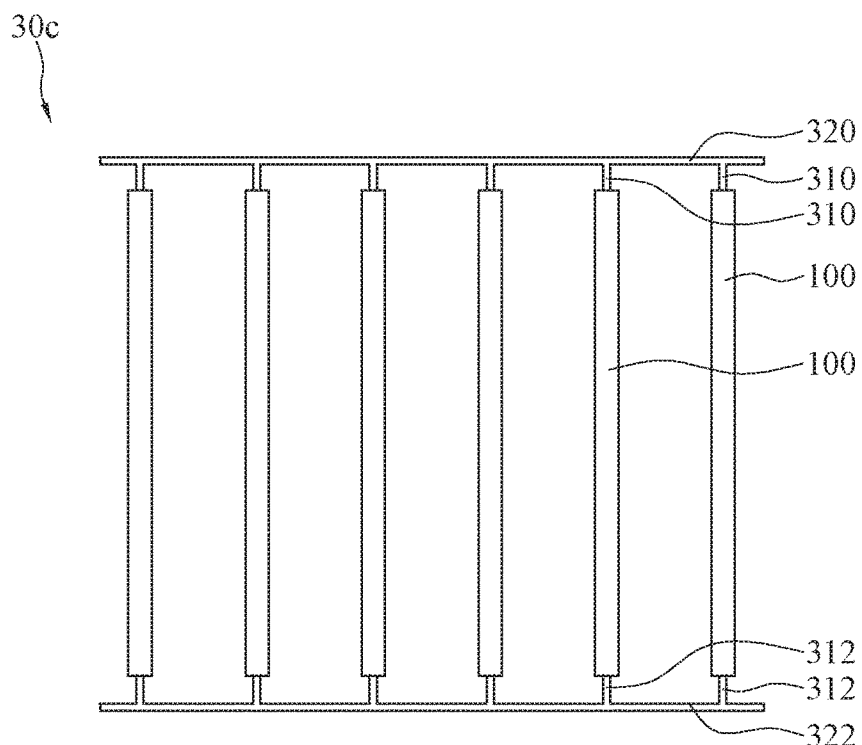
Figure 47D:
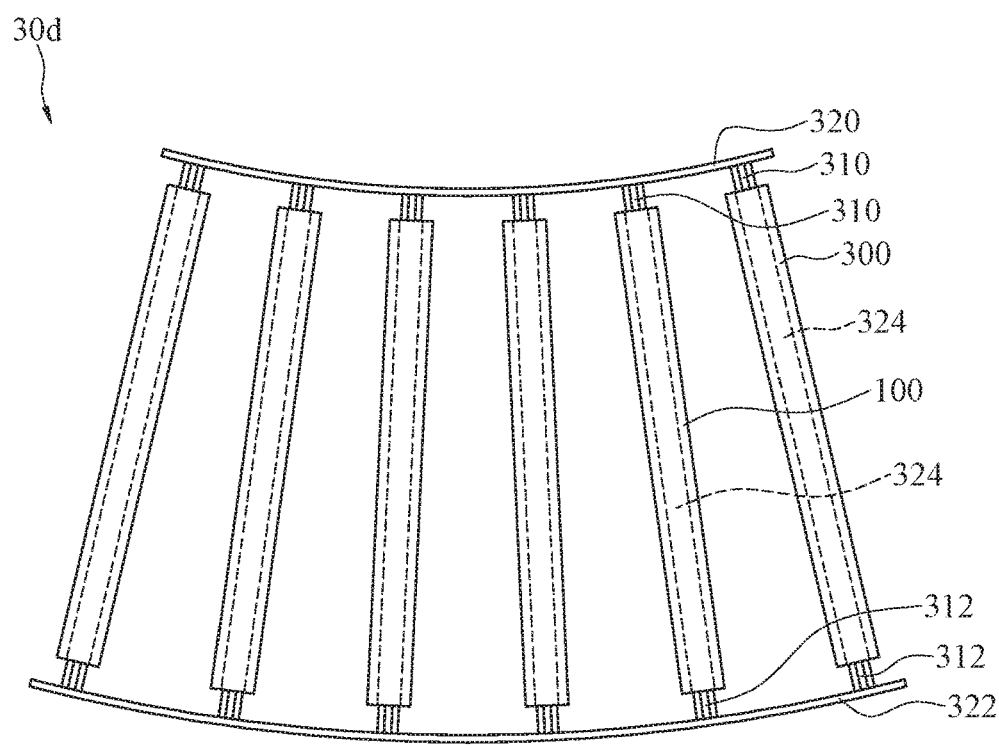
Figure 47E:
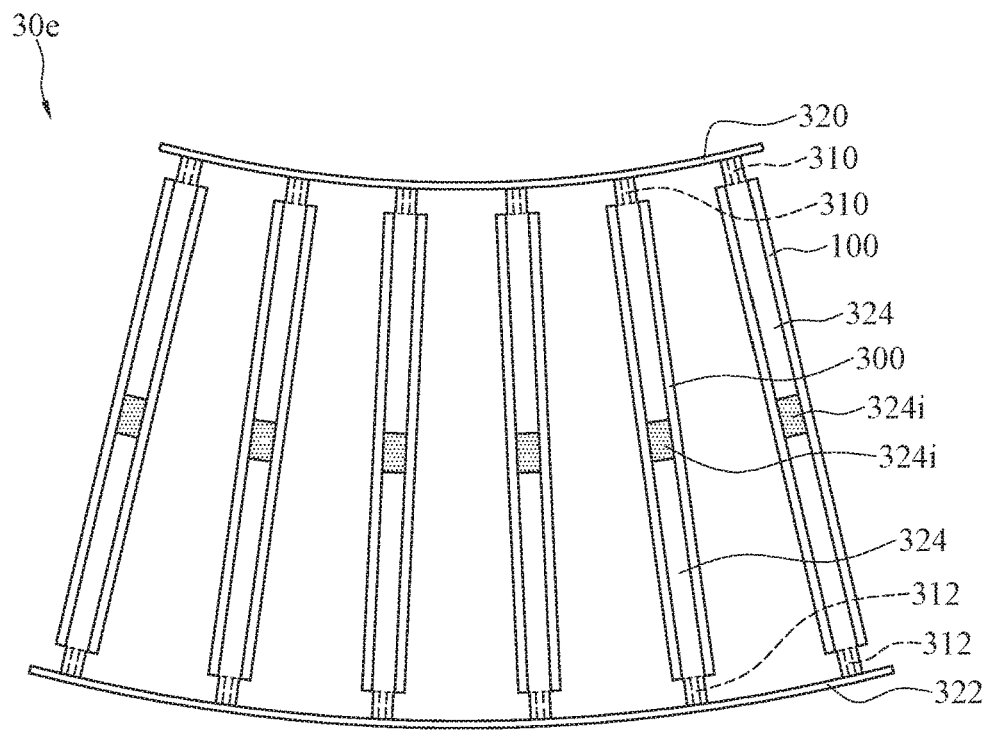
FIGS. 47E and 47F illustrate bottom views of LED filament modules according to embodiments of the present disclosure.
Figure 47F:
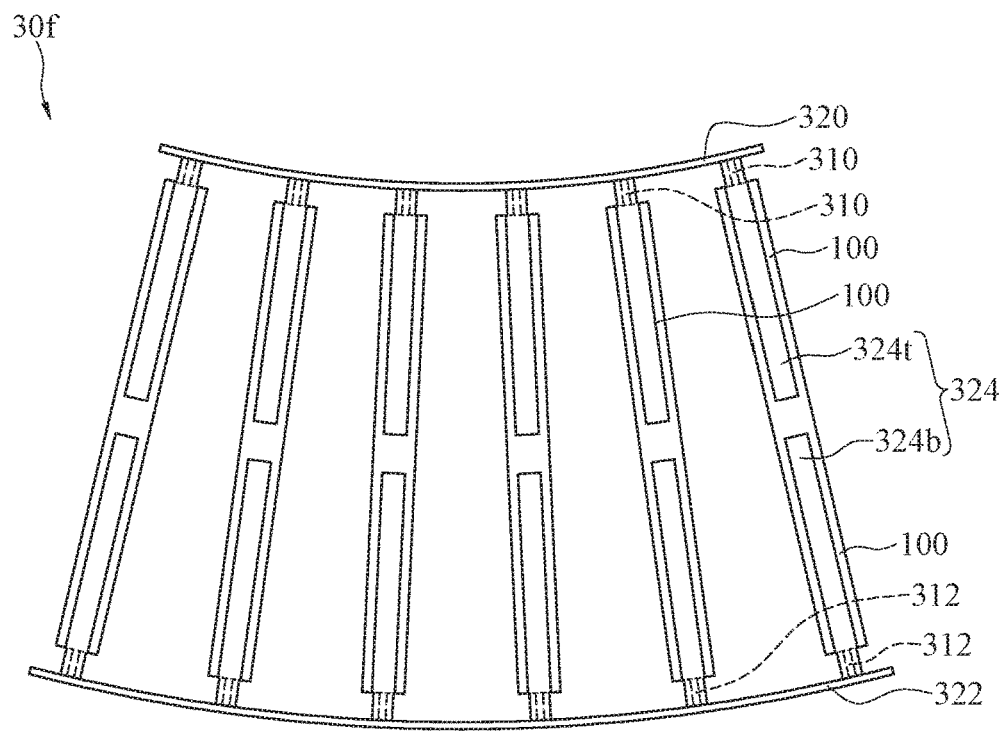
Figure 47G:
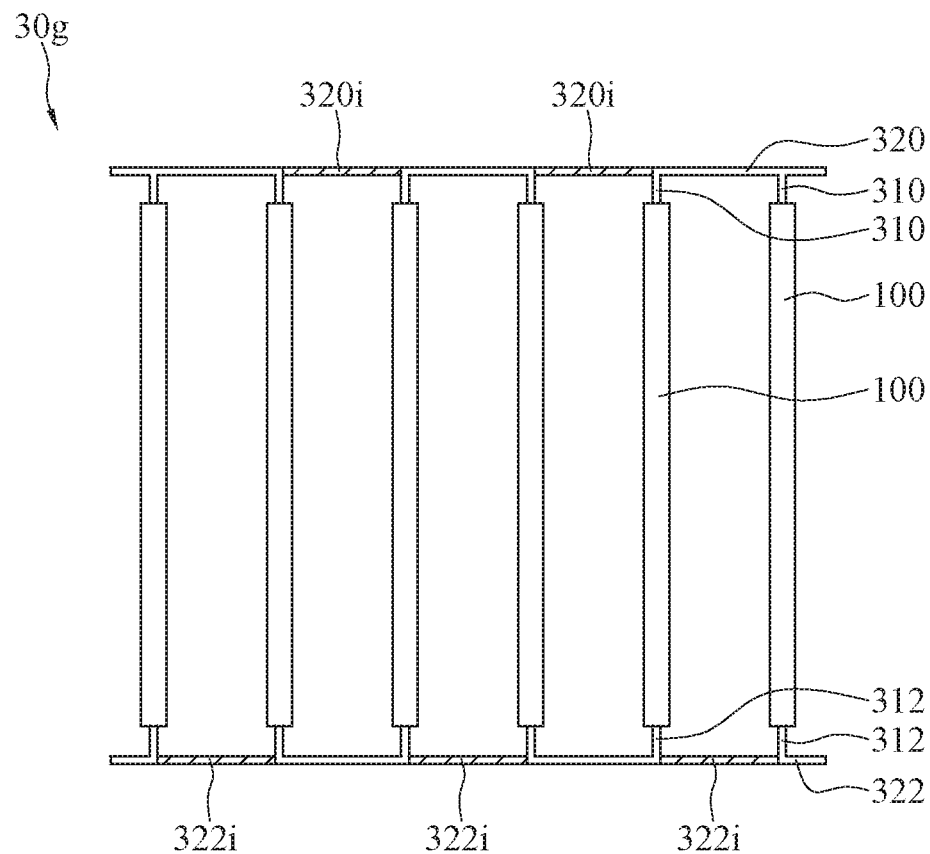
FIG. 47G illustrates a top view of an LED filament module according to another embodiment of the present disclosure.
Figure 47H:
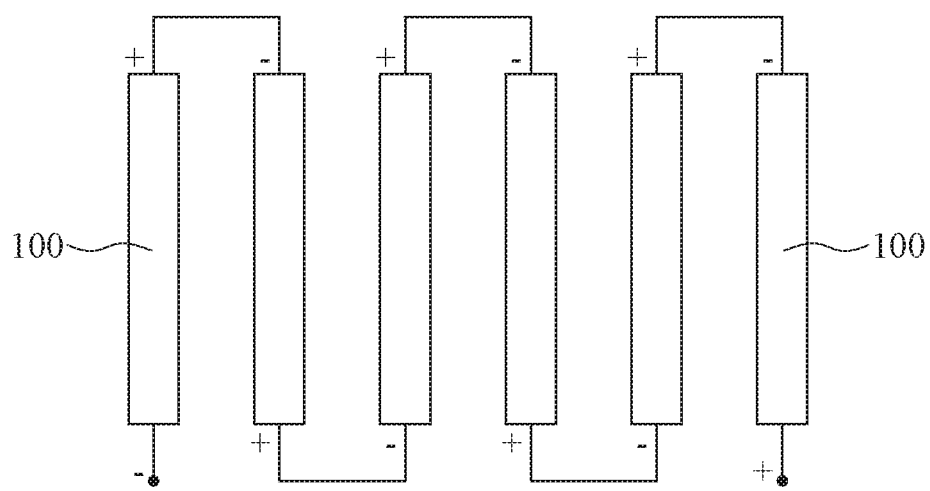
FIG. 47H illustrates a schematic circuit of the LED filament module of FIG. 47G.
Figure 47I:
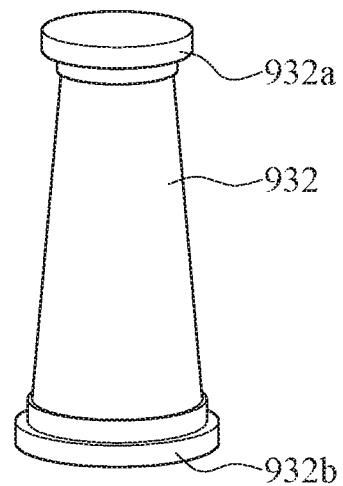
FIG. 47I illustrates a perspective view of a jig for shaping the LED filament module according to an embodiment of the present disclosure.
Figure 47J:
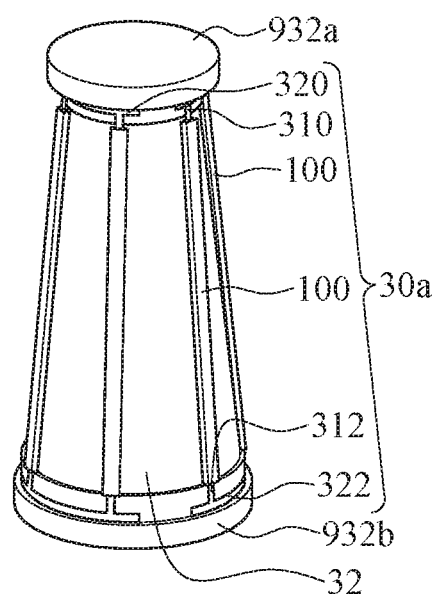
FIG. 47J illustrates a perspective view of the LED filament module of FIG. 47A being shaped by the jig.
Figure 47K:
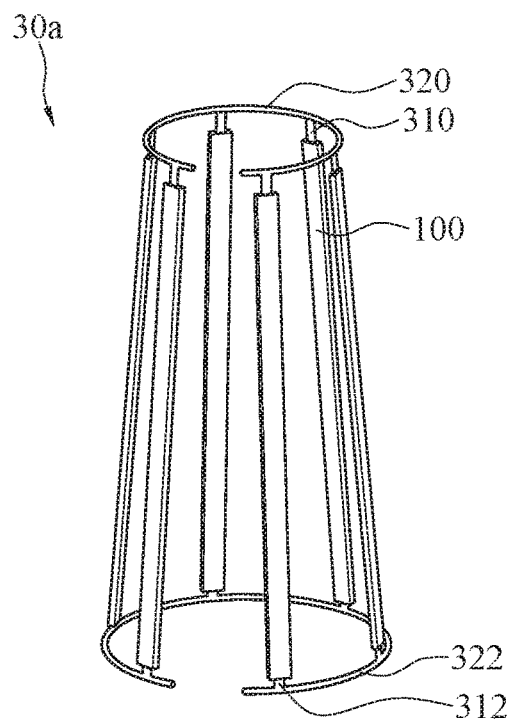
FIG. 47K illustrates a perspective view of the shaped LED filament module of FIG. 47A.
Figure 47L:
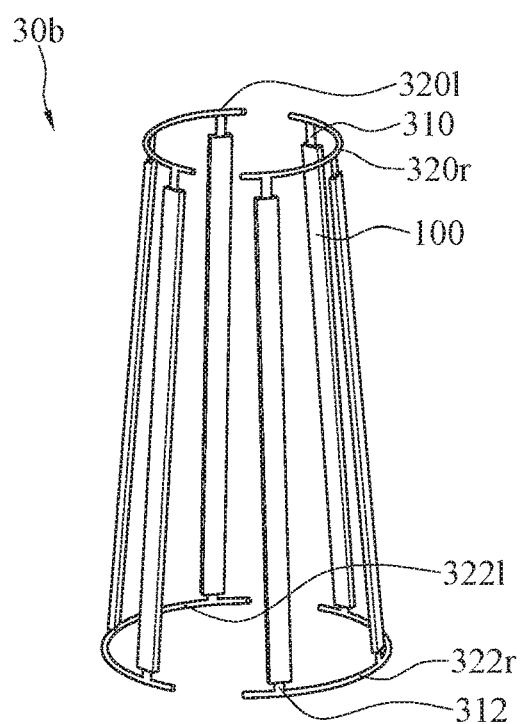
FIG. 47L illustrates a perspective view of the shaped LED filament module of FIG. 47B.

Please refer to FIG. 47B. FIG. 47B illustrates a top view of an LED filament module 30b according to an embodiment of the present disclosure. The LED filament module 30b is analogous to and can be referred to the LED filament module 30a. A difference between the LED filament modules 30a and 30b is that the LED filament module 30b is separated into two parts. The first connecting portion 320 of the LED filament module 30a is separated into first connecting portions 320l and 320r of the LED filament module 30b. The second connecting portion 322 of the LED filament module 30a is separated into second connecting portions 322l and 322r of the LED filament module 30b. A number of the all LED filaments 100, e.g., three of the six LED filaments 100, are connected with the first connecting portions 320l and the second connecting portions 322l. The others of the all LED filaments 100, e.g., the other three of the six LED filaments 100, are connected with the first connecting portions 320r and the second connecting portions 322r. The separated LED filament module 30b is benefit to manufacture and transportation and may be easier to be shaped and to be assembled to an LED light bulb.

Please refer to FIG. 47C. FIG. 47C illustrates a top view of an LED filament module 30c according to an embodiment of the present disclosure. The LED filament module 30c is analogous to and can be referred to the LED filament module 30a. A difference between the LED filament module 30c and the LED filament module 30a is that the LED filament module 30c being not shaped yet has a rectangular outline in the top view. The first connecting portion 320 and the second connecting portion 322 of the LED filament module 30c respectively have straight shapes. The straight length of the first connecting portion 320 is substantially equal to that of the second connecting portion 322.

Please refer to FIG. 47D. FIG. 47D illustrates a top view of an LED filament module 30d according to an embodiment of the present disclosure. The LED filament module 30d is analogous to and can be referred to the LED filament module 30a. A difference between the LED filament module 30d and the LED filament module 30a is that the LED filament module 30d further comprises a plurality of filament brackets 324. The filament brackets 324 are connected between the first connecting portion 320 and the second connecting portion 322. Each of the LED filaments 100 is respectively attached to each of the filament brackets 324. The conductive electrodes 310, 312 of each of the LED filaments 100 are respectively connected to the first connecting portion 320 and the second connecting portion 322. The LED filament module 30d is stronger than the LED filament module 30 since the filament brackets 324 can hold and support the LED filaments 100. In the embodiment, the first connecting portion 320, the filament brackets 324 and the second connecting portion 322 may be made into a one-piece component. In a case that the one-piece component of the first connecting portion 320, the filament brackets 324 and the second connecting portion 322 is made by insulation materials, the LED filaments 100 of the LED filament module 30d can be individually connected to an outer power source via power lines respectively connected to the conductive electrodes 310, 312. In a case that the one-piece component of the first connecting portion 320, the filament brackets 324 and the second connecting portion 322 is made by conductive materials, the first connecting portion 320 and the second connecting portion 322 can be respectively anode and cathode of the LED filament module 30d, and currents can flow through each of the LED filaments 100 in one direction to avoid short circuit in a circuit-arrangement manner (e.g., diodes can be added in the circuit) or a mechanic-arrangement manner. The circuit-arrangement manner can be, for example, diodes can be added in the circuit to restrain the direction of the currents. The mechanic-arrangement manner is described as following examples.

Please refer to FIG. 47E. FIG. 47E illustrates a bottom view of an LED filament module 30e according to an embodiment of the present disclosure. The LED filament module 30e is analogous to and can be referred to the LED filament module 30d. The viewing angle of FIG. 47E is opposite to that of FIG. 47D; therefore, the LED filaments 100 and the conductive electrodes 310, 312 are in rear of the filament brackets 324 in FIG. 47E. A difference between the LED filament module 30e and the LED filament module 30d is that each of the filament brackets 324 of the LED filament module 30e comprises an insulation portion 324i. Specifically, the first connecting portion 320, the second connecting portion 322, and the filament brackets 324 are made by conductive materials except the insulation portions 324i of the filament brackets 324. The insulation portions 324i are made by insulation materials. The design of the insulation portions 324i of the filament brackets 324 can be considered as forming a circuit loop in a mechanic-arrangement manner, which allows currents to flow through each of the LED filaments 100 in one direction and inhibits the currents from flowing through the filament brackets 324 due to the insulation portions 324i to avoid short circuit. The first connecting portion 320, the second connecting portion 322, the filament brackets 324, and the insulation portions 324i can be formed into a one-piece component by a double-molding process, metal injection molding process, or the like.

Please refer to FIG. 47F. FIG. 47F illustrates a bottom view of an LED filament module 30f according to an embodiment of the present disclosure. The LED filament module 30f is analogous to and can be referred to the LED filament module 30e. A difference between the LED filament module 30f and the LED filament module 30e is that each of the filament brackets 324 of the LED filament module 30f is separated into two parts, i.e., a top filament bracket 324t and a bottom filament bracket 324b. The top filament brackets 324t are connected with the first connecting portion 320. The bottom filament brackets 324b are connected with the second connecting portion 322. The top filament brackets 324t and the bottom filament brackets 324b are physically separated; therefore, currents do not flow through the filament brackets 324. The design of the top filament bracket 324t and the bottom filament bracket 324b of the filament brackets 324 can be considered as forming a circuit loop in a mechanic-arrangement manner, which allows the currents to flow through each of the LED filaments 100 in one direction.

Please refer to FIG. 47G. FIG. 47G illustrates a top view of an LED filament module 30g according to another embodiment of the present disclosure. The LED filament module 30g is analogous to and can be referred to the LED filament module 30c. A difference between the LED filament module 30g and the LED filament module 30c is that the first connecting portion 320 further comprises insulation portions 320i, and the second connecting portion 320 further comprises insulation portions 322i. Specifically, the first connecting portion 320 and the second connecting portion 322 are made by conductive materials except the insulation portions 320i and 322i. The insulation portions 320i and 322i are made by insulation materials. The insulation portions 320i and 322i are arranged in a staggered manner, meaning that the first insulation portions 322i are between the first LED filament 100 (the leftmost one in FIG. 47G) and the second LED filament 100 (next to the leftmost one in FIG. 47G), the first insulation portions 320i are between the second and the third LED filaments 100, the second insulation portions 322i are between the third and the fourth LED filaments 100, and so on. The design of the insulation portions 320i and 322i of the first and the second connecting portions 320 and 322 can be considered as forming a circuit loop in a mechanic-arrangement manner, which allows currents to flow through each of the LED filaments 100 in one direction.

Please refer to FIG. 47H. FIG. 47H illustrates a schematic circuit of the LED filament module 30g of FIG. 47G. Currents do not flow through the insulation portions 320i and 322i of the first and the second connecting portions 320 and 322; therefore, the LED filaments 100 are connected in series. The conductive electrode 312 of the leftmost LED filament 100 in FIG. 47G can be cathode, and the conductive electrode 312 of the rightmost LED filament 100 in FIG. 47G can be anode. Positive charges flow into the LED filaments 100 via the second connecting portion 322 and the conductive electrode 312 of the rightmost LED filament 100 in FIG. 47G, flow through the LED filaments 100 in sequence from the rightmost one to the leftmost one, and leave the LED filaments 100 via the conductive electrode 312 of the leftmost LED filament 100 in FIG. 47G and the second connecting portion 322.

Please refer to FIG. 47I. FIG. 47I illustrates a perspective view of a jig 932 for shaping the LED filament module according to an embodiment of the present disclosure. The jig 932 comprises a first limiting portion 932a and a second limiting portion 932b. The first limiting portion 932a and the second limiting portion 932b are respectively connected to two opposite ends of the jig 932. The first limiting portion 932a and the second limiting portion 932b respectively form a cap shape with respect to the jig 932. In particular, the cross-sectional size of the first limiting portion 932a in the radial direction is greater than that of the end of the jig 932 to which the first limiting portion 932a is connected, and the cross-sectional size of the second limiting portion 932b in the radial direction is greater than that of the end of the jig 932 to which the second limiting portion 932b is connected. The jig 932 has a shape of frustum of a cone, meaning that the two opposite ends of the jig 932 have different cross-sectional sizes. The perimeter of jig 932 gradually increases from the end connected the first limiting portion 932a to the end connected to the second limiting portion 932b. The different perimeters of the two opposite ends of the jig 932 are corresponding to the different arc lengths of the first connecting portion 320 and the second connecting portion 322. The jig 932 is utilized for shaping the LED filament module into a predetermined shape, e.g., a column shape or a frustum shape.

Please refer to FIG. 47J and FIG. 47K. FIG. 47J illustrates a perspective view of the LED filament module 30a being shaped by the jig 932 according to the embodiment of the present disclosure. FIG. 47K illustrates a perspective view of the shaped LED filament module 30a according to the embodiment of the present disclosure. The LED filament module 30a is forced to attach to and around the jig 932 and is shaped into a three-dimensional form with a shape of frustum of a cone. The first connecting portion 320 and the second connecting portion 322 are bended to be turned from straight line shape into curve shape to fit the jig 932, and the LED filaments 100 are around the jig 932 along with the bended first connecting portion 320 and second connecting portion 322. During the shaping process of the LED filament module 30a, the first limiting portion 932a limits the first connecting portion 320, and the second limiting portion 932b limits the second connecting portion 322; therefore, the LED filament module 30a which is being shaped can be kept between the first limiting portion 932a and the second limiting portion 932b. After the shaped LED filament module 30a is detached from the jig 932, the shaped LED filament module 30a is turned from two-dimensional form (as shown in FIG. 47A) into three-dimensional form with the shape of frustum of a cone (as shown in FIG. 47K).

In some embodiment, the jig 932 can have a shape different from the shape shown in FIG. 47I. The jig 932 having a column shape can be utilized for shaping the LED filament module 30c which has a rectangular shape in the beginning into a column shape. For example, the LED filament module 30c shown in FIG. 47C can be shaped by the jig 932 having a column shape. The shaped LED filament module 30c will have a column shape, accordingly.

Please refer to FIG. 47L. FIG. 47L illustrates a perspective view of the shaped LED filament module 30b of FIG. 15B. The separated LED filament module 30b can also be shaped by the jig 932 of FIG. 47I. In some embodiments, the separated parts of the LED filament module 30b can be shaped in one shaping process. In other embodiments, the separated parts of the LED filament module 30b can be shaped one by one or be shaped by different jigs 32.

According to above description, the LED filament module 30a-30g may have a first type and a second type. The LED filaments 100, the first connecting portion 320, and the second connecting portion 322 of the first type are in a three-dimensional form, as shown in FIGS. 47K and 47L. The LED filaments 100, the first connecting portion 320, and the second connecting portion 322 of the second type are in a two-dimensional form, as shown in FIGS. 47A to 47G. In the embodiments, the LED filaments 100, the first connecting portion 320, and the second connecting portion 322 of the second type may be formed in advance in the beginning and, optionally, be formed in one piece. Next, the shaping process is performed to have the LED filaments 100, the first connecting portion 320, and the second connecting portion 322 of the second type in the two-dimensional form shaped into the LED filaments 100, the first connecting portion 320, and the second connecting portion 322 of the first type in the three dimensional form by the jig 932. It is advantageous to the manufacture of the LED filaments 100, the first connecting portion 320, and the second connecting portion 322 of the second type on the two-dimension plane. Nevertheless, in some embodiments, the LED filaments 100, the first connecting portion 320, and the second connecting portion 322 of the first type may be formed directly in the beginning and, optionally, be formed in one piece. In other words, the LED filament module 30a-30g may have the first type only and have no need of the shaping process for shaping the second type into the first type.

In some embodiments, in the first type of the LED filament module, at least one (preferably both) of the first connecting portion and the second connecting portion is substantially a torus surrounding a center axle (e.g. the center axle of the bulb shell). The term "torus" means a shape surrounding a center and is not limited to a circle shape but can be any geometric shape (e.g. triangle shape, or rectangular shape, or polygonal shape, etc.). In some embodiments, at least one of the first connecting portion and the second connecting portion has an opening for purposes of arranging the direction of current or avoiding a short circuit.

Please refer to FIG. 48A. Please FIG. 48A illustrates a perspective view of an LED light bulb 20e according to another embodiment of the present disclosure. The LED light bulb 20e is analogous to and can be referred to the LED light bulb 20c shown in FIG. 13A. Differences between the LED light bulb 20e and the LED light bulb 20c are that the LED light bulb 20e utilizes the LED filament module 30a and non-conductive supporting arms 315. The LED light bulb 20e comprises a bulb shell 12, a bulb base 16 connected with the bulb shell 12, two conductive supports 51a, 51b disposed in the bulb shell 12, a driving circuit 518 electrically connected with both the conductive supports 51a, 51b and the bulb base 16, a stem 19, the supporting arms 315, and the LED filament module 30a. The stem 19 in the bulb shell 12 has a stand 19a extending to the center of the bulb shell 12. The supporting arms 315 are fixed to the stand 19a of the stem 19. The shaped LED filament module 30a is assembled to the supporting arms 315. The first connecting portion 320 is supported by the supporting arms 315. In the embodiment, the first connecting portion 320 is hung on the supporting arms 315. The shaped LED filament module 30a is around the stand 19a. The LED filament module 30a is electrically connected with the conductive supports 51a, 51b to receive the electrical power from the driving circuit 518. The second connecting portion 322 larger than the first connecting portion 320 (i.e., the arc length of the second connecting portion 322 is larger than that of the first connecting portion 320) is closer to the bulb base 16 than the first connecting portion 320, which helps the stability of the configuration of the LED filament module 30a of which the first connecting portion 320 is hung on the supporting arms 315.

Please refer to FIG. 48B. FIG. 48B illustrates a partial cross-sectional view of FIG. 48A. The supporting arm 315 comprises a hook end 315a and a fixed end 315b. In the embodiment, the number of the supporting arm 315 is, but not limited to, two. The fixed ends 315b of the supporting arms 315 are embedded into the stand 19a but not connected with each other. There is a gap 316 between the fixed ends 315b in the stand 19a to keep the supporting arms 315 being not electrically connected with each other, i.e., the supporting arms 315 are insulated from each other. The hook ends 315a of the supporting arms 315 extend radially from the stand 19a. The hook end 315a forms a hook structure such that the first connecting portion 320 can be hung on the hook structures of the hook ends 315a of the supporting arms 315. In some embodiments, a greater curvature of the hook structure of the hook ends 315a can be adopted to allow the first connecting portion 320 to be tightly fitted in the hook structure so as to meet the requirement of fixation between the supporting arms 315 and the first connecting portion 320.

In the embodiment, the current loop comprises the LED filament module 30a, the conductive supports 51a, 51b, the driving circuit 518, and an outer power source. Currents do not flow through the supporting arms 315 since the supporting arms 315 are not electrically connected with each other, and the stem 19 and the stand 19a are made by insulation materials. As a result, the risk of electrocorrosion regarding the supporting arms 315 can be avoided.

As shown in FIG. 48A, the second connecting portion 322 is connected with the conductive supports 51a, 51b. In some embodiments, the conductive support 51a is connected to one end of the second connecting portion 322 while the conductive support 51b is connected to another end of the second connecting portion 322. The LED filament module 30a can form a circuit loop with an outer power source in a circuit-arrangement manner. Each of the LED filaments 100 can comprise a diode allowing current to flow through the LED filaments 100 in one direction. Accordingly, the LED filaments 100 are connected in series. For example, positive charges flow into the LED filament module 30a via the conductive support 51a, and then flow through, in sequence, the second connecting portion 322, the first one of the LED filaments 100, the first connecting portion 320, the second one of the LED filaments 100, the second connecting portion 322, the third one of the LED filaments 100, and so on. Finally, positive charges flow through the last one of the LED filaments 100 and leave the LED filament module 30a via the conductive support 51b. Alternatively, the LED filament module 30a can form a circuit loop with an outer power source in a mechanic-arrangement manner. The distance between the second connecting portion 322 and the stem 19 is shorter than that between the first connecting portion 320 and the stem 19; therefore, the conductive supports 51a, 51b both connected to the second connecting portion 322 have relative shorter lengths and a better supporting effect to keep the LED filament module 30a steady and avoid swaying. In other embodiments, the conductive supports 51a, 51b can be connected to the first connecting portion 320. In other embodiments, the conductive supports 51a, 51b can be respectively connected to the first connecting portion 320 and the second connecting portion 322. Under the circumstances, the LED filaments 100 may be connected in parallel.

As shown in FIG. 48B, each of the LED filaments 100 comprises a main illuminating face La and secondary illuminating faces Lb, Lc. A front side of each of the LED chips 102, 104 (referring to the LED filament 100 of FIG. 33) faces the main illuminating face La. The front side is the side the most emitted light passes through. A rear side of each of the LED chips 102, 104 (referring to the LED filament 100 of FIG. 33) faces the secondary illuminating face Lc. The secondary illuminating face Lb are between the main illuminating face La and the secondary illuminating face Lc. As shown in FIG. 48B, the main illuminating faces La of all of the LED filaments 100 face toward outside of the LED light bulb 20e. Depending on the needs, the main illuminating faces La of a part of the LED filaments 100 face toward outside of the LED light bulb 20e, and the secondary illuminating faces Lb or Lc of another part of the LED filaments 100 face toward outside of the LED light bulb 20e. Alternatively, the main illuminating faces La of all of the LED filaments 100 face toward inside of the LED light bulb 20e (face toward the stand 19a).

In some embodiments, the LED filament 100 may comprise through holes (not shown). The through holes penetrate through the light conversion coating 420 (referring to the LED filament 100 of FIG. 33) and are corresponding to the LED chips 102, 104. Light emitted from the LED chips 102, 104 can directly pass through the through holes.

In the embodiments, all of the LED filaments 100 of the LED filament module 30a are equally spaced. In some embodiments, the LED filaments 100 of the LED filament module 30a may be not equally spaced, i.e., unequally spaced. For example, a part of the LED filaments 100 are crowded together, and another part of the LED filaments 100 are scattered. An interval between each two of the crowded LED filaments 100 is less than that between each two of the scattered LED filaments 100. Finally, an omnidirectional light circumstance with a partial emphasized illumination can be achieved because the part that the LED filaments 100 crowded together has better brightness.

In some embodiments, the LED filament module can be separated parts, as shown in FIG. 47L. It is benefit to a manufacturing procedure of the LED filament module 30. For example, the LED filament module 30a of the LED light bulb 20e shown in FIG. 48A can be replaced by the separated LED filament module 30b shown in FIG. 47L. Each of the separated parts includes a part of the first connecting portion 320 (e.g., 320l, 320r), a part of the second connecting portion 322 (e.g., 322l, 322r), and a number of the LED filaments 100. The separated parts can be assembled to each other by, for example, soldering the first connecting portion 320 and the second connecting portion 322. Alternatively, the separated parts can be assembled to the stand 19a by the supporting arms 315.

Please refer to FIG. 48C. FIG. 48C illustrates a perspective view of an LED light bulb 20f according to another embodiment of the present disclosure. The LED light bulb 20f is analogous to and can be referred to the LED light bulb 20e. Differences between the LED light bulb 20f and 10e are that the first connecting portion of the LED filament module of the LED light bulb 20f is separated into two parts, i.e., a first connecting portion 320l and a first connecting portion 320r, and the conductive supports 51a, 51b are respectively connected to the first connecting portion 320l and the first connecting portion 320r. The LED filament module can form a circuit loop in a circuit-arrangement manner (e.g., diodes can be added in the circuit) or a mechanic-arrangement manner (e.g., a part of the first connecting portions 320l, 320r and the second connecting portion 322 can be insulated, and other parts of the first connecting portions 320l, 320r and the second connecting portion 322 can be conductive) so that currents can flow through each of the LED filaments 100 in one direction to avoid short circuit.

Please refer to FIG. 48D. FIG. 48D illustrates a perspective view of an LED light bulb 20g according to another embodiment of the present disclosure. The LED light bulb 20g is analogous to and can be referred to the LED light bulb 20e. Differences between the LED light bulb 20g and 10e are that the second connecting portion of the LED filament module of the LED light bulb 20g is separated into two parts, i.e., a second connecting portion 322l and a second connecting portion 322r, and the conductive supports 51a, 51b are respectively connected to the second connecting portion 322l and the second connecting portion 322r. Under the circumstances, the second connecting portion 322l can be anode, and the second connecting portion 322r can be cathode. The LED filament module can form a circuit loop in a circuit-arrangement manner (e.g., diodes can be added in the circuit) or a mechanic-arrangement manner (e.g., a part of the first connecting portion 320 and the second connecting portions 322l, 322r can be insulated, and other parts of the first connecting portion 320 and the second connecting portions 322l, 322r can be conductive) so that currents can flow through each of the LED filaments 100 in one direction to avoid short circuit.

As the above description, during the manufacturing process of the traditional light bulb, a horn stem may cover the opening of the glass bulb housing for seal sintering. Since the material of both of them is glass, they may be melted after a high temperature sintering to achieve a seal. However, some of the above embodiments use the metal stem 14, and thus the sintering seal effect of the metal and the glass does not achieve the effect like the glass horn stem. Therefore, as an embodiment, a structure of the heat sink 17 connected to the metal stem 14 is adjusted to achieve the object for sealing the bulb housing of the light bulb. As shown in FIG. 44B, the outline of the heat sink 17 is like a cap covering the opening of the bulb housing (i.e. bulb shell) 12, and the edge thereof has a bending part 1702 and connected to a glass of the opening of the bulb housing 12. Please refer to FIG. 48F, an intermediate of a port of the bending part 1702 has a concave part 1703, and a width thereof is slightly greater than a thickness of the glass of the opening of the bulb housing 12, and therefore, the whole opening of the bulb housing 12 may completely be covered and wrapped by the concave part 1703. A sealing sealant with good sealing property may be appropriately filled in the concave part 1703, so as to make the connection of the heat sink 17 and the bulb housing 12 more stable. A plastic bulb holder 15 may be added between the heat sink 17 and the bulb base 16, so as to maintain a safety of installation or unload for the person.

Please refer to FIG. 49A. FIG. 49A illustrates a cross-sectional view of an LED filament 400a according to an embodiment of the present disclosure. The LED filament 400a is analogous to and can be referred to the LED filament 100 with the top layer 420a and the base layer 420b. The LED filament 400a comprises LED chips 102, 104, conductive electrodes 506, conductive wires 504 for electrically connecting the adjacent LED chips 102, 104 and conductive electrodes 506, and light conversion coating 420 coating on at least two sides of the LED chips 102, 104 and the conductive electrodes 506. The light conversion coating 420 exposes a portion of two of the conductive electrodes 506. The light conversion coating 420 comprises a top layer 420a and a base layer 420b. The base layer 420b coats on one side of the LED chips 102, 104 and the conductive electrodes 506. The top layer 420a coats on another sides of the LED chips 102, 104 and the conductive electrodes 506.

The top layer 420a and the base layer 420b may be distinct by a manufacturing procedure of the LED filament 400a. During a manufacturing procedure, the base layer 420b can be formed in advance. Next, the LED chips 102, 104 and the conductive electrodes 506 can be disposed on the base layer 420b. The LED chips 102, 104 are connected to the base layer 420b via die bond glues 450. The conductive wires 504 can be formed between the adjacent LED chips 102, 104 and conductive electrodes 506. Finally, the top layer 420a can be coated on the LED chips 102, 104 and the conductive electrodes 506.

Both of the top layer 420a and the base layer 420b can comprise at least one of phosphor glue layer(s), phosphor film layer(s), and transparent layer(s). If the top layer 420a or the base layer 420b comprises a transparent layer, it may comprise the other phosphor glue/film player(s). In some embodiments, the surface roughness Rz of the phosphor film layer may be 1 nm-200 μm, and the surface roughness Rz of the phosphor glue layer may be 1 μm-2 mm.

Each of the layers of the phosphor glue layer(s) and the phosphor film layer(s) of the top layer 420a and the base layer 420b can comprise an adhesive, phosphors, and may preferably further comprise inorganic oxide nanoparticles (optional). The transmittance of visible light of the transparent layer can be greater than 40%. The transparent layer can be formed by adhesive made of a silica gel, a silicone resin, a polyimide (PI) gel, the like or a combination thereof. The adhesive with the PI gel is harder than that formed by silicone resin only. The phosphors or the inorganic oxide nanoparticles in different phosphor glue layers or phosphor film layers can have different sizes or densities and can be made by varied materials depending on needs. Different phosphor glue layers or phosphor film layers can have varied thickness. According to the adhesive, the phosphors, the inorganic oxide nanoparticles, or other possible elements, the phosphor glue layer or phosphor film layer can have different hardness and wavelength conversion properties. The percent transmittance of the phosphor glue layer or the phosphor film layer of the top layer 420a or the base layer 420b can be varied depending on needs. For example, the percent transmittance of the phosphor glue layer or the phosphor film layer of the top layer 420a or the base layer 420b can be greater than 20%, 50%, or 70%. The layers of the top layer 420a or the base layer 420 can have different transmittance.

It should be understood that when the top layer 420a or the base layer 420b comprise continuous layers of same definition, at least one property of the continuous layers capable of being distinct from one layer to another layer should exist between the continuous layers. For example, when the two continuous layers are phosphor glue layers or phosphor film layers, the properties (e.g. particle size, wavelength conversion properties, ingredient proportion, thickness, hardness, etc.) of the continuous may be different. When the two continuous layers are transparent layers, the properties (e.g. adhesive type, thickness, ingredient proportion, optical properties like transmittance, refraction index, etc.) of the continuous transparent layers may be different.

In the embodiment, the top layer 420a is the phosphor glue layer, and the base layer 420b is the phosphor film layer. The phosphor glue layer comprises an adhesive 422, a plurality of phosphors 424, and a plurality of inorganic oxide nanoparticles 426. The adhesive 422 may be silica gel or silicone resin. The plurality of the inorganic oxide nanoparticles 426 may be, but not limited to, aluminium oxides ($Al_2O_3$). The phosphor film layer comprises an adhesive 422', a plurality of phosphors 424', and a plurality of inorganic oxide nanoparticles 426'. The compositions of the adhesives 422 and adhesive 422' may be different. The adhesive 422' may be harder than the adhesive 422 to facilitate the disposition of the LED chips 102, 104 and the conductive wires 504. For example, the adhesive 422 may be silicone resin, and the adhesive 422' may be a combination of silicone resin and PI gel. The mass ratio of the PI gel of the adhesive 422' can be equal to or less than 10%. The PI gel can strengthen the hardness of the adhesive 422'. The plurality of the inorganic oxide nanoparticles 426 may be, but not limited to, aluminium oxides ($Al_2O_3$) or aluminium nitride. The size of the phosphors 424' may be smaller than that of the phosphors 424. The size of the inorganic oxide nanoparticles 426' may be smaller than that of the inorganic oxide nanoparticles 426. The size of inorganic oxide nanoparticles may be around 100 to 600 nanometers (nm). The inorganic oxide nanoparticles are beneficial of heat dissipating. In some embodiment, part of inorganic oxide nanoparticles may be replaced by inorganic oxide particles which have the size of 0.1 to 100 μm. The heat dissipation particles may be with different sizes.

The Shore Hardness of the phosphor glue layer may be D40-70. The Shore Hardness of the phosphor film layer may be D20-70. The thickness of the phosphor glue layer is substantially between 0.2 mm and 1.5 mm. The thickness of the phosphor film layer is substantially between 0.1 mm and 0.5 mm. The index of refraction of the phosphor film layer is substantially equal to or greater than 1.4. The percent transmittance of the phosphor film layer is 40% to substantially equal to or greater than 95%. The adhesive may be mixed with polyimide (PI) gel (WT % of the PI gel is substantially equal to or less than 10%) to form the light conversion coating 420 to improve the toughness of the light conversion coating 420 and to reduce possibility of cracking or embrittlement. The PI gel is highly electrically insulated and is insensitive to temperature. In some embodiments, the solid content of the PI gel in terms of WT % is substantially between 5% and 40%. The rotation viscosity of the PI gel may be substantially between 5 Pa·s and 20 Pa·s. In some embodiment, the mass ratio of the polyimide in the light conversion coating is equal to or less than 10%.

Figure 49B:
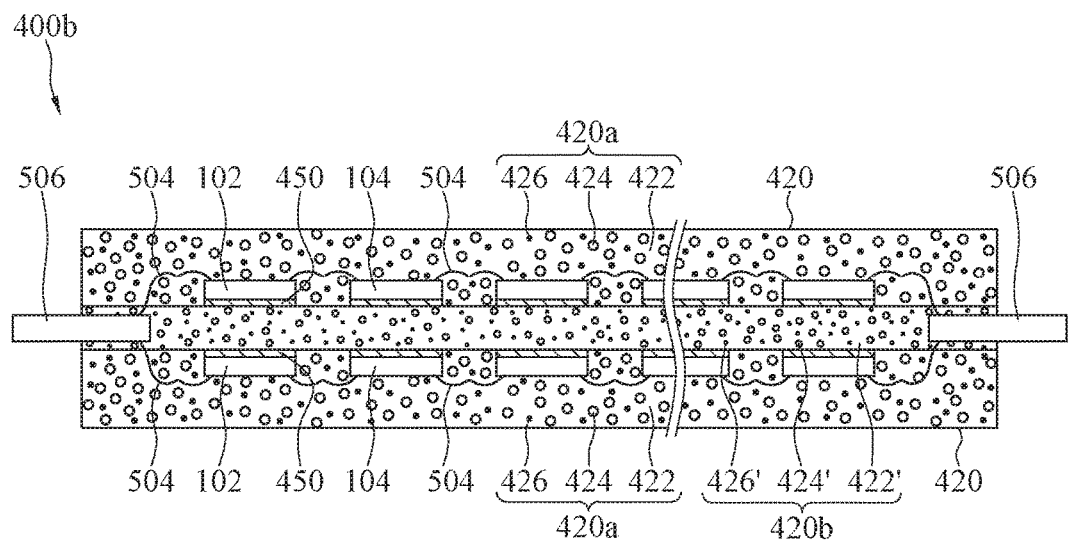

Please refer to FIG. 49B. FIG. 49B illustrates a cross-sectional view of an LED filament 400b according to an embodiment of the present disclosure. The LED filament 400b is analogous to and can be referred to the LED filament 400a. In the embodiment, the LED chips 102, 104, the conductive wires 504, and the top layer 420a are disposed on two opposite sides of the base layer 420b. In other words, the base layer 420b is between the two top layers 420a. The conductive electrodes 506 are at two opposite ends of the base layer 420b. The LED chips 102 of both of the two top layers 420a can be connected to the same conductive electrodes 506 via the conductive wires 504.

Figure 49C:
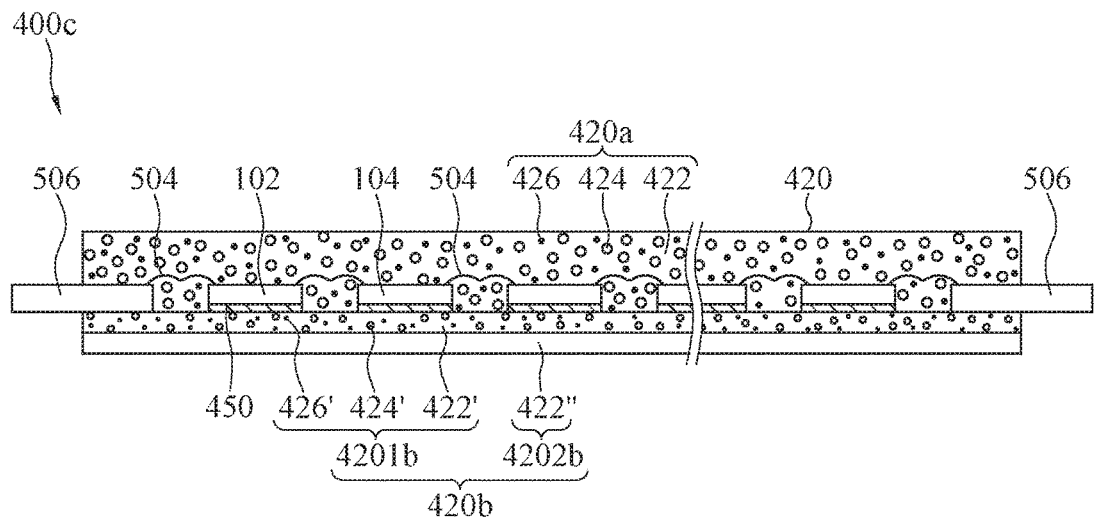

Please refer to FIG. 49C. FIG. 49C illustrates a cross-sectional view of an LED filament 400c according to an embodiment of the present disclosure. The LED filament 400c is analogous to and can be referred to the LED filament 400a. In the embodiments, the base layer 420b of the LED filament 400c is further divided into a phosphor film layer 4201b and a transparent layer 4202b with different hardness. The phosphor film layer 4201b may be harder than the transparent layer 4202b. The harder layer (i.e., the phosphor film layer 4201b) of the base layer 420b is between the softer layer (i.e., the transparent layer 4202b) of the base layer 420b and the top layer 420a. The harder layer is a layer on which the LED chips 102, 104 and the conductive electrodes 506 are directly disposed. Due to the greater hardness of the harder layer, the disposition of the LED chips 102, 104, the conductive electrodes 506, and the conductive wires 504 is easier. Due to the greater flexibility of the softer layer, the light conversion coating 420 is still of toughness. In the embodiment, the phosphor film layer 4201b comprises the adhesive 422' mixed with the PI gel. The transparent layer 4202b comprises an adhesive 422" only. The adhesive 422" may be silicone resin. The transparent layer 4202b may be of highest transmittance than other layers.

In some embodiment, the transparent layers, which may be disposed in the top layer or the base layer, can function as one or more refraction-altering layers, and which can alter the index of refraction so that the angle of emergence of light rays emitted from the LED chips 102, 104, the phosphor film layer 4201b and penetrating through the transparent layer(s) is adjustable. For example, the thickness of the transparent 4202b may be ¼ wavelength of optical thickness and may be different according to the wavelength of light; therefore, interference phenomenon may occur due to multiple reflection of interfaces (e.g. interfaces between LED chip 102, 104 and the phosphor film layer 4201b, the phosphor film layer 4201b and the transparent layer 4202b, and the transparent layer 4202b and the atmosphere), and thus the reflected light may be reduced. In some embodiments, the number of transparent layers may be more than one. For example, when there are two or three transparent layers, the reflectivity may be lower. For example, when there are three transparent layers respectively with ¼, ½, and ¼ wavelength of thickness, it can bring the effect of wideband low reflection. In some embodiments, the thickness of transparent layer may be regulated according to different wavelengths of LED chips, the phosphor glue layers, the phosphor film layers within a range of the ratio to reduce the interference phenomenon. For example, the thickness of the transparent layer may be integral multiples of ±20% of ½, ¼ wavelength. The thickness of the transparent layer may be regulated according to the inner layer thereof (e.g. LED chip, the phosphor glue layer, or the phosphor film layer). It refers to mainly regulate the waveband of emergent light that the luminous intensity is greater than 60% (preferably 80%) of the luminous intensity of total wavelength. The material of the transparent layer may be selected from materials with the index of refraction within ±20% of square root of the index of refraction of the inner layer. For example, when the index of refraction of the phosphor film layer 4201b (i.e. the inner layer of the transparent layer 4202b) is 2, the index of refraction of the transparent layer 4202b will be 1.414±20%. Hence, loss of light reflection can be reduced efficiently.

In some embodiments, the shore hardness of the phosphor film layer 4201b equals to 40 plus the shore hardness of the transparent layer 4202b. The shore hardness of the transparent layer 4202b is D20-40.

In some embodiment, the base layer 420b may be further divided into two layers with different thickness.

Figure 49D:
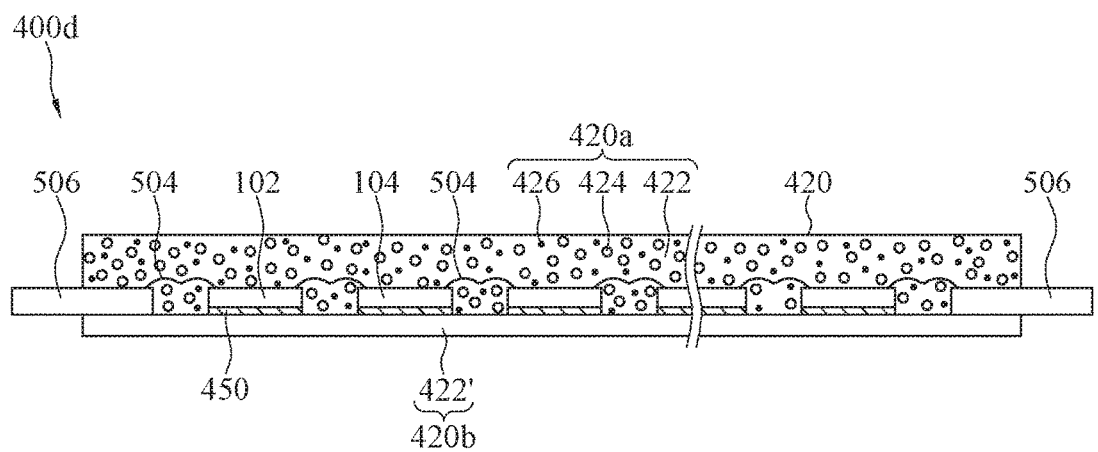

Please refer to FIG. 49D. FIG. 49D illustrates a cross-sectional view of an LED filament 400d according to an embodiment of the present disclosure. The LED filament 400d is analogous to and can be referred to the LED filament 400a. A difference between the LED filament 400d and 400a is that the base layer 420b of the LED filament 400d comprises an adhesive 422' only. The adhesive 422' may be silicone resin mixed with PI gel to increase the hardness of the base layer 420b so as to facilitate the deposition of the LED chips 102, 104, the conductive electrodes 506, and the conductive wires 504. The base layer 420b may be of highest transmittance than other layers.

Figure 49E:
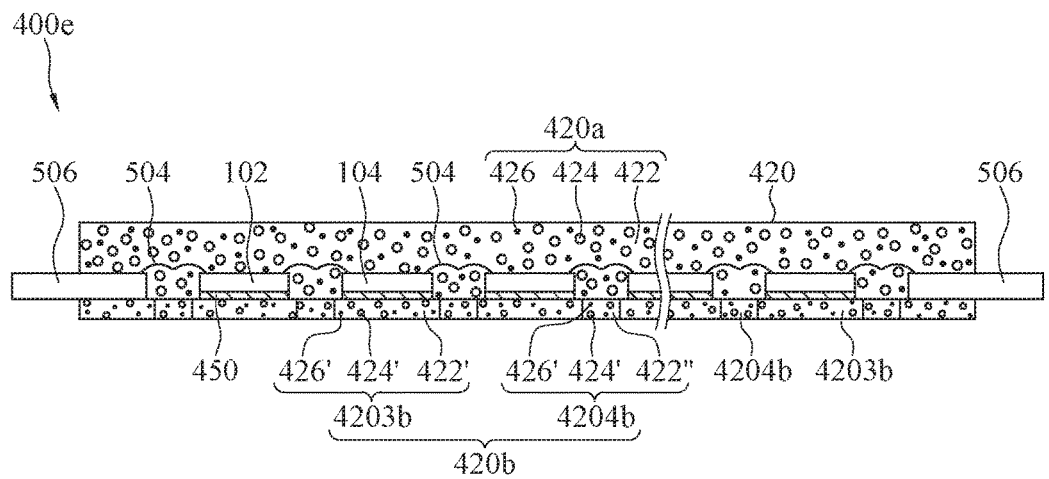

Please refer to FIG. 49E. FIG. 49E illustrates a cross-sectional view of an LED filament 400e according to an embodiment of the present disclosure. The LED filament 400e is analogous to and can be referred to the LED filament 400a. A difference between the LED filament 400e and 400a is that the base layer 420b of the LED filament 400e is divided into different portions (not layers). The base layer 420b of the LED filament 400e is divided into harder portions 4203b and softer portions 4204b. The harder portions 4203b and the softer portions 4204b are arranged in a staggered manner. The harder portions 4203b comprise an adhesive 422', phosphors 424', and inorganic oxide nanoparticles 426'. The softer portions 4204b comprise an adhesive 422", phosphors 424', and inorganic oxide nanoparticles 426'. The adhesive 422' can be PI gel or silicone resin mixed with PI gel, and the adhesive 422" can be silicone resin without PI gel; therefore, the harder portions 4203b is harder than the softer portion 4204b. The harder portions 4203b are aligned with the LED chips 102, 104 and the conductive electrodes 506, which facilitates the disposition of the LED chips 102, 104 and the conductive electrodes 506. The softer portions 4204b can improve the flexibility of the base layer 420b. In some embodiments (not shown), a flexible LED filament installed in an LED light bulb can be defined as, for example, three parts according to their positions related to a bulb base or a stem of the LED light bulb. A part of the flexible LED filament the closest to the bulb base or the stem is defined as a bottom segment. A part of the flexible LED filament the farthest to the bulb base or the stem is defined as a top segment. A part of the flexible LED filament between the bottom segment and the top segment is defined as a middle segment. The curvatures of shapes of each of the top segment, the middle segment, and the bottom segment being bent can be defined as, for example, three degrees, which are the highest one, the lowest one, and an average one. As needed, the bottom segment, the top segment, or the middle segment can be formed with different ingredient/proportion and thus have the different curvature.

Figure 49F:
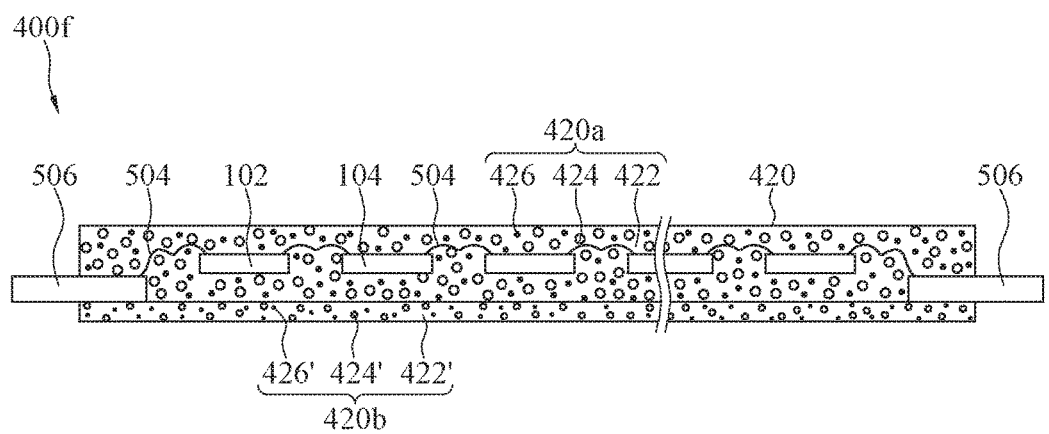

Please refer to FIG. 49F. FIG. 49F illustrates a cross-sectional view of an LED filament 400f according to an embodiment of the present disclosure. The LED filament 400f is analogous to and can be referred to the LED filament 400a. A difference between the LED filament 400f and 400a is that the LED chips 102, 104 are enclosed by the top layer 420a. The top layer 420a directly contacts each side of the LED chips 102, 104. The base layer 420b does not contact the LED chips 102, 104. During a manufacturing procedure, the base layer 420b can be formed in advance, and then the LED chips 102, 104 and the top layer 420a can be formed.

Figure 49G:
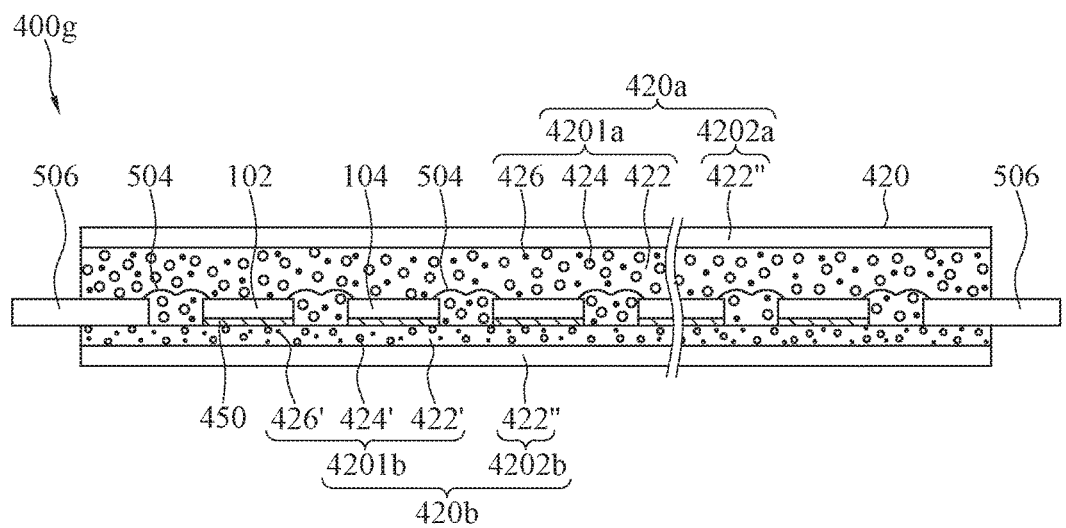

Please refer to FIG. 49G. FIG. 49G illustrates a cross-sectional view of an LED filament 400g according to an embodiment of the present disclosure. The LED filament 400g is analogous to and can be referred to the LED filament 400c. A difference between the LED filament 400g and 400c is that the top layer 420a of the LED filament 400g is further divided into two layers, a phosphor glue layer 4201a and a transparent layer 4202a. The phosphor glue layer 4201a comprises an adhesive 422, phosphors 424, and inorganic oxide nanoparticles 426. The transparent layer 4202a comprises an adhesive 422" only. The transparent layer 4202a may be of highest transmittance than other layers and can protect the phosphor glue layer 4201a. In some embodiments (not shown), the transparent layer 4202a encloses the phosphor glue layer 4201a, i.e., all sides of the phosphor glue layer 4201a except the one adjacent to the phosphor film layer 4201b are covered by the transparent layer 4202a. Additionally, the transparent layer 4202b encloses the phosphor film layer 4201b, i.e., all sides of the phosphor film layer 4201b except the one adjacent to the phosphor glue layer 4201a are covered by the transparent layer 4202b. The transparent layers 4202a, 4202b not only protect the phosphor glue layer 4201a and the phosphor film layer 4201b but also strengthen the whole structure of the LED filament. Preferably, the transparent layer 4202a, 4202b may be thermal shrink film with high transmittance.

Figure 49H:
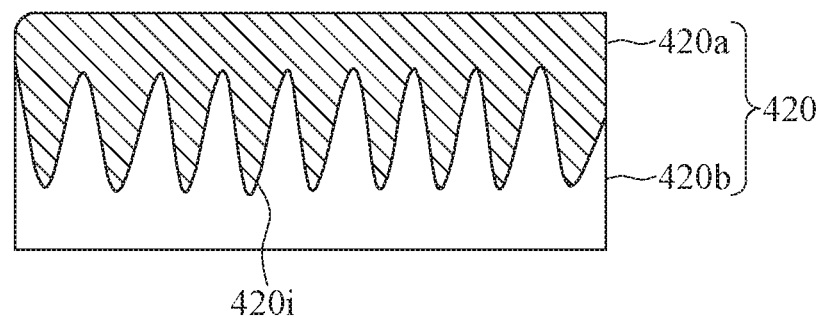
FIG. 49H illustrates a cross-sectional view of a layer structure of an LED filament with attaching strength being enhanced.

Please refer to FIG. 49A and FIG. 49H. FIG. 49H illustrates a cross-sectional view of a layer structure of an LED filament with attaching strength being enhanced. As shown in FIG. 49A, the LED filament 400a comprises LED chips 102, 104, conductive electrodes 506, conductive wires 504 for electrically connecting the adjacent LED chips 102, 104 and conductive electrodes 506, and light conversion coating 420 coating on at least two sides of the LED chips 102, 104 and the conductive electrodes 506. The light conversion coating 420 exposes a portion of two of the conductive electrodes 506. The light conversion coating 420 comprises a top layer 420a and a base layer 420b. The base layer 420b coats on one side of the LED chips 102, 104 and the conductive electrodes 506. The top layer 420a coats on another sides of the LED chips 102, 104 and the conductive electrodes 506. The area of the top layer 420a may be the same as or be different from that of the base layer 420b. In an embodiment, the area of the top layer 420a is slightly less than that of the base layer 420b. In some embodiments, the surface roughness Rz of an upper surface of the base layer 420b, i.e., the surface of the base layer 420b contacting the top layer 420a, may be 1 nm to 200 μm, and the surface roughness Rz of an upper surface of the top layer 420a, i.e., the surface of the top layer 420a opposite to the base layer 420b, may be 1 μm to 2 mm.

As shown in FIG. 49H, there is an attaching structure provided between the top layer 420a and the base layer 420b. The attaching structure is utilized for enhancing an attaching strength between the base layer 420b and the top layer 420a. While the base layer 420b and the top layer 420a contact and attach to each other by one single flat surface, the attaching strength between the base layer 420b and the top layer 420a may be not enough. In order to enhance the attaching strength between the base layer 420b and the top layer 420a, an area of the surface where the base layer 420b and the top layer 420a attach to each other may be properly increased. Alternatively, the shape of the surface where the base layer 420b and the top layer 420a attach to each other may be varied. Alternatively, an interface region between the base layer 420b and the top layer 420a may be adjusted to be nonobvious. In an embodiment, the attaching structure comprises a rough surface. The rough surface is respectively formed on contact faces (the surfaces where the base layer 420b and the top layer 420a attach to each other) between the top layer 420a and the base layer 420b to enhance the attaching strength between the base layer 420b and the top layer 420a. In addition, other embodiments of the attaching structure are described below.

Figure 54:
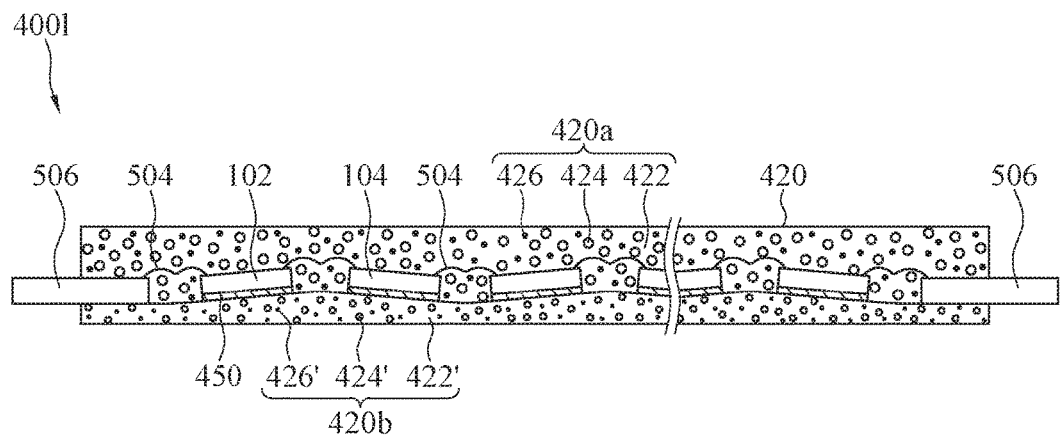

The manners of increasing the area of the contact faces between the base layer 420b and the top layer 420a and adjusting the shape of the contact faces are described below. As shown in FIG. 49H (the LED chips and the conductive electrodes are omitted in FIG. 49H), the light conversion coating 420 of the LED filament comprises the top layer 420a and the base layer 420b. At least parts of the contact faces of the top layer 420a and the base layer 420b are formed with embedded regions such that the embedded region of the top layer 420a is embedded in the embedded region of the base layer 420b. In an embodiment, middle regions of the contact faces of the top layer 420a and the base layer 420b in the width direction of the LED filament 400a as shown in FIG. 49A at which the LED chips are located are flat surfaces attaching to each other, and side regions aside the middle region in the width direction are the embedded regions. In the embodiment, the embedded regions shown in FIG. 49H are wave-shaped interfaces 420i of the top layer 420a and the base layer 420b corresponding to each other. Comparing to the case of the top layer 420a and the base layer 420b attaching to each other with flat contact faces, the top layer 420a and the base layer 420b attaching to each other with the wave-shaped interfaces 420i have greater attaching strength. Alternatively, the middle region at which the LED chips are located may also be provided with wave-shaped interfaces (as shown in FIG. 54) rather than flat surfaces. The embedded regions between the top layer 420a and the base layer 420b are not limited to the wave-shaped interfaces. In some embodiments, the embedded regions may be of saw tooth shape. In an embodiment, the upper surface of the base layer 420b (the contact face contacting the top layer 420a) may have greater surface roughness to achieve similar effect.

Figure 49I:
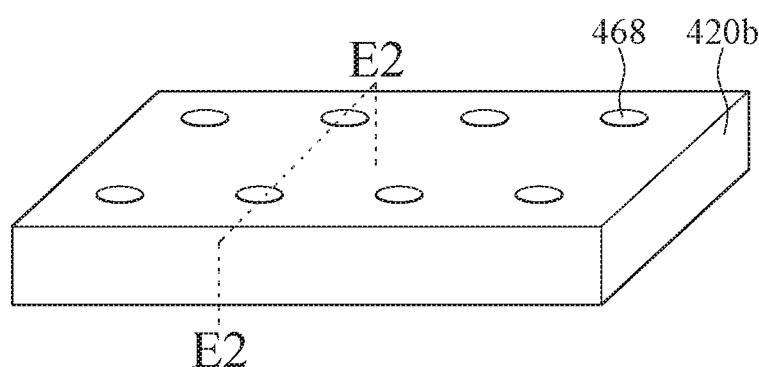
Figure 49J:
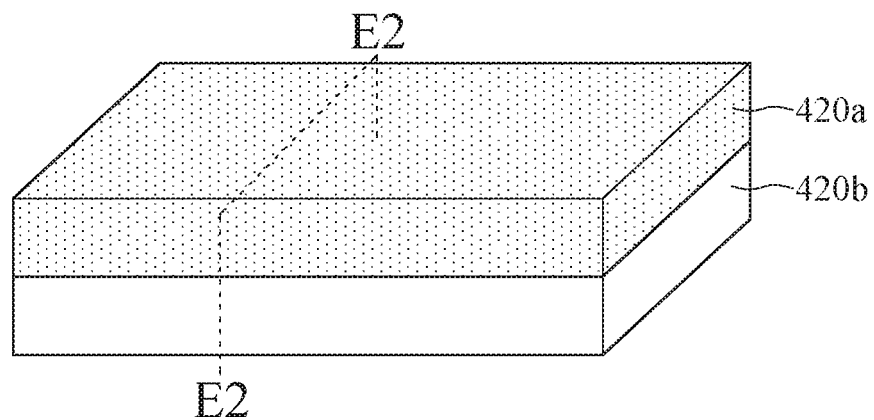
Figure 49K:
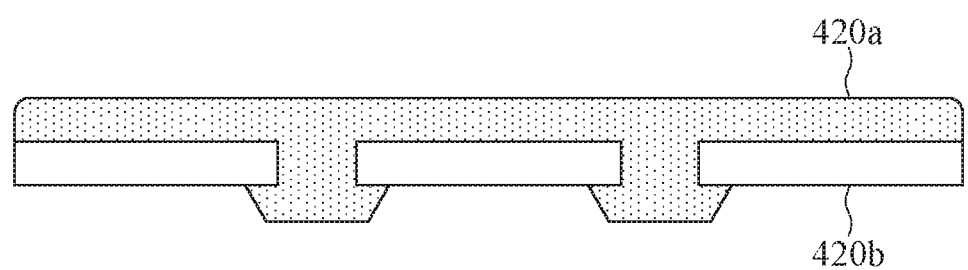

Please refer to FIG. 49I to FIG. 49K. FIG. 49I to FIG. 49K illustrate an LED filament with attaching strength being enhanced according to an embodiment. FIG. 49I is a perspective view showing the base layer 420b only. FIG. 49J is a perspective view showing the base layer 420b and the top layer 420a. FIG. 49K is a cross-sectional view along a line E1-E2 in FIG. 49J. FIG. 49K shows a layer structure of an LED filament. In the embodiment as shown in FIG. 49I (the LED chips and the conductive electrodes are omitted in FIG. 49I), the base layer 420b comprises a plurality of holes 468. The top layer 420a can extend into the base layer 420b via the holes 468 to increase the area of the contact faces between the top layer 420a and the base layer 420b. The phosphor powder glue forming the top layer 420a extends into the holes 468 and further extends to another side of the base layer 420b, as shown in FIG. 49K. The top layer 420a contacts at least two sides (the upper side and the lower side) of the base layer 420b. That is to say, the base layer 420b is clamped by the top layer 420a, and the top layer 420a and the base layer 420b are riveted together.

In an embodiment, the interfaces between the top layer 420a and the base layer 420b are nonobvious. To make the nonobvious interfaces, the manufacturing process is, but is not limited to, described below. A light conversion layer (the base layer 420b) is applied to a carrier, and the LED chips 102, 104 and the conductive electrodes 506 are disposed on the light conversion layer (the base layer 420b) on the carrier. One side of the base layer 420b is slightly solidified in advance (not completely solidified) in a heating or a UV lighting process, and then the LED chips 102, 104 are put on the slightly solidified base layer 420b. Next, the top layer 420a is applied to the LED chips 102, 104 and the slightly solidified base layer 420b, and, in such case, the top layer 420a and the base layer 420b are melted with each other within a certain range there between, As a result, a coincidence region is formed between the top layer 420a and the base layer 420b within the certain range, and the coincidence region is a transition zone where the top layer 420a and the base layer 420b are mixed together. Compositions of both of the top layer 420a and the base layer 420b exist in the transition zone. There is no distinct interface between the top layer 420a and the base layer 420b, so that the top layer 420a and the base layer 420b are hard to be stripped (separated) from each other. For example, while the attaching structure as shown in FIG. 49H comprising the coincidence region as the aforementioned description, the interfaces 420i between the top layer 420a and the base layer 420b shown in FIG. 49H may be no longer obvious, and the transition zone containing compositions of both of the top layer 420a and the base layer 420b may replace the interfaces 420i.

Figure 5G:
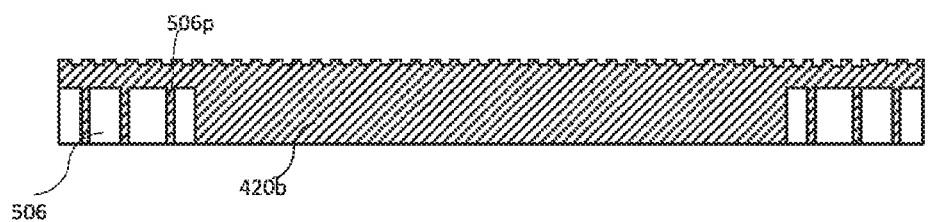
FIG. 5G is a side view of conductive electrodes of a filament in accordance with an embodiment of the present invention.
Figure 5H:
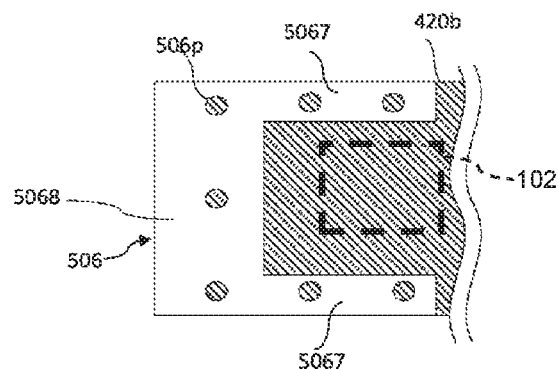
FIGS. 5H, 5I and 5J are top views of conductive electrodes of filaments in accordance with an embodiment of the present invention.
Figure 5I:
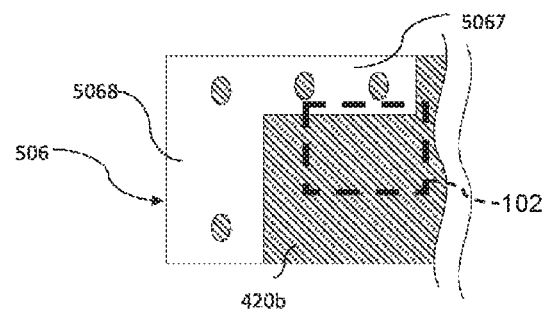
Figure 5J:
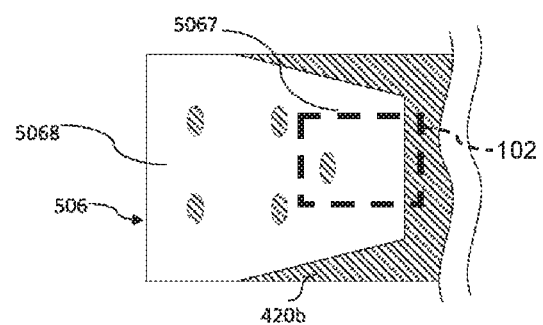

In addition, the structures depicted in FIGS. 49I, 49J, and 49K can not only be referred to the top layer and the base layer of the LED filament, but can also be referred to a relationship between the conductive electrodes and the base layer (or the top layer). For example, the base layer 420b of FIGS. 49I, 49J, and 49K can be replaced by the conductive electrode of the filament, and the top layer 420a of FIGS. 49I, 49J, and 49K can be replaced by the base layer of the filament; in such case, the conductive electrodes are embedded in the base layer of the filament, which creates significant attaching strength between the conductive electrodes and the base layer. In an embodiment, the structure of the conductive electrode 506 in the filament as shown in FIG. 5F comprises one connecting region 5068 and two transition region 5067 to surround the LED chip. The conductive electrode 506 may have holes 506p similar to the holes 468 shown in FIG. 49I and FIG. 49 K. A base layer (e.g., a phosphor film) can be made with the conductive electrode 506 embedded inside, which can be referred to the base layer (the phosphor film) 420b as shown in FIG. 5G and FIG. 5H. The base layer (the phosphor film) 420b infiltrates the holes 506p from one end and, depending on needs, can pass through the other end of the holes 506p. The base layer (the phosphor film) 420b shown in FIG. 5G does not pass through the holes 506p; however, the base layer (the phosphor film) 420b can pass through the holes 506p and extend to another side of the holes 506p of which the structure may be similar to FIG. 49K. An upper surface facing upwardly in FIG. 5G of the base layer 420b is processed in a surface roughening treatment; therefore, the base layer 420b has better heat dissipation ability based upon the roughened surface. FIG. 5H is a bottom view of the base layer 420b shown in FIG. 5G. FIG. 5I and FIG. 5J show embodiments of the conductive electrode 506 with holes. The difference between the embodiments of FIG. 5I and FIG. 5H is that the conductive electrode 506 of the embodiment of FIG. 5I has only one transition region 5067. The difference between the embodiments of FIG. 5I and FIG. 5J is that the transition region 5067 of the conductive electrode 506 of the embodiment in FIG. 5J extends from the connecting region 5068, the width of the transition region 5067 decrease gradually from the connecting region 5068 and has a trapezoidal structure. An average width of the transition region 5067 is less than that of the connecting region 5068. The conductive wires are not shown in FIG. 5H-5J, and the LED chips 102 are illustrated as dashed line.

In the embodiment shown in FIG. 5F, the first/last one of the LED chips 102 is entirely disposed within the area between the two transition regions 5067, in the other words, the first/last one of the LED chips is entirely disposed within the boundary of the conductive electrode, i.e., the segment where the conductive electrode disposed in. In other embodiments, the first/last one of the LED chips may be only partially within the boundary of conductive electrode.

In the FIG. 5H, 5I, the transition regions have a rectangle shape which has a constant width. In other embodiments, the transition regions may be similar to FIG. 5J, and have a width gradually decrease from the end close to the connecting region.

The conductive electrode and the LED chips are not limited to be in the same layer. In the embodiment of FIG. 5G-5J, the conductive electrodes 506 are disposed in the base layer 420b, and the LED chips may be disposed in the top layer (not shown), in this situation, the base layer 420b may be reversed and make the conductive electrodes 506 face upward, so as to electrically connect to the LED chips easily.

FIG. 5G and FIG. 5H shows an embodiment of a base layer (e.g., a phosphor film) with the conductive electrode embedded inside. As described previously, embodiments of FIG. 5I, 5J may be also a base layer with the conductive electrode embedded inside. As modified embodiments thereof, the conductive electrodes 506 shown in FIG. 5H, 5I, 5J may be disposed in top layer where LED chips disposed in (as shown in FIG. 49A). In this situation, the conductive electrodes 506 may be disposed at different height even they are in the same layer.

In other embodiments, the top layer 420a and the base layer 420b can be more tightly attached to each other in a vacuum manner processed by suction of negative pressure.

In addition, the LED filament with bending shape may comprise a hard substrate incapable of bending. In an embodiment, the LED filament comprises a straight portion and a bending portion. The straight portion comprises the hard substrate bearing the LED chips and surrounded by the phosphor powder glue. The bending portion may comprise a flexible printed circuit (FPC) bearing the LED chips surrounded by the phosphor powder glue. Alternatively, the bending portion may comprise no substrate, and the LED chips in the bending portion are only surrounded by the phosphor powder glue. The hard substrate may be, for example, made by ceramics, glass, sapphire, BT, FR4, metal, or aluminum oxide.

Figure 50:
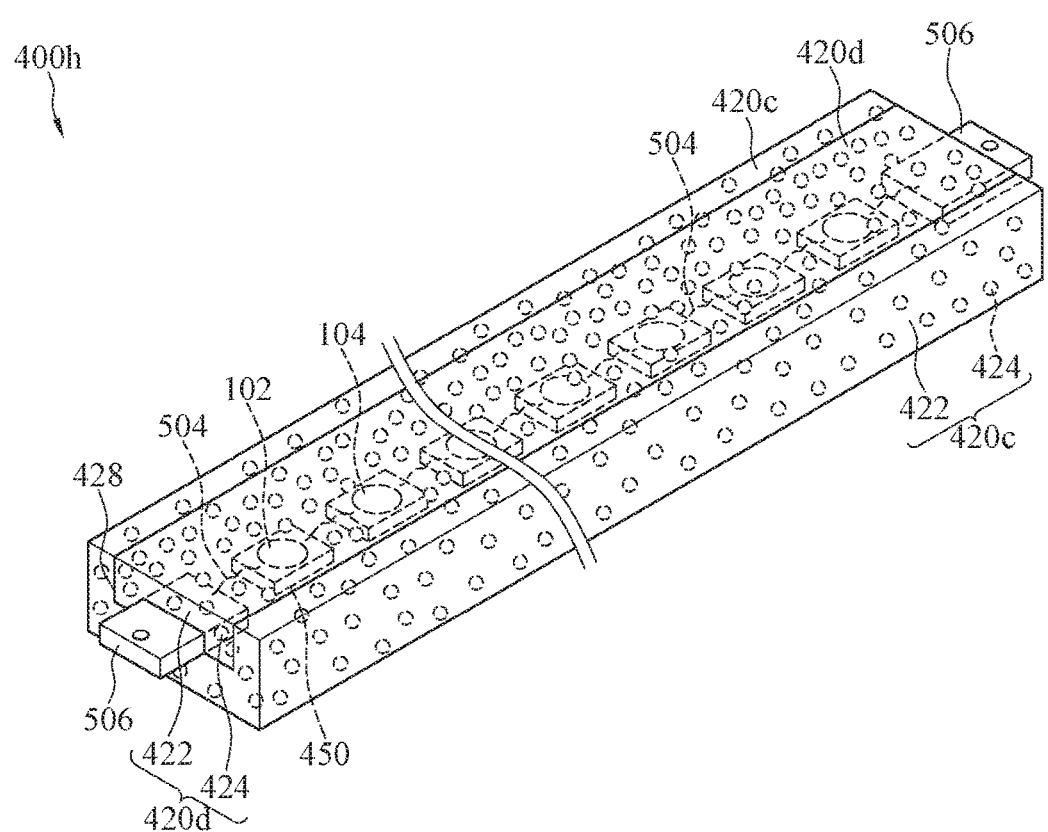
FIG. 50 illustrates a perspective view of an LED filament according to another embodiment of the present disclosure.

Please refer to FIG. 50. FIG. 50 illustrates a perspective view of an LED filament 400h according to another embodiment of the present disclosure. The LED filament 400h comprises LED chips 102, 104, conductive electrodes 506, conductive wires 504 for electrically connecting the adjacent LED chips 102, 104 and conductive electrodes 506, and light conversion coating 420 coating on at least two sides of the LED chips 102, 104 and the conductive electrodes 506. The light conversion coating 420 exposes a portion of two of the conductive electrodes 506. The light conversion coating 420 comprises a base layer 420c and a top layer 420d. The base layer 420c coats on one side of the LED chips 102, 104 and the conductive electrodes 506. Furthermore, the base layer 420c is formed with a trough 428. The LED chips 102, 104 and portions of the conductive electrodes 506 are disposed in the trough 428. One of the top layer 420d and the base layer 420c extends into the other one of the top layer 420d and the base layer 420c. In other words, the interface between the base layer 420c and the top layer 420d includes a three-dimensional surface for strengthening the interconnection. A portion of the LED chips 102, 104 are connected to the base layer 420c via die bond glues 450. The top layer 420d is filled in the troughs 428 and coats on the other side of the LED chips 102, 104 and the conductive electrodes 506. The top layer 420d comprises an adhesive 422 and a plurality of phosphors 424. The base layer 420c comprises an adhesive 422 and a plurality of phosphors 424. The mass ratio of the phosphors 424 of the base layer 420c is less than that of the phosphors 424 of the top layer 420d since the base layer 420c requires a better flexibility, and the top layer 420d requires a better illuminating effect. The mass ratio of the phosphors 424 of the top layer 420d is substantially between 60% and 85%. The mass ratio of the phosphors 424 of the base layer 420c is substantially between 40% and 65%. In some embodiments, the conversion efficiency of the phosphors 424 of the top layer 420d is greater than that of the phosphors 424' of the base layer 420c. Under the circumstances, the top layer 420d has a better illuminating effect.

Figure 51:
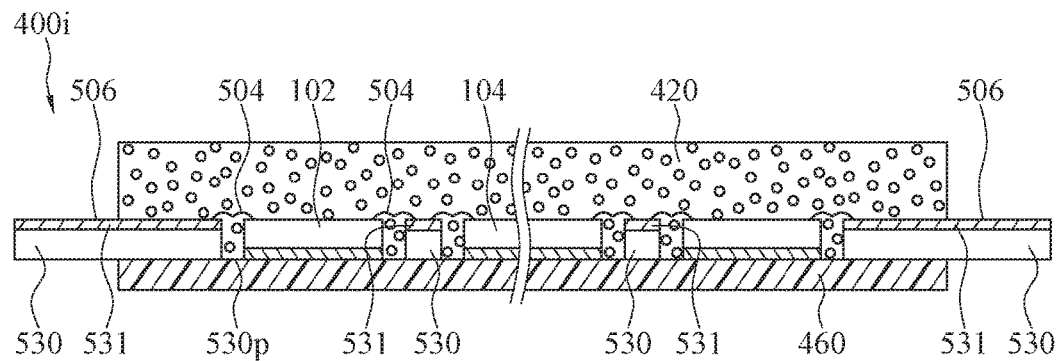
FIGS. 51 to 53 illustrate a cross-sectional views of an LED filament according to embodiments of the present disclosure.

Please refer to FIG. 51. FIG. 51 illustrates a cross-sectional view of an LED filament 400i according to an embodiment of the present disclosure. The LED filament 400i comprises LED chips 102, 104, conductive electrodes 506 formed by two ends of a layer of conductive foil 530, conductive wires 504 for electrically connecting the adjacent LED chips 102, 104 and conductive electrodes 506, light conversion coating 420 coating on at least one side of the LED chips 102, 104 and the conductive electrodes 506, and an insulation substrate 460 on which the LED chips 102, 104 and conductive electrodes 506 are disposed. In particular, the conductive foil 530 has a plurality of openings 530p. The width of each of the openings 530p is greater than that of each of the LED chips 102, 104. The LED chips 102, 104 are individually received in the openings 530p. The LED chips 102, 104 and the conductive electrodes 506 are electrically connected together through conductive foil 530 and conductive wire 504. The conductive foil 530 may be, but not limited to, a copper foil coated with a silver layer 531 to increase the reflection of light.

Figure 52:
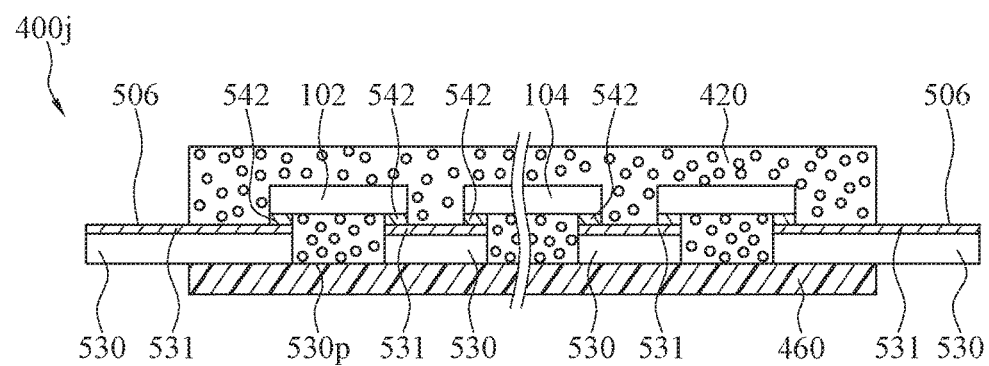

Please refer to FIG. 52. FIG. 52 illustrates a cross-sectional view of an LED filament 400j according to an embodiment of the present disclosure. The LED filament 400j can be referred to the LED filament 400i. Differences between the LED filament 400j and the LED filament 400i are that the LED chips 102, 104 of the LED filament 400j are flip chips (i.e. chip having equal-height electrodes), and the width of each of the opening 530p is less than that of each of the LED chips 102, 104. Each of the LED chips 102, 104 comprises soldering bumps 442. The LED chips 102, 104 are disposed on the conductive foil 530 respectively corresponding to the openings 530p. The soldering bumps 442 of each of the LED chips 102, 104 are respectively soldered on two sides of the conductive foil 530 divided by each of the openings 530p. The LED chips 102, 104 and the conductive electrodes 506 are electrically connected together through conductive foil 530 without the conductive wires 504.

Figure 53:
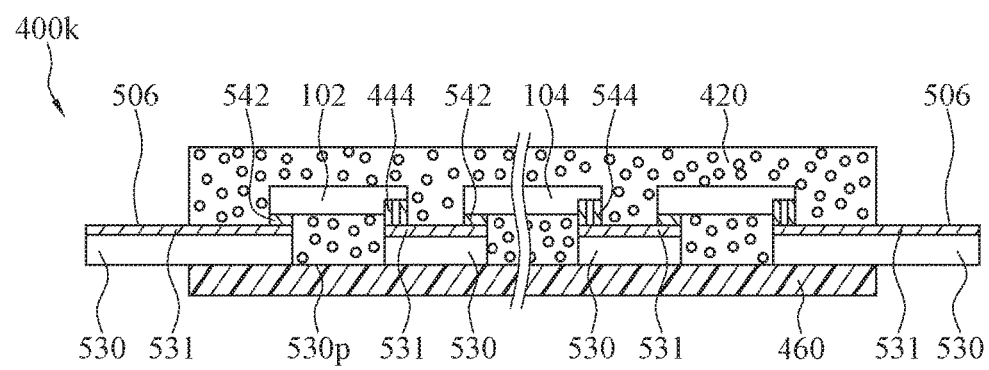

Please refer to FIG. 53. FIG. 53 illustrates a cross-sectional view of an LED filament 400k according to an embodiment of the present disclosure. The LED filament 400k can be referred to the LED filament 400j. A difference between the LED filament 400k and the LED filament 400j is that the LED chips 102, 104 of the LED filament 400k are face-up chips (i.e. chip having unequal-height electrodes). Each of the LED chips 102, 104 of the LED filament 400k comprises a soldering bump 542 and an extended bump 544. The soldering bump 542 and the extended bump 544 of each of the LED chips 102, 104 reach the same elevation, meaning that the thickness of the LED chips 102, 104 in the cross-sectional view from a side with the soldering bump 542 to another side with the extended bump 544 is identical. Each of the LED chips 102, 104 of the LED filament 400k can be aligned in a upside-down position and electrically connected to the conductive foil 530 via the soldering bump 542 and the extended bump 544. The soldering bump 542 and the extended bump 544 of each of the LED chips 102, 104 are respectively soldered on two sides of the conductive foil 530 divided by each of the openings 530p. The LED chips 102, 104 and the conductive electrodes 506 are electrically connected together through conductive foil 530 without the conductive wires 504.

Please refer to FIG. 54. FIG. 54 illustrates a cross-sectional view of an LED filament 400l according to an embodiment of the present disclosure. The LED filament 400l can be referred to the LED filament 400a. A difference between the LED filament 400l and the LED filament 400a is regarding the alignment of the LED chips 102, 104. The LED chips 102, 104 of the LED filament 400a are aligned along a direction from the conductive electrode 410 to the conductive electrode 412 and parallel with a horizontal plane on which the base layer 420b of the LED filament 400a is laid (referring to FIG. 49A). In contrast, the LED chips 102, 104 of the LED filament 400l are not aligned along a direction from the conductive electrode 410 to the conductive electrode 412 and not parallel with a horizontal plane on which the base layer 420b of the LED filament 400l is laid (referring to FIG. 54). The LED chips 102, 104 of the LED filament 400l may respectively have different angles related to the horizontal plane. Correspondingly, the illuminating directions of the LED chips 102, 104 may be different from one another. Under the circumstances, a side of the base layer 420b of the LED filament 400l carrying the LED chips 102, 104 (or the die bond glues 450) may be not a flat plane but may be a successively concave-convex plane so that each of the LED chips 102, 104 disposed on different positions of the successively concave-convex plane have different angles, accordingly. In some embodiments, all of the LED chips 102, 104 of the LED filament 400l have angles related to the horizontal plane different from one another. Alternatively, a part of the LED chips 102, 104 of the LED filament 400l have a first angle related to the horizontal plane, and another part of LED chips 102, 104 of the LED filament 400l have a second angle related to the horizontal plane. In some embodiments, the first angle equals to 180 degrees minus the second angle. Additionally, the LED chips 102, 104 of the LED filament 400l may have different heights related to the horizontal plane. As a result, the LED filament 400l with the LED chips 102, 104 having different illuminating directions (different angles related to the horizontal plane) and/or different heights may generate a more even illumination, such as an omni-directional illumination.

Figure 55:
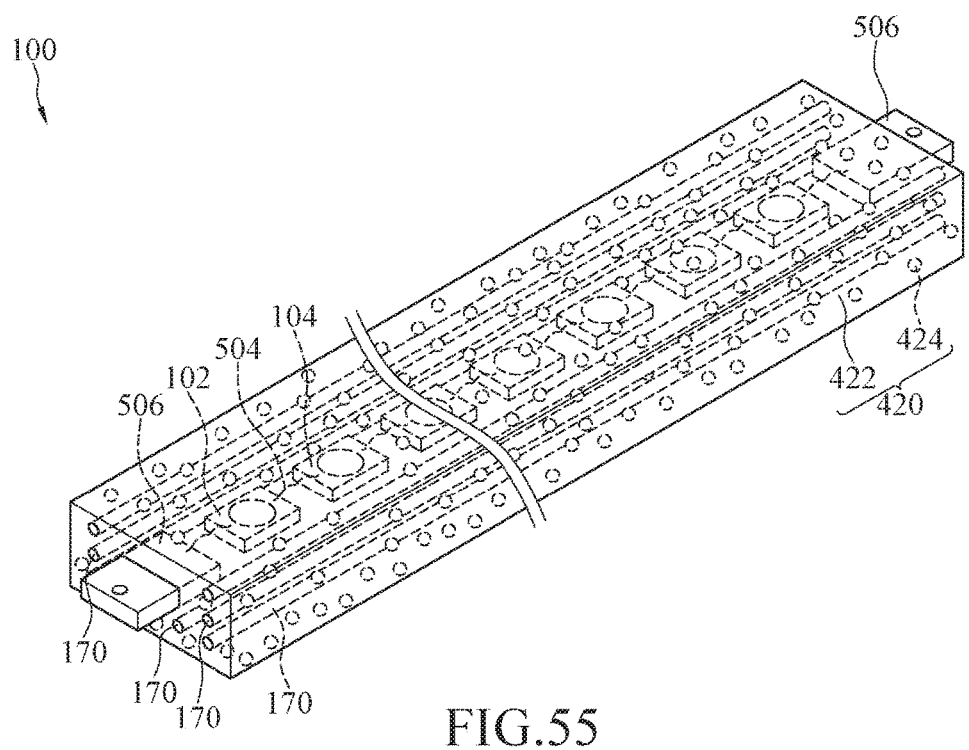
FIG. 55 illustrates a perspective view of an LED filament according to an embodiment of the present disclosure.

Please refer to FIG. 55. FIG. 55 illustrates a perspective view of an LED filament 100 according to another embodiment of the present disclosure. The LED filament 100 herein can be referred to the LED filament 100 shown in FIG. 33. A difference between the LED filament 100 herein and the LED filament 100 shown in FIG. 33 is that the LED filament 100 herein further comprises a plurality of auxiliary pieces 170. The auxiliary pieces 170 are enclosed by the light conversion coating 420. The auxiliary pieces 170 extend from a side of the LED filament 100 with conductive electrode 506 to another side of the LED filament 100 with conductive electrode 506. The auxiliary pieces 170 may be around the LED chips 102, 104. The auxiliary pieces 170 improve the toughness of the light conversion coating 420 and reduce possibility of damage of the conductive wires 540. In some embodiments, the auxiliary pieces could be made by material such as metal (e.g. copper), glass fiber, graphene, carbon nanotube, or the like. In some embodiments, the light conversion coating 420 comprises a top layer and a base layer. The top layer comprises phosphor glue layer(s) or phosphor film layer(s). The base layer comprises a flexible tempered glass of which a thickness is substantially 0.1-0.5 mm, a hardness is substantially 1H, and a percent transmittance is substantially equal to or greater than 90%.

In other embodiments, the auxiliary piece is not limited to the straight line extending along the axle of the filament as shown in FIG. 55. The auxiliary piece may be of a spiral shape or of a curved shape extending along the axle of the filament. Different segments of one auxiliary piece may be disposed at different layers of the filament. In addition, the auxiliary piece may be traverse with respect to the axle of the filament.

Figure 55A:
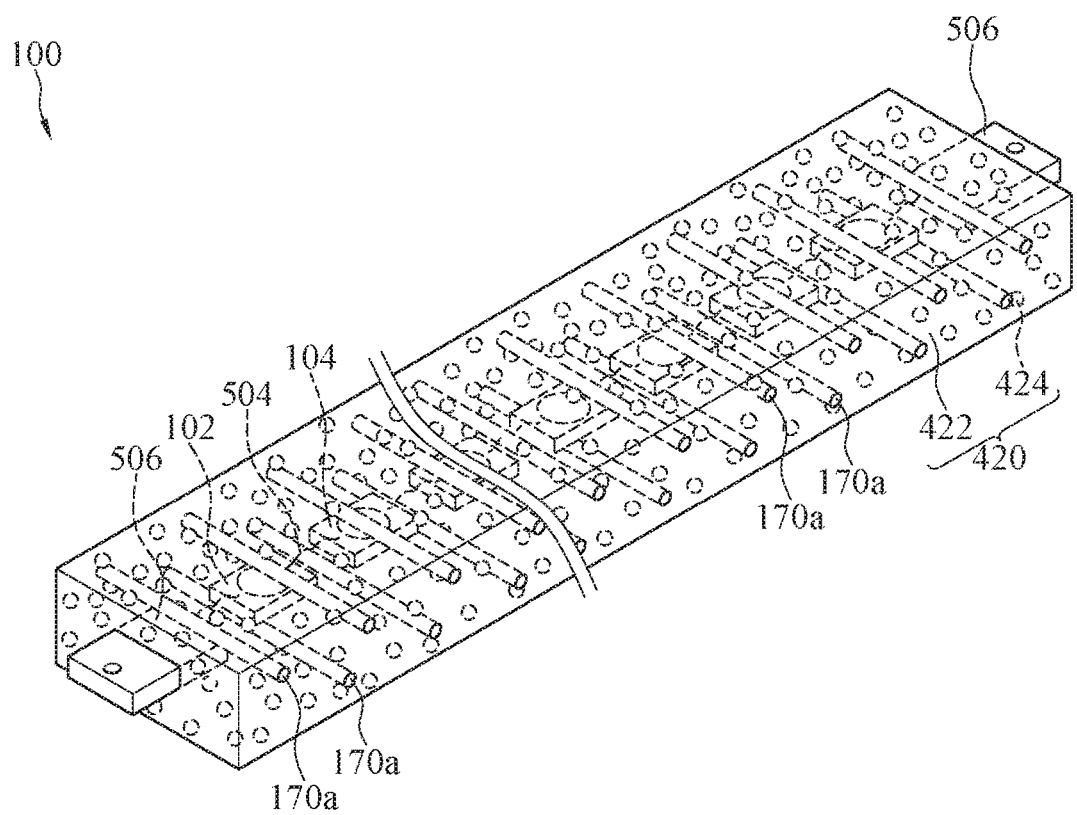
FIG. 55A is a perspective view of an LED filament according to another embodiment of the present invention.

Please refer to FIG. 55A. FIG. 55A is a perspective view of an LED filament according to another embodiment of the present invention. The LED filament 100 comprises a plurality of auxiliary pieces 170a. The auxiliary pieces 170a are arranged in a traverse alignment. There is not any electrical connection between the auxiliary pieces 170a and other components such as the conductive electrodes 506, the LED chips 102 and 104, and the conductive wires 540. The auxiliary pieces 170a are for enhancing the structure of the filament to prevent external force applied to the filament from damaging the LED chips 102 and 104. The thickness and the number of the auxiliary pieces 170a may be adjusted according to sizes and weights of the LED chips 102, 104 and the LED filament 100 and a designated shape of the LED filament 100 so as to support the LED filament 100. In the embodiment, the auxiliary pieces 170a are distributed over the top layer and the base layer of the LED filament 100. As shown in FIG. 55A, the auxiliary pieces 170a are above and below the LED chips 102, 104. In other embodiments, the auxiliary pieces 170a may be disposed at the base layer of the LED filament 100 only. For example, as shown in FIG. 55A, all of the auxiliary pieces 170a may be below the LED chips 102, 104. Alternatively, the auxiliary pieces 170a may be disposed at the top layer of the LED filament 100. For example, as shown in FIG. 55A, all of the auxiliary pieces 170a may be above the LED chips 102, 104.

Figure 55B:
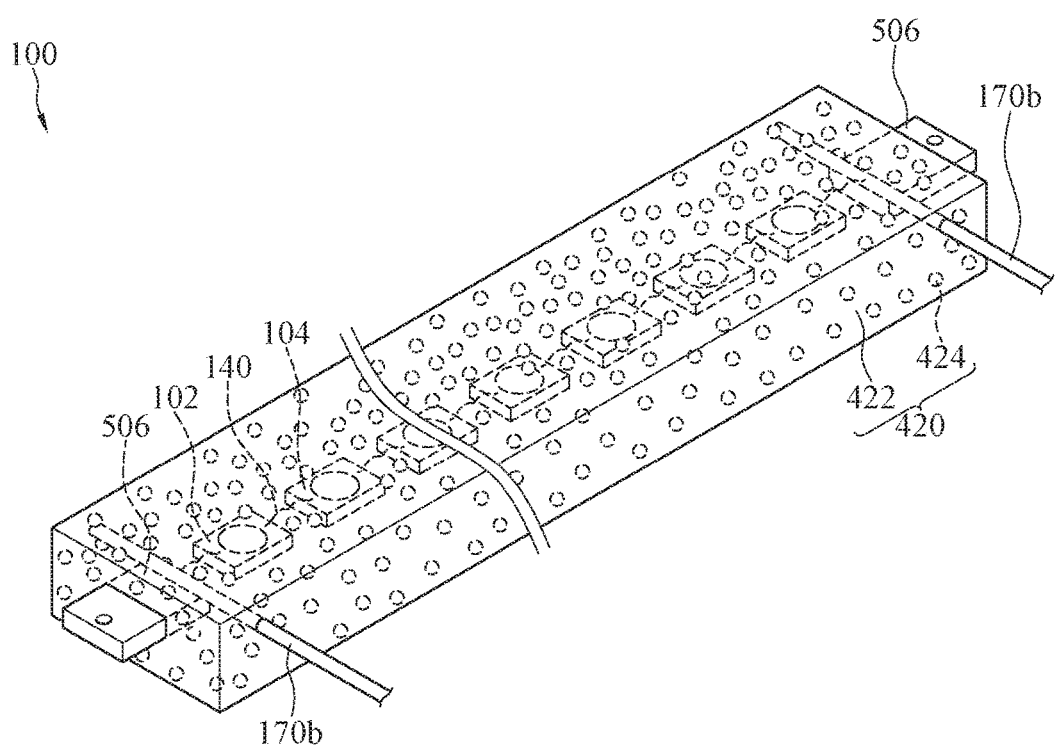
FIG. 55B is a perspective view of an LED filament according to another embodiment of the present invention.

Please refer to FIG. 55B. FIG. 55B is a perspective view of an LED filament according to another embodiment of the present invention. The LED filament 100a comprises a plurality of auxiliary pieces 170b. The auxiliary pieces 170b are arranged in a traverse alignment. The difference between the auxiliary pieces 170a and the auxiliary pieces 170b is that the auxiliary pieces 170b further extend to outside of the LED filament 100. Additionally, a part of the auxiliary pieces 170b extending to outside of the LED filament 100 may replace the supporting arms 15 and may be further connected to the stem 19 (as shown in FIG. 45C and FIG. 45E). Under the circumstances, the auxiliary pieces 170b are not only reinforce the whole structure of the filament, but also fix the LED filament 100 to the stem 19 directly. Based upon the design of the auxiliary pieces 170b which replaces the supporting arms 15, the manufacturing process of the LED light bulb can be simplified. That is to say, in the embodiment, the support arms (i.e., the auxiliary pieces 170b herein) may be formed with the LED filament 100 directly and simultaneously. The additional process that the manufacture of the LED filament 100 needs to be accomplished in advance and the supporting arms need to be connected to the accomplished LED filament 100 later is no longer required.

Figure 55C:
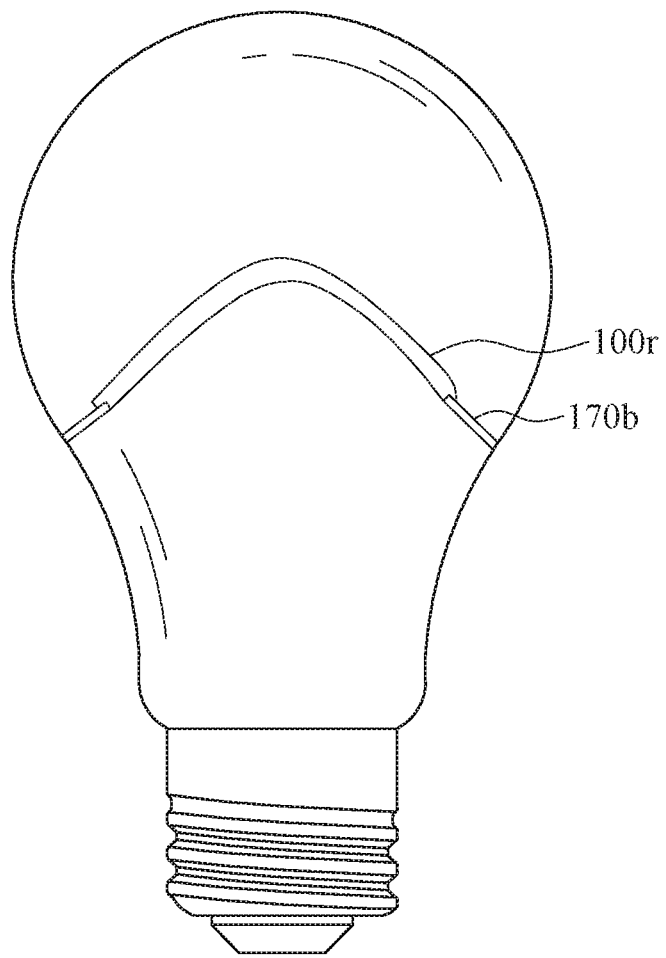
FIG. 55C is a side view of an LED filament in an LED light bulb according to an embodiment of the present invention.
Figure 55D:
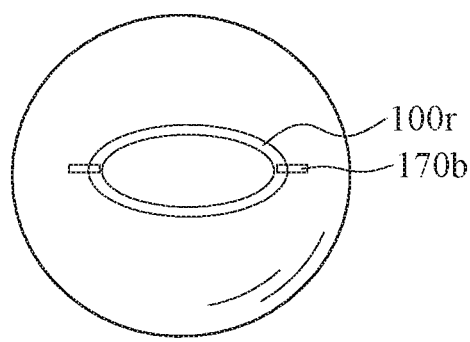
FIG. 55D is a perspective view of an LED filament of FIG. 55C.

Please refer to FIG. 55C and FIG. 55D. FIG. 55C is a side view of an LED filament in an LED light bulb according to an embodiment of the present invention. FIG. 55D is a perspective view of an LED filament of FIG. 55C. In the embodiment, the LED light bulb comprises a LED filament 100r but has no stem and no stand. A head portion and an end portion of the LED filament 100r are connected to each other such that the LED filament 100r is of a ring shape. Two conductive electrodes are respectively located at the head portion and a middle portion of the LED filament 100r. The conductive electrodes are made by transparent conductive glue. The LED filament 100r comprises longitudinal auxiliary piece(s) made by copper, which are for supporting and flexibility. The two conductive electrodes of the LED filament 100r are electrically connected with traverse auxiliary pieces 170b formed by glass fibers. The traverse auxiliary pieces 170b extend to outside of the LED filament 100r and are connected to the bulb shell. For example, the traverse auxiliary pieces 170b may be sintered to the bulb shell. A power route (not shown) which is capable of supplying the conductive electrodes is formed by transparent conductive coating and is formed on the traverse auxiliary pieces 170b and the bulb shell to extend downwardly to reach the bulb base. The stem/stand for supporting the LED filament and the support arm for fixing the LED filament in aforementioned embodiments can be replaced by the auxiliary pieces 170b in the embodiment. The traverse auxiliary pieces 170b are made by glass fibers. Additionally, the conductive supports in aforementioned embodiments can be replaced by the transparent auxiliary pieces 170b and the transparent conductive coating in the embodiment; therefore, most of light rays emitted from the LED filament 100r wouldn't be blocked. The light bulb as a whole has a better aesthetic appearance. In an embodiment, there are glass joint portions (not shown) disposed on the outside of the conductive electrodes of the LED filament 100r and/or on the end of the portion of the auxiliary piece 170b extending to outside of the LED filament 100r such that the glass joint portions can be easily sintered to the bulb shell. In an embodiment, there are male joint portions and corresponding female joint portions respectively disposed on the inside of the bulb shell, on the conductive electrodes of the LED filament 100r and/or on the end the auxiliary piece 170b. For example, the male joint portion may be a plug or a latch, and the female joint portion may be a through hole. The male joint portion can be jointed with the female joint portion (e.g., the plug may be inserted into the through hole) in advance, and then the male joint portion and the female joint portion can be sintered together.

In an embodiment, the LED filament may comprise a longitudinal auxiliary piece and a traverse auxiliary piece. For example, there may be two longitudinal auxiliary pieces and several traverse auxiliary pieces in the LED filament. The traverse auxiliary pieces extend to outside of the LED filament along the width direction of the LED filament and are connected to the stem/stand. In such case, the traverse auxiliary pieces can be referred to the auxiliary pieces 170b shown in FIG. 55B, which can replace the supporting arms 15 shown in FIG. 45C and FIG. 45E. Alternatively, the LED filament may comprise no traverse auxiliary piece, and, instead, at least one end of the longitudinal auxiliary piece may be bended to form a L-shaped structure. A portion of the L-shaped structure may extend to outside of the LED filament along the width direction of the LED filament to be further connected to the stem/stand or other parts inside the LED light bulb (e.g., a part of the internal surface of the bulb shell), such that the LED filament can be fastened.

In an embodiment, while the auxiliary piece is made by metal or other materials having good thermal conductivity for heat dissipation, the auxiliary piece may extend to outside of the LED filament and be connected to the stem or a heat dissipator of the LED light bulb to facilitate heat dissipation. Alternatively, the auxiliary piece may extend to outside of the LED light bulb in order to contact external air to facilitate heat dissipation.

Figure 55E:
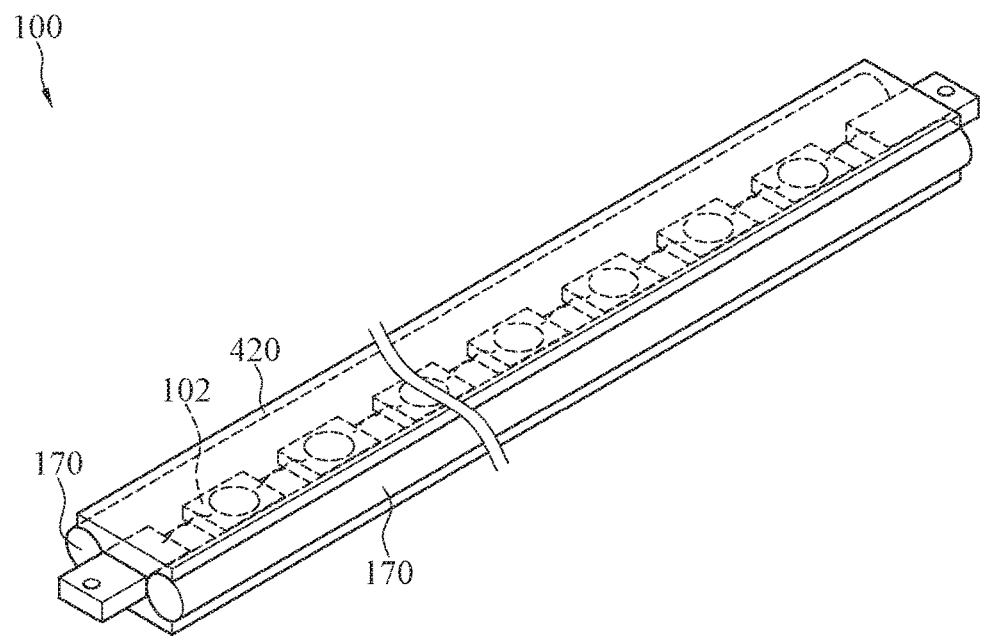
FIG. 55E is a perspective view of an LED filament according to an embodiment of the present invention.

In an embodiment, as shown in FIG. 55, the auxiliary pieces 170 are not electrically connected to the conductive electrodes 506/LED chips 102, 104/wires 140 and are disposed at two sides of the LED chips 102, 104. In some embodiments, while the auxiliary pieces 170 are made by materials with greater thermal conductivity for better effect of heat dissipation, the auxiliary pieces 170 may be connected to the conductive electrodes but not to LED chips/wires. In such case, the filament can be dissipated through the conductive electrodes and the auxiliary pieces 170 and therefore have no risk of short-circuit. In an embodiment, a cross section of a filament along an axle of the filament may be referred to FIG. 49A, and a top view of the filament may be referred to FIG. 55E. The auxiliary pieces 170 of a filament 100 shown in FIG. 55E are disposed at two opposite sides of the LED chips 102. The auxiliary pieces 170 are function as a side frame and are made by copper. An outer portion of the auxiliary pieces 170 is exposed in the light bulb; therefore, the auxiliary pieces 170 can directly contact the gas inside the light bulb, which is benefit to heat dissipation. In the embodiment, the outer portion of the auxiliary pieces 170 is totally exposed to contact the gas inside the light bulb; alternatively, the outer portion of the auxiliary pieces 170 may be partially exposed to contact the gas inside the light bulb, meaning that a part of the outer portion of the auxiliary pieces 170 is covered by a light conversion coating (not shown in FIG. 55E). In the embodiment, the auxiliary pieces 170 and the LED chips 102 are at the same level with the same height; alternatively, the auxiliary pieces 170 and the LED chips 102 may be at different levels with different heights. In the embodiment, the auxiliary pieces 170 are tightly attached to the LED chips 102; alternatively, there may be a light conversion coating/layer or gap(s) between the auxiliary pieces 170 and the LED chips 102 depending on needs. In the embodiment, the auxiliary pieces 170 are copper wires. The portion of the auxiliary pieces 170 exposed to contact the gas inside the light bulb may be coated with a film with high thermal emissivity (e.g., aluminum nitride, silicon nitride, nano-carbon tubes, and graphene). In other embodiment, the auxiliary pieces 170 may be made by materials of nano-carbon tubes and graphene with high thermal conductivity and high thermal emissivity.

Figure 55F:
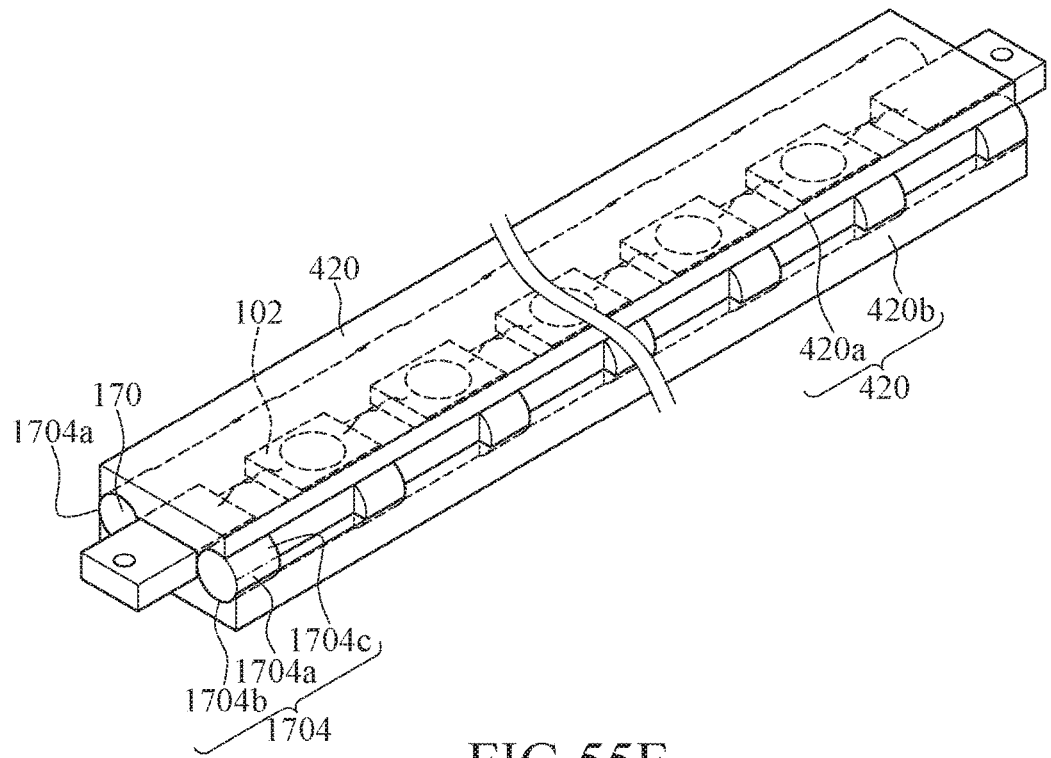
FIG. 55F is a perspective view of an LED filament according to another embodiment of the present invention

Additionally, the auxiliary pieces may have varied shapes which are appropriate to practice. The auxiliary pieces 170 shown in FIG. 55F are similar to the auxiliary pieces 170 shown in FIG. 55E. The difference is that the auxiliary pieces 170 shown in FIG. 55F comprises tooth portions 1704 disposed on an outer side of the auxiliary pieces 170. The tooth portions 1704 are adjacent to and spaced from one another. In the embodiment, the tooth portion 1704 of the auxiliary piece 170 has an outer face 1704a facing outwardly to contact the gas inside the light bulb to facilitate heat dissipation. The space between the two adjacent tooth portions 1704 can be filled with the light conversion coating (the base layer 420b and the top layer 420a). Comparing to the auxiliary pieces 170 of the embodiment shown in FIG. 55E, the auxiliary pieces 170 of the embodiment shown in FIG. 55F is thinner, and the spaces between every two adjacent tooth portions 1704 are filled with the light conversion coatings; therefore, the effect of illumination is better. Depending on needs, the base layer 420b and the top layer 420a of the light conversion coating may be fully cover or partially cover the tooth portions 1704, or the base layer 420b and the top layer 420a of the light conversion coating do not cover the tooth portions 1704 at all. The tooth portions 1704 are aligned in two rows respectively on the two auxiliary pieces 170. In the embodiment, as shown in FIG. 55F, lower faces 1704b of the two rows of the tooth portions 1704 of the embodiment shown in FIG. 55F contact the base layer 420b of the light conversion coating. The outer faces 1704a of the two rows of the tooth portions 1704 exposed from the light conversion coating to contact the gas inside the light bulb. Upper faces 1704c are opposite with the lower faces. The upper faces 1704c of one of the two rows of the tooth portions 1704 contact the top layer 420a, and the upper faces 1704c of the other one of the two rows of the tooth portions 1704 are exposed from the light conversion coating to contact the gas inside the light bulb. In the embodiment, the tooth portions 1704 are, but are not limited to, arranged corresponding to and close to the LED chips. In other embodiments, the tooth portions 1704 are arranged close to the spaces between every two adjacent LED chips 102; alternatively, the tooth portions 1704 can be disposed at any segment of the auxiliary piece. In the embodiment, the auxiliary pieces 170 have straight shapes extending continuously. In other embodiments, the auxiliary pieces 170 extend discontinuously and are in a spaced arrangement. FIG. 55E is just an embodiment of the auxiliary piece 170. The auxiliary pieces 170 is not limited to strip shape having a substantial circle cross section as shown in FIG. 55E, the auxiliary pieces 170 may be a thin film or a foil.

Figure 56:
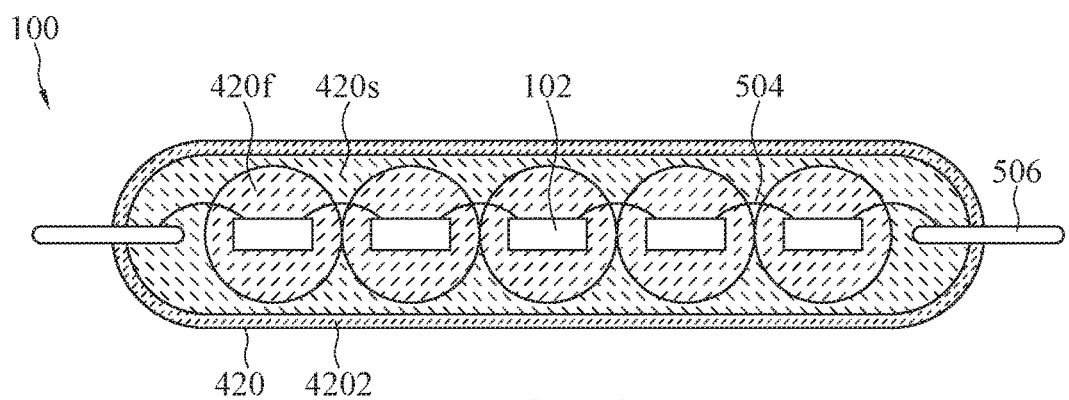
FIG. 56 is a cross sectional view of the LED filament according to an embodiment of the present enclosure.

Referring to FIG. 56, in accordance with an embodiment, the LED filament 100 configured for emitting omnidirectional light comprises a linear array of LED chips 102 operably interconnected to emit light upon energization; a conductive electrode 506; a plurality of conductive wires 540 for electrically connecting the linear array of LED chips 102 and the conductive electrode 506; and a light conversion coating 420 enclosing the linear array of LED chips 102 and the conductive electrode 506, wherein: the light conversion layer 120 includes a first phosphor glue layer 4201, a second phosphor glue layer 4202 and a transparent layer 4202; the first phosphor glue layer 4201 includes a linear series of pairwise tangent globular structures; the LED chip 102 is enclosed in a central portion of the first phosphor glue layer 4201; the transparent layer 4202 forms an external layer of the LED filament 100; and the second phosphor glue layer 4202 fills the gap between the transparent layer 4202 and the first phosphor glue layer 4201. In the embodiment, the second phosphor glue layer 4202 is made by applying glue and waiting the applied glue solidifying naturally; therefore, an edge of a surface of the second phosphor glue layer 4202 is declined naturally.

Figure 57A:
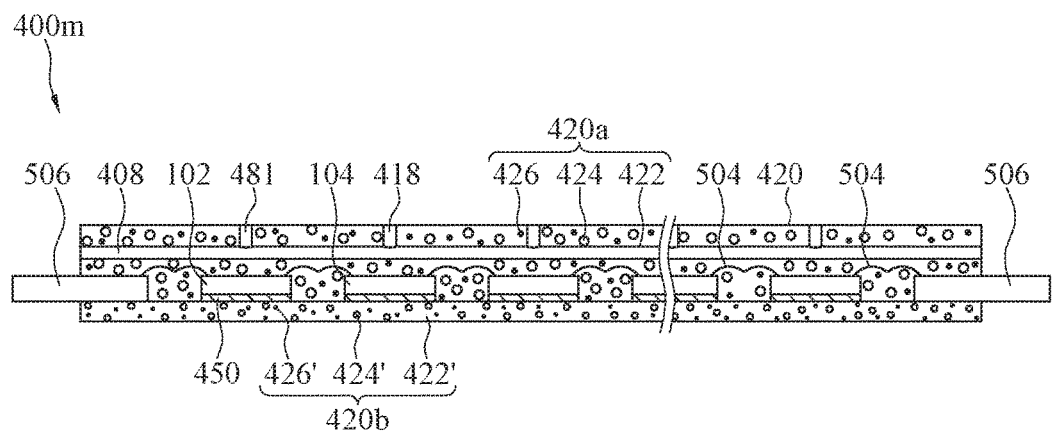
FIG. 57A is a cross-sectional view of an LED filament according to an embodiment of the present invention.

Please refer to FIG. 57A. FIG. 57A is a cross-sectional view of an LED filament according to an embodiment of the present invention. The difference between an LED filament 400m shown in FIG. 57A and the LED filament 400a shown in FIG. 49A is that the LED filament 400m shown in FIG. 57A further comprises a heat dissipating channel 408 and a plurality of heat dissipating holes 418. In the embodiment, the heat dissipating channel 408 penetrates through the LED filament 400m along the axle direction of the LED filament 400m, and is disposed in the top layer 420a. But the design of the heat dissipating channel 408 may be varied and is not limited to the aforementioned embodiment. In other embodiment, the heat dissipating channel 408 may penetrate through the LED filament 400m along the traverse direction relative to the axle direction. Alternatively, the heat dissipating channel 408 may be disposed in the base layer 420b. Alternatively, there may be a plurality of the heat dissipating channels 408 distributed in the top layer 420a and the base layer 420b. In the embodiment, the heat dissipating holes 418 penetrate through the LED filament 400m along a direction perpendicular to the axle of the LED filament 400m. Specifically, one end of the heat dissipating hole 418 communicates with the heat dissipating channel 408, and the other end of the heat dissipating hole 418 penetrates through a surface of the top layer 420a away from the base layer 420b. The heat dissipating channel 408 and the heat dissipating holes 418 are beneficial of heat dissipation of the LED filament 400m. For example, during the operation of the LED filament 400m, relative low temperature air flows into the LED filament 400m via openings at two ends of the heat dissipating channel 408, the low temperature air takes away heat generated by the LED chips 102, 104 and the conductive electrodes 506, and heated air rises and flows to outside of the LED filament 400a via the heat dissipating holes 418. As a result, air can circulate between the inside and the outside of the LED filament 400*m* to create convection, which assists heat dissipation of the LED filament 400*m*. In the embodiment, the heat dissipating holes 418 may be aligned in correspondence with the LED chips 102, 104, and, in such alignment, the efficiency of the heat dissipation is better since the LED chips 102, 104 generate the most heat in the LED filament 400*m*. A thinner heat dissipating channel and thinner heat dissipating holes may be, but not limited to, made in a photoetching manner by photoresist in any segment of the LED filament.

Figure 57B:
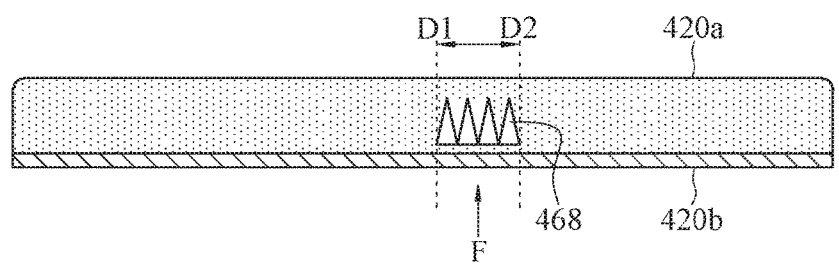
FIG. 57B is a cross-sectional view of an LED filament according to another embodiment of the present invention.

Please refer to FIG. 57B. FIG. 57B is a cross-sectional view of an LED filament according to another embodiment of the present invention. The LED chips and the conductive electrodes are omitted in FIG. 57B. In the embodiment, the LED filament in the LED light bulb is curved and rises and falls, and, consequently, a portion of the LED filament curved by a small angle (with a greater curvature) may be easy to expense due to heat, such that the curved portion may be easily influenced by thermal stress to become fragile. Thus, the LED filament in the embodiment may further comprise one or more holes or breaches properly disposed close to the curved portion to reduce the influence of thermal stress. In an embodiment, as shown in FIG. 57B, an interval D1-D2 is a predetermined curved portion. The top layer 420*a* is formed by phosphor powder glue (or phosphor glue), and the base layer 420*b* is formed by phosphor powder film (or phosphor film). There is a plurality of holes 468 disposed in the top layer 420*a*. Preferably, the diameter of the hole 468 may gradually increase from an outer side of the predetermined curved portion (the upper side in FIG. 57B) to an inner side of the predetermined curved portion (the lower side in FIG. 57B). In the embodiment, the shape of the cross section of the hole 468 is of a triangle. While the LED filament is curved (bended), force is applied to the predetermined curved portion of the LED filament upwardly along F direction shown in FIG. 57B. The holes 468 in the interval D1-D2 facilitate the bending process of the LED filament and reduce the thermal stress. If sizes and shapes of the holes 468 are properly designed based upon the curvature of the predetermined curved portion, the holes 468 can retain its hollow structure to a certain extend after the LED filament is curved and the holes 468 are squeezed, i.e., an inner diameter of the hole 468 after the LED filament is curved is still greater than 0, but is less than that of the hole 468 before the LED filament is curved. Under the circumstances, the holes 468 may also assist the heat dissipation. In another embodiment, the holes 468 may be combined with the heat dissipating holes 418 and the heat dissipating channel 408 shown in FIG. 57A. Alternatively, the heat dissipating holes 418 shown in FIG. 57A may have two ends with different diameters analogous to the holes 468 to facilitate the bending process of the LED filament.

In an embodiment, an LED filament in an LED light bulb is straight. The straight LED filament also comprises a plurality of heat dissipating holes (the heat dissipating holes 418 shown in FIG. 57A) and a heat dissipating channel (he heat dissipating channel 408 shown in FIG. 57A). The straight LED filament may be set upright or set slanting relative to the height direction of the LED light bulb and, in such case, the straight LED filament has two opposite end portions in the axle direction, which are an upper end portion and a lower end portion. There are two openings respectively disposed on the upper end portion and the lower end portion of the LED filament and communicating with the heat dissipating channel. During the operation of the LED filament, cool air can flow into the LED filament via the opening on the lower end portion, through the heat dissipating channel, and finally flow to outside of the LED filament via the opening on the upper end portion. In an embodiment, an LED filament in an LED light bulb is curved and rises and falls, e.g., the LED filament 100, 100*d* shown in FIGS. 45C and 45E. The curved LED filament may have one or more upper end portions and one or more lower end portion according to its shape. The curved LED filament also comprises a plurality of heat dissipating holes (the heat dissipating holes 418 shown in FIG. 57A) and a heat dissipating channel (he heat dissipating channel 408 shown in FIG. 57A). The heat dissipating holes communicate with the heat dissipating channel. The heat dissipating holes may be respectively disposed on the upper end portions. Additionally, the heat dissipating holes may also be respectively disposed on the lower end portions, which may significantly improve the efficiency of heat dissipation.

In an embodiment, the bulb shell may comprise a heat dissipating region close to the upper end portion(s) of the LED filament to assist heat dissipation. The heat dissipating region may comprise one or more ventilation holes penetrating through the bulb shell. Alternatively, the heat dissipating region may be made by materials with greater thermal conductivity. For example, the bulb shell may be made with an opening in advance, and the opening is filled with transparent resin with heat dissipating particles. The heat dissipating particles may be made by materials with greater transmittance and greater thermal conductivity, such as graphite, ceramics, carbon fiber, aluminum oxide, magnesium oxide, and nano-silver. Additionally, the bulb shell with the ventilation holes may be filled with nitrogen, oxygen, or hydrogen. For example, the ventilation holes are connected to the openings on the LED filament by tubes, such that external air can flow through the heat dissipating channel and the heat dissipating holes while the internal space of the bulb shell is stilled in a sealing state. The gas of nitrogen, oxygen, or hydrogen filled in the internal space of the bulb shell also assists the heat dissipation. In an embodiment, the heat dissipating channel may be made in correspondence with the bending shape of the LED filament. In an embodiment, the LED filament is of a spiral shape and has multiple spiral rings overlapping upwardly in the height direction to mutually form a spiral structure. At least one side of each of the spiral rings contacts one another. A straight heat dissipating channel may be formed on the side where the spiral rings contact one another and penetrate through the spiral rings. The above embodiments are suitable for the LED light bulb with either hard filament or flexible filament.

In some embodiments described above, the material of adhesive to form LED filaments is silicone. The process of heat-curing has also been introduced due to its thermosetting property. However, the gel is not limited to thermosetting type or UV-curing type, thermoplastic type, like thermalplastic resin (e.g. polyethylene terephthalate (PET), Polymethylmethacrylate (PMMA), acrylonitrile-styrene resin (SAN), and Polyvinylidene Chloride (PVDC)) with better transparency or glass, may be applied as well.

In an embodiment, the materiel of gel is made of PVDC powder. The PVDC powder with phosphor powder is melted by heating the gel to the operating temperature (for example, the operating temperature of PVDC is 160-200° C.). The melted gel of the PVDC powders with phosphors wraps the LED chips to form the LED filament. In another embodiment, the PVDC is converted into a liquid state by melting the PVDC powders first, and then phosphors are doped into the PVDC gel. The LED chips are wrapped by the PVDV gel doped with phosphors to form LED filament described in this specification. The filament formed by the way described above has a stable structure and may be reconstructed or reformed by heating it again to arrange the shape of LED filament. Alternatively, we can also heat a portion of the filament and modify the LED filament with curved angles to an ideal shape.

Figure 58A:
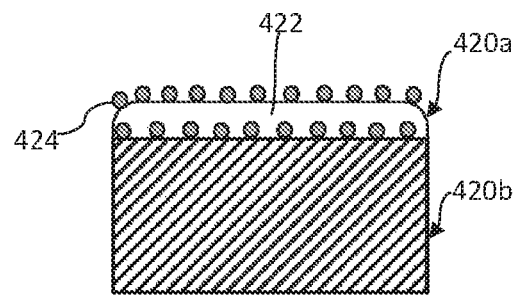
FIG. 58A and FIG. 58B are cross-sectional views of an LED filament according to different embodiments of the present invention.
Figure 58B:
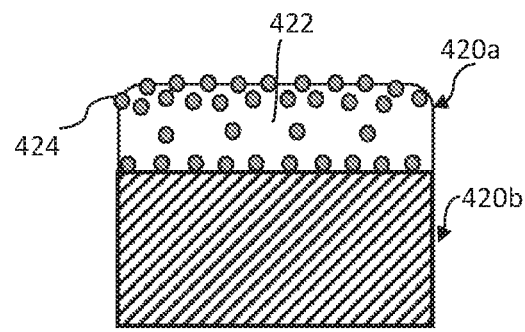

There are varied ways to form the phosphor glue or the phosphor film in addition to a glue dispensing manner. The phosphor glue or the phosphor film can be made in a screen printing manner, in an inkjet printing manner, or in a spraying manner. The phosphors in the phosphor glue layer or the phosphor film layer are evenly distributed. In addition, the phosphors in the phosphor glue layer or the phosphor film layer are distributed in a layered arrangement or in a graduated arrangement. FIG. 58A and FIG. 58B are cross-sectional views of an LED filament according to different embodiments. The top layer 420a of the filament in FIG. 58A comprises phosphors 424 distributed in a layered manner. There are two layers of the phosphors 424 distributed in the top layer 420a in FIG. 58A; alternatively, there may be more layers (e.g., more than three layers) of the phosphors 424 in the top layer 420a formed by the adhesive 422. The top layer 420a of the filament in FIG. 58B comprises phosphors 424 distributed in a graduated manner. In other embodiments, the phosphors 424 distributed in a graduated manner may also be distributed in a layered manner.

Figure 59A:
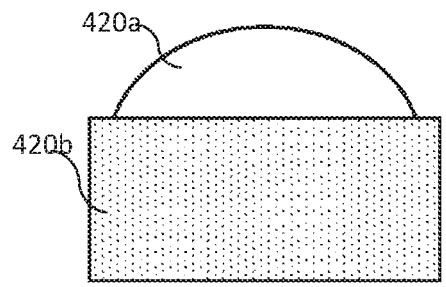
FIGS. 59A, 59B, and 59C are cross-sectional views of an LED filament according to different embodiments of the present invention.
Figure 59B:
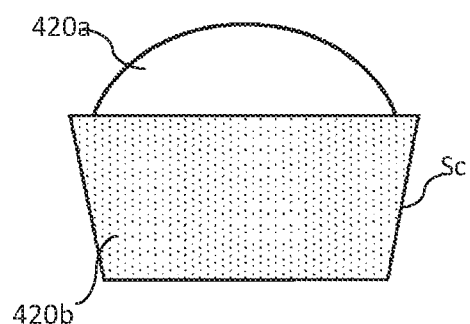
Figure 59C:
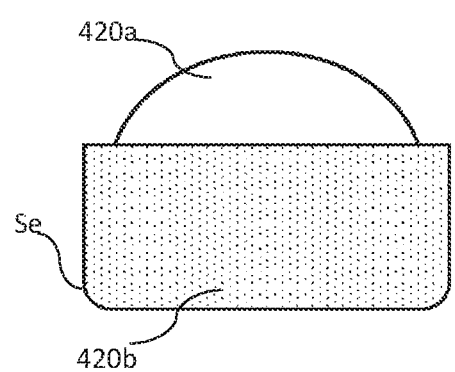

FIGS. 59A, 59B, and 59C are cross-sectional views of an LED filament according to different embodiments of the present invention. Surfaces of the filaments shown in FIGS. 59A, 59B, and 59C are with different angles. Top layers 420a shown in FIGS. 59A, 59B, and 59C may be made by a glue dispenser. Two sides of the top layer 420a naturally collapse to form arc surfaces after dispensing process by adjusting the viscosity of the phosphors glue. A cross section of a base layer 420b in FIG. 59A is rectangular because the phosphor film of the base layer 420b is cut vertically. A cross section of a base layer 420b in FIG. 59B is trapezoidal and has slant edges Sc because the phosphor film of the base layer 420b is cut bias or is cut by a cutter with an angular configuration. The top layer 420a may cut together with the base layer 420b, in this situation, the cross section of the top layer 420a has slant edges too. A cross section of a base layer 420b in FIG. 59C is similar to that of the base layer 420b in FIG. 59A. The difference between the base layers 420b of FIG. 59A and FIG. 59C is that lower corners of the base layer 420b in FIG. 59C are further processed to form arc corners Se. Based upon different finishing manners of FIGS. 59A, 59B, and 59C, the filament may have different illuminating angles and different effects of illumination.

Regarding the definition of the top layer and the base layer, the top layer and the base layer may be distinguished by several ways, for example, in some embodiments, the base layer is formed earlier than the top layer; in some embodiments, the base layer contacts the surface opposite to the main illuminating surface of the LED chips; in some embodiments, the base layer contacts the die bond glue on the LED chips.

While the present invention has been described by way of example and in terms of the preferred embodiments, it is to be understood that the present invention needs not be limited to the disclosed embodiments. For anyone skilled in the art, various modifications and improvements within the spirit of the present invention are covered under the scope of the present invention. The covered scope of the present invention is based on the appended claims.

What is claimed is:

1. An LED light bulb, comprising:
a bulb shell;
a bulb base connected to the bulb shell;
a stem comprising a stem bottom and a stem top opposite to each other, the stem bottom being connected to the bulb base;
at least two conductive supports connected to the stem;
an LED filament comprising a filament body and two conductive electrodes, the two conductive electrodes being at two opposite ends of the filament body and being respectively connected to the two conductive supports, the filament body being around the stem; and
at least one supporting arm with an end connected to the stem and an another end connected to the filament body;
wherein, in a height direction of the LED light bulb, H is a distance from a bottom of the bulb shell to a top of the bulb shell, a first height difference is defined between the two conductive electrodes and is from 0 to 1/10H, the filament body is curved and rises and falls to form a highest point and a lowest point, a second height difference is defined between the highest point and the lowest point, the first height difference is less than the second height difference, and the second height difference is from 2/10H to 4/10H.

2. The LED light bulb of claim 1, wherein the filament body is around the stem by an angle greater than 270 degrees.

3. The LED light bulb of claim 1, wherein in the height direction, the highest point and the lowest point of the filament body are both between 1/3H to 4/5H from the bottom of the bulb shell.

4. The LED light bulb of claim 1, wherein the filament body between the two conductive electrodes is a lighting segment, and more than 50% of a height of the lighting segment is higher than the two conductive electrodes in the height direction.

5. The LED light bulb of claim 4, wherein more than 30% of a height of the lighting segment is higher than the stem top in the height direction.

6. The LED light bulb of claim 1, wherein a number of the LED filament is one, and when the LED light bulb is projected to a projection plane at a particular angle, a projection of the two conductive supports overlaps, a projection of the filament body crosses over two sides of a projection of the stem, and the projection of the two conductive supports is at one of the two sides of the projection of the stem.

7. The LED light bulb of claim 1, wherein the filament body comprises a plurality of LED chips being wire bonded and aligned in line, the filament body comprises a main lighting face and a subordinate lighting face opposite to each other and corresponding to the LED chip, and any portion of the main lighting face is towards the bulb shell or the bulb base at any angle.

8. The LED light bulb of claim 1, wherein the second height difference is between 2.2 cm and 2.8 cm.

9. The LED light bulb of claim 1, wherein the first height difference is between 0 and 1/20H.

10. The LED light bulb of claim 1, wherein the two conductive electrodes are between 1/2H and 3/4H from the bottom of the bulb shell.

11. The LED light bulb of claim 1, wherein points of the LED filament in an xyz coordinates are defined as X, Y, and Z and satisfy a curve equation, an origin of the xyz coordinates is at the stem top, an x-y plane of the xyz coordinates passes through the stem top and is perpendicular to the height direction, a z-axis of the xyz coordinates is coaxial with stem, and the two conductive electrodes are symmetrically disposed at two sides of a y-axis of the xyz coordinates, the curve equation is:

$$X=m1*\cos(t*360),$$

$$Y=m2*\sin(t*360),$$

$$Z=n*\cos(t*360*k),$$

Wherein, t is a variable between 0 and 1, the LED filament varies along an x-direction, a y-direction, and a z-direction according to t; wherein, when X=0, a max value of |Y| is m2, and a max value of |Z| is n; wherein, when Y=0, a max value of |X| is m1, the max value of |Z| is n; wherein, when Z=0, the max value of |X| is m1, and the max value of |Y| is m2; wherein, m1 is a length in the x-direction, m2 is a length in the y-direction, n is a height of the highest point from the x-y plane in the z-direction, and k is a number of the highest point.

12. The LED light bulb of claim 11, wherein m1 is greater than or equal to 24 mm and is less than or equal to 27 mm.

13. The LED light bulb of claim 11, wherein m2 is greater than or equal to 24 mm and is less than or equal to 27 mm.

14. The LED light bulb of claim 11, wherein n is greater than 0 and is less than or equal to 14 mm.

15. The LED light bulb of claim 11, wherein k is greater than or equal to 2 and is less than or equal to 8.

16. The LED light bulb of claim 11, wherein the filament body comprises a light conversion coating and a plurality of LED chips, the light conversion coating is applied to at least two sides of the LED chips and the two conductive electrodes, a part of the two conductive electrodes is exposed from the light conversion coating, the light conversion coating comprises a top layer and a base layer, the top layer and the base layer are at two or more sides of the LED chips and the two conductive electrodes, and an attaching structure is provided between the top layer and the base layer.

17. The LED light bulb of claim 16, wherein the attaching structure comprises a rough surface respectively formed on contact faces between the top layer and the base layer.

18. The LED light bulb of claim 16, wherein the attaching structure comprises a wave-shaped interface respectively formed on contact faces between the top layer and the base layer.

19. The LED light bulb of claim 16, wherein the attaching structure comprises a plurality of through holes formed on a side of the base layer facing the top layer, and the top layer extends into the through holes.

20. The LED light bulb of claim 16, wherein the attaching structure comprises a coincidence region formed between the top layer and the base layer within a certain range, and the coincidence region is a transition zone where the top layer and the base layer are mixed together.

21. The LED light bulb of claim 1, wherein the bulb shell comprises an adhesive film attaching to an outside or an inside of the bulb shell.

22. The LED light bulb of claim 1, wherein the bulb shell comprises a ventilation hole penetrating through the bulb shell.

23. The LED light bulb of claim 22, wherein the ventilation hole is disposed on the top or the bottom of the bulb shell in the height direction.

24. The LED light bulb of claim 23, wherein the ventilation hole is disposed on the top of the bulb shell, and an area of an opening of the ventilation hole is between 100 mm$^2$ and 500 mm$^2$.

25. The LED light bulb of claim 24, wherein the area of the opening of the ventilation hole is between 150 mm$^2$ and 450 mm$^2$.

26. The LED light bulb of claim 23, wherein the ventilation hole is disposed on the bottom of the bulb shell, and an area of an opening of the ventilation hole is between 200 mm$^2$ and 1200 mm$^2$.

27. The LED light bulb of claim 26, wherein the area of the opening of the ventilation hole is between 450 mm$^2$ and 1000 mm$^2$.

28. The LED light bulb of claim 1, wherein the bulb shell comprises a diffusing film attaching to an outside or an inside of the bulb shell.

29. The LED light bulb of claim 28, wherein the bulb shell comprises an adhesive layer disposed between the bulb shell and the diffusing film.

30. The LED light bulb of claim 28, wherein the diffusing film comprises calcium carbonate, halogen calcium phosphate, and aluminum oxide.

31. The LED light bulb of claim 1, wherein the bulb shell comprises a diffusing coating attaching to an outside or an inside of the bulb shell.

32. The LED light bulb of claim 31, wherein the diffusing coating comprises calcium carbonate, strontium phosphate, thickener, and ceramic activated carbon.

33. The LED light bulb of claim 1, wherein the bulb shell comprises a light conversion film comprising a light conversion substance, the light conversion film is for adjusting the color temperature of light emitted from the LED light bulb.

34. The LED light bulb of claim 33, wherein the light conversion substance is phosphor powder or dye.

35. The LED light bulb of claim 1, wherein the bulb shell comprises a light conversion substance and is for adjusting the color temperature of light emitted from the LED light bulb.

36. The LED light bulb of claim 35, wherein the light conversion substance is phosphor powder or dye.

37. An LED light bulb, comprising:
a bulb shell;
a bulb base connected to the bulb shell;
a stem comprising a stem bottom and a stem top opposite to each other, the stem bottom being connected to the bulb base;
at least two conductive supports connected to the stem;
an LED filament comprising a filament body and two conductive electrodes, the two conductive electrodes being at two opposite ends of the filament body and being respectively connected to the two conductive supports, the filament body being around the stem; and
at least one supporting arm with an end connected to the stem and an another end connected to the filament body;
wherein, when the LED light bulb is projected to a side projection plane parallel with a height direction of the LED light bulb, a filament side projection of the filament body on the side projection plane comprises a highest point and a lowest point, a height difference is defined between the highest point and the lowest point in the height direction, the height difference is from 1/8 to 3/8 of a height of the bulb shell;
wherein, when the LED light bulb is projected to a horizontal projection plane perpendicular to the height direction of the LED light bulb, a filament horizontal projection of the filament body on the horizontal projection plane is of a quasi-circle or a quasi U shape, and a shortest distance between the two ends of the filament horizontal projection is from 0 cm to 3 cm;

wherein, in the height direction of the LED light bulb, a height difference between the two conductive electrodes is from 0 mm to 5 mm.

38. The LED light bulb of claim 37, wherein r is a distance from a center point defined by the filament horizontal projection to the filament horizontal projection, θ is an angle of an arc formed by the filament horizontal projection, and θ is greater than or equal to 30 degrees and is less than or equal to 360 degrees.

39. The LED light bulb of claim 38, wherein points of the LED filament in an xyz coordinates are defined as X, Y, and Z, an origin of the xyz coordinates is at the stem top, an x-y plane of the xyz coordinates passes through the stem top and is perpendicular to the height direction, a z-axis of the xyz coordinates is coaxial with stem, and the two conductive electrodes are symmetrically disposed at two sides of a y-axis of the xyz coordinates, a relation between the LED filament varying along the z-axis and θ satisfies a function:

$$Z=n*\cos(k\theta+\pi),$$

Wherein, n is a height of the highest point from the x-y plane in the z-direction, and k is a number of the highest point.

40. The LED light bulb of claim 39, wherein n is greater than 0 and is less than or equal to 14 mm.

41. The LED light bulb of claim 39, wherein k is greater than or equal to 2 and is less than or equal to 8.

42. An LED light bulb, comprising:
a bulb shell;
a bulb base connected to the bulb shell;
a stem comprising a stem bottom and a stem top opposite to each other, the stem bottom being connected to the bulb base;
at least two conductive supports connected to the stem;
a single LED filament comprising a filament body and two conductive electrodes, the two conductive electrodes being at two opposite ends of the filament body and being respectively connected to the two conductive supports, the filament body being around the stem; and
at least one supporting arm with an end connected to the stem and an another end connected to the filament body;

wherein, the filament body comprises at least one first curving segment and at least two second curving segments, the first curving segment is between the two second curving segments, the two conductive electrodes are respectively at an end of each of the two second curving segments away from the first curving segment, a height difference between the two conductive electrodes in a height direction of the LED light bulb is from 0 mm to 5 mm, the first curving segment curves towards a first direction, the second curving segment curves towards a second direction, and the first curving segment and the two second curving segments form a wave shaped annular structure.

43. The LED light bulb of claim 42, wherein the first direction is towards the bulb base, and the second direction is away from the bulb base.

44. The LED light bulb of claim 42, wherein the first direction is away from the bulb base, and the second direction is towards the bulb base.

45. The LED light bulb of claim 42, wherein when the LED light bulb is respectively projected to a first side projection plane and a second side projection plane perpendicular to each other and both parallel with the height direction of the LED light bulb, a projection of the first curving segment and the two second curving segments on the first side projection plane is of a reversed U shape, and a projection of the first curving segment and the two second curving segments on the second side projection plane is of a U shape.

46. The LED light bulb of claim 42, wherein when the LED light bulb is projected to a horizontal projection plane perpendicular to the height direction of the LED light bulb, a projection of the first curving segment and the two second curving segments on the horizontal projection plane is of a U shape.

* * * * *